US011417843B2

(12) United States Patent
Sakuma

(10) Patent No.: US 11,417,843 B2
(45) Date of Patent: Aug. 16, 2022

(54) ORGANIC ELECTROLUMINESCENCE DEVICE AND AMINE COMPOUND FOR ORGANIC ELECTROLUMINESCENCE DEVICE

(71) Applicant: Samsung Display Co., Ltd., Yongin-si (KR)

(72) Inventor: Takao Sakuma, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 351 days.

(21) Appl. No.: 16/584,780

(22) Filed: Sep. 26, 2019

(65) Prior Publication Data

US 2020/0119282 A1 Apr. 16, 2020

(30) Foreign Application Priority Data

Oct. 12, 2018 (KR) ........................ 10-2018-0121963

(51) Int. Cl.
*H01L 51/00* (2006.01)
*H01L 51/50* (2006.01)

(52) U.S. Cl.
CPC ...... *H01L 51/0059* (2013.01); *H01L 51/0052* (2013.01); *H01L 51/0072* (2013.01);
(Continued)

(58) Field of Classification Search
None
See application file for complete search history.

(56) References Cited

U.S. PATENT DOCUMENTS 5,077,142 A * 12/1991 Sakon .................... H05B 33/14 428/690
8,329,316 B2 12/2012 Kim et al.
(Continued)

FOREIGN PATENT DOCUMENTS

CN 106083606 A * 11/2016 ............. H01L 51/54
CN 106831313 A 6/2017
(Continued)

OTHER PUBLICATIONS

Machine translation of CN-106083606, translation generated Nov. 2021, 23 pages. (Year: 2021).*

*Primary Examiner* — Robert S Loewe
(74) *Attorney, Agent, or Firm* — Lewis Roca Rothgerber Christie LLP

(57) ABSTRACT

An organic electroluminescence device of an embodiment includes a first electrode and a second electrode opposite of the first electrode, and at least one organic layer between the first electrode and the second electrode, wherein the at least one organic layer includes an amine compound represented by Formula 1 below.

(Continued)

Formula 1

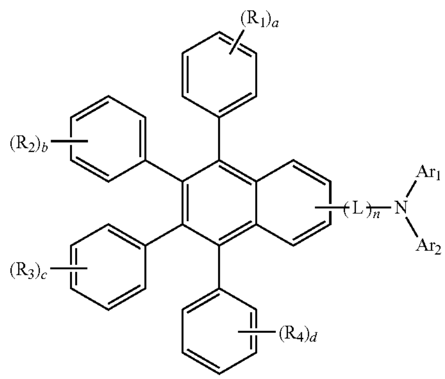

20 Claims, 2 Drawing Sheets

(52) U.S. Cl.
CPC ...... *H01L 51/0073* (2013.01); *H01L 51/0074* (2013.01); *H01L 51/0094* (2013.01); *H01L 51/5056* (2013.01); *H01L 51/5092* (2013.01)

(56) References Cited

U.S. PATENT DOCUMENTS

| | | | | |
|---|---|---|---|---|
| 2005/0025993 A1* | 2/2005 | Thompson | ............. | C09K 11/06 428/690 |
| 2007/0252511 A1* | 11/2007 | Funahashi | ............. | C07C 255/51 313/498 |
| 2018/0331298 A1 | 11/2018 | Hayashi et al. | | |

FOREIGN PATENT DOCUMENTS

| | | | |
|---|---|---|---|
| JP | 5437641 | B2 | 3/2014 |
| KR | 10-0852326 | B1 | 8/2008 |
| KR | 10-2009-0069249 | A | 6/2009 |
| KR | 10-1733155 | B1 | 5/2017 |
| KR | 10-2018-0075559 | A | 7/2018 |
| WO | WO 2007/105884 | A1 | 9/2007 |
| WO | WO 2018/087346 | A1 | 5/2018 |
| WO | WO2017/073594 | A1 | 8/2018 |

* cited by examiner

ORGANIC ELECTROLUMINESCENCE DEVICE AND AMINE COMPOUND FOR ORGANIC ELECTROLUMINESCENCE DEVICE

CROSS-REFERENCE TO RELATED APPLICATION

This application claims priority to and the benefit of Korean Patent Application No. 10-2018-0121963, filed on Oct. 12, 2018, the entire contents of which are incorporated herein by reference.

BACKGROUND

1. Field

Embodiments of the present disclosure herein relate to an amine compound and an organic electroluminescence device including the same, and for example, to an amine compound used in a hole transport region and an organic electroluminescence device including the same.

2. Description of the Related Art

Recently, the development of an organic electroluminescence display device as an image display device is being actively conducted. Different from a liquid crystal display device, the organic electroluminescence display device is a self-luminescent display device in which holes and electrons injected from a first electrode and a second electrode recombine in an emission layer, and a light emission material including an organic compound in the emission layer emits light to display an image.

In the application of an organic electroluminescence device to a display device, the decrease of the driving voltage, and the increase of the light-emitting efficiency and the life of the organic electroluminescence device are desired, and development of materials for an organic electroluminescence device stably attaining the desired features are being continuously researched.

In addition, in order to accomplish an organic electroluminescence device with high efficiency, development on a material for a hole transport layer for restraining the diffusion of the exciton energy of an emission layer is being conducted.

SUMMARY

Embodiments of the present disclosure provide an amine compound that is a material for an organic electroluminescence device with improved emission efficiency and device life.

Embodiments of the present disclosure also provide an organic electroluminescence device including an amine compound containing tetraphenyl naphthalene, and having improved device efficiency and life.

An embodiment of the present disclosure provides an organic electroluminescence device including a first electrode; a second electrode on the first electrode; and a plurality of organic layers between the first electrode and the second electrode, wherein at least one organic layer among the organic layers includes an amine compound, and the amine compound includes a tetraphenyl naphthalene derivative, a tertiary amine derivative, and a linker including a hydrocarbon ring or a heterocycle connecting a naphthalene part of the tetraphenyl naphthalene derivative and a nitrogen atom of the tertiary amine derivative.

In an embodiment, the organic layers may include an emission layer; and a hole transport region between the first electrode and the emission layer, and the hole transport region may include the amine compound.

In an embodiment, the organic layers may include an emission layer; a hole injection layer between the first electrode and the emission layer; and a hole transport layer between the hole injection layer and the emission layer, and the hole transport layer may include the amine compound.

In an embodiment, the tertiary amine derivative may include a substituted or unsubstituted aryl group of 6 to 50 carbon atoms for forming a ring, or a substituted or unsubstituted heteroaryl group of 2 to 50 carbon atoms for forming a ring.

In an embodiment, the linker may be a substituted or unsubstituted phenylene group, a substituted or unsubstituted naphthylene group, a substituted or unsubstituted divalent biphenyl group, a substituted or unsubstituted divalent fluorene group, a substituted or unsubstituted divalent phenanthrene group, a substituted or unsubstituted divalent dibenzofuran group, or a substituted or unsubstituted divalent dibenzothiophene group.

In an embodiment, the amine compound may be represented by the following Formula 1:

Formula 1

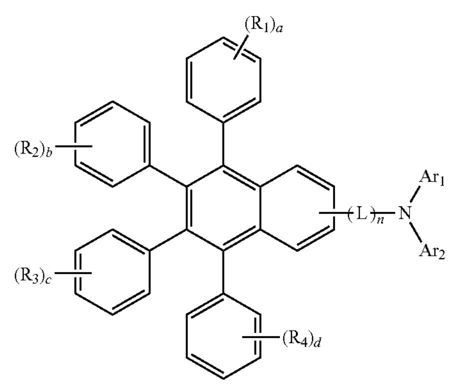

In Formula 1, $R_1$ to $R_4$ are each independently a hydrogen atom, a deuterium atom, a halogen atom, a cyano group, a substituted or unsubstituted silyl group, a substituted or unsubstituted alkyl group of 1 to 30 carbon atoms, a substituted or unsubstituted alkoxy group of 1 to 30 carbon atoms, a substituted or unsubstituted aryloxy group of 6 to 30 carbon atoms, a substituted or unsubstituted alkylthio group of 1 to 30 carbon atoms, a substituted or unsubstituted arylthio group of 6 to 30 carbon atoms, a substituted or unsubstituted aryl group of 6 to 50 carbon atoms for forming a ring, or a substituted or unsubstituted heteroaryl group of 2 to 50 carbon atoms for forming a ring, a to d are each independently an integer of 0 to 5, L is a substituted or unsubstituted arylene group of 6 to 50 carbon atoms for forming a ring, or a substituted or unsubstituted heteroarylene group of 2 to 50 carbon atoms for forming a ring, n is an integer of 1 to 3, $Ar_1$ and $Ar_2$ are each independently a substituted or unsubstituted aryl group of 6 to 50 carbon atoms for forming a ring, or a substituted or unsubstituted heteroaryl group of 2 to 50 carbon atoms for forming a ring.

In an embodiment, Formula 1 may be represented by the following Formula 1-1 or Formula 1-2:

Formula 1-1

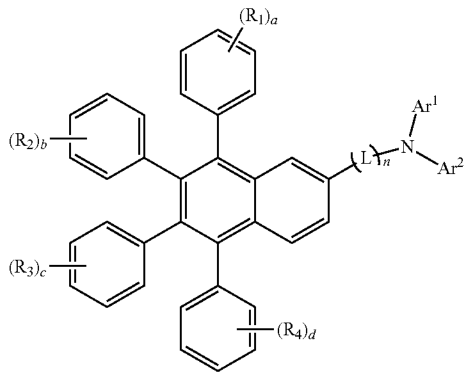

Formula 1-2

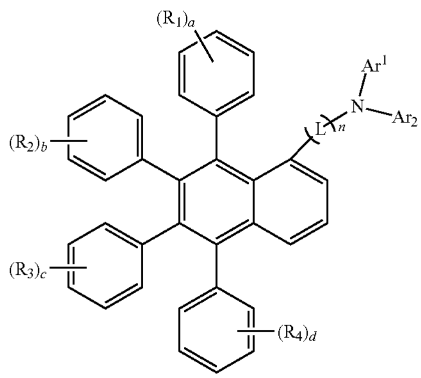

In Formula 1-1 and Formula 1-2, $R_1$ to $R_4$, a to d, L, n, $Ar_1$, and $Ar_2$ are the same as defined with respect to Formula 1.

In an embodiment, L may be represented by any one selected from the following Formulae L-1 to L-7:

L-1

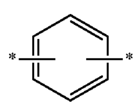

L-2

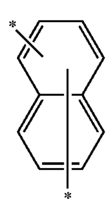

L-3

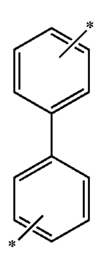

-continued

L-4

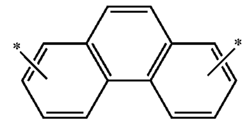

L-5

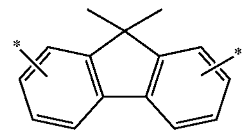

L-6

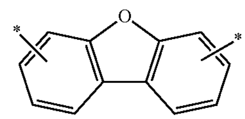

L-7

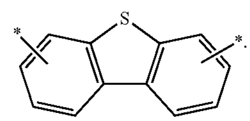

In an embodiment, a to d may be 0.

In an embodiment, the emission layer may include an anthracene derivative represented by the following Formula 2:

Formula 2

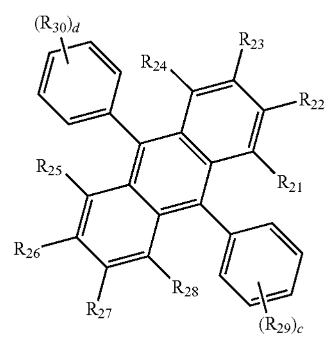

In Formula 2, $R_{21}$ to $R_{30}$ are each independently a hydrogen atom, a deuterium atom, a halogen atom, a substituted or unsubstituted silyl group, a substituted or unsubstituted alkyl group of 1 to 10 carbon atoms, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring, and c and d are each independently an integer of 0 to 5.

In another embodiment of the present disclosure, there is provided an organic electroluminescence device including a first electrode; a second electrode on the first electrode; and a plurality of organic layers between the first electrode and the second electrode, wherein at least one organic layer among the organic layers includes an amine compound represented by the following Formula 1:

Formula 1

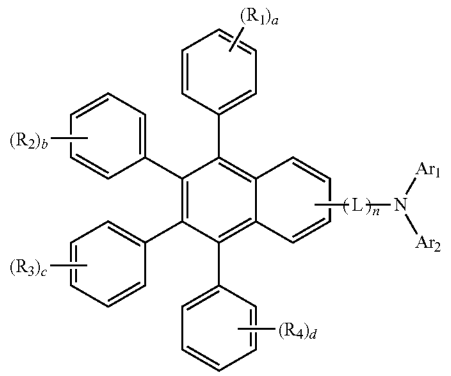

In Formula 1, $R_1$ to $R_4$ are each independently a hydrogen atom, a deuterium atom, a halogen atom, a cyano group, a substituted or unsubstituted silyl group, a substituted or unsubstituted alkyl group of 1 to 30 carbon atoms, a substituted or unsubstituted alkoxy group of 1 to 30 carbon atoms, a substituted or unsubstituted aryloxy group of 6 to 30 carbon atoms, a substituted or unsubstituted alkylthio group of 1 to 30 carbon atoms, a substituted or unsubstituted arylthio group of 6 to 30 carbon atoms, a substituted or unsubstituted aryl group of 6 to 50 carbon atoms for forming a ring, or a substituted or unsubstituted heteroaryl group of 2 to 50 carbon atoms for forming a ring, a to d are each independently an integer of 0 to 5, L is a substituted or unsubstituted arylene group of 6 to 50 carbon atoms for forming a ring, or a substituted or unsubstituted heteroarylene group of 2 to 50 carbon atoms for forming a ring, n is an integer of 1 to 3, $Ar_1$ and $Ar_2$ are each independently a substituted or unsubstituted aryl group of 6 to 50 carbon atoms for forming a ring, or a substituted or unsubstituted heteroaryl group of 2 to 50 carbon atoms for forming a ring.

In an embodiment, the organic layers may include an emission layer; and a hole transport region between the first electrode and the emission layer, and the hole transport region may include an amine compound represented by Formula 1.

In another embodiment of the present disclosure, there is provided an amine compound represented by the following Formula 1:

Formula 1

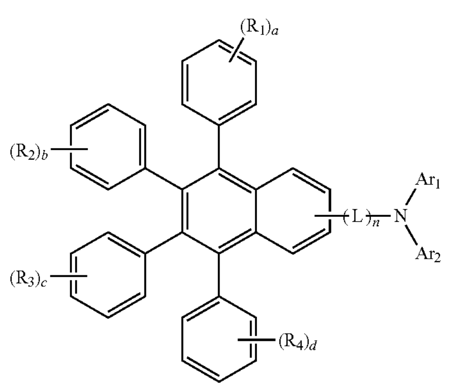

In Formula 1, $R_1$ to $R_4$ are each independently a hydrogen atom, a deuterium atom, a halogen atom, a cyano group, a substituted or unsubstituted silyl group, a substituted or unsubstituted alkyl group of 1 to 30 carbon atoms, a substituted or unsubstituted alkoxy group of 1 to 30 carbon atoms, a substituted or unsubstituted aryloxy group of 6 to 30 carbon atoms, a substituted or unsubstituted alkylthio group of 1 to 30 carbon atoms, a substituted or unsubstituted arylthio group of 6 to 30 carbon atoms, a substituted or unsubstituted aryl group of 6 to 50 carbon atoms for forming a ring, or a substituted or unsubstituted heteroaryl group of 2 to 50 carbon atoms for forming a ring, a to d are each independently an integer of 0 to 5, L is a substituted or unsubstituted arylene group of 6 to 50 carbon atoms for forming a ring, or a substituted or unsubstituted heteroarylene group of 2 to 50 carbon atoms for forming a ring, n is an integer of 1 to 3, $Ar_1$ and $Ar_2$ are each independently a substituted or unsubstituted aryl group of 6 to 50 carbon atoms for forming a ring, or a substituted or unsubstituted heteroaryl group of 2 to 50 carbon atoms for forming a ring.

In an embodiment, Formula 1 may be represented by the following Formula 1-1 or Formula 1-2:

Formula 1-1

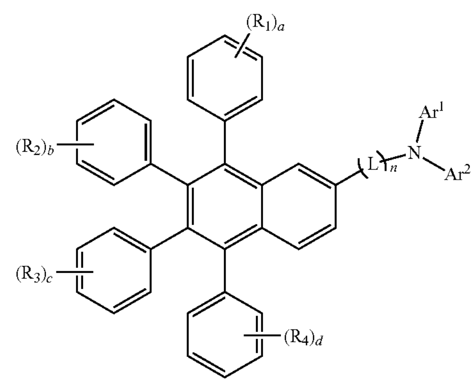

Formula 1-2

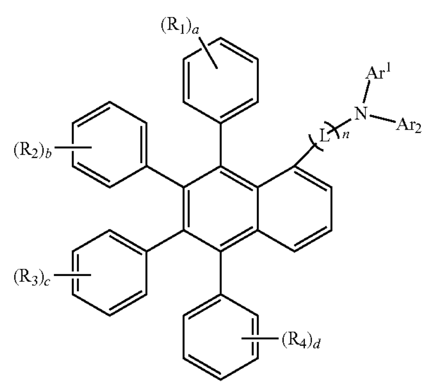

In Formula 1-1 and Formula 1-2, $R_1$ to $R_4$, a to d, L, n, $Ar_1$, and $Ar_2$ may be the same as defined with respect to Formula 1.

In an embodiment, L may be a substituted or unsubstituted phenylene group, a substituted or unsubstituted naphthylene group, a substituted or unsubstituted divalent biphenyl group, a substituted or unsubstituted divalent fluorene group, a substituted or unsubstituted divalent phenanthrene group, a substituted or unsubstituted divalent dibenzofuran group, or a substituted or unsubstituted divalent dibenzothiophene group.

In an embodiment, L may be represented by any one selected from the following Formulae L-1 to L-7:

L-1

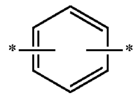

L-2

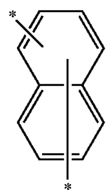

L-3

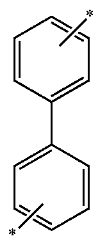

L-4

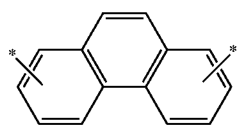

L-5

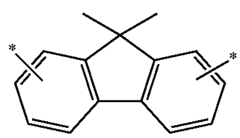

L-6

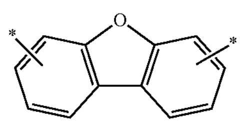

L-7

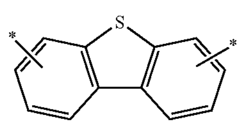

In an embodiment, a to d may be 0.

BRIEF DESCRIPTION OF THE FIGURES

The accompanying drawings are included to provide a further understanding of the subject matter of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
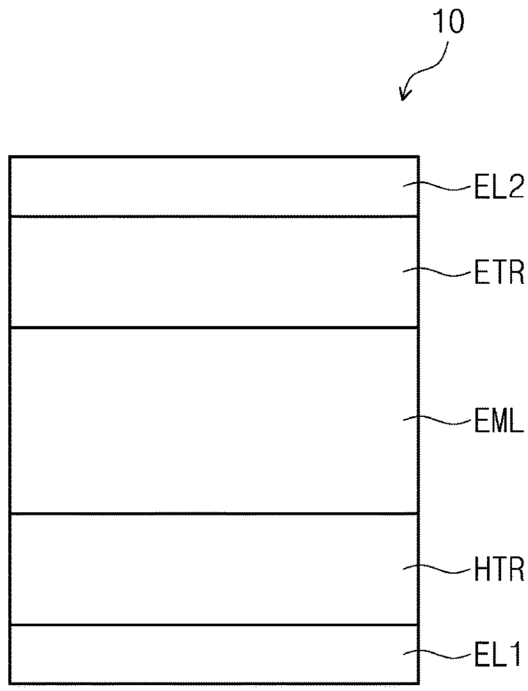
FIG. 1 is a cross-sectional view schematically illustrating an organic electroluminescence device according to an embodiment of the present disclosure.

The subject matter of the present disclosure may have various modifications and may be embodied in different forms, and example embodiments will be explained in more detail with reference to the accompany drawings. The subject matter of the present disclosure may, however, be embodied in different forms and should not be construed as being limited to the embodiments set forth herein. Rather, all modifications, equivalents, and substituents which are included in the spirit and technical scope of the present disclosure should be included in the present disclosure.

Like reference numerals refer to like elements throughout. In the drawings, the dimensions of structures may be exaggerated for clarity of illustration. It will be understood that, although the terms first, second, etc. may be used herein to describe various elements, these elements should not be limited by these terms. These terms are only used to distinguish one element from another element. Thus, a first element could be termed a second element without departing from the spirit and scope of the present disclosure. Similarly, a second element could be termed a first element. As used herein, the singular forms are intended to include the plural forms as well, unless the context clearly indicates otherwise.

It will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof. It will also be understood that when a layer, a film, a region, a plate, etc. is referred to as being "on" another part, it can be "directly on" the other part, or intervening layers may also be present.

Hereinafter, an organic electroluminescence device according to an embodiment of the present disclosure and an amine compound of an embodiment included therein will be explained with reference to the drawings.

Figure 2:
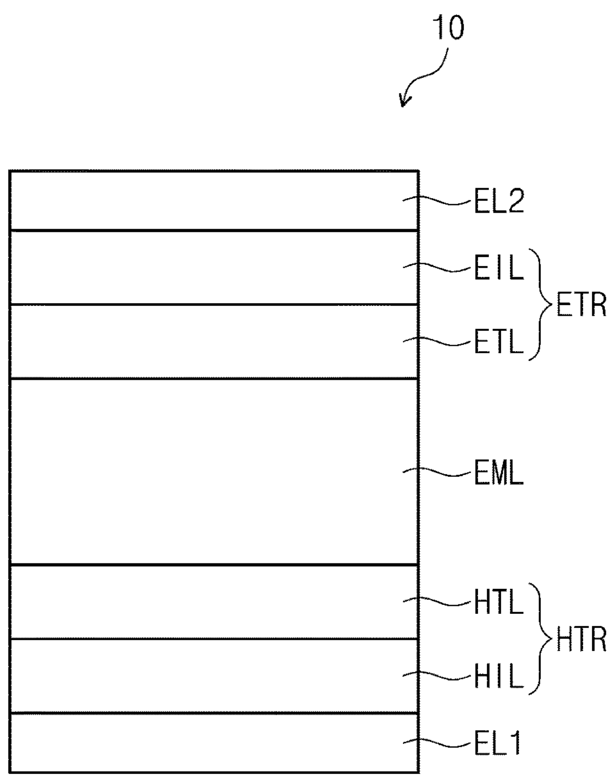
FIG. 2 is a cross-sectional view schematically illustrating an organic electroluminescence device according to an embodiment of the present disclosure.
Figure 3:
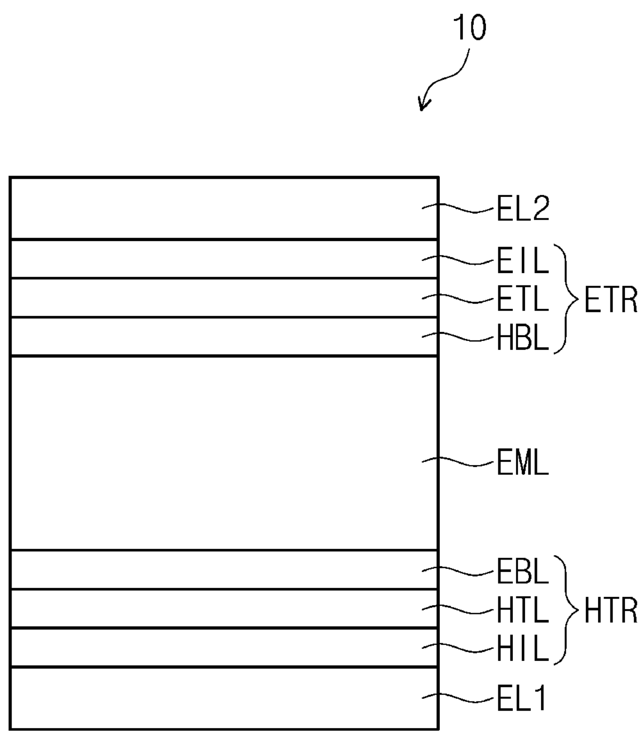
FIG. 3 is a cross-sectional view schematically illustrating an organic electroluminescence device according to an embodiment of the present disclosure.

FIGS. 1 to 3 are cross-sectional views schematically illustrating organic electroluminescence devices according to exemplary embodiment of the present disclosure. Referring to FIGS. 1 to 3, an organic electroluminescence device 10 according to an embodiment may include a first electrode EL1, a hole transport region HTR, an emission layer EML, an electron transport region ETR and a second electrode EL2, which may be laminated one by one.

The first electrode EL1 and the second electrode EL2 are located opposite to each other, and a plurality of organic layers may be between the first electrode EL1 and the second electrode EL2. The plurality of the organic layers may include a hole transport region HTR, an emission layer EML, and an electron transport region ETR.

The organic electroluminescence device 10 of an embodiment may include the amine compound of an embodiment in at least one organic layer which will be explained herein below among the plurality of organic layers between the first electrode EL1 and the second electrode EL2. For example, the amine compound of an embodiment may be included in a hole transport region HTR.

When compared with FIG. 1, FIG. 2 shows the cross-sectional view of an organic electroluminescence device 10 of an embodiment, wherein a hole transport region HTR includes a hole injection layer HIL and a hole transport layer HTL, and an electron transport region ETR includes an electron injection layer EIL and an electron transport layer ETL. In addition, when compared with FIG. 1, FIG. 3 shows the cross-sectional view of an organic electroluminescence device 10 of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. In the organic electroluminescence device 10 of an embodiment, the hole transport layer HTL may include the amine compound of an embodiment.

In the organic electroluminescence device 10 of an embodiment, the hole transport layer HTL may include a plurality of sub hole transport layers, and the amine compound of an embodiment may be included in a sub hole transport layer adjacent to the emission layer EML among the sub hole transport layers, In an organic electroluminescence device 10 of an embodiment, the amine compound may be included in at least one organic layer among the plurality of the organic layers between the first electrode EL1 and the second electrode EL2, and the amine compound may include a tetraphenyl derivative, a tertiary amine derivative, and a linker connecting the tetraphenyl derivative and the tertiary amine derivative.

For example, the organic electroluminescence device 10 of an embodiment may include a tetraphenyl derivative

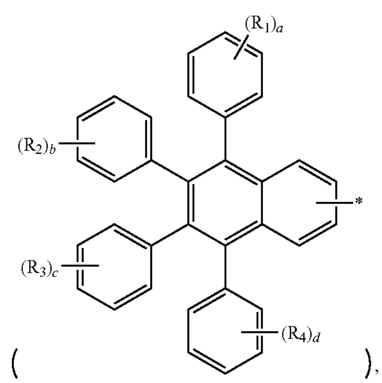

a tertiary amine derivative

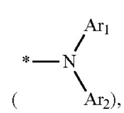

and the linker including a hydrocarbon ring or a heterocycle, connecting the naphthalene part of the tetraphenyl derivative and the nitrogen atom of the tertiary amine derivative in at least one organic layer.

In the amine compound included in at least one organic layer of the organic electroluminescence device 10 of an embodiment, the tertiary amine derivative may be an amine group including a substituted or unsubstituted aryl group of 6 to 50 carbon atoms for forming a ring, or a substituted or unsubstituted heteroaryl group of 2 to 50 carbon atoms for forming a ring.

In addition, the linker in the amine compound included in the at least one organic layer of the organic electroluminescence device 10 of an embodiment may be a substituted or unsubstituted phenylene group, a substituted or unsubstituted naphthylene group, a substituted or unsubstituted divalent biphenyl group, a substituted or unsubstituted divalent fluorene group, a substituted or unsubstituted divalent phenanthrene group, a substituted or unsubstituted divalent dibenzofuran group, or a substituted or unsubstituted divalent dibenzothiophene group.

If the amine compound used in an embodiment is included in the at least one organic layer, the efficiency and life characteristics of an organic electroluminescence device 10 of an embodiment may be improved due to the conformation of the tetraphenyl part of the tetraphenyl derivative and the electron transport properties of the naphthalene part.

In the present description, -* means a connecting position.

In the present description, the term "substituted or unsubstituted" corresponds to substituted or unsubstituted with at least one substituent selected from the group consisting of a deuterium atom, a halogen atom, a cyano group, a nitro group, an amino group, a silyl group, a boron group, a phosphine oxide group, a phosphine sulfide group, an alkyl group, an alkenyl group, an alkoxy group, an aryloxy group, an alkylthio group, an arylthio group, a hydrocarbon ring, an aryl group, and a heterocyclic group. In addition, each of the substituents may be substituted or unsubstituted. For example, a biphenyl group may be interpreted as an aryl group or a phenyl group substituted with a phenyl group.

In the present description, the halogen atom may include a fluorine atom, a chlorine atom, a bromine atom and an iodine atom.

In the present description, the alkyl may be a linear, branched or cyclic type (or kind). The carbon number of the alkyl may be from 1 to 50, from 1 to 30, from 1 to 20, from 1 to 10, or from 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the present description, the hydrocarbon ring means an optional functional group or substituent derived from an aliphatic hydrocarbon ring, or an optional functional group or substituent derived from an aromatic hydrocarbon ring. The hydrocarbon ring may not include a heteroatom and may be a ring of 5 to 50 carbon atoms for forming a ring. For example, the carbon number for forming a ring of the hydrocarbon ring may be 6 to 20. The hydrocarbon ring may be a monocyclic ring or a polycyclic ring. In some embodiments, the hydrocarbon ring may include an aryl group.

In the present description, the heterocycle may be a ring compound including one or more among O, N, P, Si and S as a heteroatom. The carbon number for forming a ring of the heterocycle may be 2 to 50 or 2 to 20. The heterocycle may be a monocyclic ring or a polycyclic ring. In some embodiments, the heterocycle may include a heteroaryl group.

In the present description, the aryl group means an optional functional group or substituent derived from an aromatic hydrocarbon ring. The aryl group may be a monocyclic aryl group or a polycyclic aryl group. The carbon number for forming a ring in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., without limitation.

In the present description, the fluorenyl group may be substituted, and two substituents may be combined with each other to form a spiro structure. Examples of a substituted fluorenyl group are as follows. However, embodiments of the present disclosure are not limited thereto.

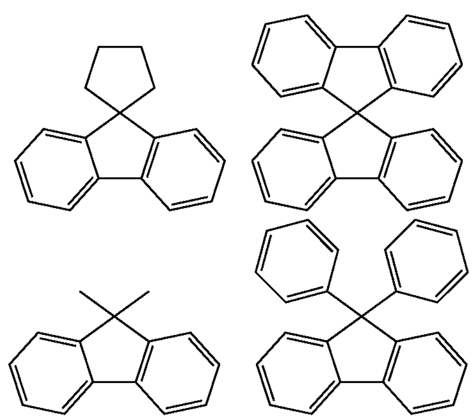

In the present description, the heteroaryl may be a heteroaryl including one or more among O, N, P, Si or S as a heteroatom. The carbon number for forming a ring of the heteroaryl may be 2 to 30 or 2 to 20. The heteroaryl may be monocyclic heteroaryl or polycyclic heteroaryl. Examples of the polycyclic heteroaryl may have a dicyclic or tricyclic structure. Examples of the heteroaryl may include thiophene, furan, pyrrole, imidazole, thiazole, oxazole, oxadiazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, thiazole, isooxazole, oxadiazole, thiadiazole, phenothiazine, dibenzosilole, dibenzofuran, etc., without limitation.

In the present description, the silyl group includes an alkylsilyl group and an arylsilyl group. Examples of the silyl group may include trimethylsilyl, triethylsilyl, t-butyldimethylsilyl, vinyldimethylsilyl, propyldimethylsilyl, triphenylsilyl, diphenylsilyl, phenylsilyl, etc. However, embodiments of the present disclosure are not limited thereto.

In the present description, the oxy group may include an alkoxy group and an aryloxy group. The alkoxy group may be a linear, branched or cyclic chain. The carbon number of the alkoxy group is not specifically limited but may be, for example, 1 to 30, 1 to 20, or 1 to 10. The carbon number of the aryloxy group is not specifically limited but may be, for example, 6 to 30, or 6 to 20. Examples of the oxy group may include methoxy, ethoxy, n-propoxy, isopropoxy, butoxy, pentyloxy, hexyloxy, octyloxy, nonyloxy, decyloxy, benzyloxy, etc. However, embodiments of the present disclosure are not limited thereto.

In the present description, the thio group may include an alkylthio group and an arylthio group. The carbon number of the alkylthio group is not specifically limited, but may be, for example, 1 to 30, 1 to 20, or 1 to 10. The carbon number of the arylthio group is not specifically limited, but may be, for example, 6 to 30, or 6 to 20.

The same explanation of the alkyl group provided herein above may be applied to the alkyl group in the alkoxy group and the alkylthio group in the present description. The same explanation of the aryl group provided herein above may be applied to the aryl group in the aryloxy group and the arylthio group in the present description.

In the present description, the expression "forming a ring via the combination with an adjacent group" may mean forming a substituted or unsubstituted hydrocarbon ring, or a substituted or unsubstituted heterocycle via the combination with an adjacent group. The hydrocarbon ring includes an aliphatic hydrocarbon ring and an aromatic hydrocarbon ring. The heterocycle includes an aliphatic heterocycle and an aromatic heterocycle. The ring formed by the combination with an adjacent group may be a monocyclic ring or a polycyclic ring. In addition, the ring formed via the combination with each other may be combined with another ring to form a spiro structure.

In the present description, the term "adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentane, two ethyl groups may be interpreted as "adjacent groups" to each other.

In the organic electroluminescence devices 10 of embodiments as shown in FIG. 1 to FIG. 3, the first electrode EL1 has conductivity (e.g., is electrically conductive). The first electrode EL1 may be formed using a metal alloy or a conductive compound. The first electrode EL1 may be an anode. In addition, the first electrode may be a pixel electrode. The first electrode EL1 may be a transmissive electrode, a transflective electrode, or a reflective electrode. If the first electrode EL1 is the transmissive electrode, the first electrode EL1 may be formed using a transparent metal oxide such as indium tin oxide (ITO), indium zinc oxide (IZO), zinc oxide (ZnO), and indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may have a structure including a plurality of layers including a reflective layer or a transflective layer formed using the above materials, and a transmissive conductive layer formed using ITO, IZO, ZnO, or ITZO. For example, the first electrode EL1 may have a three-layer structure of ITO/Ag/ITO. However, embodiments of the present disclosure are not limited thereto. The thickness of the first electrode EL1 may be from about 1,000 Å to about 10,000 Å, for example, from about 1,000 Å to about 3,000 Å.

The hole transport region HTR is provided on the first electrode EL1. The hole transport region HTR may include at least one of a hole injection layer HIL, a hole transport layer HTL, a hole buffer layer, or an electron blocking layer EBL.

The hole transport region HTR may have a single layer formed using a single material, a single layer formed using a plurality of different materials, or a multilayer structure including a plurality of layers formed using a plurality of different materials.

For example, the hole transport region HTR may have the structure of a single layer such as a hole injection layer HIL, or a hole transport layer HTL, and may have a structure of a single layer formed using a hole injection material and a hole transport material. In some embodiments, the hole transport region HTR may have a structure of a single layer formed using a plurality of different materials, or a structure laminated from the first electrode EL1 of hole injection layer HIL/hole transport layer HTL, hole injection HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, without limitation.

The hole transport region HTR may be formed using various suitable methods such as a vacuum deposition method, a spin coating method, a cast method, a Langmuir-Blodgett (LB) method, an inkjet printing method, a laser printing method, and a laser induced thermal imaging (LITI) method.

In the organic electroluminescence device 10 of an embodiment, at least one organic layer among organic layers between a first electrode EL1 and a second electrode EL2 may include an amine compound including a tetraphenyl derivative, a tertiary amine derivative, and a linker including a hydrocarbon ring or a heterocycle combining the tetraphenyl derivative and the tertiary amine derivative. For example, in the organic electroluminescence device 10 of an embodiment, at least one organic layer among the organic layers between the first electrode EL1 and the second electrode EL2 may include an amine compound represented by Formula 1. For example, in the organic electroluminescence device 10 of an embodiment, a hole transport region HTR may include the amine compound represented by Formula 1.

Formula 1

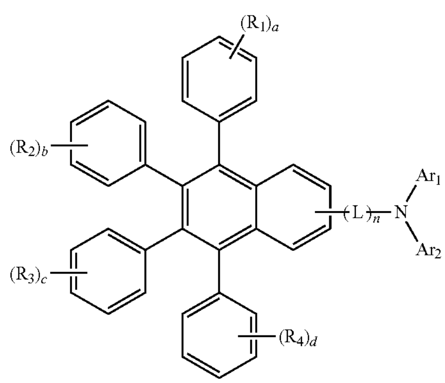

In Formula 1, $R_1$ to $R_4$ may be each independently a hydrogen atom, a deuterium atom, a halogen atom, a cyano group, a substituted or unsubstituted silyl group, a substituted or unsubstituted alkyl group of 1 to 30 carbon atoms, a substituted or unsubstituted alkoxy group of 1 to 30 carbon atoms, a substituted or unsubstituted aryloxy group of 6 to 30 carbon atoms, a substituted or unsubstituted alkylthio group of 1 to 30 carbon atoms, a substituted or unsubstituted arylthio group of 6 to 30 carbon atoms, a substituted or unsubstituted aryl group of 6 to 50 carbon atoms for forming a ring, or a substituted or unsubstituted heteroaryl group of 2 to 50 carbon atoms for forming a ring.

In Formula 1, a to d may be each independently an integer of 0 to 5. In some embodiments, if a to d are an integer of 2 or more, a plurality of $R_1$ to $R_4$ may be the same or different from each other.

In some embodiments, if a to d are 0, a tetraphenyl naphthalene derivative

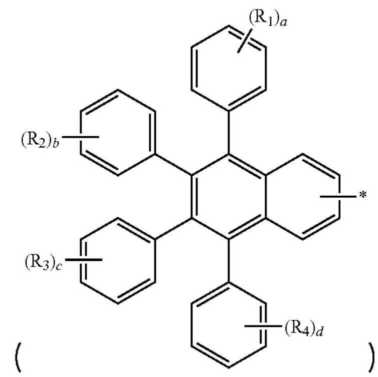

in Formula 1 may be an unsubstituted tetraphenyl naphthalene.

In Formula 1, $Ar_1$ and $Ar_2$ may be each independently a substituted or unsubstituted aryl group of 6 to 50 carbon atoms for forming a ring, or a substituted or unsubstituted heteroaryl group of 2 to 50 carbon atoms for forming a ring. In Formula 1, $Ar_1$ and $Ar_2$ may be the same or different. For example, $Ar_1$ and $Ar_2$ may be each independently a substituted or unsubstituted aryl group of 6 to 50 carbon atoms for forming a ring, or $Ar_1$ and $Ar_2$ may be each independently a substituted or unsubstituted heteroaryl group of 2 to 50 carbon atoms for forming a ring. For example, in Formula 1, $Ar_1$ and $Ar_2$ may be the same or different aryl groups, or $Ar_1$ and $Ar_2$ may be the same or different heteroaryl groups. In addition, in Formula 1, one of $Ar_1$ and $Ar_2$ may be an aryl group, and the remaining one may be a heteroaryl group.

For example, in Formula 1, the tertiary amine derivative

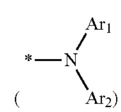

may be an arylamine group, or a heteroarylamine group.

In Formula 1, $Ar_1$ and $Ar_2$ may be each independently a substituted or unsubstituted phenyl group, a substituted or unsubstituted biphenyl group, a substituted or unsubstituted naphthalene group, a substituted or unsubstituted phenanthrene group, a substituted or unsubstituted fluorene group, a substituted or unsubstituted dibenzofuran group, or a substituted or unsubstituted dibenzothiophene group. In some embodiments, the substituent of the substituted or unsubstituted phenyl group, the substituted or unsubstituted biphenyl group, the substituted or unsubstituted naphthalene group, the substituted or unsubstituted phenanthrene group, the substituted or unsubstituted fluorene group, the substituted or unsubstituted dibenzofuran group, or the substituted or unsubstituted dibenzothiophene group may be a deuterium atom, a halogen atom, a triphenylsilyl group, a phenyl group, a naphthalene group, a phenylnaphthalene group, a carbazole group, etc. However, embodiments of the present disclosure are not limited thereto.

In Formula 1, L may be a substituted or unsubstituted arylene group of 6 to 50 carbon atoms for forming a ring, or a substituted or unsubstituted heteroarylene group of 2 to 50 carbon atoms for forming a ring. In some embodiments, n may be an integer of 1 to 3.

In Formula 1, the tetraphenyl naphthalene derivative

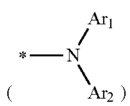

and the tertiary amine derivative

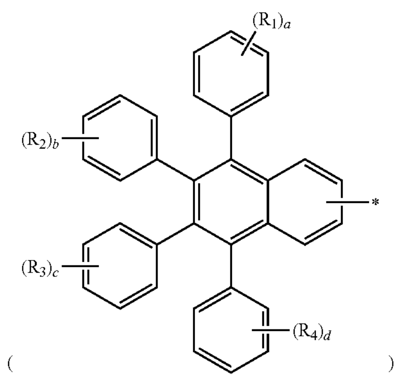

may be combined with each other via the linker including an arylene group or a heteroarylene group. For example, in the amine compound represented by Formula 1, the tetraphenyl naphthalene derivative and the tertiary amine derivative are combined with each other via the linker including a hydrocarbon ring or a heterocycle, and the tetraphenyl naphthalene derivative and the tertiary amine derivative are not directly combined. In some embodiments, the linker L may connect the naphthalene part of the tetraphenyl naphthalene derivative and the nitrogen atom of the tertiary amine derivative.

In Formula 1, the linker L may be a substituted or unsubstituted phenylene group, a substituted or unsubstituted naphthylene group, a substituted or unsubstituted divalent biphenyl group, a substituted or unsubstituted divalent fluorene group, a substituted or unsubstituted divalent phenanthrene group, a substituted or unsubstituted divalent dibenzofuran group, or a substituted or unsubstituted divalent dibenzothiophene group.

In addition, L in Formula 1 may be represented by any one selected from the following Formulae L-1 to L-7.

L-1

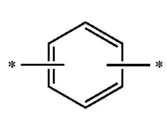

-continued

L-2

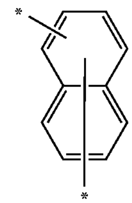

L-3

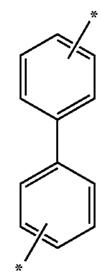

L-4

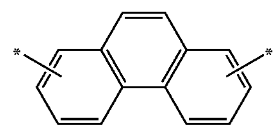

L-5

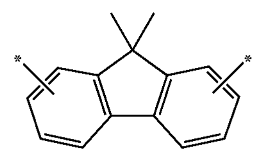

L-6

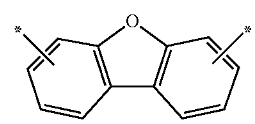

L-7

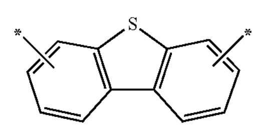

In addition, Formula 1 may be represented by the following Formula 1-1 or Formula 1-2.

Formula 1-1

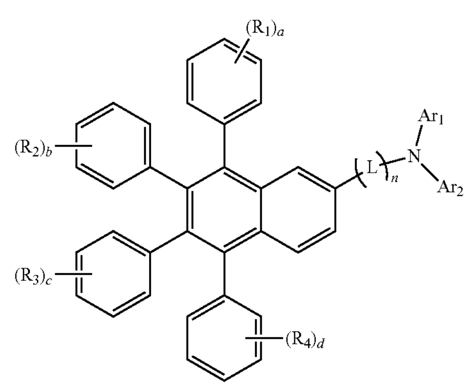

-continued

Formula 1-2

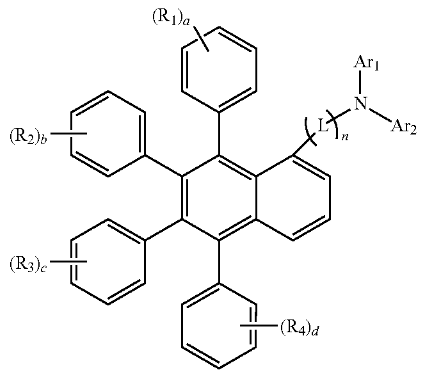

In some embodiments, Formula 1-1 and Formula 1-2 show cases where the combination positions of the tertiary amine derivatives that are combined with the tetraphenyl naphthalene derivative via the linker L, are different from each other.

In Formula 1-1 and Formula 1-2, the same explanation provided with respect to Formula 1 may be applied to $R_1$ to $R_4$, a to d, L, n, $Ar_1$, and $Ar_2$.

The amine compound of an embodiment, represented by Formula 1 may be represented by any one selected from the compounds represented in Compound Group 1 below. For example, the organic electroluminescence device 10 of an embodiment may include at least one selected from the compounds represented in Compound Group 1 below in at least one organic layer. In addition, the organic electroluminescence device 10 of an embodiment may include at least one selected from the compounds represented in Compound Group 1 below in a hole transport region HTR.

Compound Group 1

A1

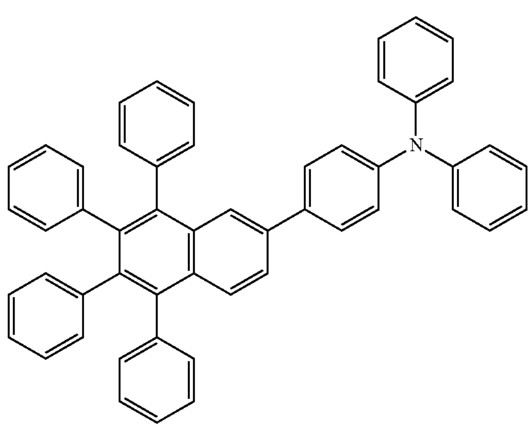

-continued

A2

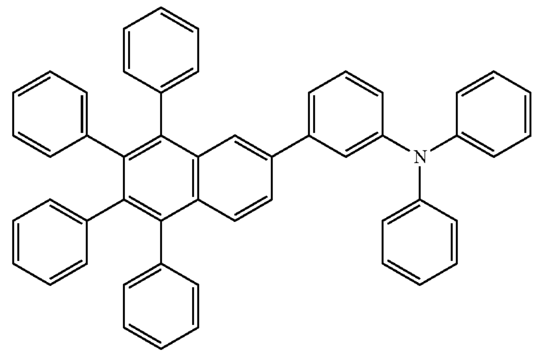

A3

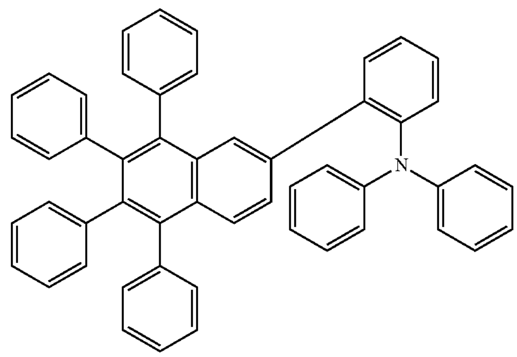

A4

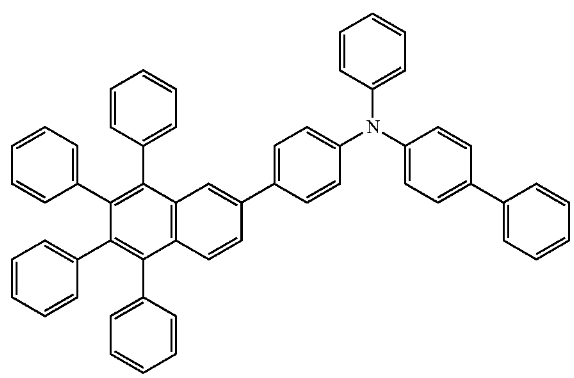

A5

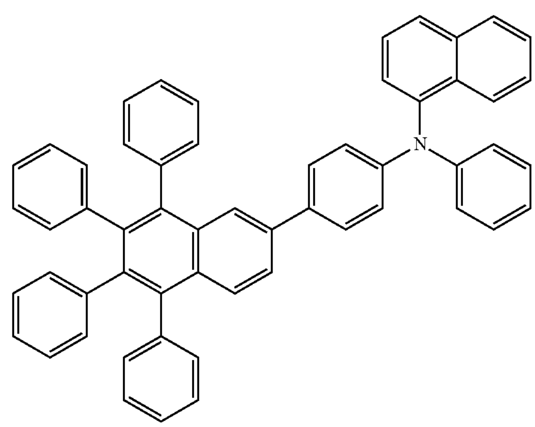

-continued
A6
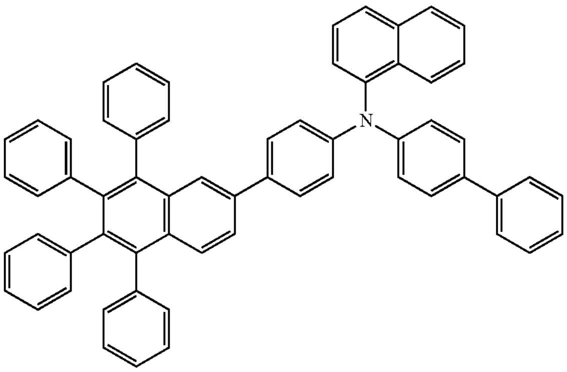
A7
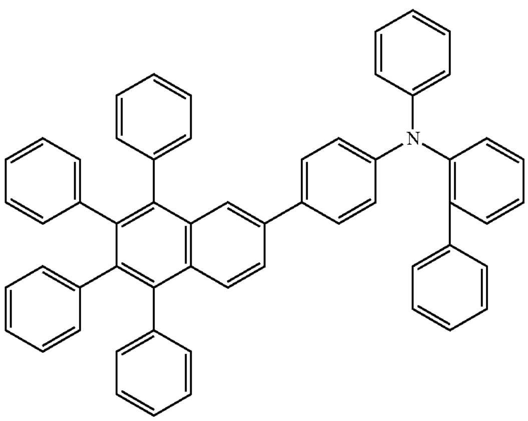
A8
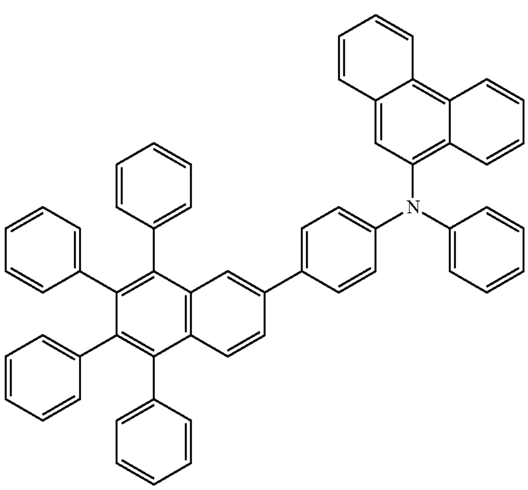
-continued
A9
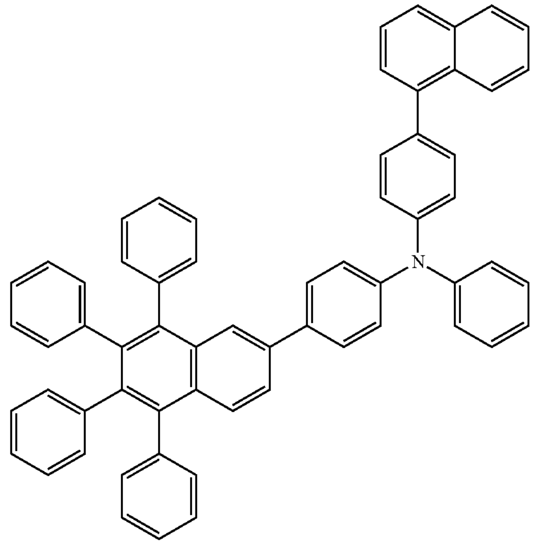
A10
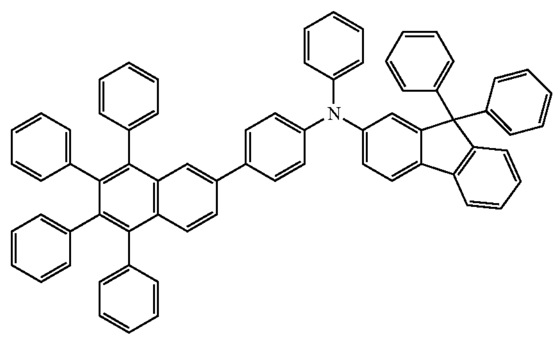
A11
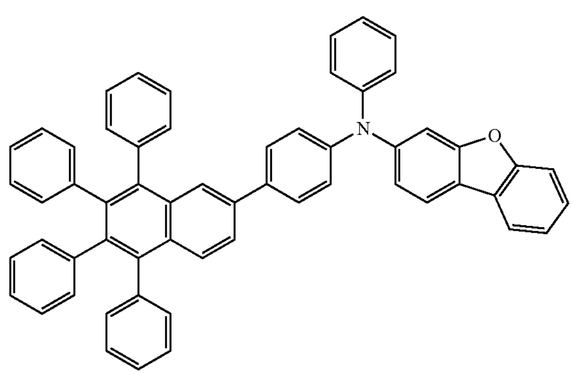

-continued
A12
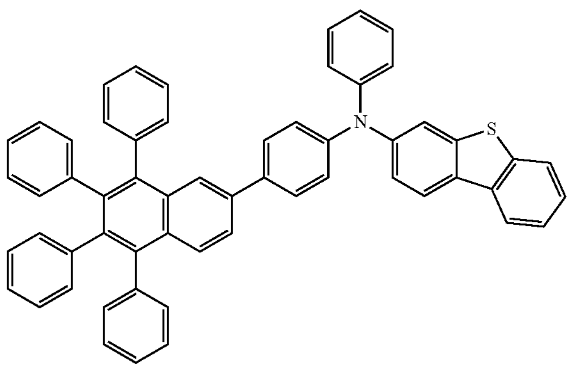
A13
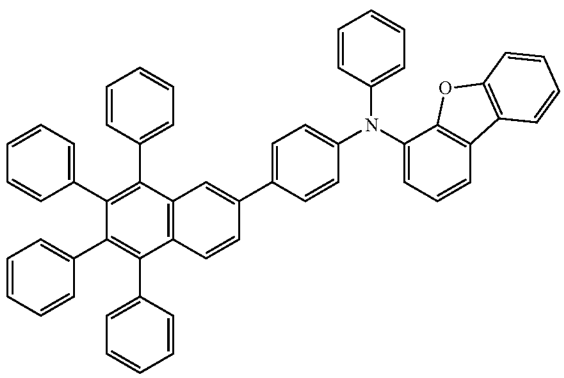
A14
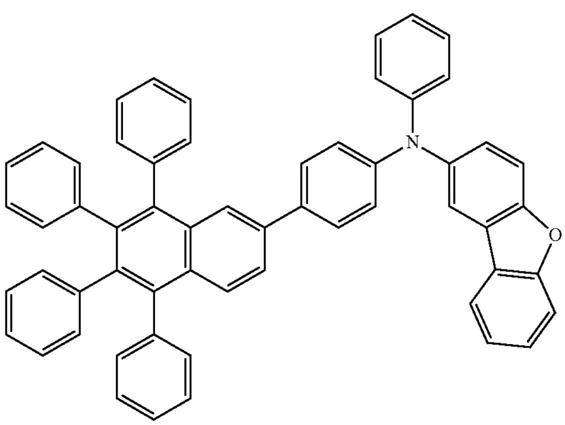
A15
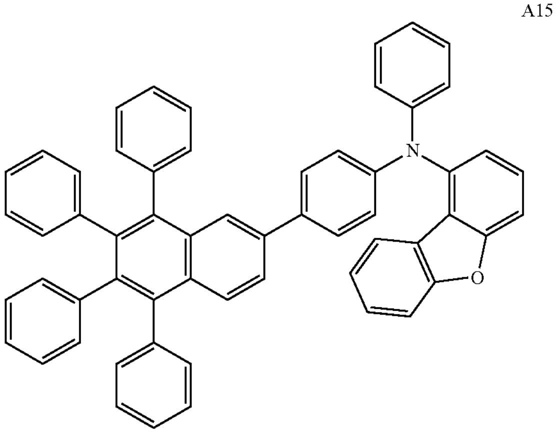
-continued
A16
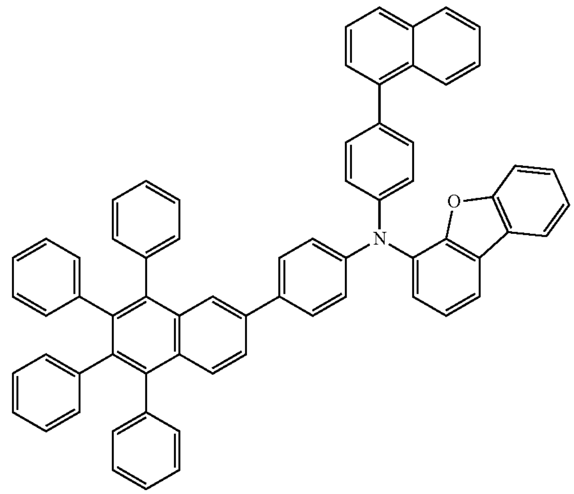
A17
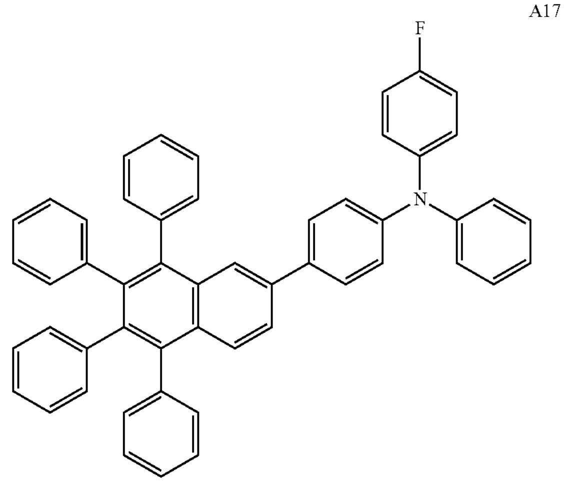
A18
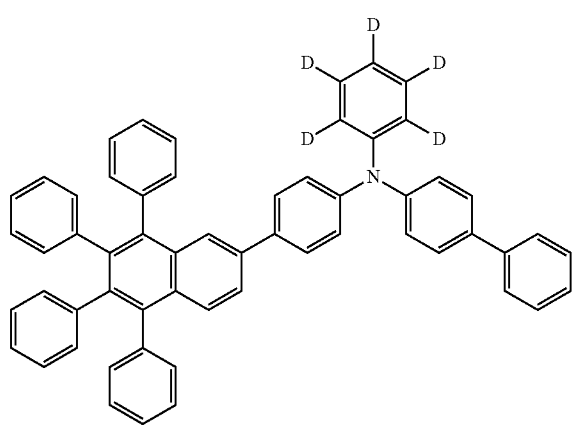

A19
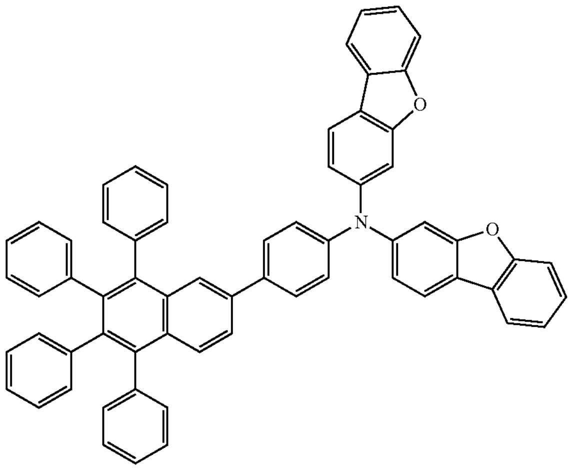
A20
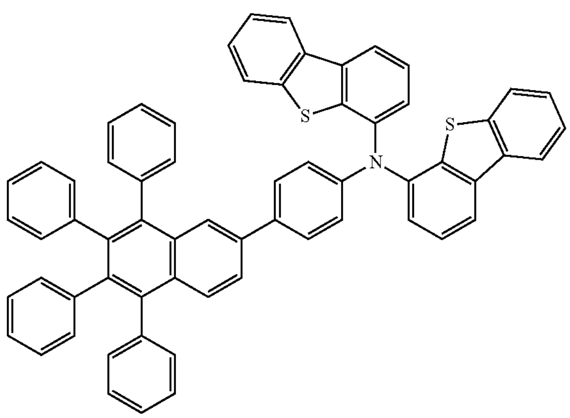
A21
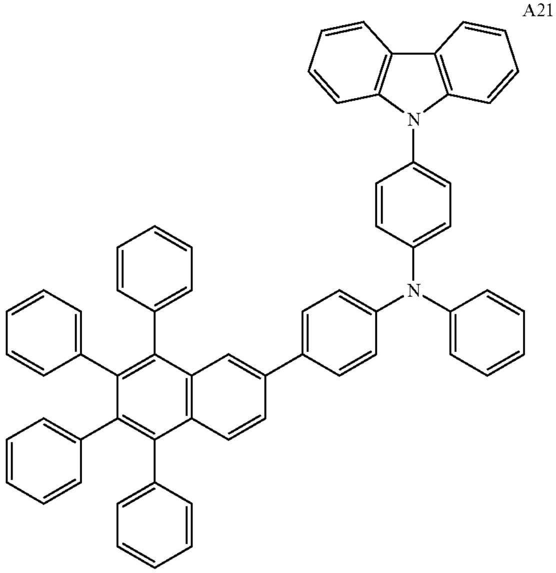
A22
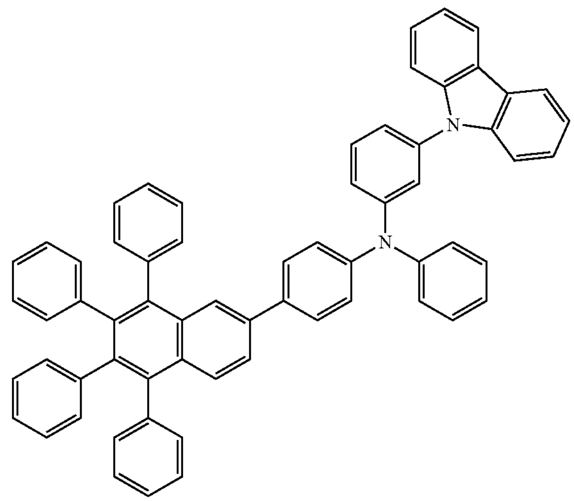
A23
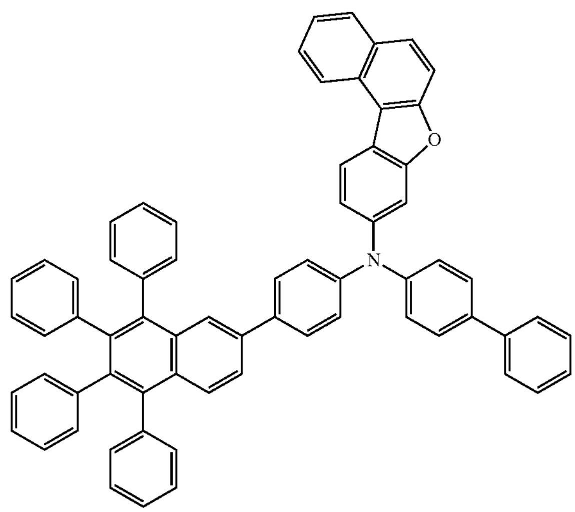
A24
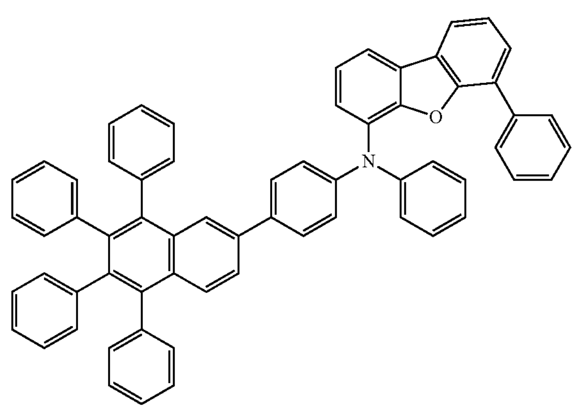

-continued
A25
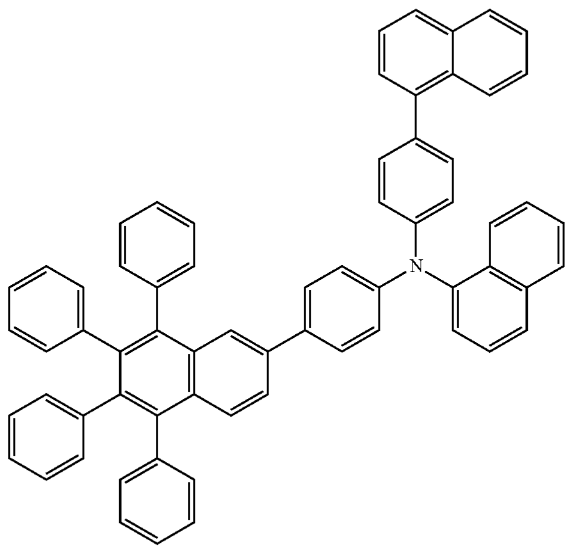
A26
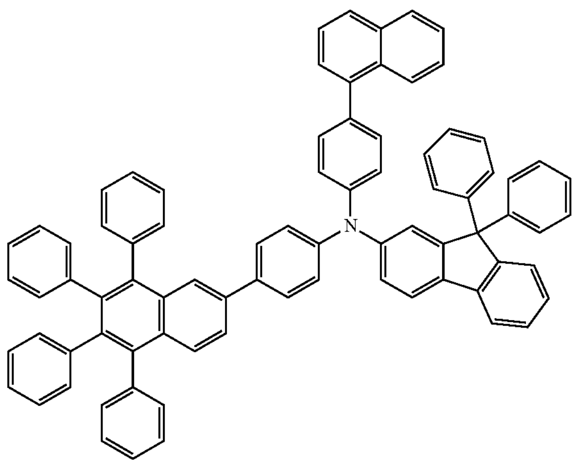
A27
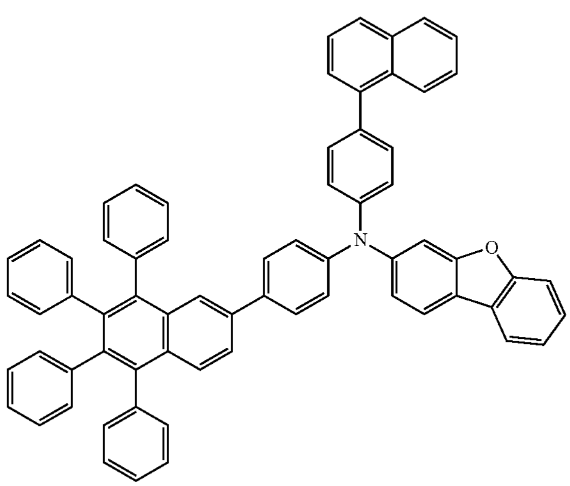
-continued
A28
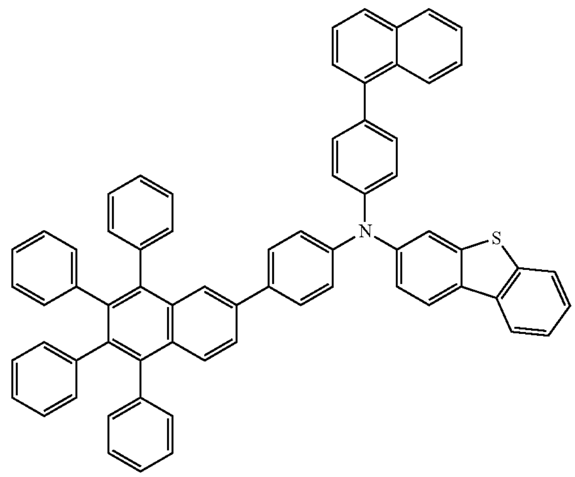
A29
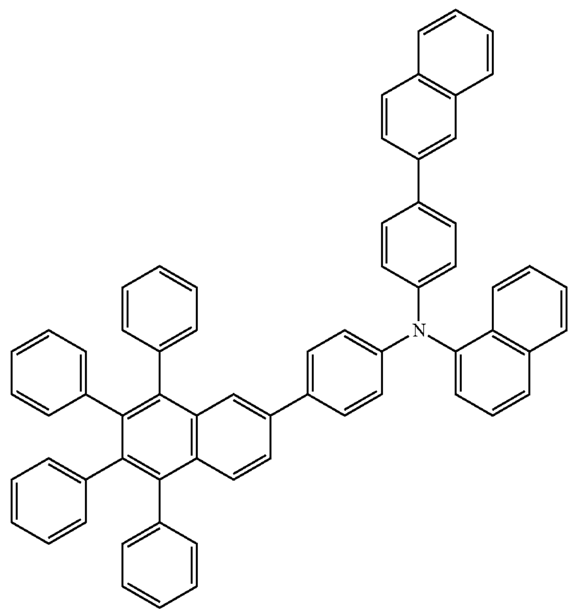
A30
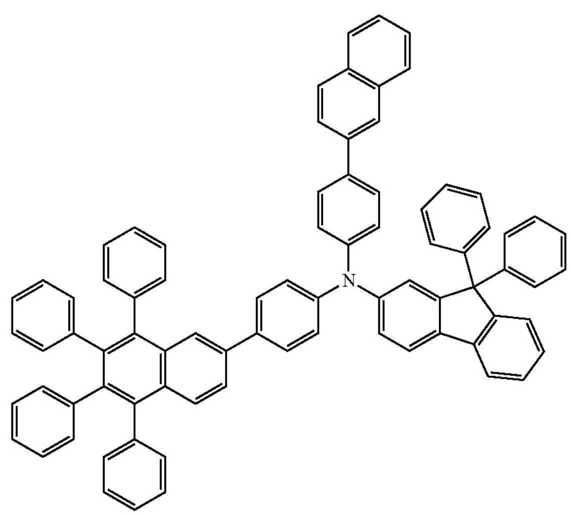

-continued
A31
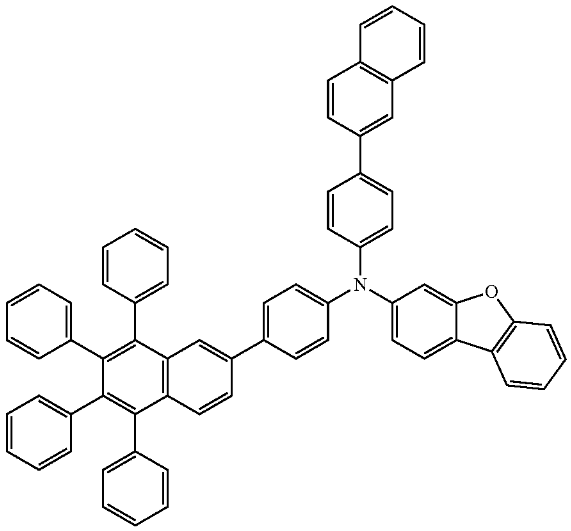
A32
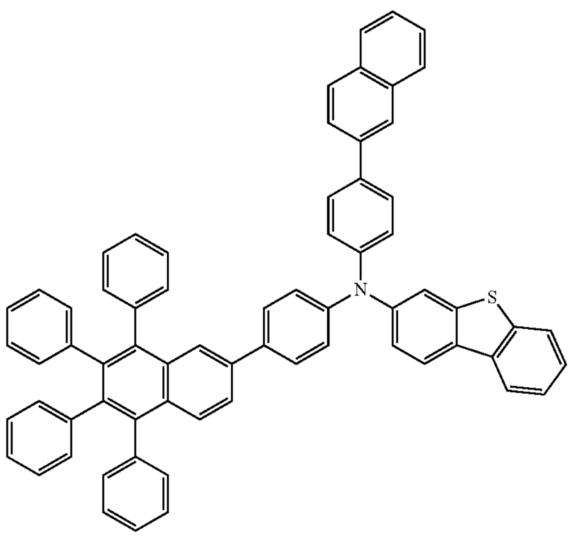
A33
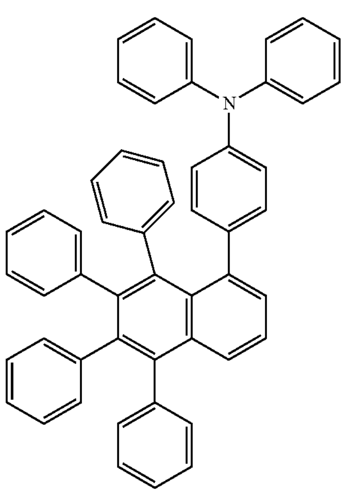
-continued
A34
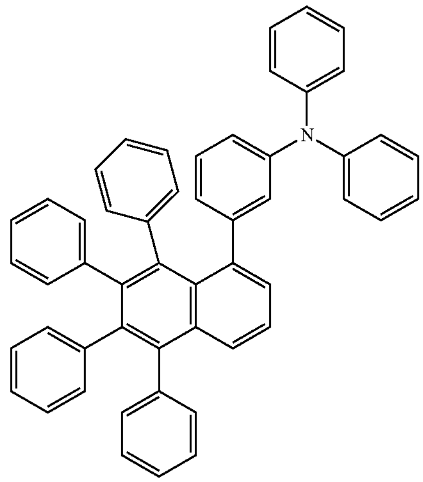
A35
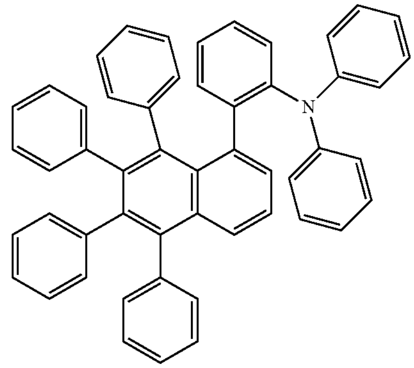
A36
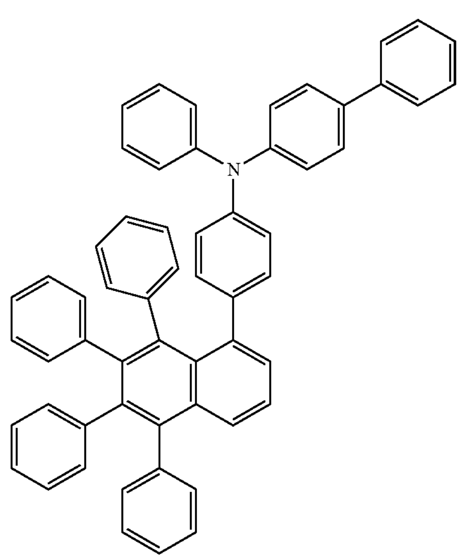

-continued
A37
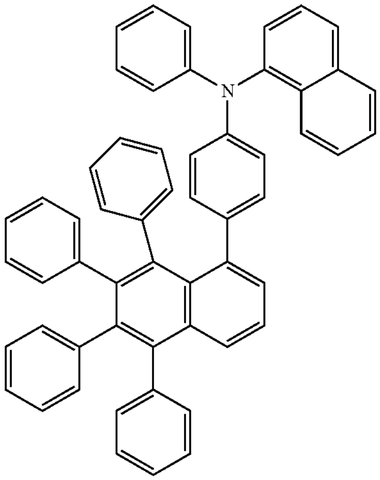
A38
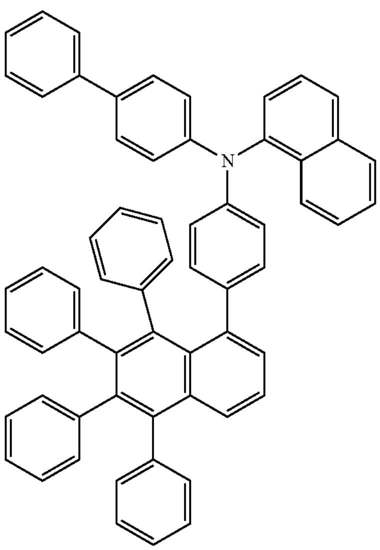
A39
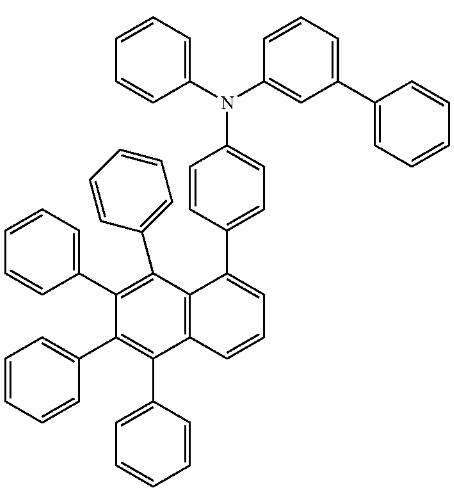
-continued
A40
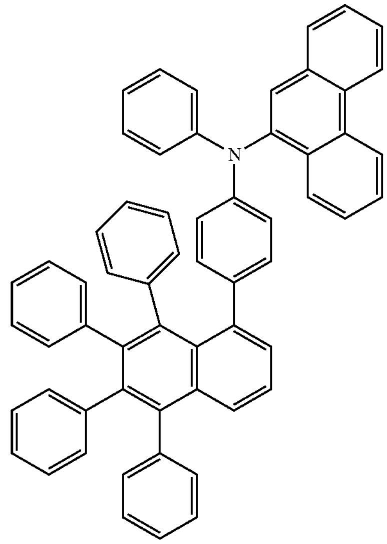
A41
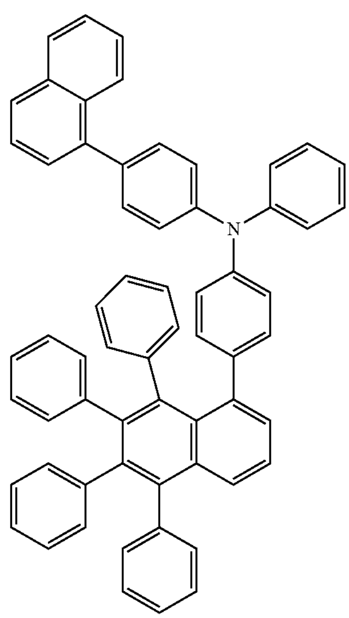

-continued
A42
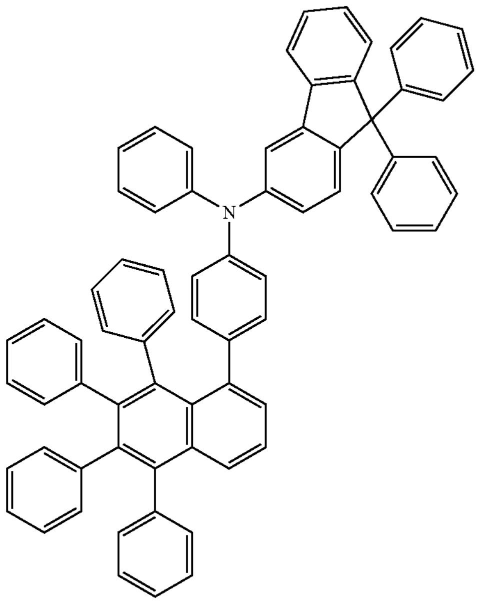
A43
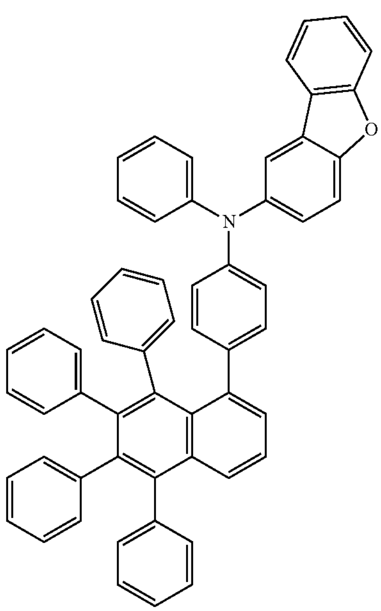
-continued
A44
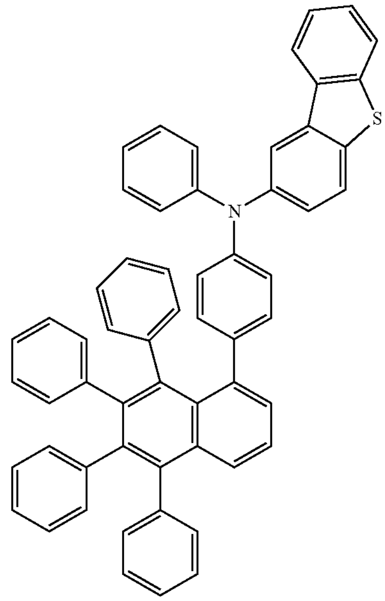
A45
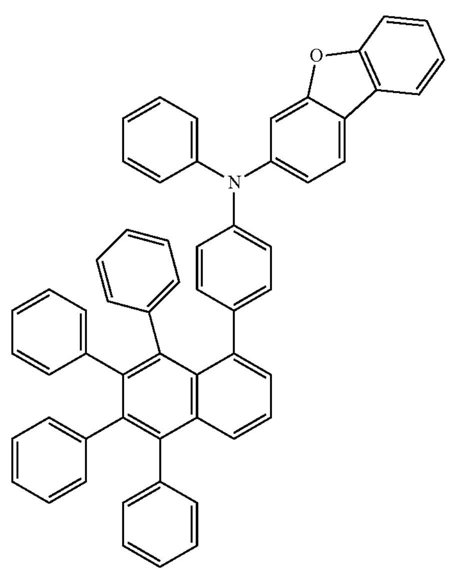

-continued
A46
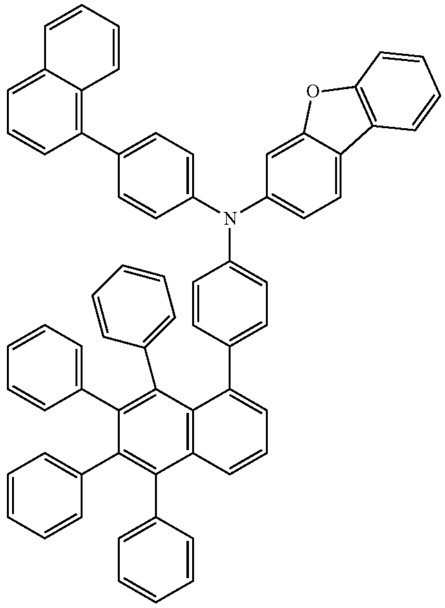
A47
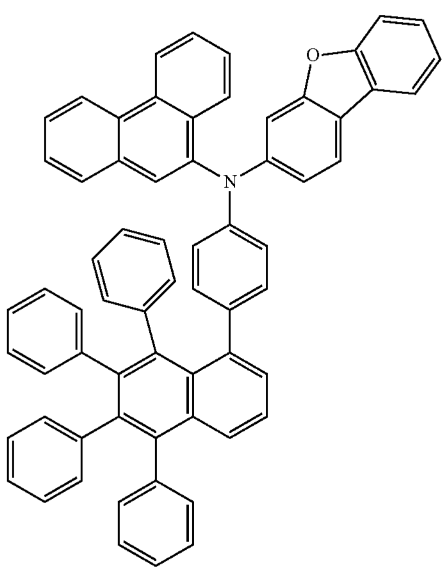
-continued
A48
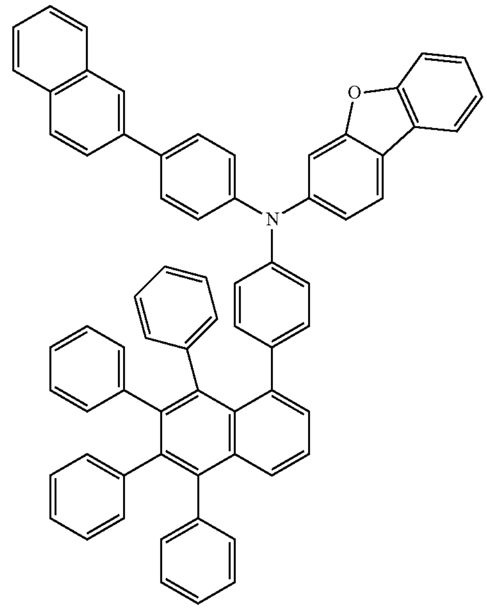
A49
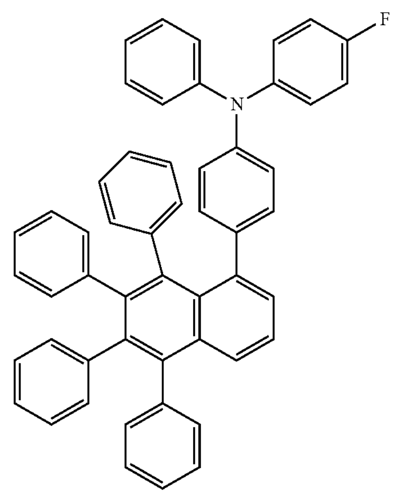
A50
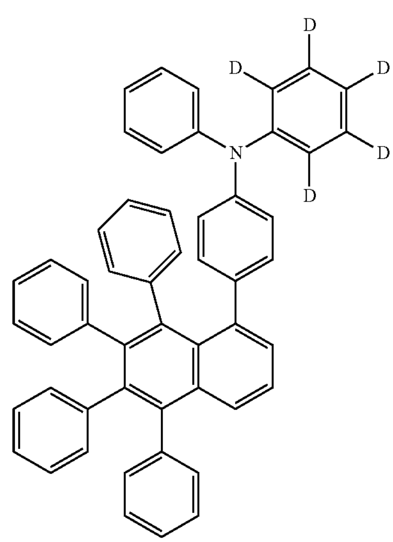

-continued
A51
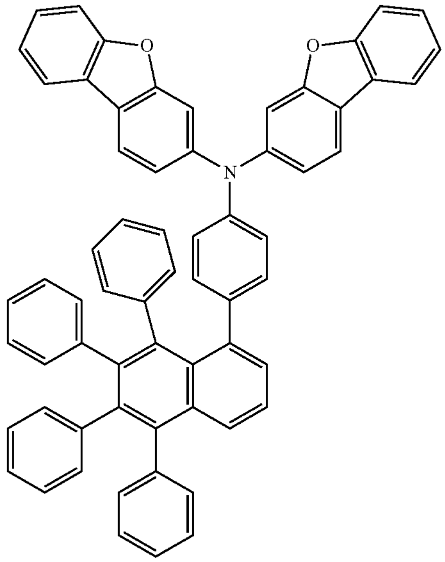
A52
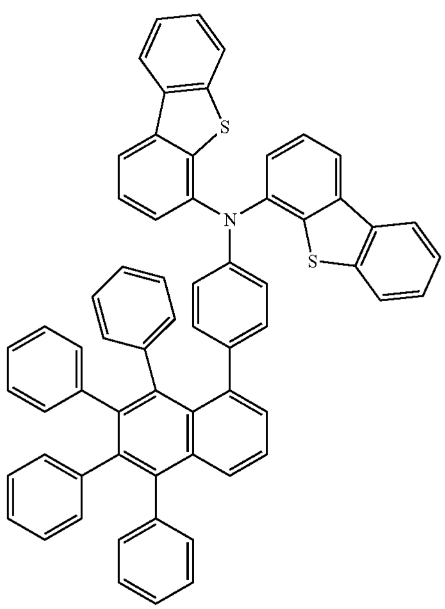
-continued
A53
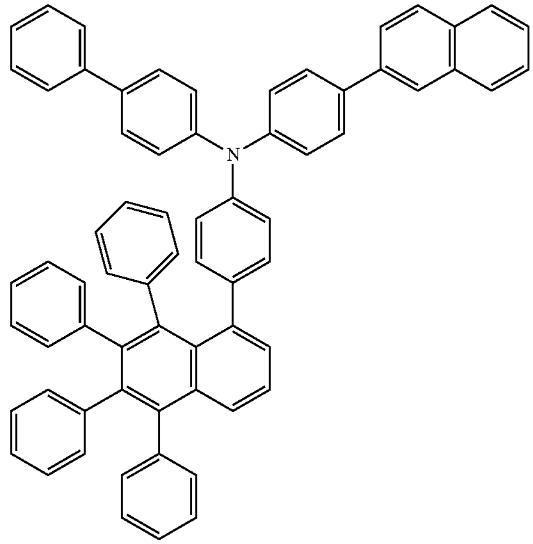
A54
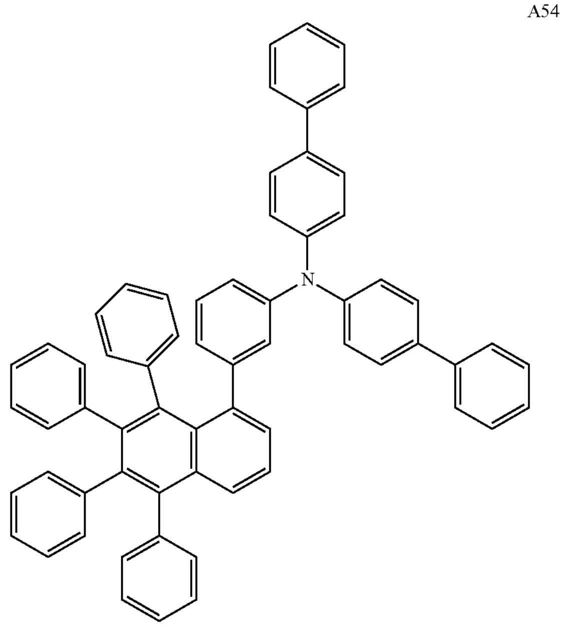
A55
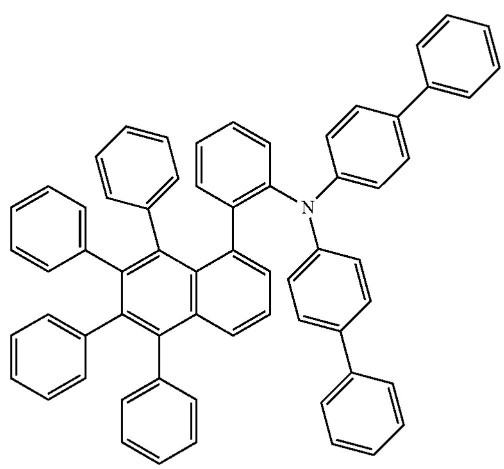

-continued
A56
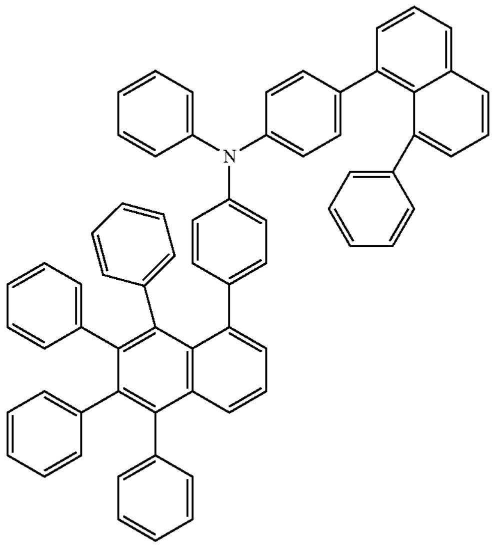
A57
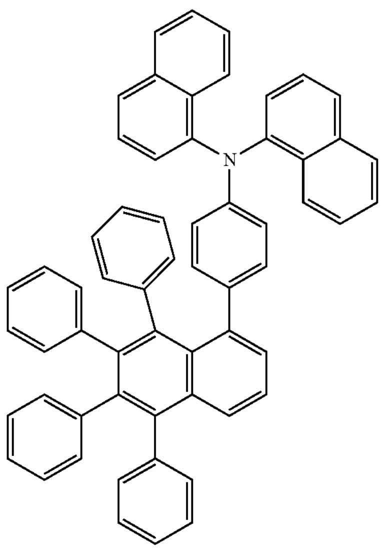
A58
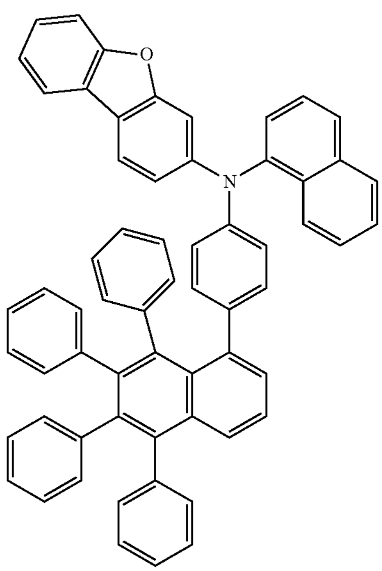
-continued
A59
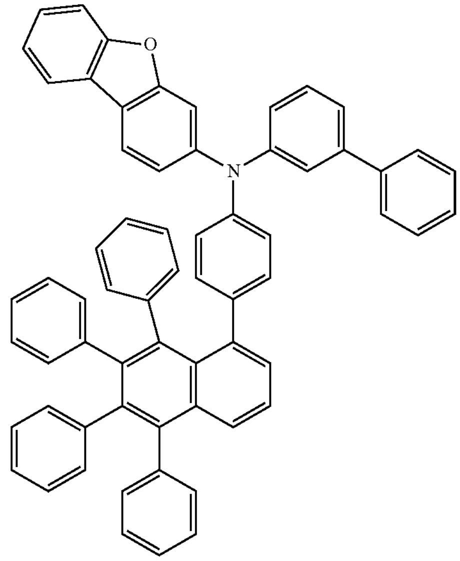
A60
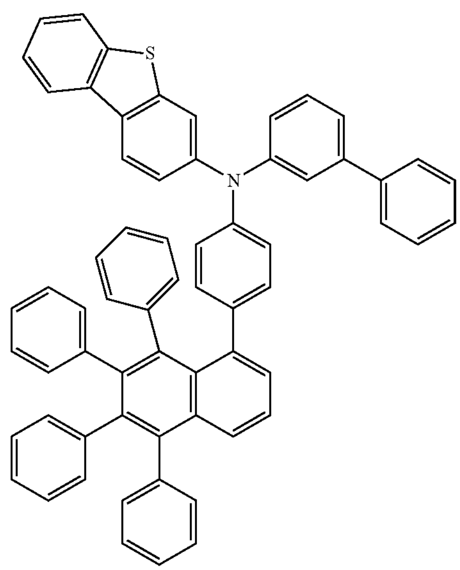

-continued
A61
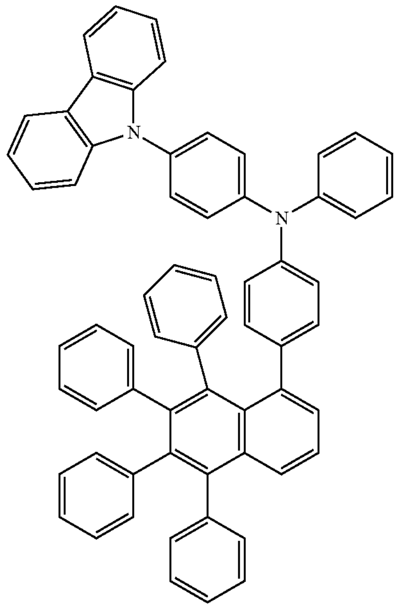
A62
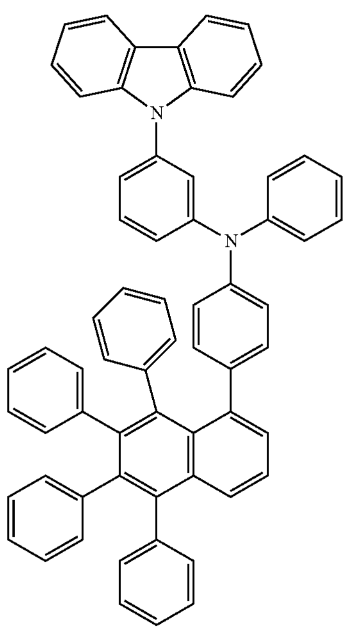
-continued
A63
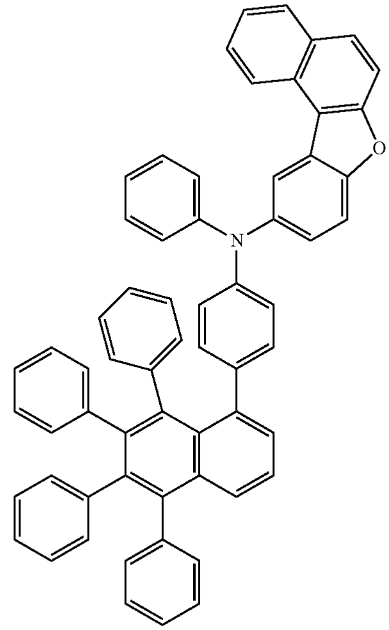
A64
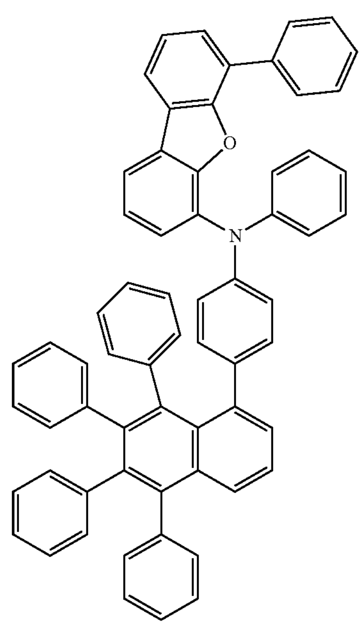

A65
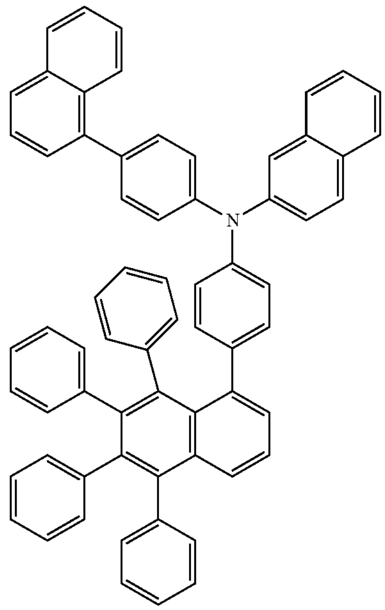
A66
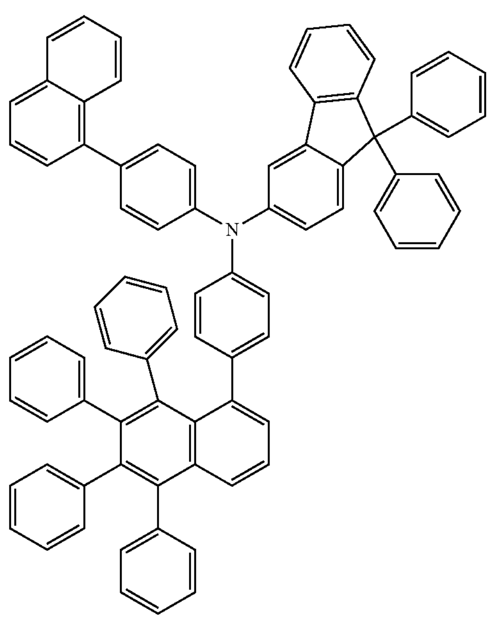
A67
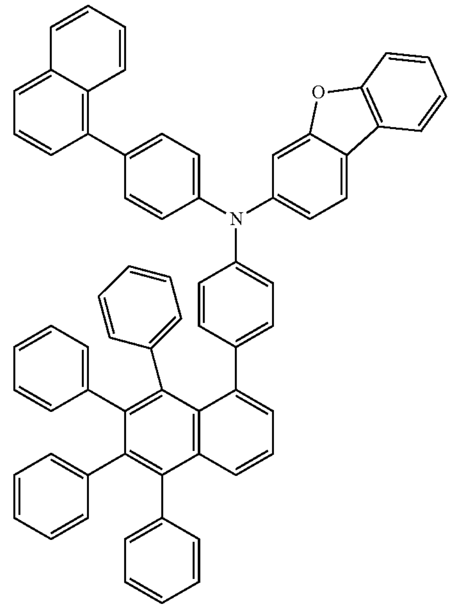
A68
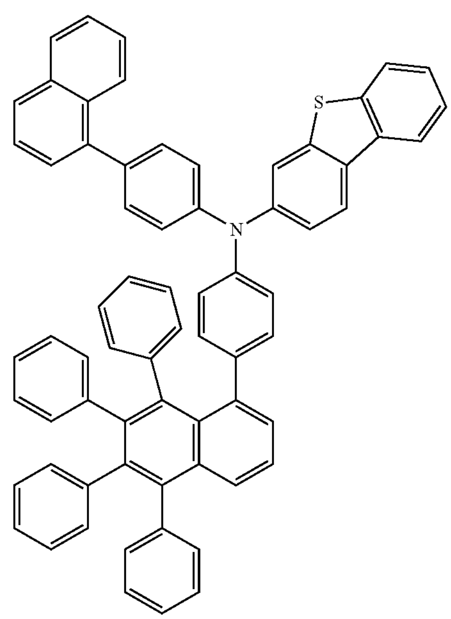

-continued
A69
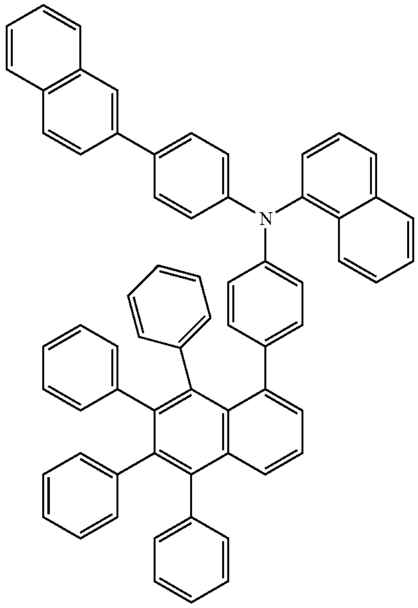
A70
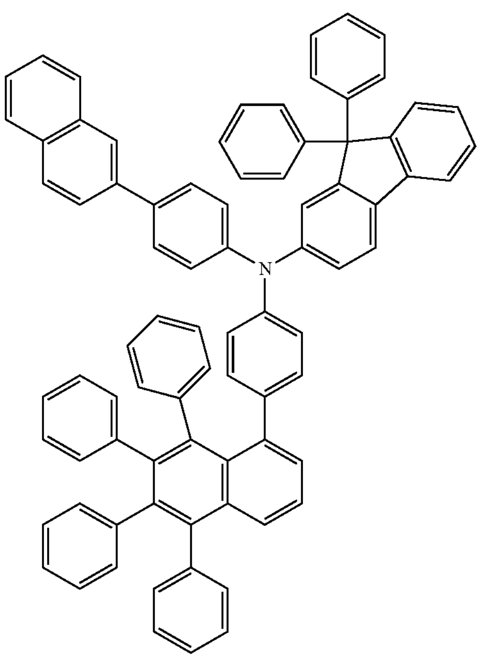
-continued
A71
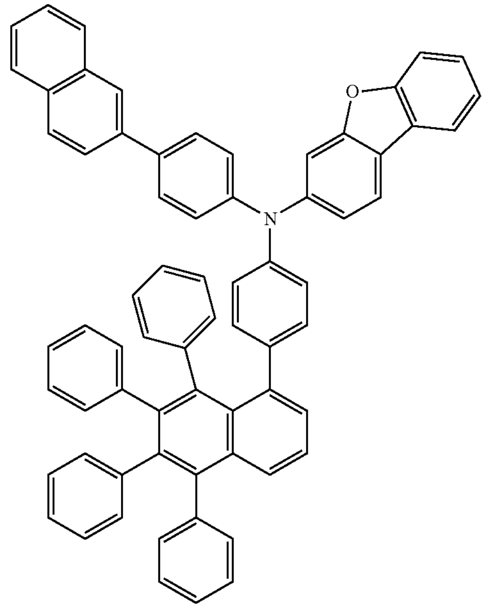
A72
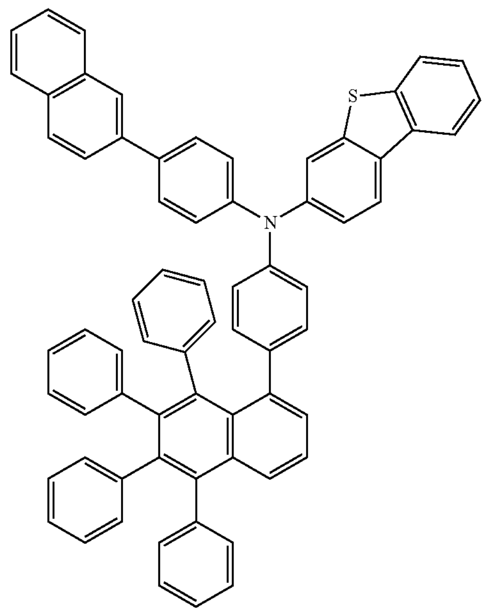
A73
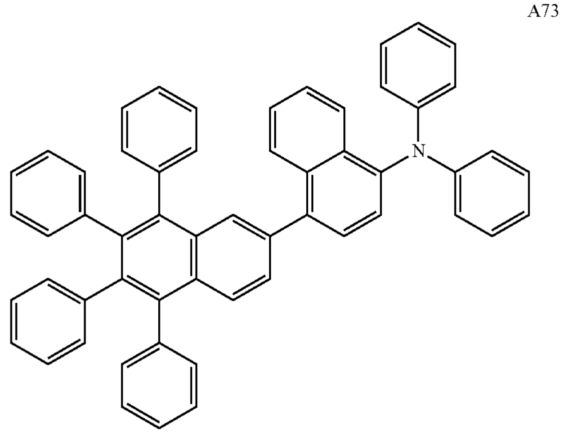

A74
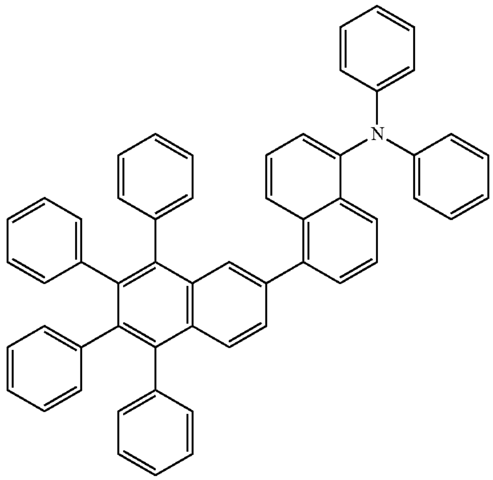
A75
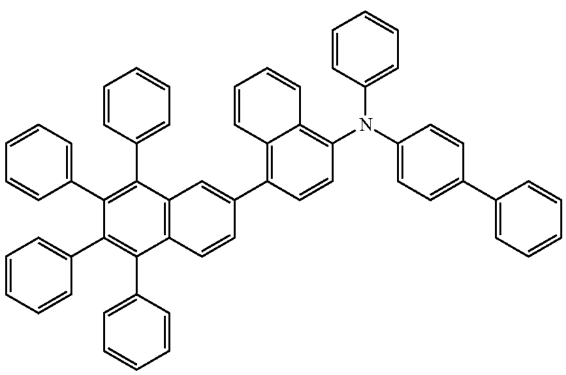
A76
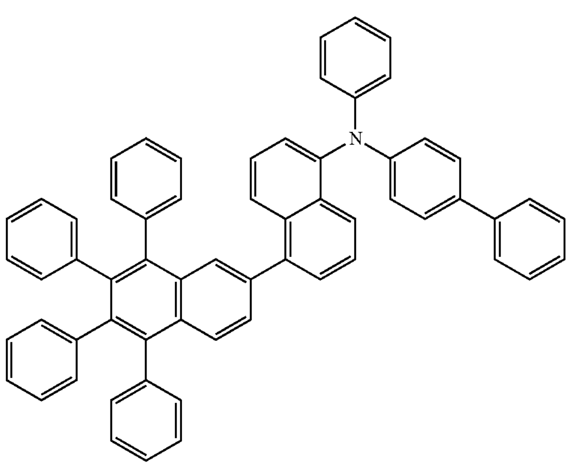
A77
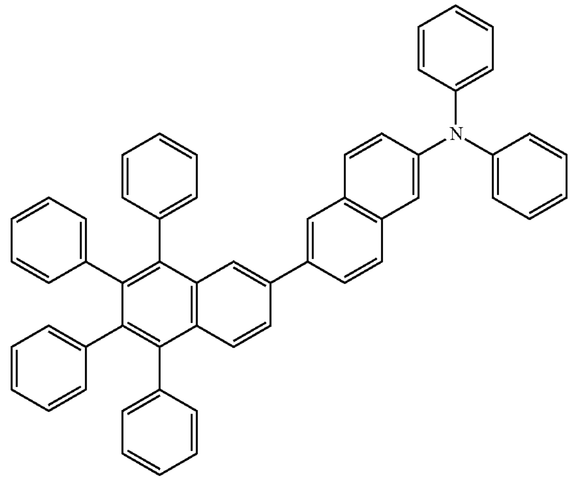
A78
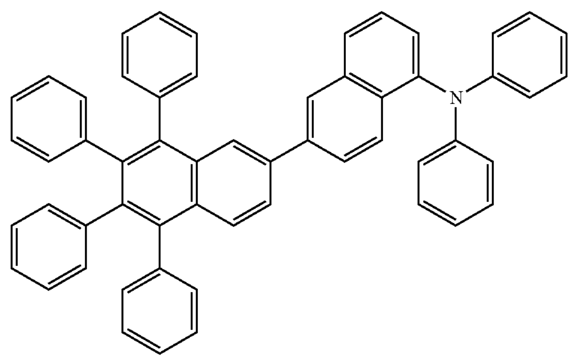
A79
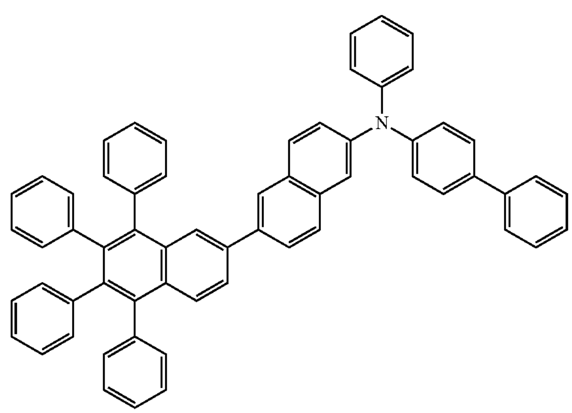

-continued
A80
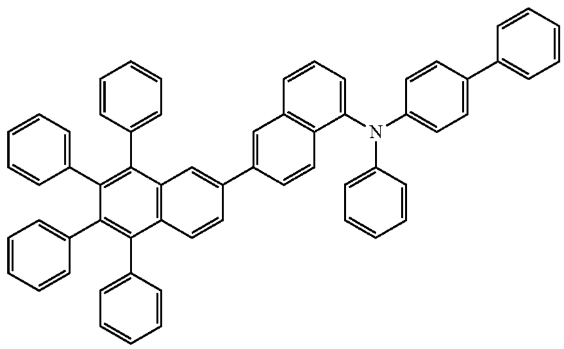
A81
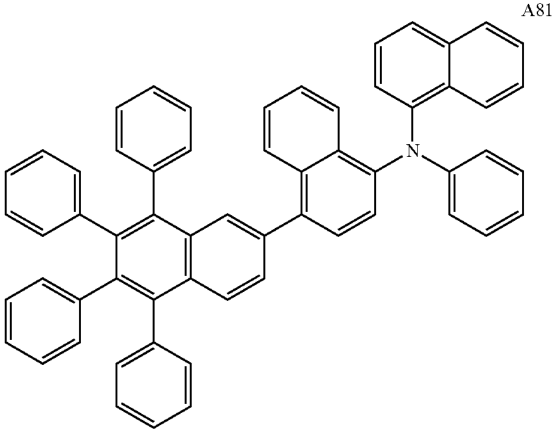
A82
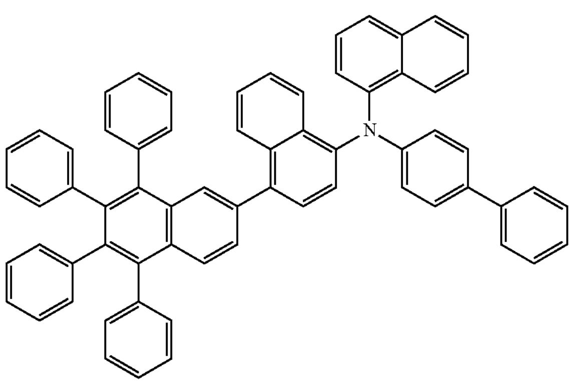
A83
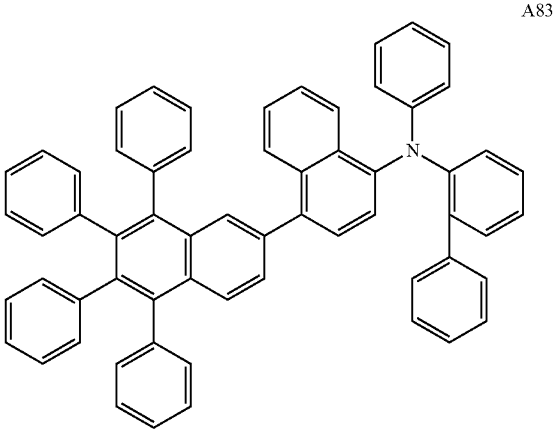
-continued
A84
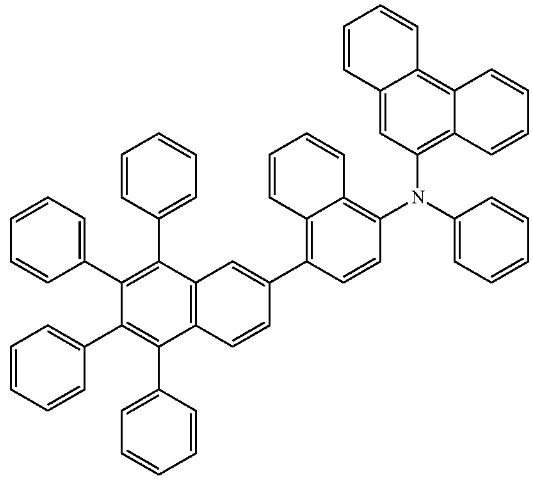
A85
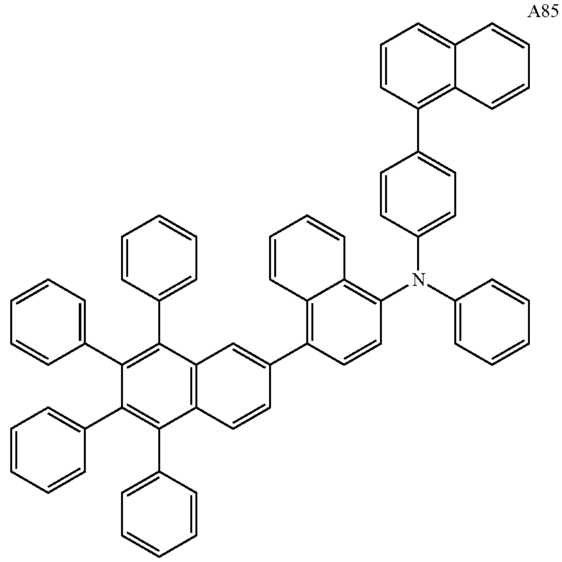
A86
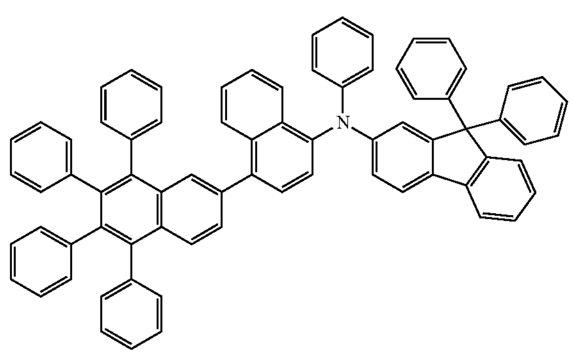

-continued
A87
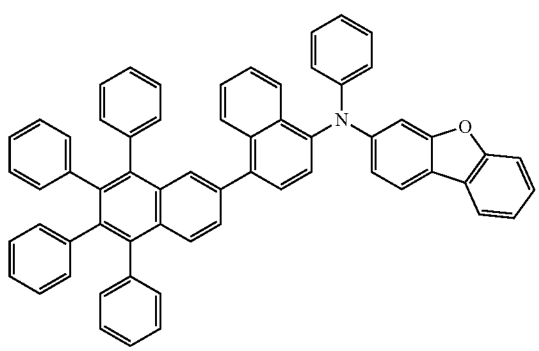
A88
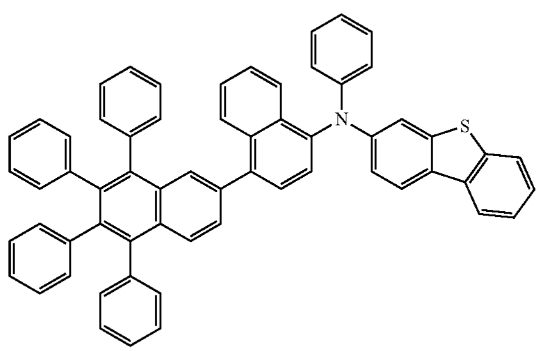
A89
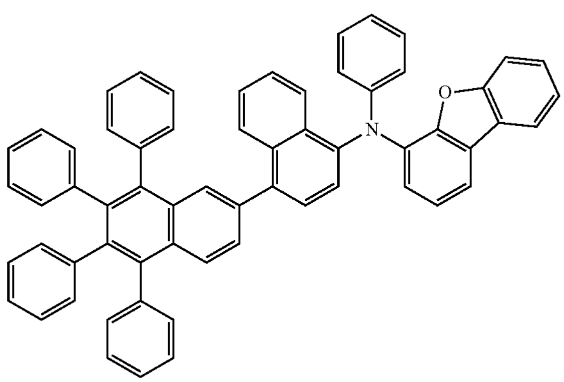
A90
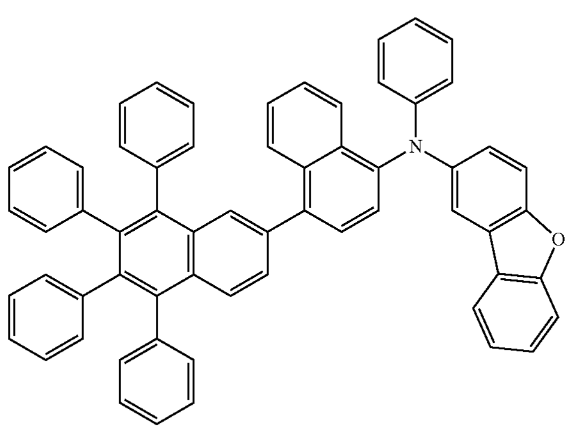
-continued
A91
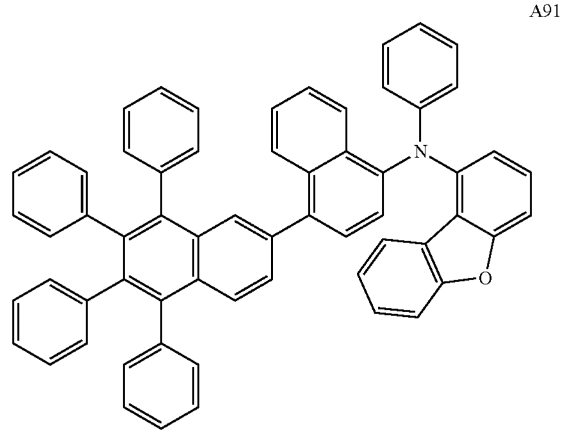
A92
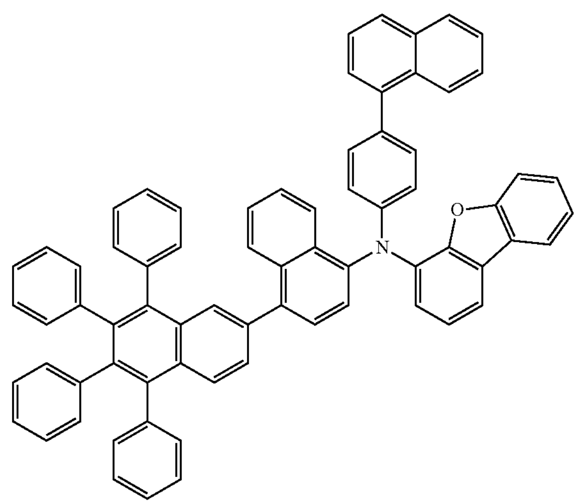
A93
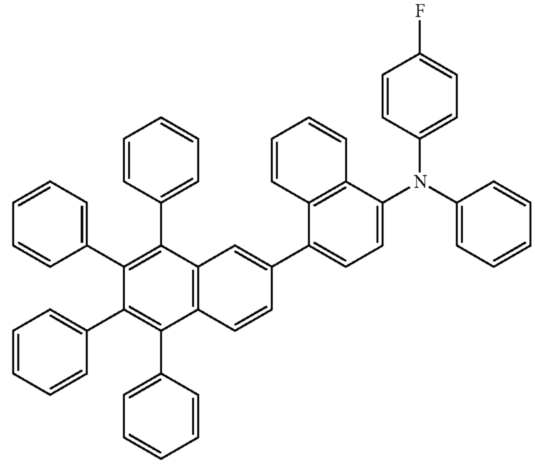

A94
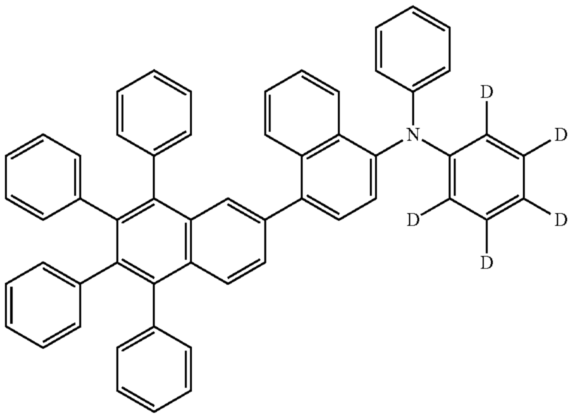
A95
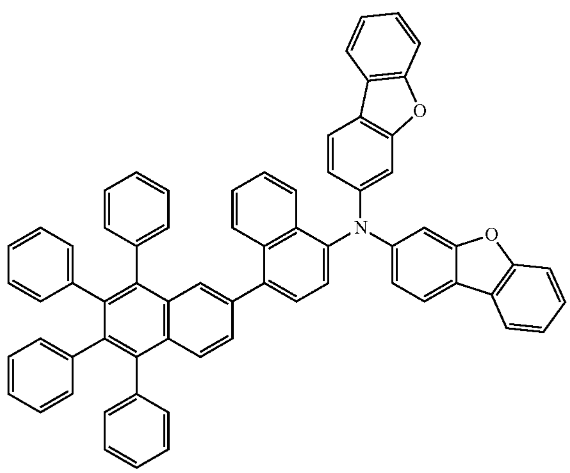
A96
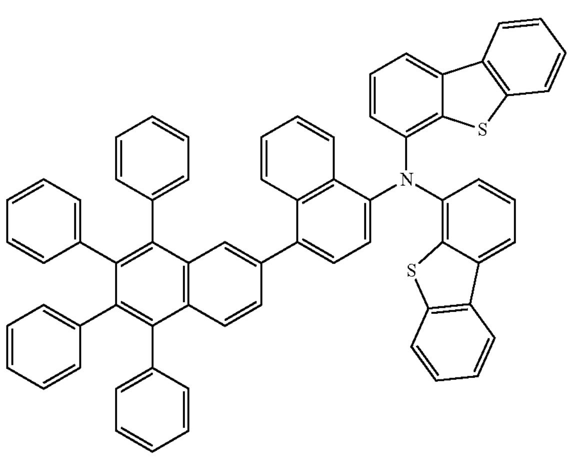
A97
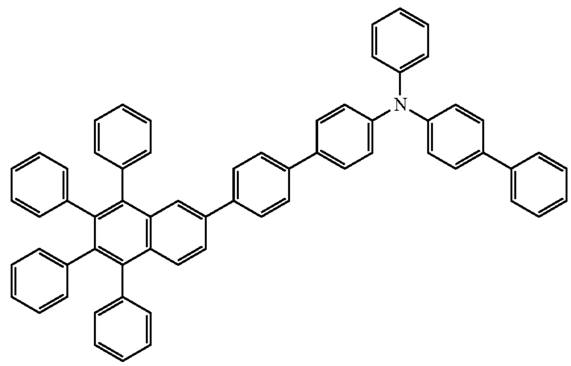
A98
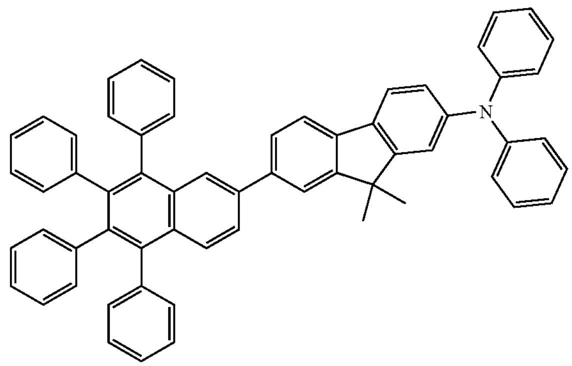
A99
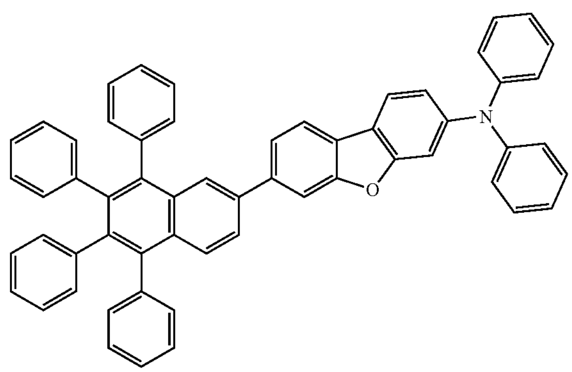
A100
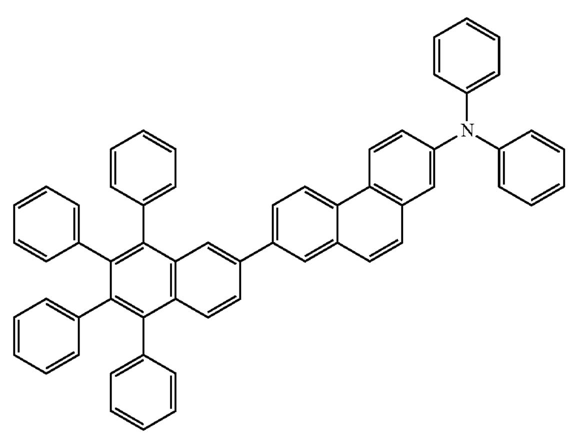

-continued
A101
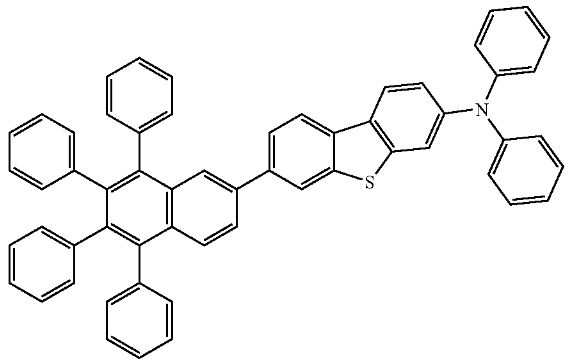
A102
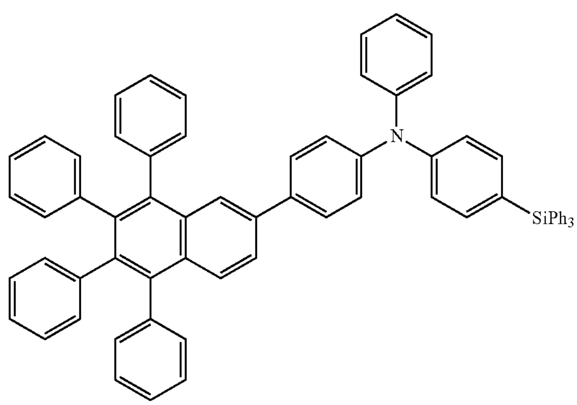
A103
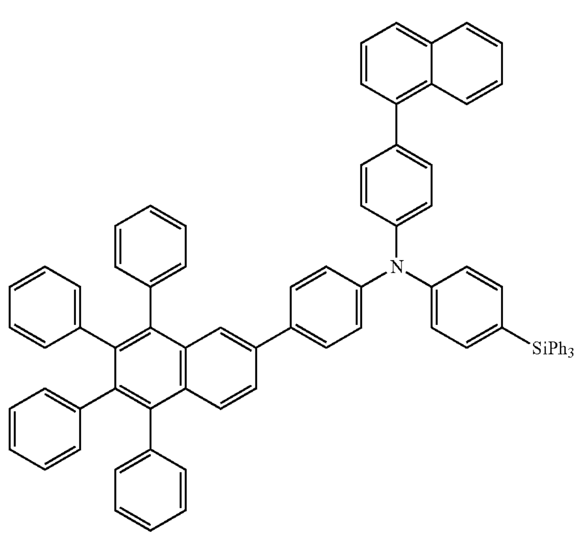
-continued
A104
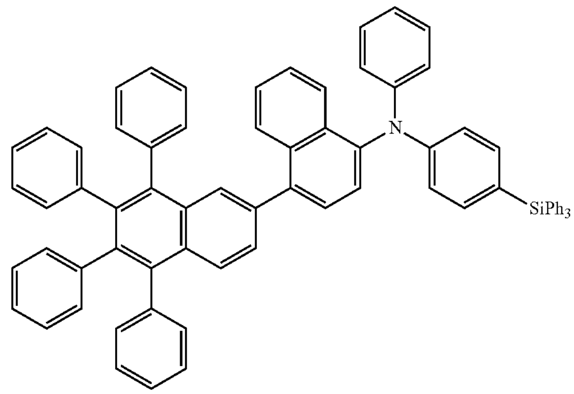
A105
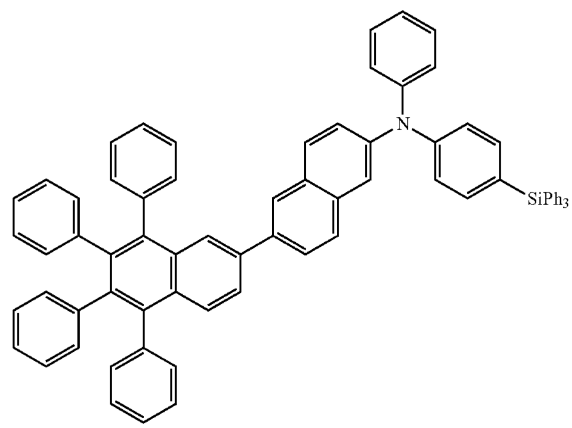
A106
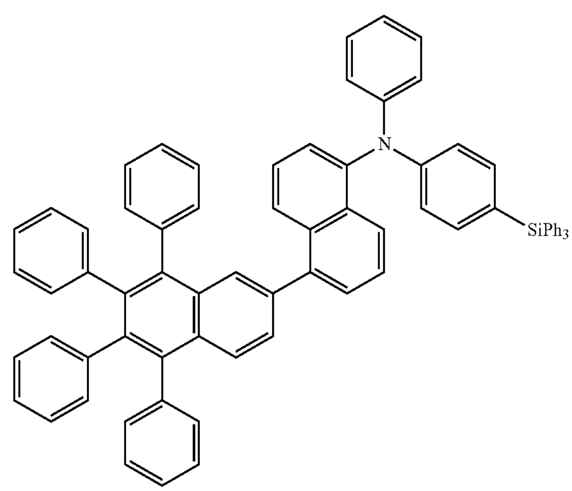

-continued
A107
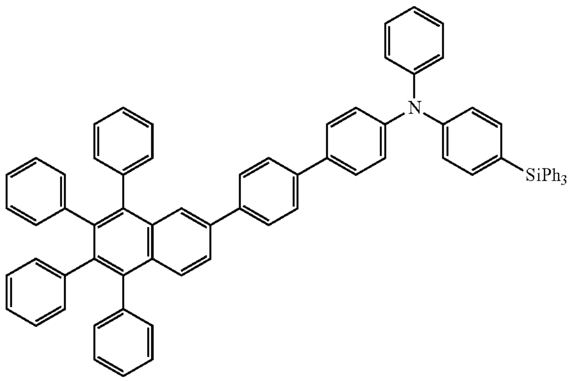
A108
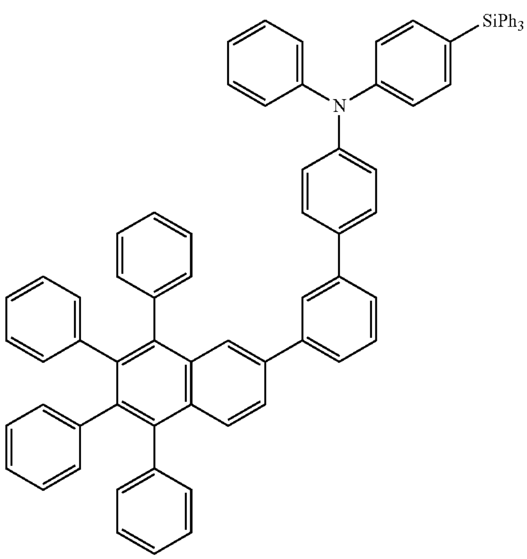
A109
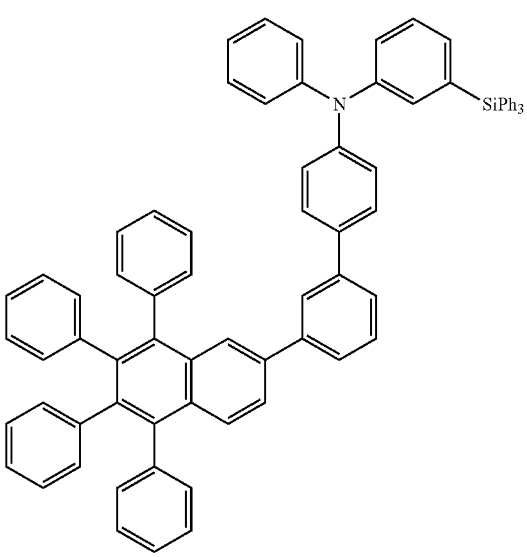
-continued
A110
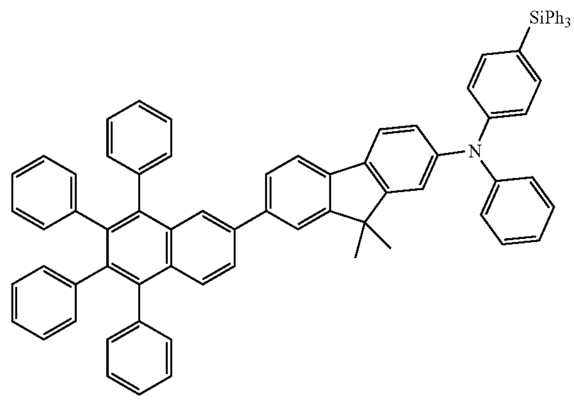
A111
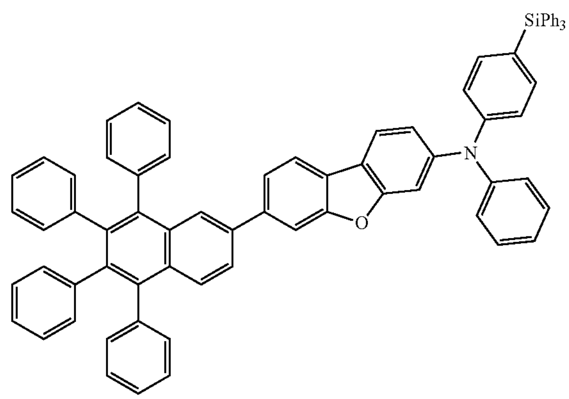
A112
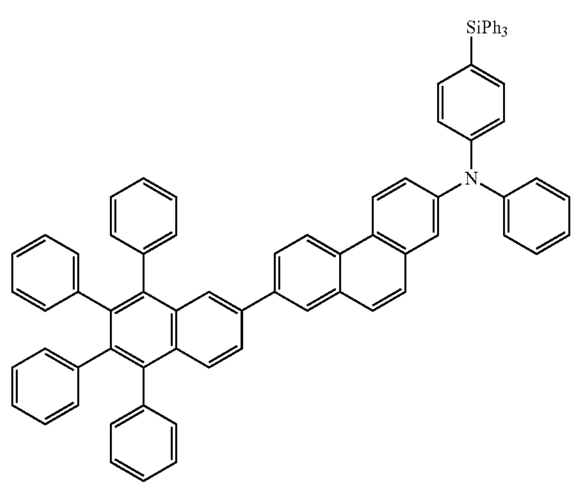

A113
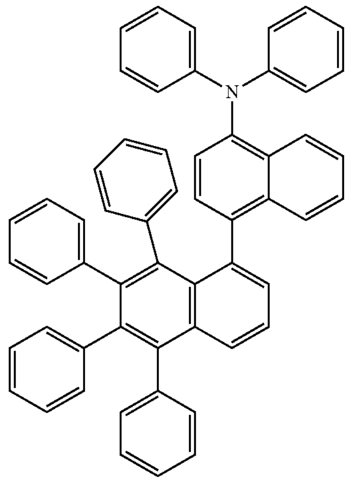
A114
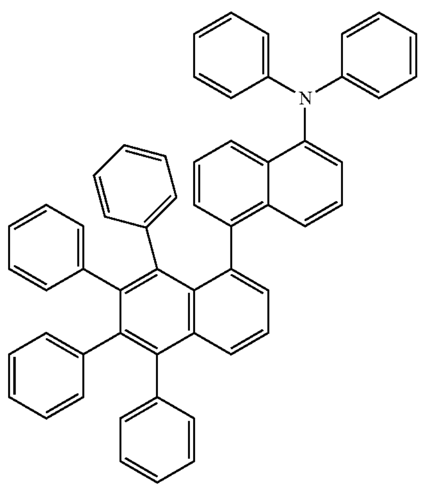
A115
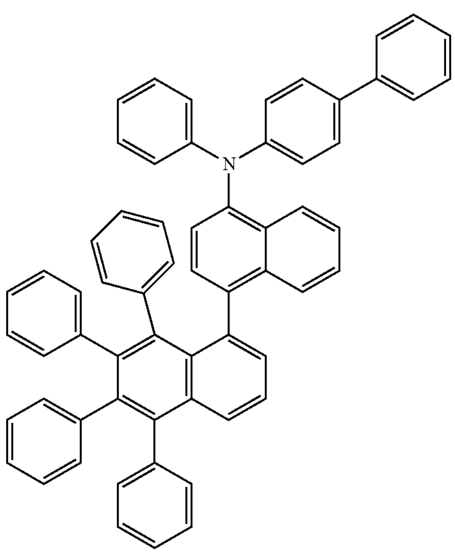
A116
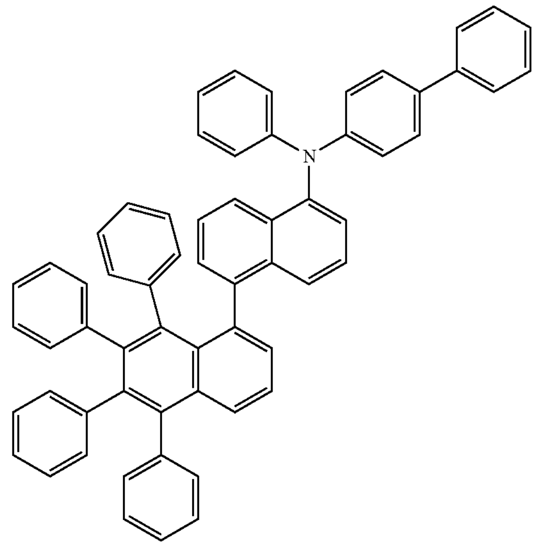
A117
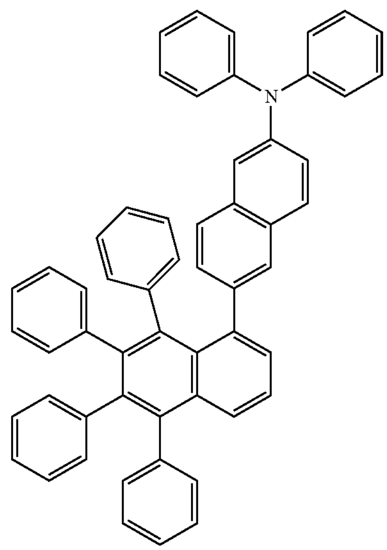
A118
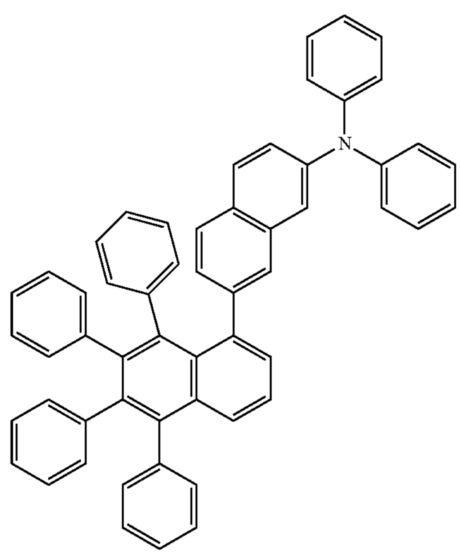

-continued
A119
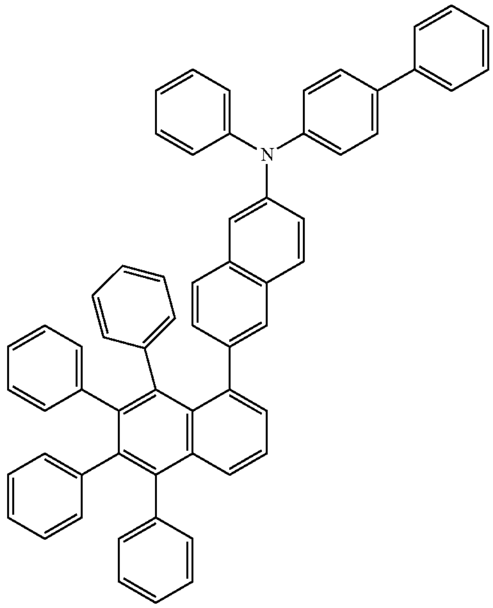
A120
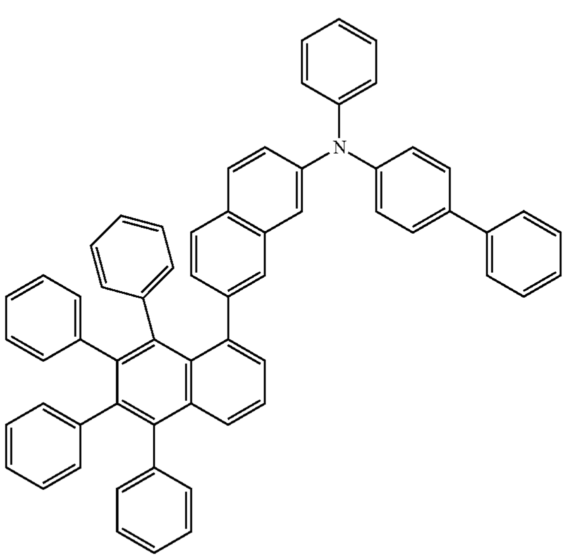
-continued
A121
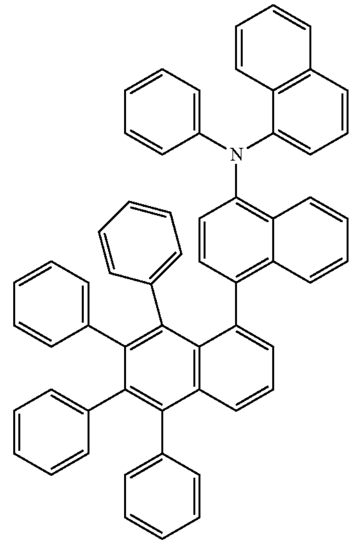
A122
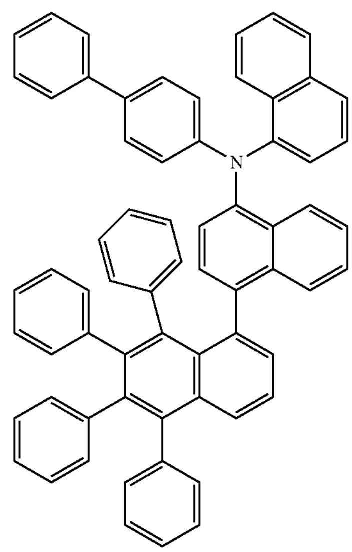
A123
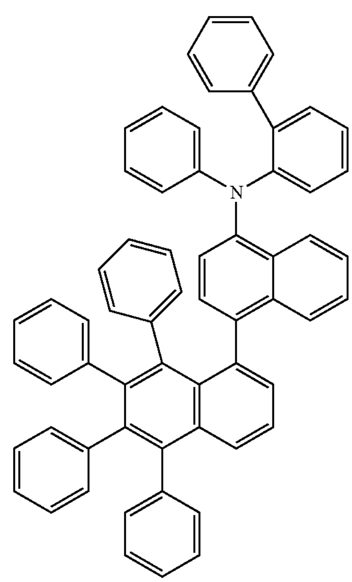

-continued
A124
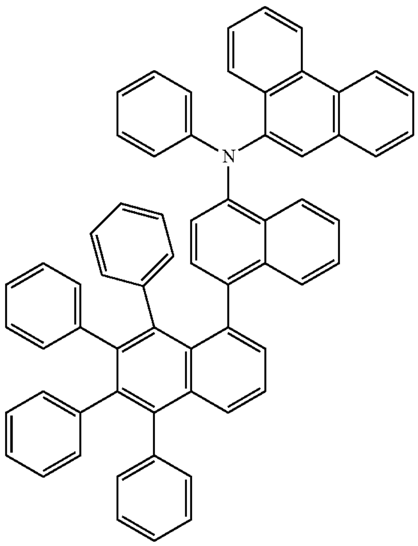
A125
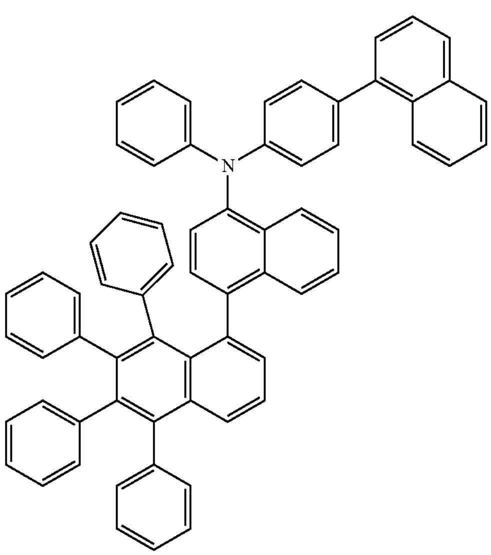
-continued
A126
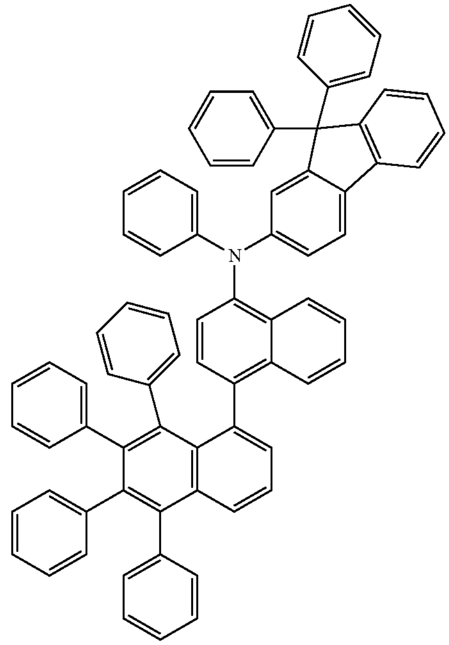
A127
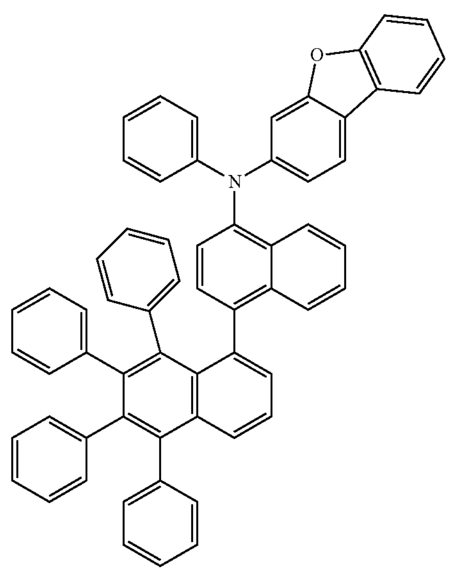

-continued
A128
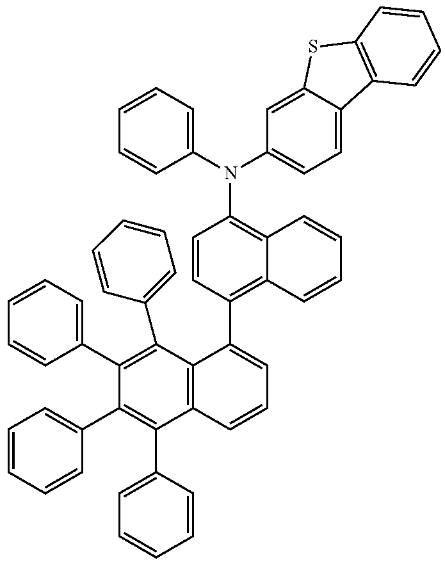
A129
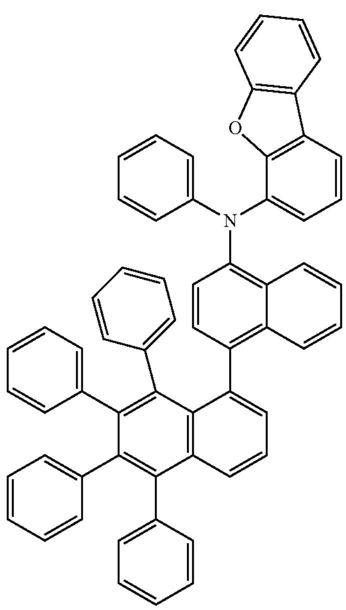
-continued
A130
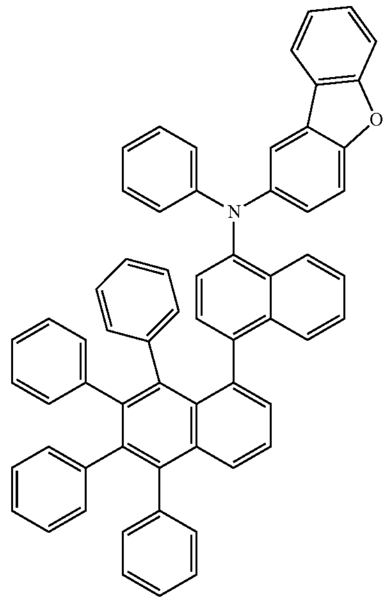
A131
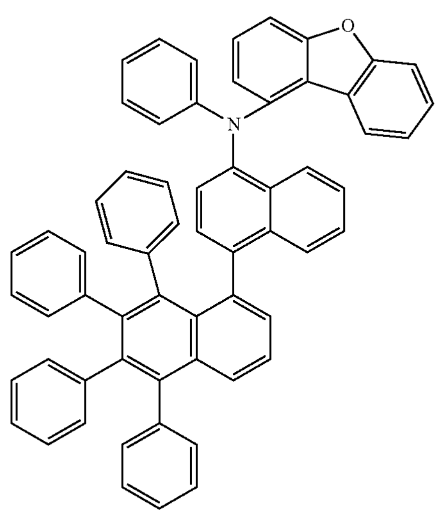

A132
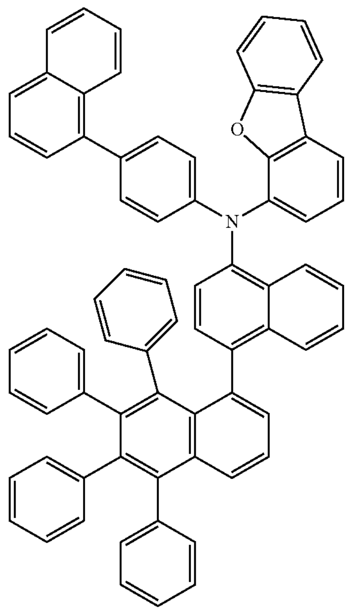
A133
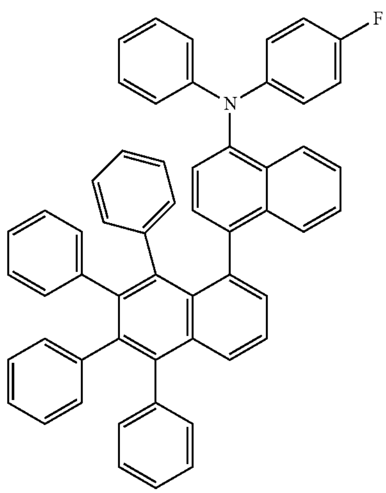
A134
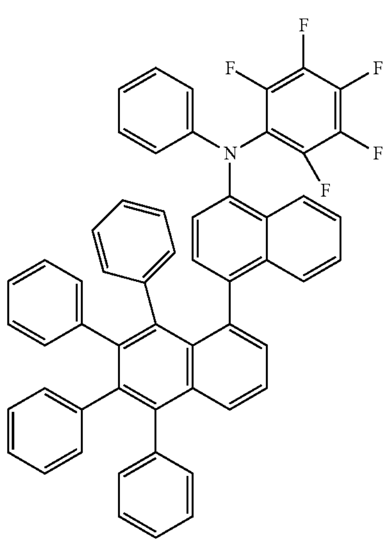
A135
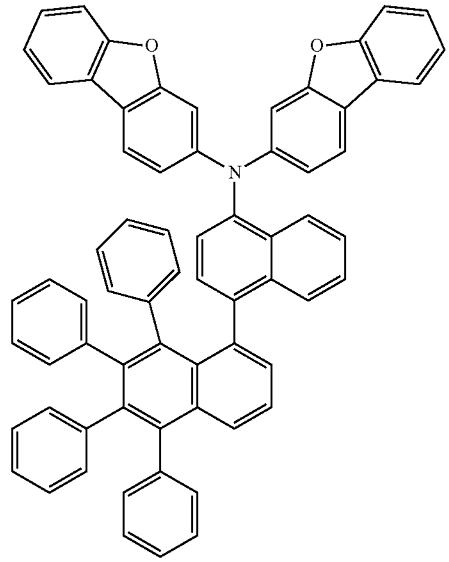
A136
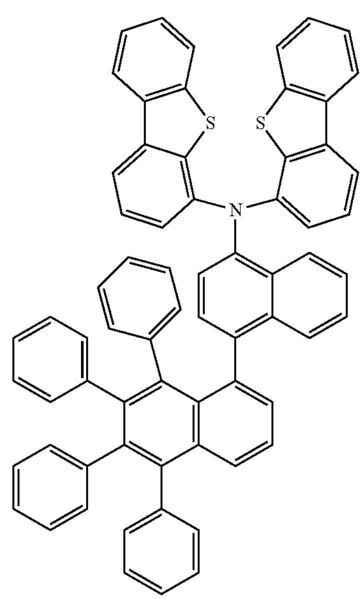

-continued
A137
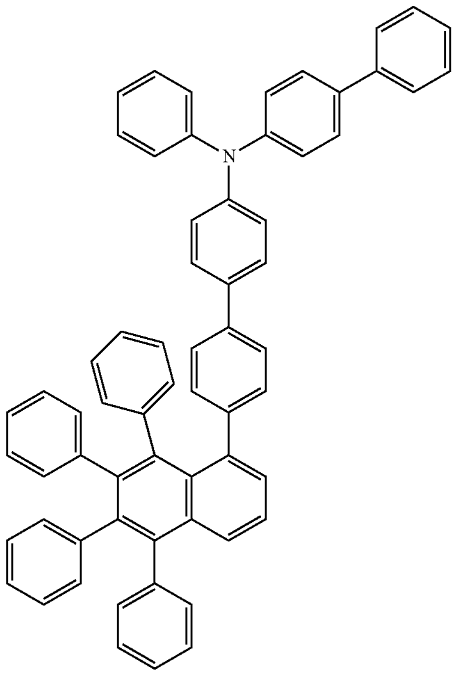
A138
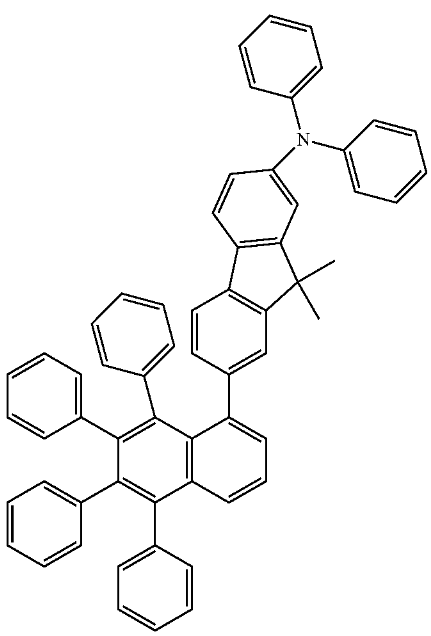
-continued
A139
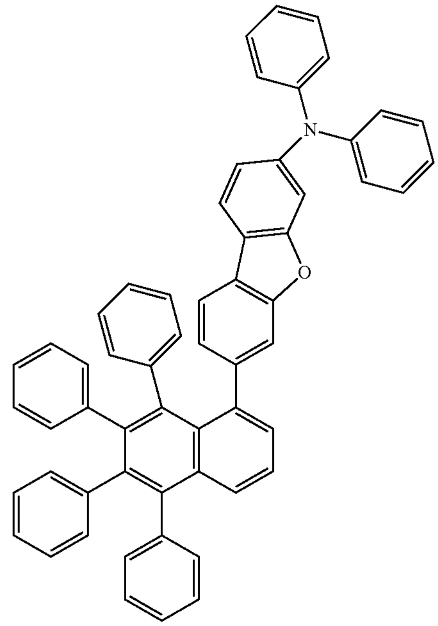
A140
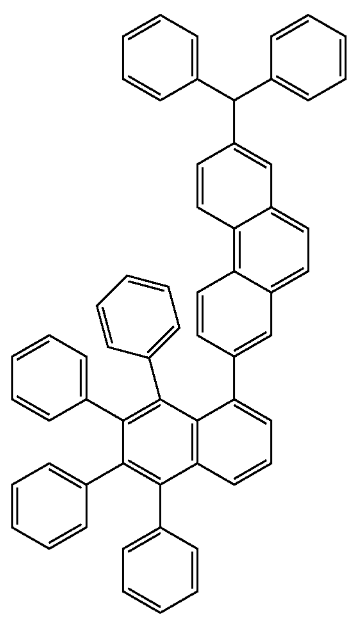

-continued
A141
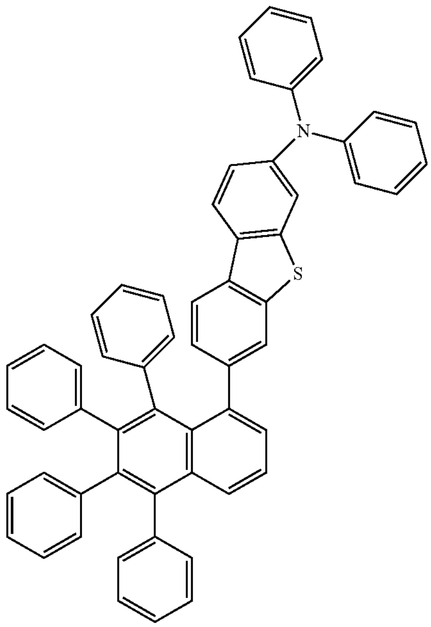
A142
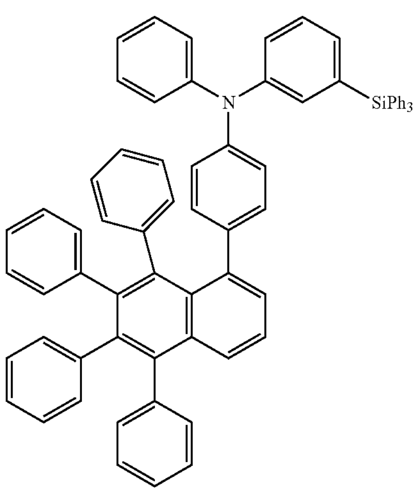
-continued
A143
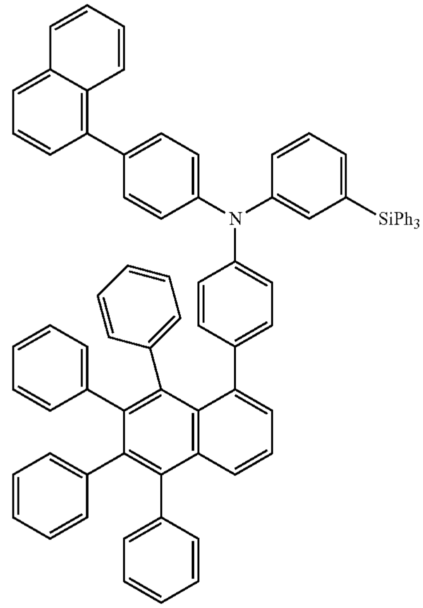
A144
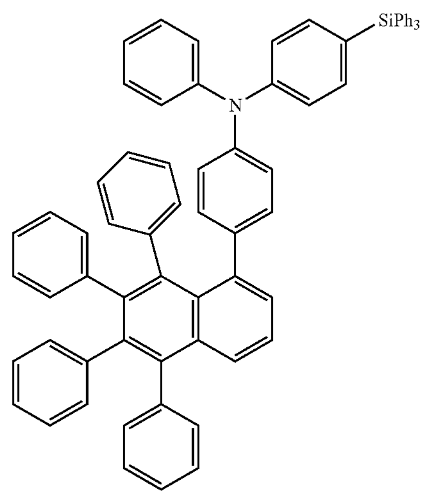
A145
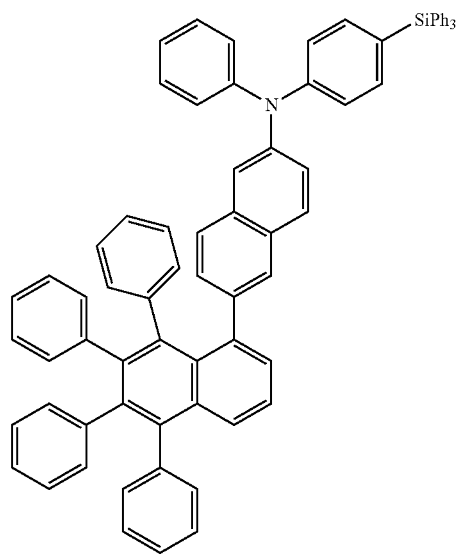

-continued
A146
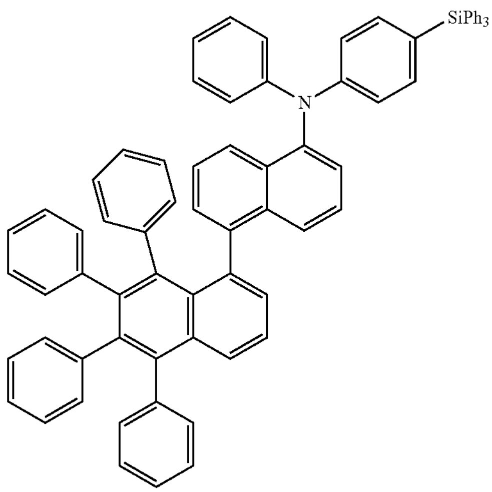
A147
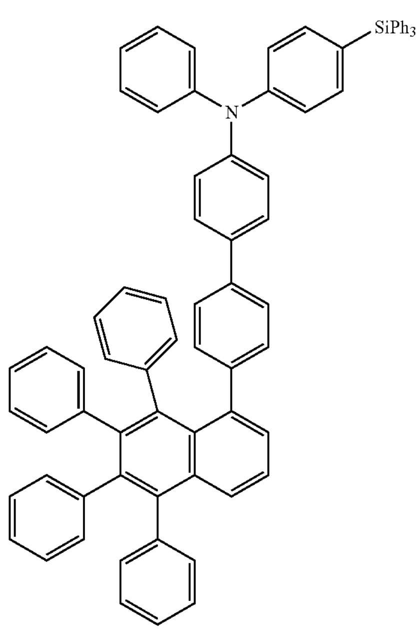
-continued
A148
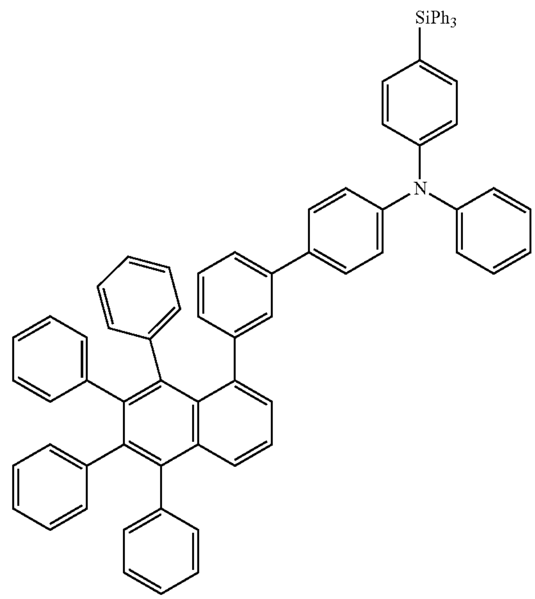
A149
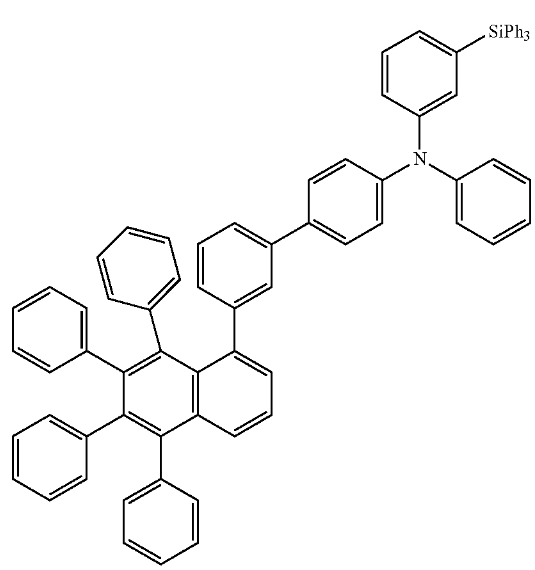

-continued
A150
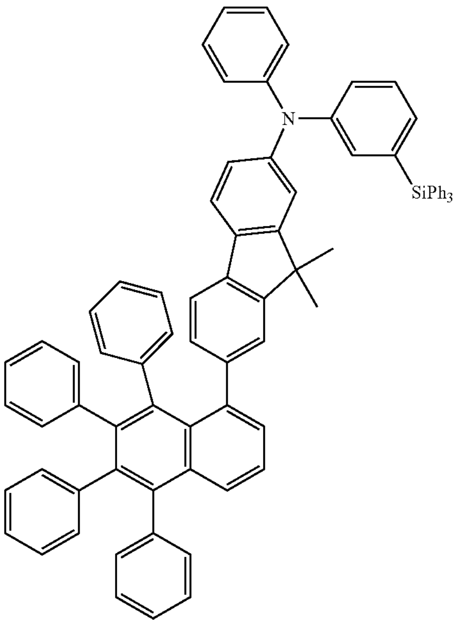
A151
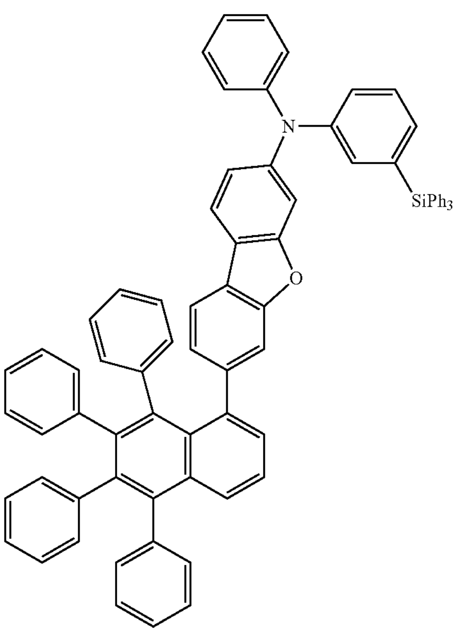
-continued
A152
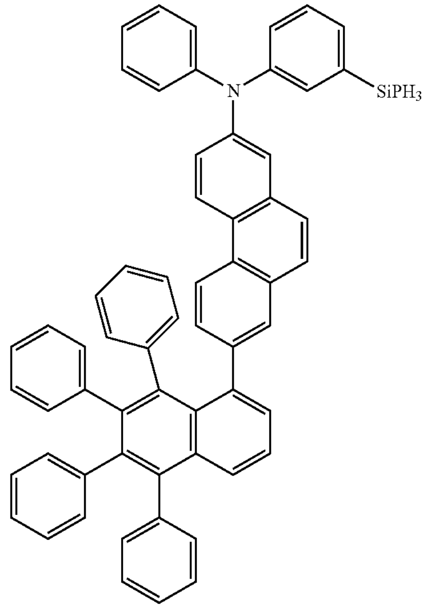
A153
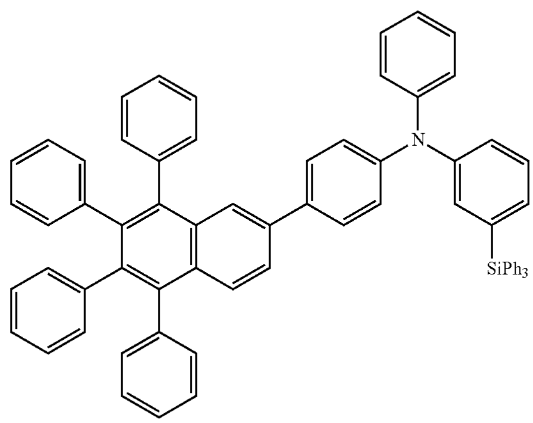
A154
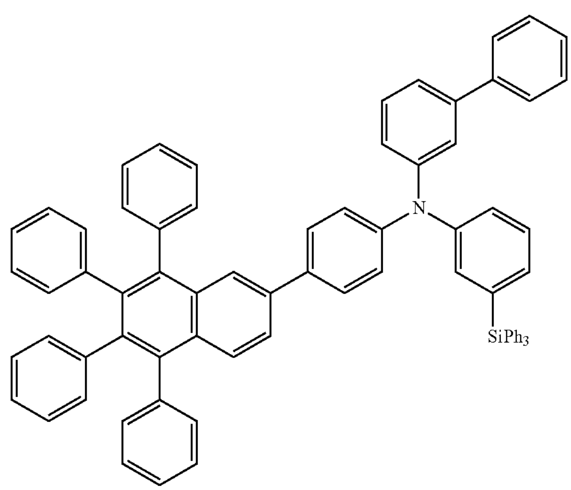

-continued
A155
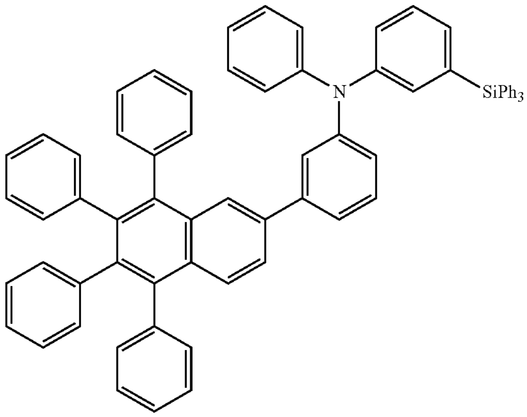
A156
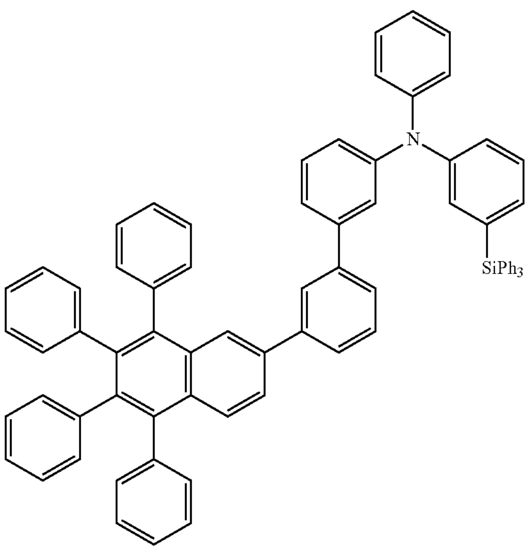
A157
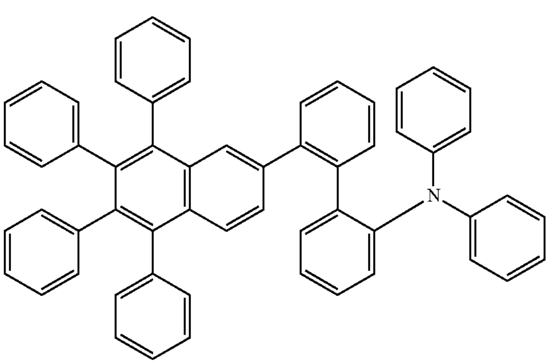
-continued
A158
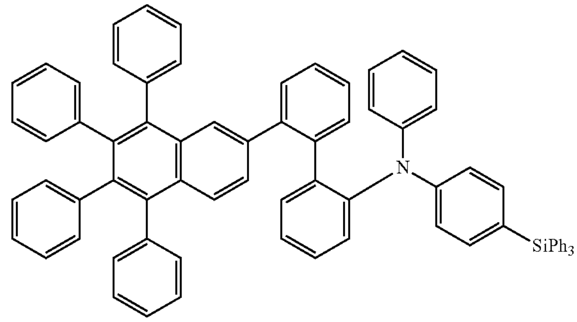
A159
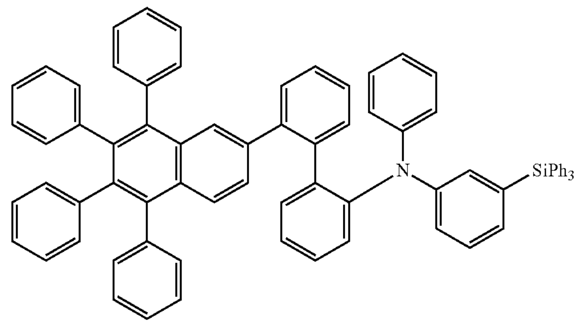
A160
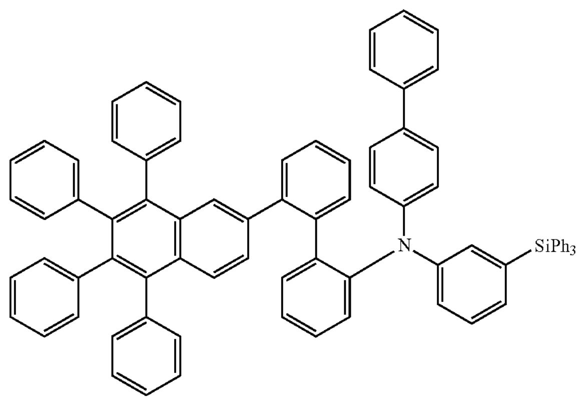
A161
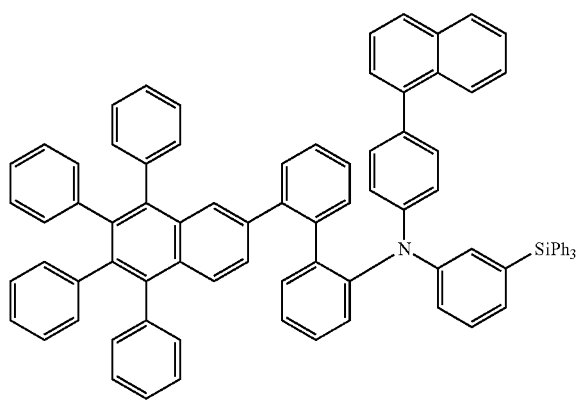

A162
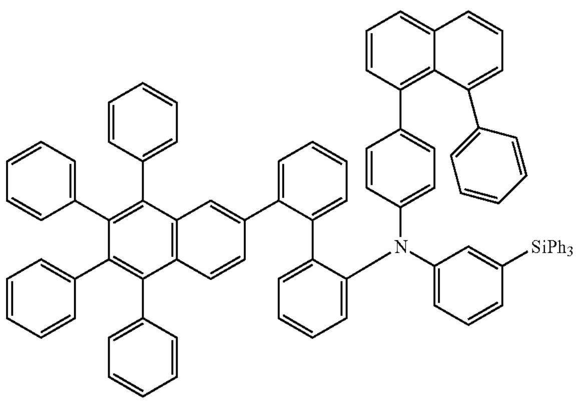
A163
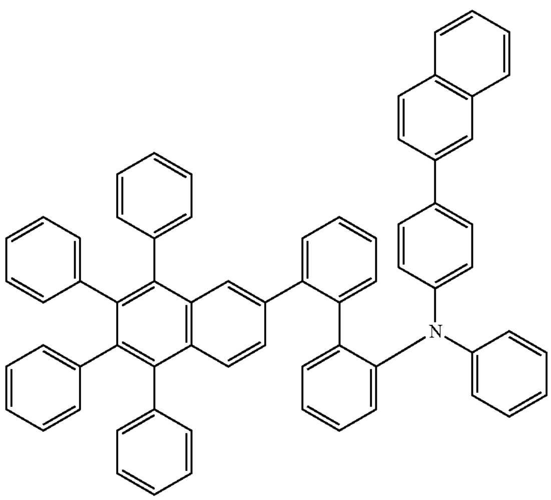
A164
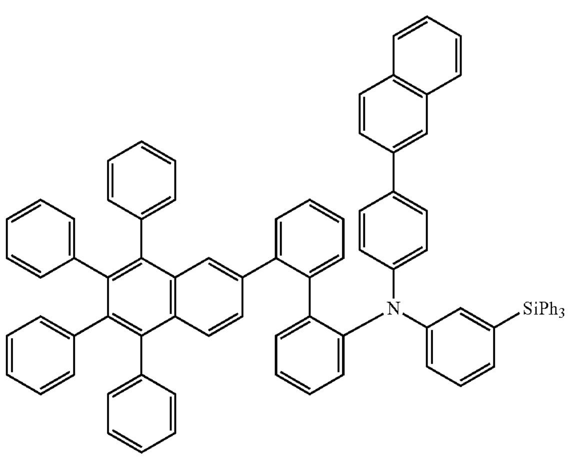
A165
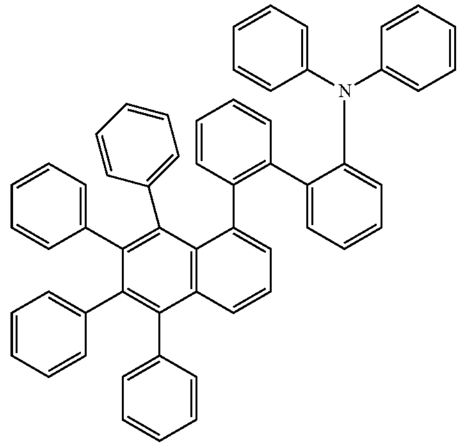
A166
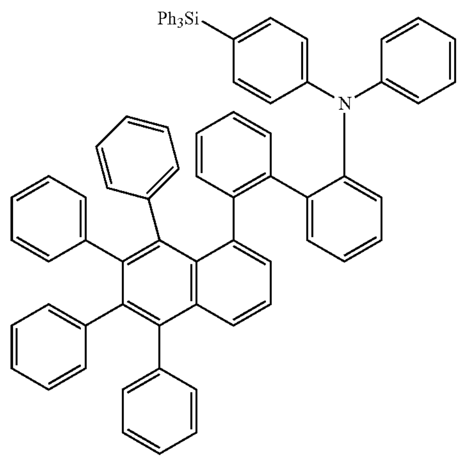
A167
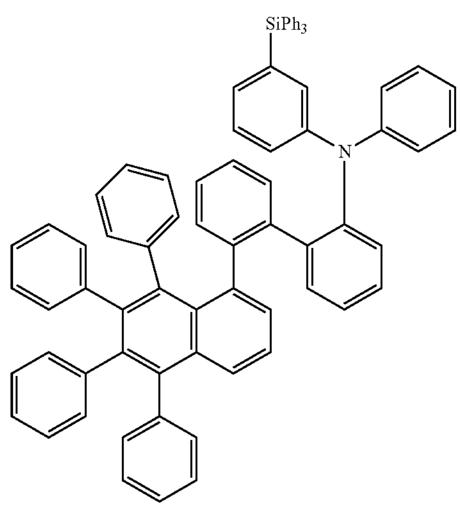

-continued
A168
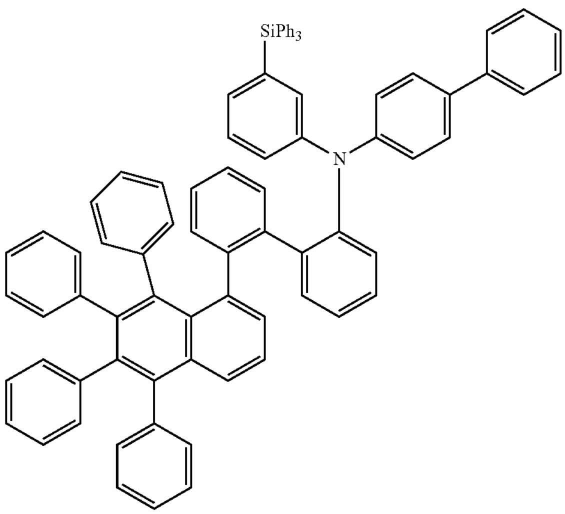
A169
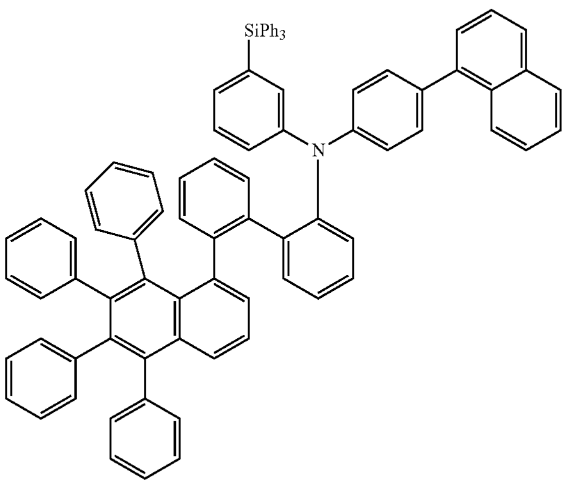
A170
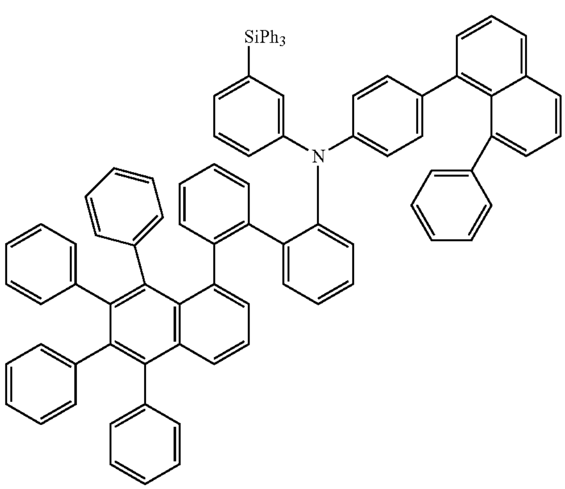
-continued
A171
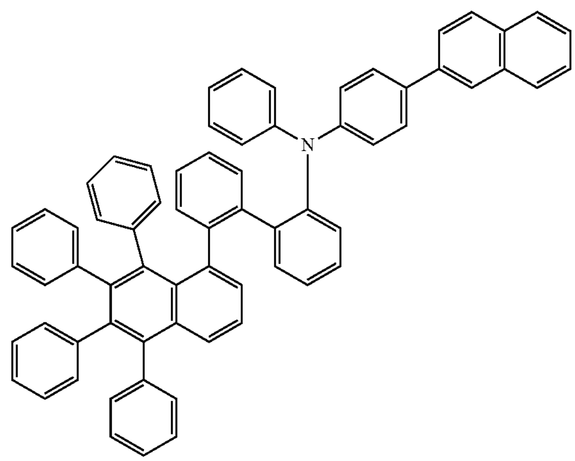
A172
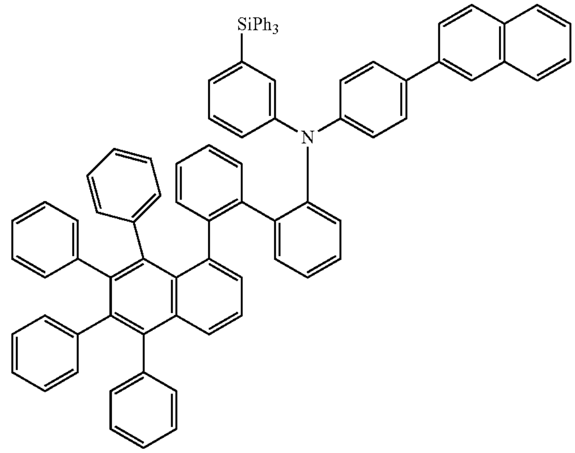
A173
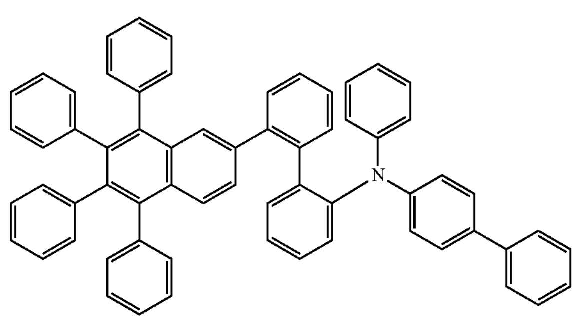
In some embodiments, in the amine compound represented in Compound Group 1, "$SiPh_3$" may represent a triphenylsilyl group.

The amine compound of an embodiment may include both a tetraphenyl naphthalene derivative

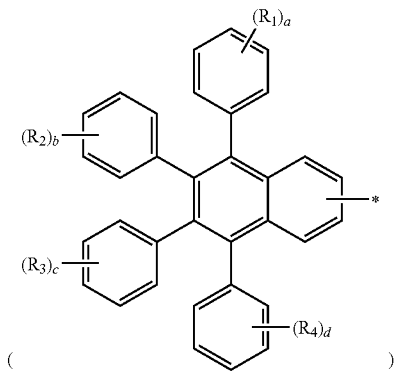

and an amine derivative

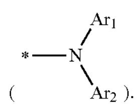

The amine compound of an embodiment may include both a tetraphenyl naphthalene part and an amine part and may exhibit long life characteristics and high emission properties.

In the amine compound of an embodiment, the tetraphenyl naphthalene has a steric hindrance effect due to the presence of four phenyl substituents, and has a structure having improved intermolecular interaction in a layer. In addition, the tetraphenyl naphthalene and the nitrogen atom of an amine are connected via a hydrocarbon ring or a heterocycle, and electrons are delocalized in the molecules (or groups) of the amine compound, thereby improving hole transport properties. The amine compound of an embodiment includes a tetraphenyl naphthalene derivative and a tertiary amine derivative, and has a connected structure of a naphthalene part and the nitrogen atom of an amine via a hydrocarbon ring or a heterocycle. Accordingly, the steric effect and improved charge transport properties may be improved and the life and efficiency of an organic electroluminescence device including the same may be improved.

In the organic electroluminescence device 10 of an embodiment, as shown in FIGS. 1 to 3, a hole transport region HTR may include one or more kinds of amine compounds represented in Compound Group 1. In some embodiments, the hole transport region HTR may further include any suitable material generally available in the art in addition to the amine compound in Compound Group 1.

In addition, in the organic electroluminescence device 10 of an embodiment, if the hole transport region HTR is composed of a plurality of organic layers, the amine compound may be included in an organic layer adjacent to the emission layer EML in the hole transport region HTR. For example, the amine compound of an embodiment may be included in the hole transport layer HTL of the hole transport region HTR. In addition, if the hole transport layer HTL includes a plurality of organic layers, the amine compound of an embodiment may be included in an adjacent layer to the emission layer EML among the plurality of organic layers.

In some embodiments, if the hole transport region HTR of the organic electroluminescence device 10 of an embodiment includes a hole injection layer HIL and a hole transport layer HTL, the amine compound of an embodiment may be included in the hole transport layer HTL, and if the hole transport region HTR of the organic electroluminescence device of an embodiment includes a hole injection layer HIL, a hole transport layer HTL and an electron blocking layer EBL, the amine compound of an embodiment may be included in the electron blocking layer EBL.

In the organic electroluminescence device 10 of an embodiment, if the hole transport layer HTL includes the amine compound of an embodiment, the hole injection layer HIL may include any suitable hole injection material generally available in the art. For example, the hole injection layer HIL may include triphenylamine-containing polyetherketone (TPAPEK), 4-isopropyl-4'-methyldiphenyliodoniumtetrakis(pentafluorophenyl)borate (PPBI), N,N'-diphenyl-N,N'-bis-[4-(phenyl-m-tolyl-amino)-phenyl]-phenyl-4,4'-diamine (DNTPD), a phthalocyanine compound such as copper phthalocyanine, 4,4',4"-tris(3-methyl phenyl phenylamino)triphenylamine (m-MTDATA), N,N'-di(1-naphthyl)-N,N'-diphenylbenzidine (NPB), N,N'-bis(1-naphthyl)-N,N'-diphenyl-4,4'-diamine (α-NPD), 4,4',4"-tris(N,N-diphenylamino)triphenylamine (TDATA), 4,4',4"-tris(N,N-2-naphthyl phenylamino)triphenylamine (2-TNATA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or dipyrazino[2,3-f:2',3'-h]quinoxaline-2,3,6,7,10,11-hexacarbonitrile (HAT-CN). However, embodiments of the present disclosure are not limited thereto.

In some embodiments, the hole transport layer HTL of the organic electroluminescence device 10 of an embodiment may further include any suitable hole transport material generally available in the art in addition to the amine compound of an embodiment. For example, the hole transport layer HTL may include 1,1-bis[(di-4-trileamino)phenyl]cyclohexane (TAPC), carbazole derivatives such as N-phenyl carbazole and polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl)triphenylamine (TCTA), N,N'-di(1-naphthalene)-1-yl)-N,N'-diphenyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 1,3-bis(N-carbazolyl)benzene (mCP), etc. However, embodiments of the present disclosure are not limited thereto.

As described herein above, in the organic electroluminescence device 10 of an embodiment, the hole transport region HTR may further include at least one of a hole buffer layer or an electron blocking layer EBL in addition to the hole injection layer HIL and the hole transport layer HTL. The hole buffer layer may compensate an optical resonance distance according to the wavelength of light emitted from an emission layer EML and may increase light emission efficiency. Materials which may be included in a hole transport region HTR may be used as materials included in a hole buffer layer.

In some embodiments, if a hole transport region HTR further includes an electron blocking layer EBL between a hole transport layer HTL and an emission layer EML, the electron blocking layer EBL may serve the function of preventing or reducing electron injection from an electron transport region ETR to a hole transport region HTR.

In the organic electroluminescence device 10 of an embodiment, if the hole transport region HTR includes an electron blocking layer EBL, the electron blocking layer EBL may include the amine compound of an embodiment. In addition, the electron blocking layer EBL may include any suitable material generally available in the art in addition to the amine compound of an embodiment. The electron blocking layer EBL may include, for example, carbazole derivatives such as N-phenylcarbazole, and polyvinyl carbazole, fluorene-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl)triphenylamine (TCTA), N,N'-di(naphthalene-1-yl)-N,N'-diphenyl-benzidine (NPD), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), mCP, etc.

For example, in the organic electroluminescence device 10 of an embodiment, if the hole transport region HTR is a single layer, the hole transport region HTR may include the amine compound of an embodiment. In this case, the hole transport region HTR may further include any suitable hole injection material generally available in the art or any suitable hole transport material generally available in the art.

In addition, in the organic electroluminescence device 10 of an embodiment, if the hole transport region HTR includes a plurality of layers, at least one layer among the plurality of layers included in the hole transport region HTR may include the amine compound of an embodiment. For example, a layer adjacent to an emission layer EML among the plurality of layers included in the hole transport region HTR may include the amine compound of an embodiment. In some embodiments, a layer not including the amine compound of an embodiment among the plurality of layers, may include any suitable hole injection material generally available in the art, or any suitable hole transport material generally available in the art. In addition, the layer including the amine compound of an embodiment may further include any suitable hole injection material generally available in the art, or any suitable hole transport material generally available in the art.

The thickness of the hole transport region HTR may be from about 100 Å to about 10,000 Å, for example, from about 100 Å to about 5,000 Å. The thickness of the hole injection layer HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. If the thicknesses of the hole transport region HTR, the hole injection layer HIL, the hole transport layer HTL and the electron blocking layer EBL satisfy the above-described ranges, suitable or satisfactory hole transport properties may be achieved without substantial increase of a driving voltage.

The hole transport region HTR may further include a charge generating material in addition to the above-described materials to increase conductivity. The charge generating material may be dispersed uniformly or non-uniformly in the hole transport region HTR. The charge generating material may be, for example, a p-dopant. The p-dopant may be one of quinone derivatives, metal oxides, or cyano group-containing compounds, without limitation. For example, non-limiting examples of the p-dopant may include quinone derivatives such as tetracyanoquinodimethane (TCNQ) and 2,3,5,6-tetrafluoro-7,7,8,8-tetracyanoquinodimethane (F4-TCNQ), metal oxides such as tungsten oxide, and molybdenum oxide, without limitation.

The emission layer EML is provided on the hole transport region HTR. The thickness of the emission layer EML may be, for example, from about 100 Å to about 300 Å. The emission layer EML may have a single layer formed using a single material, a single layer formed using a plurality of different materials, or a multilayer structure having a plurality of layers formed using a plurality of different materials.

The emission layer EML may emit one of red, green, blue, white, yellow or cyan light. The emission layer EML may include a fluorescence-emitting material or a phosphorescence-emitting material.

In the organic electroluminescence device 10 of an embodiment, the emission layer EML may include anthracene derivatives, pyrene derivatives, fluoranthene derivatives, chrysene derivatives, dihydrobenzanthracene derivatives, or triphenylene derivatives. For example, the emission layer EML may include an anthracene derivative or a pyrene derivative.

The emission layer EML may include an anthracene derivative represented by Formula 2, below.

Formula 2

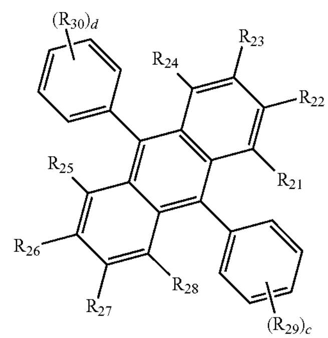

In Formula 2, $R_{21}$ to $R_{30}$ may be each independently a hydrogen atom, a deuterium atom, a halogen atom, a substituted or unsubstituted silyl group, a substituted or unsubstituted alkyl group of 1 to 10 carbon atoms, a substituted or unsubstituted aryl group of 6 to 30 carbon atoms for forming a ring, or a substituted or unsubstituted heteroaryl group of 2 to 30 carbon atoms for forming a ring, or may be combined with an adjacent group to form a ring. In some embodiments, $R_{21}$ to $R_{30}$ may be combined with an adjacent group to form a saturated hydrocarbon ring or an unsaturated hydrocarbon ring.

In Formula 2, c and d may be each independently an integer of 0 to 5.

Formula 2 may be represented by any one selected from Formula 2-1 to Formula 2-12, below.

2-1

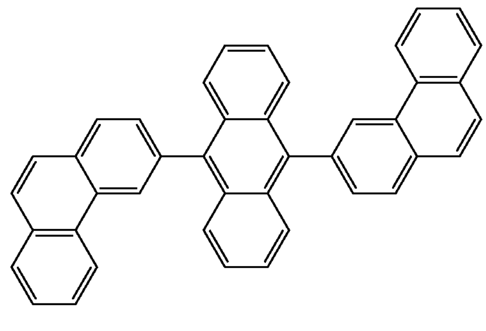

-continued
2-2
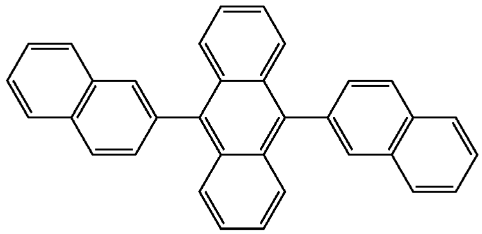
2-3
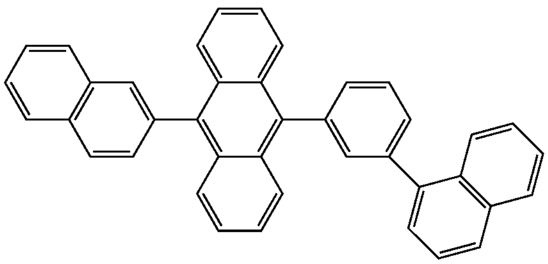
2-4
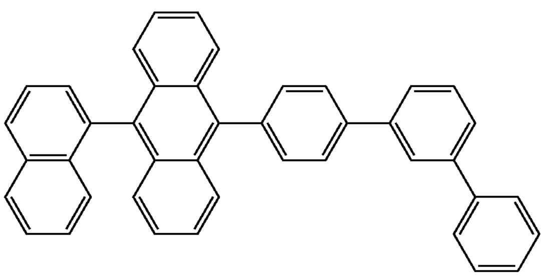
2-5
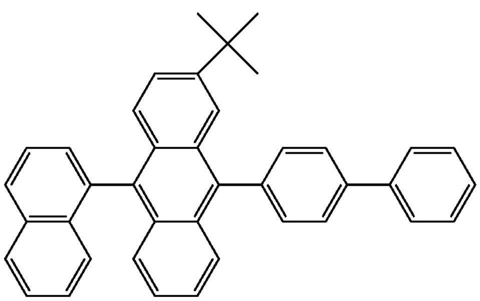
2-6
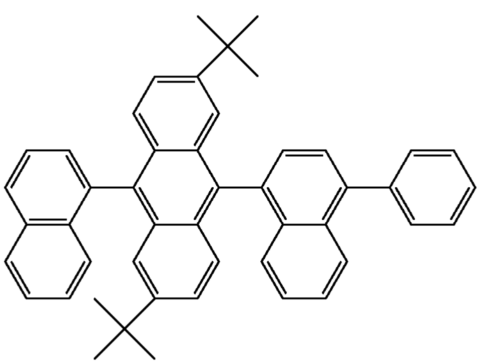
-continued
2-7
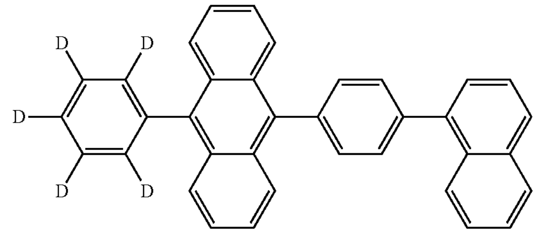
2-8
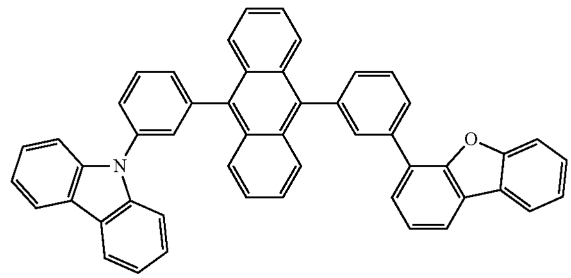
2-9
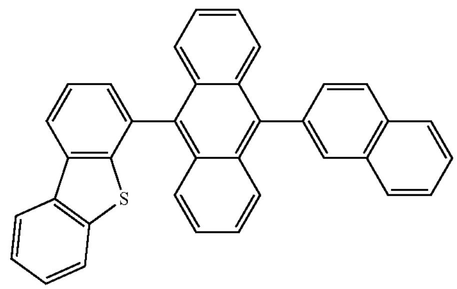
2-10
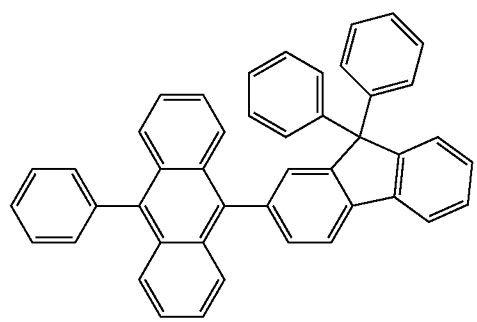
2-11
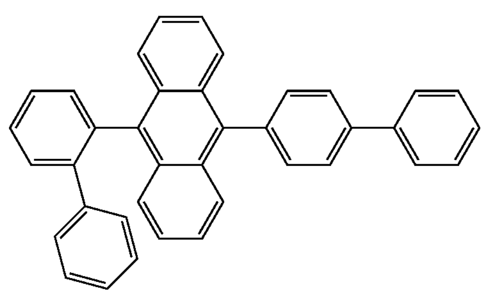

-continued 2-12

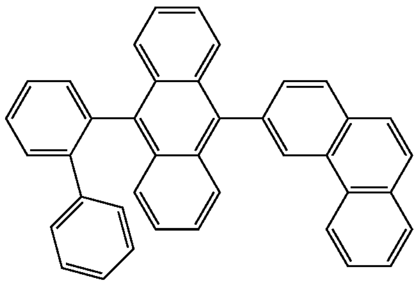

In the organic electroluminescence device 10 of an embodiment, as shown in FIG. 1 to FIG. 3, the emission layer EML may include a host and a dopant, and the emission layer EML may include the compound represented by Formula 2 as a host material.

The emission layer EML may further include any suitable material generally available in the art as the host material. For example, the emission layer EML may include as a host material, at least one of bis[2-(diphenylphosphino)phenyl] ether oxide (DPEPO), 4,4'-bis(carbazol-9-yl)biphenyl (CBP), 1,3-bis(n-carbazolyl)benzene (mCP), 2,8-bis(diphenylphosphoryl)dibenzo[b,d]furan (PPF), 4,4',4"-tris(carbazol-9-yl)-triphenylamine (TcTa) or 1,3,5-tris(N-phenylbenzimidazole-2-yl)benzene (TPBi). For example, tris(8-hydroxyquinolino)aluminum ($Alq_3$), 4,4'-bis(N-carbazolyl)-1,1'-biphenyl (CBP), poly(n-vinylcarbazole) (PVK), 9,10-di (naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di (naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), 2,8-bis(diphenylphosphoryl)dibenzofuran (PPF), etc. may be used as the host material. However, embodiments of the present disclosure are not limited thereto.

In an embodiment, the emission layer EML may include as any suitable dopant material such as, for example, styryl derivatives (for example, 1,4-bis[2-(3-N-ethylcarbazoryl) vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-Avinyl)phenyl)-N-phenylbenzenamine (N-BDAVBi), perylene and the derivatives thereof (for example, 2,5,8,11-tetra-t-butylperylene (TBP)), pyrene and the derivatives thereof (for example, 1,1-dipyrene, 1,4-dipyrenylbenzene, 1,4-bis(N,N-diphenylamino)pyrene), etc.

If the emission layer EML emits red light, the emission layer EML may further include a fluorescence material including tris(dibenzoylmethanato)phenanthroline europium (PBD:Eu(DBM)3(Phen)) or perylene. If the emission layer EML emits red color, the dopant included in the emission layer EML may be selected from, for example, a metal complex or an organometallic complex such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr) and octaethylporphyrin platinum (PtOEP), rubrene and the derivatives thereof, and 4-dicyanomethylene-2-(p-dimethylaminostyryl)-6-methyl-4H-pyrane (DCM) and the derivatives thereof.

If the emission layer EML emits green light, the emission layer EML may further include a fluorescence material including tris(8-hydroxyquinolino)aluminum (Alq3). If the emission layer EML emits green light, the dopant included in the emission layer EML may be selected from, for example, a metal complex or an organometallic complex such as fac-tris(2-phenylpyridine)iridium (Ir(ppy)3), and coumarin and the derivatives thereof.

If the emission layer EML emits blue light, the emission layer EML may further include a fluorescence material including, for example, any one selected from the group consisting of spiro-DPVBi, spiro-6P, distyryl-benzene (DSB), distyryl-arylene (DSA), a polyfluorene (PFO)-based polymer and a poly(p-phenylene vinylene) (PPV)-based polymer. If the emission layer EML emits blue light, the dopant included in the emission layer EML may be selected from a metal complex or an organometallic complex such as (4,6-F2ppy)2Irpic, and perylene and the derivatives thereof.

In the organic electroluminescence device 10 of an embodiment, the electron transport region ETR is provided on the emission layer EML. The electron transport region ETR may include at least one of a hole blocking layer HBL, an electron transport layer ETL or an electron injection layer EIL. However, embodiments of the present disclosure are not limited thereto.

The electron transport region ETR may have a single layer formed using a single material, a single layer formed using a plurality of different materials, or a multilayer structure having a plurality of layers formed using a plurality of different materials.

For example, the electron transport region ETR may have a single layer structure of an electron injection layer EIL or an electron transport layer ETL, or a single layer structure formed using an electron injection material and an electron transport material. Further, the electron transport region ETR may have a single layer structure composed of a plurality of different materials, or a structure laminated from the emission layer EML of electron transport layer ETL/electron injection layer EIL, or hole blocking layer HBL/electron transport layer ETL/electron injection layer EIL, without limitation. The thickness of the electron transport region ETR may be, for example, from about 100 Å to about 1,500 Å.

The electron transport region ETR may be formed using various suitable methods such as a vacuum deposition method, a spin coating method, a cast method, a Langmuir-Blodgett (LB) method, an inkjet printing method, a laser printing method, and a laser induced thermal imaging (LITI) method.

If the electron transport region ETR includes an electron transport layer ETL, the electron transport region ETR may include, for example, tris(8-hydroxyquinolinato)aluminum ($Alq_3$), 1,3,5-tri[(3-pyridyl)-phen-3-yl]benzene, 2,4,6-tris (3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq2), 9,10-di(naphthalene-2-yl) anthracene (ADN), or a mixture thereof, without limitation.

If the electron transport region ETR includes the electron transport layer ETL, the thickness of the electron transport layer ETL may be from about 100 Å to about 1,000 Å and may be, for example, from about 150 Å to about 500 Å. If the thickness of the electron transport layer ETL satisfies the above-described range, suitable or satisfactory electron transport properties may be obtained without substantial increase of a driving voltage.

If the electron transport region ETR includes the electron injection layer EIL, the electron transport region ETR may include, for example, LiF, 8-hydroxyquinolinnolata-lithium (LiQ), $Li_2O$, BaO, NaCl, CsF, a metal in lanthanoides such as Yb, or a metal halide such as RbCl, RbI and KI. However, embodiments of the present disclosure are not limited thereto. The electron injection layer EIL may be also formed using a mixture material of an electron transport material and an insulating organo metal salt. The organo metal salt may be a material having an energy band gap of about 4 eV or more. For example, the organo metal salt may include, for example, metal acetates, metal benzoates, metal acetoacetates, metal acetylacetonates, or metal stearates.

If the electron transport region ETR includes the electron injection layer EIL, the thickness of the electron injection layer EIL may be from about 1 Å to about 100 Å, and from about 3 Å to about 90 Å. If the thickness of the electron injection layer EIL satisfies the above described range, suitable or satisfactory electron injection properties may be obtained without inducing substantial increase of a driving voltage.

The electron transport region ETR may include a hole blocking layer HBL as described above. The hole blocking layer HBL may include, for example, at least one of 2,9-dimethyl-4,7-diphenyl-1,10-phenanthroline (BCP), or 4,7-diphenyl-1,10-phenanthroline (Bphen). However, embodiments of the present disclosure are not limited thereto.

The second electrode EL2 is provided on the electron transport region ETR. The second electrode EL2 has conductivity. The second electrode EL2 may be formed using a metal alloy or a conductive compound. The second electrode EL2 may be a cathode. The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed using the above-described materials, and a transparent conductive layer formed using ITO, IZO, ZnO, ITZO, etc.

In some embodiments, the second electrode EL2 may be connected with an auxiliary electrode. If the second electrode EL2 is connected with the auxiliary electrode, the resistance of the second electrode EL2 may decrease.

In some embodiments, a capping layer may be further included on the second electrode EL2 of the organic electroluminescence device 10. The capping layer may include, for example, α-NPD, NPB, TPD, m-MTDATA, $Alq_3$, CuPc, N4,N4,N4',N4'-tetra(biphenyl-4-yl) biphenyl-4,4'-diamine (TPD15), 4,4',4"-tris(carbazol sol-9-yl) triphenylamine (TCTA), N,N'-bis(naphthalene-1-yl), etc.

In the organic electroluminescence device 10, according to the application of a voltage to each of the first electrode EL1 and second electrode EL2, holes injected from the first electrode EL1 may move via the hole transport region HTR to the emission layer EML, and electrons injected from the second electrode EL2 may move via the electron transport region ETR to the emission layer EML. The electrons and the holes are recombined in the emission layer EML to produce excitons, and the excitons may emit light via transition from an excited state to a ground state.

If the organic electroluminescence device 10 is a top emission type (or kind), the first electrode EL1 may be a reflective electrode and the second electrode EL2 may be a transmissive electrode or a transflective electrode. If the organic electroluminescence device 10 is a bottom emission type (or kind), the first electrode EL1 may be a transmissive electrode or a transflective electrode and the second electrode EL2 may be a reflective electrode.

The amine compound of an embodiment may be included in the organic electroluminescence device 10 according to an embodiment. In the present description, a case where the amine compound of an embodiment is included in the hole transport region HTR is mainly explained, but embodiments of the present disclosure are not limited thereto. For example, the organic electroluminescence device 10 according to an embodiment of the present disclosure may include the amine compound in at least one organic layer between the first electrode EL1 and the second electrode EL2, or in a capping layer on the second electrode EL2.

The organic electroluminescence device 10 according to an embodiment of the present disclosure includes the amine compound in at least one organic layer between the first electrode EL1 and the second electrode EL2, and excellent emission efficiency and high reliability may be achieved. For example, the organic electroluminescence device 10 according to an embodiment includes the amine compound in a hole transport region HTR and may show high emission efficiency and improved life characteristics.

In some embodiments, the organic electroluminescence device of an embodiment includes the amine compound of an embodiment in an organic layer adjacent to the emission layer among the plurality of the organic layers of the hole transport region, and the hole transport region may keep high hole transport capacity while restraining (or reducing) the movement of electrons, thereby showing improved emission efficiency.

For example, in an embodiment, by including an amine compound including a tetraphenyl naphthalene derivative, a tertiary amine derivative, and a linker connecting the naphthalene part of the tetraphenyl naphthalene derivative and the nitrogen atom of the tertiary amine derivative in a hole transport region, the amine compound may have excellent reliability and charge transport capacity, and thus, the organic electroluminescence device of an embodiment may show excellent device efficiency and life characteristics.

Hereinafter, an amine compound according to an embodiment of the present disclosure and an organic electroluminescence device including the amine compound of an embodiment will be explained in more detail with reference to embodiments and comparative embodiments. In addition, the following embodiments are only illustrations to assist the understanding of the present disclosure, and the scope of the present disclosure is not limited thereto

EXAMPLES

1. Synthesis of Amine Compound

First, the synthetic method of an amine compound according to this embodiment will be explained with reference to Compound A4, Compound A5, Compound A9, Compound A114, Compound A21, Compound A19, Compound A38, Compound A58, Compound A97, Compound A77, Compound A98, and Compound A157 of Compound Group 1. In addition, the synthetic method of an amine compound explained below is an embodiment, and the synthetic method of an amine compound according to embodiments of the present disclosure is not limited thereto.

Synthesis of Compound A4

Amine Compound A4 according to an embodiment may be synthesized, for example, by the following Reaction 1.

Reaction 1

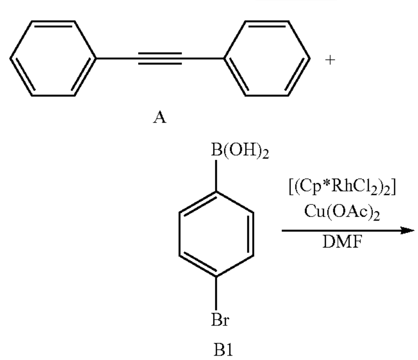

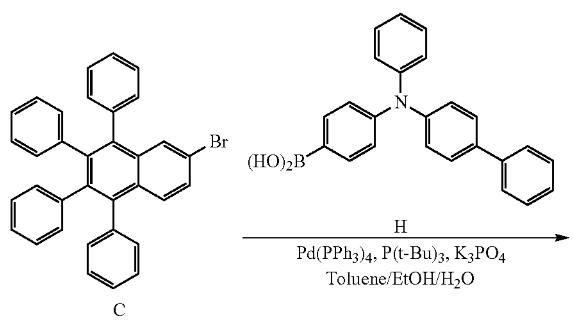

-continued

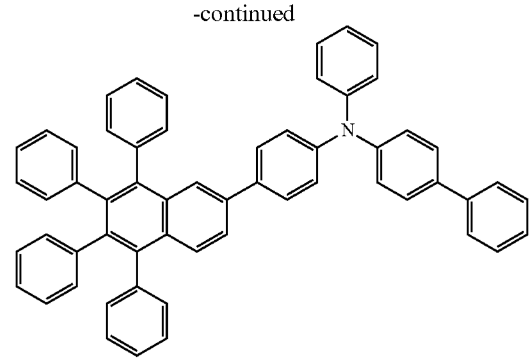

A4

Synthesis of Intermediate Compound C

A dimethylformamide solution (250 ml) was added to Compound A (8.9 g, 59 mmol), which was an alkyne compound, B1 (10.0 g, 50 mmol), which was a boronic acid, $[(Cp^*RhCl_2)_2]$ (310 mg, 0.5 mmol), and $Cu(OAc)_2$ (360 mg, 2.0 mol), and the resultant was then heated and stirred at about 120° C. for about 3 hours. After cooling to room temperature in the air, the reaction solution was extracted with ethyl acetate, washed with water ($H_2O$) and a brine solution, and dried with $MgSO_4$. The solution thus obtained was concentrated and separated by silica gel column chromatography to obtain Compound C (16.8 g, 33 mmol, yield 67%, FAB-MS m/z 510.1).

Synthesis of Compound A4

Toluene/EtOH/$H_2O$ (with a volume ratio of 4/2/1, 180 ml) was added to the Intermediate Compound C (11.8 g, 23 mmol), Compound H (13 g, 35 mmol), and $K_3PO_4$ (14 g, 69 mmol), and the resultant was degassed. Under an argon (Ar) atmosphere, 2-dicyclohexylphosphino-2',6'-dimethoxybiphenyl (140 mg, 0.34 mmol) and tetrakis(triphenylphosphine) palladium (1.6 g, 1.4 mmol) were added thereto, followed by heating and stirring at about 85° C. for about 6 hours. The reaction solution was cooled to room temperature, extracted with toluene, washed with water ($H_2O$) and a brine solution, and dried with $MgSO_4$. The solution thus obtained was concentrated and separated by silica gel column chromatography to obtain Compound A4 (10.7 g, 12 mmol, yield 62%, FAB-MS m/z 751.3).

Synthesis of Compound A97

Amine Compound A97 according to an embodiment may be synthesized, for example, by the following Reaction 2.

Reaction 2

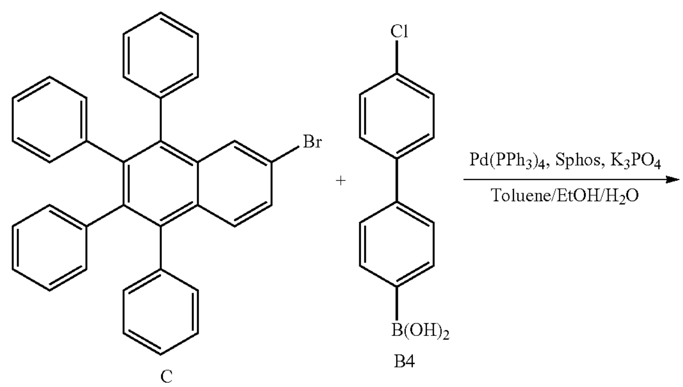

-continued

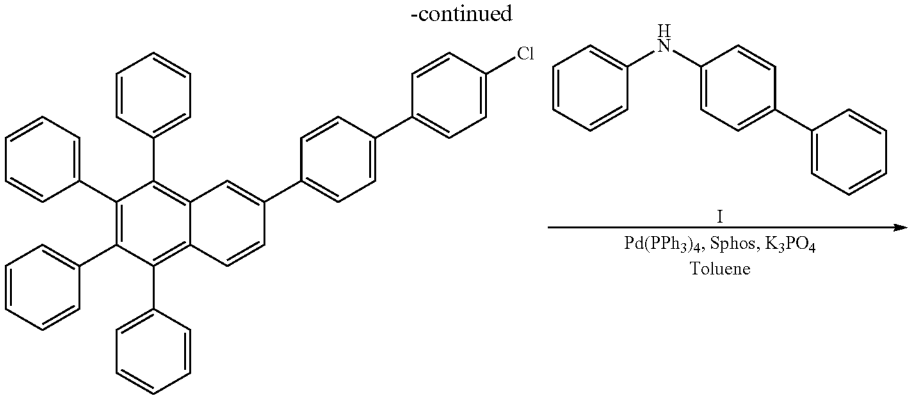

F

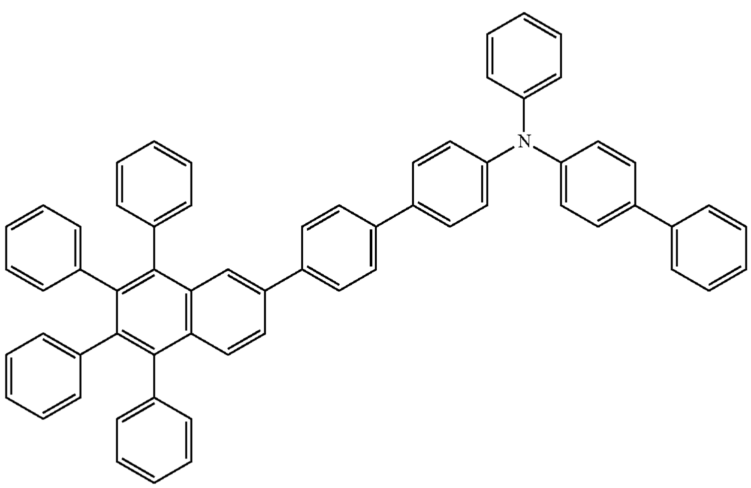

A97

Synthesis of Intermediate Compound F

Toluene/EtOH/$H_2O$ (with a volume ratio of 4/2/1, 250 ml) was added to Intermediate Compound C (10.2 g, 20 mmol), which was used in the synthesis of Compound A4, B4 (4.7 g, 20 mmol), which was a boronic acid, and $K_3PO_4$ (8.5 g, 40 mmol), and the resultant was degassed. Under an argon atmosphere, 2-dicyclohexylphosphino-2',6'-dimethoxybiphenyl (1.6 g, 4.0 mmol) and tetrakis(triphenylphosphine) palladium (1.6 g, 1.0 mmol) were added thereto, followed by heating and stirring at about 85° C. for about 6 hours. The reaction solution was cooled to room temperature, extracted with toluene, washed with water ($H_2O$) and a brine solution, and dried with $MgSO_4$. The solution thus obtained was concentrated and separated by silica gel column chromatography to obtain Intermediate Compound F (9.3 g, 15 mmol, yield 75%, FAB-MS m/z 618.2).

Synthesis of Compound A97

Toluene (200 ml) was added to Intermediate Compound F (6.2 g, 10 mmol) thus obtained, Compound I (3.2 g, 10 mmol), and $K_3PO_4$ (4.0 g, 20 mmol), and the resultant was degassed. Under an argon atmosphere, tri-tert-butylphosphine (0.2 ml, 1 M in toluene) and tetrakis(triphenylphosphine) palladium (0.70 g, 0.61 mmol) were added thereto, followed by heating and stirring at about 85° C. for about 6 hours. The reaction solution was cooled to room temperature, extracted with toluene, washed with water ($H_2O$) and a brine solution, and dried with $Na_2SO_4$. The solution thus obtained was concentrated and separated by silica gel column chromatography to obtain Compound A97 (5.4 g, 6.5 mmol, yield 65%, FAB-MS m/z 827.4).

Synthesis of Compound A75

Amine Compound A75 according to an embodiment may be synthesized, for example, by the following Reaction 3.

Reaction 3

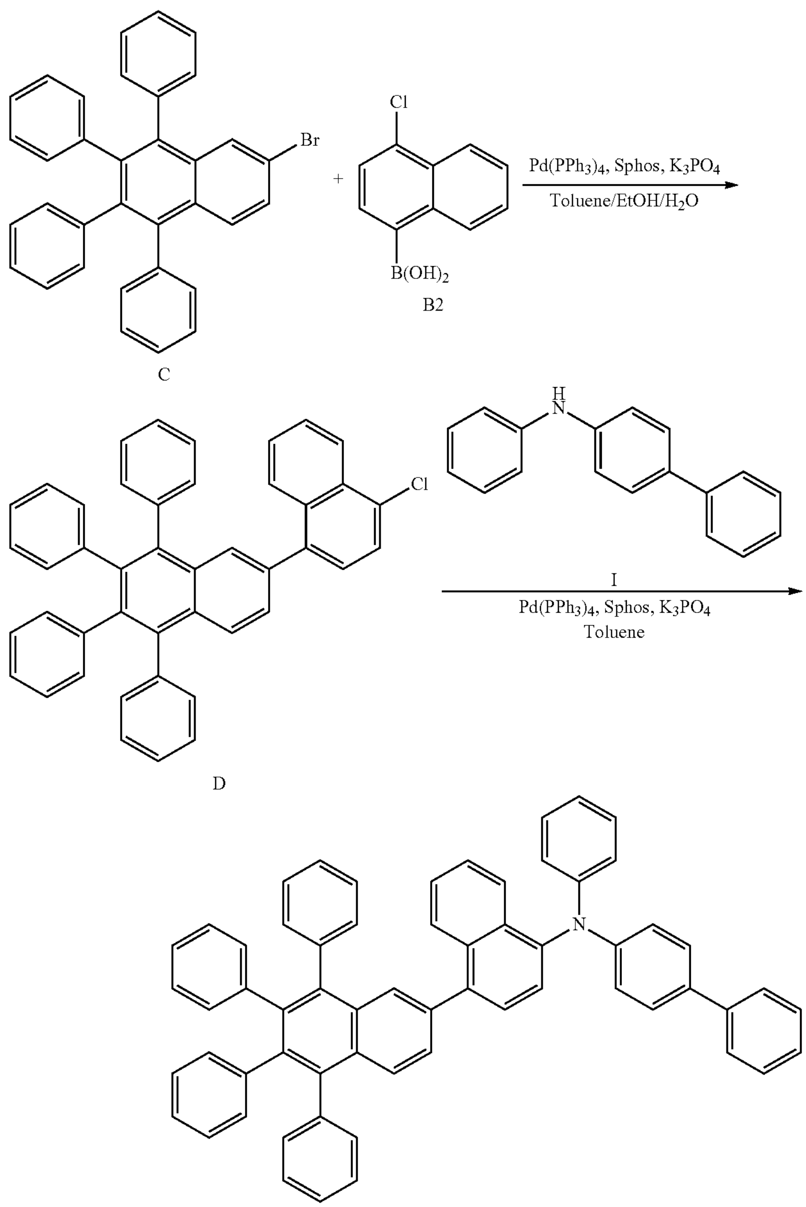

A75

Synthesis of Intermediate Compound D

Toluene/EtOH/$H_2O$ (with a volume ratio of 4/2/1, 250 ml) was added to Intermediate Compound C (10.2 g, 20 mmol), which was used in the synthesis of Compound A4, B2 (4.1 g, 20 mmol), which was a boronic acid, and $K_3PO_4$ (8.5 g, 40 mmol), and the resultant was degassed. Under an argon atmosphere, 2-dicyclohexylphosphino-2',6'-dimethoxybiphenyl (1.6 g, 4.0 mmol) and tetrakis(triphenylphosphine) palladium (1.6 g, 1.0 mmol) were added thereto, followed by heating and stirring at about 85° C. for about 6 hours. The reaction solution was cooled to room temperature, extracted with toluene, washed with water ($H_2O$) and a brine solution, and dried with $Na_2SO_4$. The solution thus obtained was concentrated and separated by silica gel column chromatography to obtain Intermediate Compound D (9.1 g, 15 mmol, yield 77%, FAB-MS m/z 592.2).

Synthesis of Compound A75

Toluene (200 ml) was added to Intermediate Compound D (5.9 g, 10 mmol) thus obtained, Compound I (3.2 g, 10 mmol), and $K_3PO_4$ (4.0 g, 20 mmol), and the resultant was degassed. Under an argon atmosphere, tri-tert-butylphosphine (0.2 ml, 1 M in toluene) and tetrakis(triphenylphosphine) palladium (0.70 g, 0.61 mmol) were added thereto, followed by heating and stirring at about 85° C. for about 6

2hours. The reaction solution was cooled to room temperature, extracted with toluene, washed with water ($H_2O$) and a brine solution, and dried with $Na_2SO_4$. The solution thus obtained was concentrated and separated by silica gel column chromatography to obtain Compound A75 (3.9 g, 4.9 mmol, yield 49%, FAB-MS m/z 801.3).

Synthesis of Compound A79

Amine Compound A79 according to an embodiment may be synthesized, for example, by the following Reaction 4.

Reaction 4

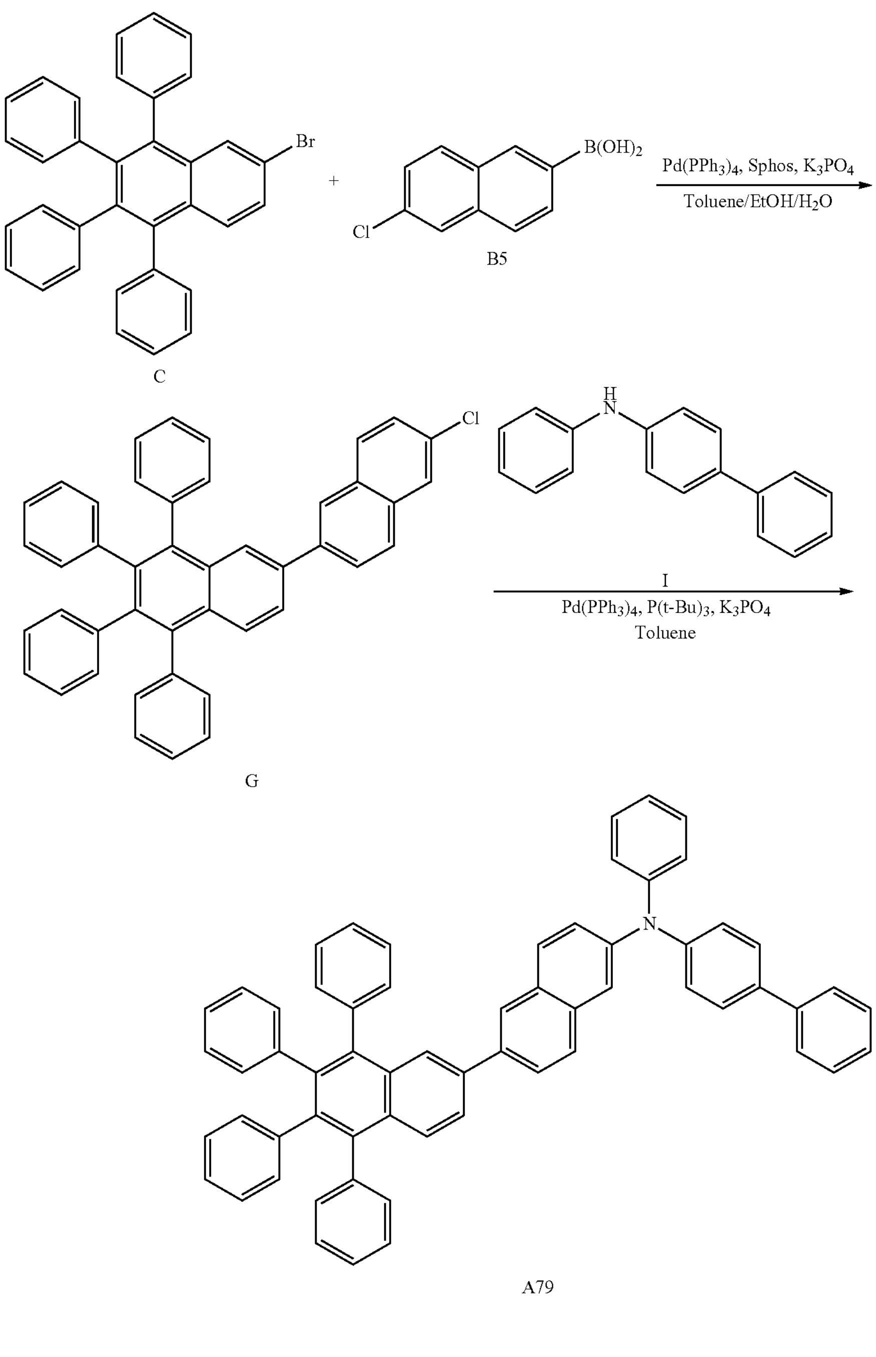

A79

Synthesis of Intermediate Compound G

Toluene/EtOH/$H_2O$ (with a volume ratio of 4/2/1, 250 ml) was added to Intermediate Compound C (10.2 g, 20 mmol), which was used in the synthesis of Compound A4, B5 (4.1 g, 20 mmol), which was a boronic acid, and $K_3PO_4$ (8.5 g, 40 mmol), and the resultant was degassed. Under an argon atmosphere, 2-dicyclohexylphosphino-2',6'-dimethoxybiphenyl (1.6 g, 4.0 mmol) and tetrakis(triphenylphosphine) palladium (1.6 g, 1.0 mmol) were added thereto, followed by heating and stirring at about 85° C. for about 6 hours. The reaction solution was cooled to room temperature, extracted with toluene, washed with water ($H_2O$) and a brine solution, and dried with $Na_2SO_4$. The solution thus obtained was concentrated and separated by silica gel column chromatography to obtain Compound G (9.6 g, 16 mmol, yield 81%, FAB-MS m/z 592.2).

Synthesis of Compound A79

Toluene (200 ml) was added to Intermediate Compound G (5.9 g, 10 mmol) thus obtained, Compound I (2.5 g, 10 mmol), and $K_3PO_4$ (4.0 g, 20 mmol), and the resultant was degassed. Under an argon atmosphere, tri-tert-butylphosphine (0.2 ml, 1 M in toluene) and tetrakis(triphenylphosphine) palladium (0.70 g, 0.61 mmol) were added thereto, followed by heating and stirring at about 85° C. for about 6 hours. The reaction solution was cooled to room temperature, extracted with toluene, washed with water ($H_2O$) and a brine solution, and dried with $Na_2SO_4$. The solution thus obtained was concentrated and separated by silica gel column chromatography to obtain Compound A79 (4.4 g, 5.5 mmol, yield 55%, FAB-MS m/z 801.3).

Synthesis of Compound A173

Amine Compound A173 according to an embodiment may be synthesized, for example, by the following Reaction 5.

Synthesis of Intermediate Compound E

Toluene/EtOH/$H_2O$ (with a volume ratio of 4/2/1, 250 ml) was added to Intermediate Compound C (10.2 g, 20 mmol), which was used in the synthesis of Compound A4, B3 (6.2 g, 20 mmol), which was a boronic acid, and $K_3PO_4$ (8.5 g, 40 mmol), and the resultant was degassed. Under an argon atmosphere, 2-dicyclohexylphosphino-2',6'-dimethoxybiphenyl (1.6 g, 4.0 mmol) and tetrakis(triphenylphosphine) palladium (1.6 g, 1.0 mmol) were added thereto, followed by heating and stirring at about 85° C. for about 6 hours. The reaction solution was cooled to room temperature, extracted with toluene, washed with water ($H_2O$) and a brine solution, and dried with $Na_2SO_4$. The solution thus obtained was concentrated and separated by silica gel column chromatography to obtain Compound E (9.1 g, 13 mmol, yield 65%, FAB-MS m/z 694.2).

Reaction 5

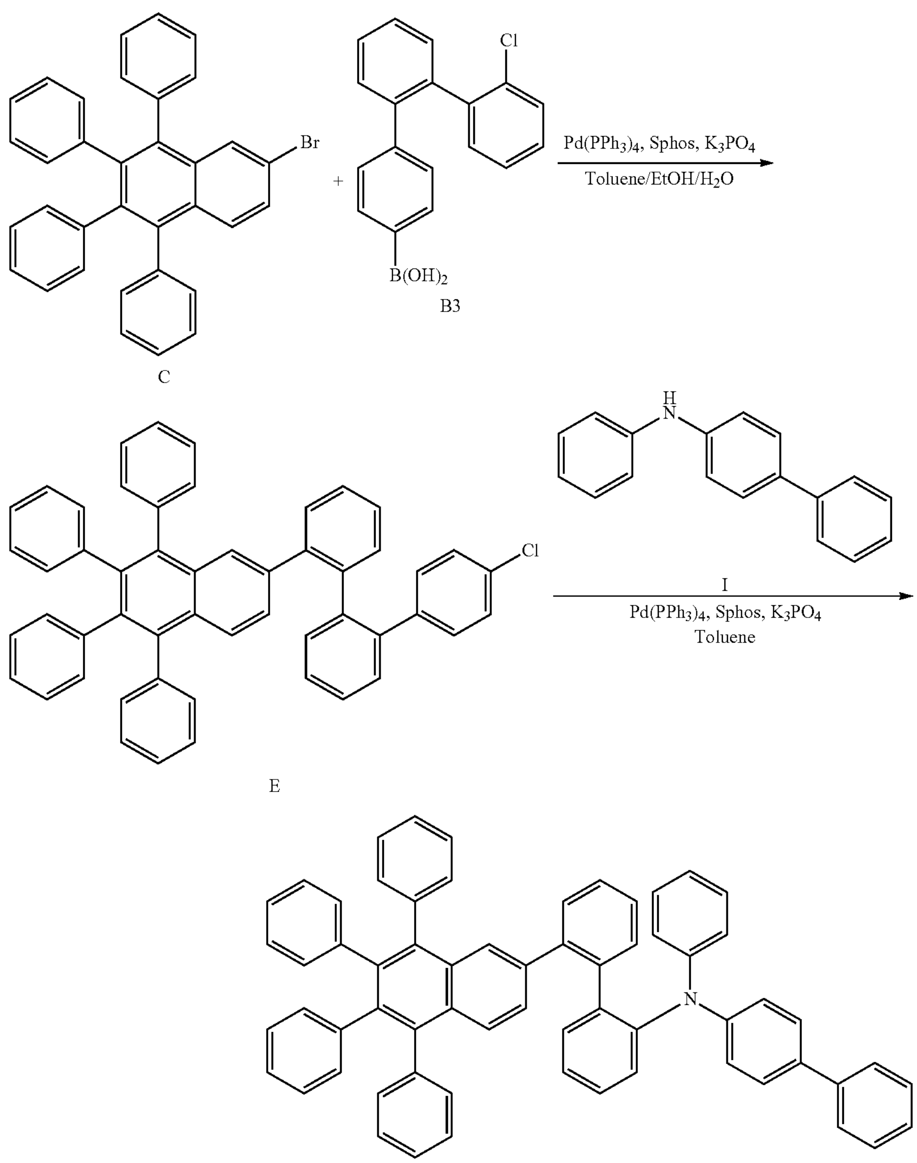

A173

Synthesis of Compound A173

Toluene (200 ml) was added to Intermediate Compound E (7.0 g, 10 mmol) thus obtained, Compound I (3.2 g, 10 mmol), and $K_3PO_4$ (4.0 g, 20 mmol), and the resultant was degassed. Under an argon atmosphere, tri-tert-butylphosphine (0.2 ml, 1 M in toluene) and tetrakis(triphenylphosphine) palladium (0.70 g, 0.61 mmol) were added thereto, followed by heating and stirring at about 85° C. for about 6 hours. The reaction solution was cooled to room temperature, extracted with toluene, washed with water ($H_2O$) and a brine solution, and dried with $Na_2SO_4$. The solution thus obtained was concentrated and separated by silica gel column chromatography to obtain Compound A173 (3.4 g, 4.1 mmol, yield 41%, FAB-MS m/z 827.4).

Synthesis of Compound A157

Substantially the same method for synthesizing Compound A173 was performed except for using Intermediate Compound E. Compound A157 (3.4 g, 4.1 mmol, yield 41%, FAB-MS m/z 751.3) was obtained.

Synthesis of Compound A5

Amine Compound A5 according to an embodiment may be synthesized, for example, by the following Reaction 6.

Reaction 6

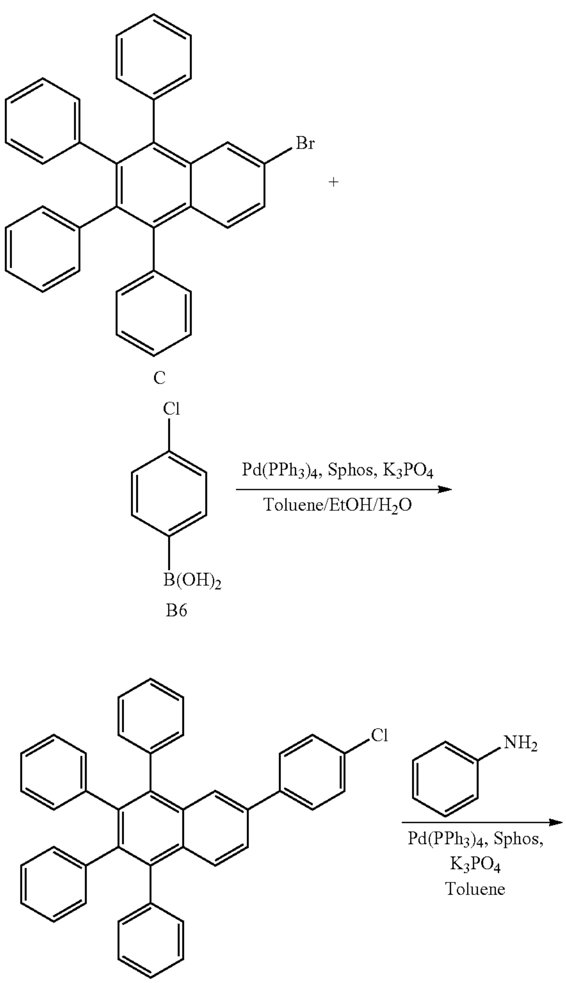

-continued

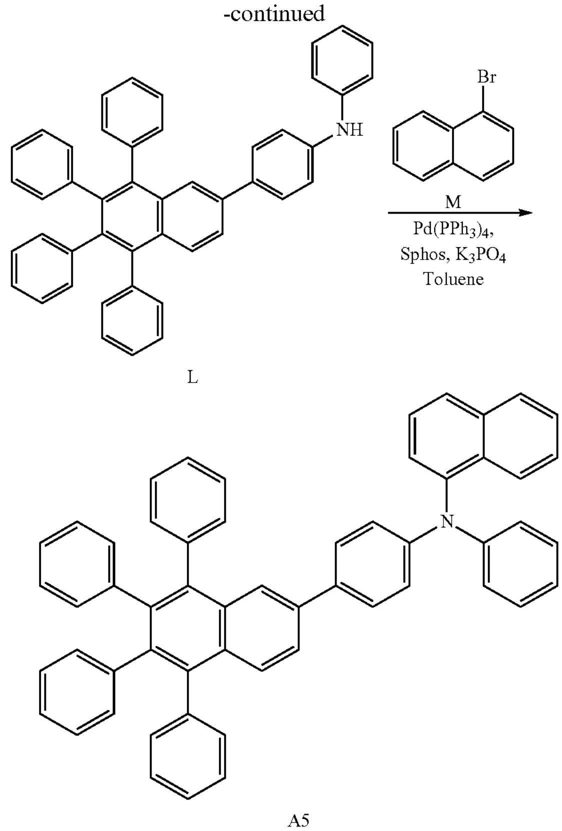

Synthesis of Intermediate Compound K

Toluene/EtOH/$H_2O$ (with a volume ratio of 4/2/1, 250 ml) was added to Intermediate Compound C (10.2 g, 20 mmol), which was used in the synthesis of Compound A4, B6 (3.1 g, 20 mmol), which was a boronic acid, and $K_3PO_4$ (8.5 g, 40 mmol), and the resultant was degassed. Under an argon atmosphere, 2-dicyclohexylphosphino-2',6'-dimethoxybiphenyl (1.6 g, 4.0 mmol) and tetrakis(triphenylphosphine) palladium (1.6 g, 1.0 mmol) were added thereto, followed by heating and stirring at about 85° C. for about 6 hours. The reaction solution was cooled to room temperature, extracted with toluene, washed with water ($H_2O$) and a brine solution, and dried with $Na_2SO_4$. The solution thus obtained was concentrated and separated by silica gel column chromatography to obtain Compound K (6.5 g, 12 mmol, yield 59%, FAB-MS m/z 542.2).

Synthesis of Intermediate Compound L

Toluene (200 ml) was added to Intermediate Compound K (7.0 g, 10 mmol) thus obtained, aniline (3.2 g, 10 mmol), and $K_3PO_4$ (4.0 g, 20 mmol), and the resultant was degassed. Under an argon atmosphere, tri-tert-butylphosphine (0.2 ml, 1 M in toluene) and tetrakis(triphenylphosphine) palladium (0.70 g, 0.61 mmol) were added thereto, followed by heating and stirring at about 85° C. for about 6 hours. The reaction solution was cooled to room temperature, extracted with toluene, washed with water ($H_2O$) and a brine solution, and dried with $Na_2SO_4$. The solution thus obtained was concentrated and separated by silica gel column chromatography to obtain Intermediate Compound L (3.7 g, 6.1 mmol, yield 61%, FAB-MS m/z 599.3).

Synthesis of Compound A5

Toluene (100 ml) was added to Intermediate Compound L (7.0 g, 5 mmol) thus obtained, Compound M (1.0 g, 10 mmol), and $K_3PO_4$ (2.0 g, 10 mmol), and the resultant was degassed. Under an argon atmosphere, tri-tert-butylphosphine (0.1 ml, 1 M in toluene) and tetrakis(triphenylphosphine) palladium (0.35 g, 0.30 mmol) were added thereto, followed by heating and stirring at about 85° C. for about 6 hours. The reaction solution was cooled to room temperature, extracted with toluene, washed with water ($H_2O$) and a brine solution, and dried with $Na_2SO_4$. The solution thus obtained was concentrated and separated by silica gel column chromatography to obtain Compound A5 (2.8 g, 3.8 mmol, yield 63%, FAB-MS m/z 725.3).

Synthesis of Compound A9

Amine Compound A9 according to an embodiment may be synthesized, for example, by the following Reaction 7.

Reaction 7

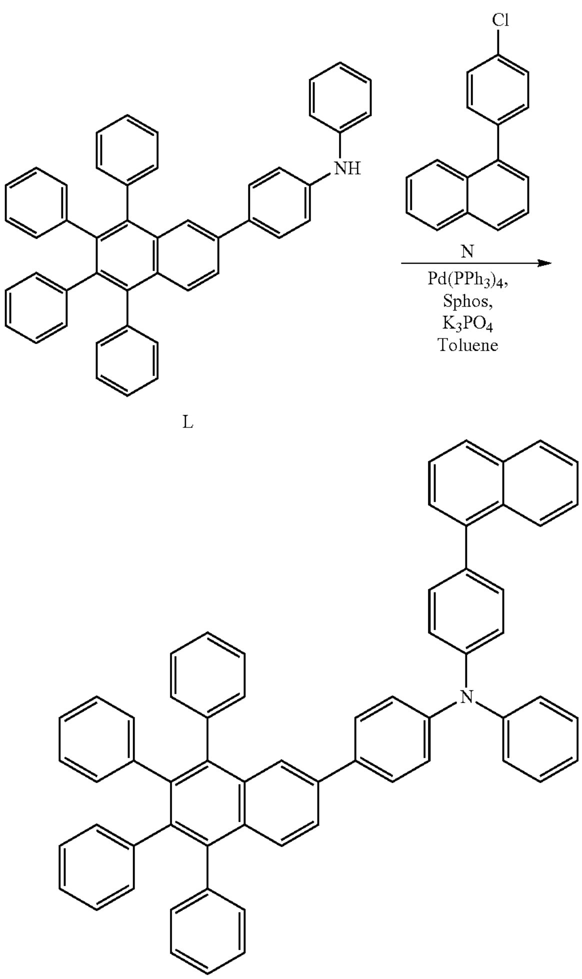

A9

Toluene (100 ml) was added to Intermediate Compound L (7.0 g, 5 mmol), which was explained in the synthesis of Compound A5, Compound N (1.2 g, 10 mmol), and $K_3PO_4$ (2.0 g, 10 mmol), and the resultant was degassed. Under an argon atmosphere, tri-tert-butylphosphine (0.1 ml, 1 M in toluene) and tetrakis(triphenylphosphine) palladium (0.35 g, 0.30 mmol) were added thereto, followed by heating and stirring at about 85° C. for about 6 hours. The reaction solution was cooled to room temperature, extracted with toluene, washed with water ($H_2O$) and a brine solution, and dried with $Na_2SO_4$. The solution thus obtained was concentrated and separated by silica gel column chromatography to obtain Compound A9 (1.8 g, 2.3 mmol, yield 45%, FAB-MS m/z 801.3).

Synthesis of Compound A21

Amine Compound A21 according to an embodiment may be synthesized, for example, by the following Reaction 8.

Reaction 8

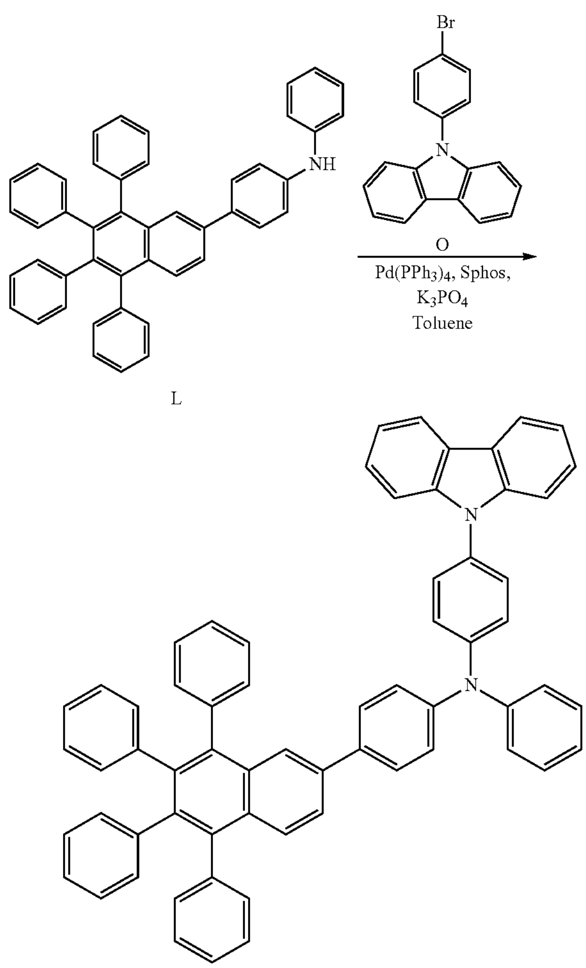

A21

Toluene (100 ml) was added to Intermediate Compound L (7.0 g, 5 mmol), which was explained in the synthesis of Compound A5, Compound O (1.6 g, 10 mmol), and $K_3PO_4$ (2.0 g, 10 mmol), and the resultant was degassed. Under an argon atmosphere, tri-tert-butylphosphine (0.1 ml, 1 M in toluene) and tetrakis(triphenylphosphine) palladium (0.35 g, 0.30 mmol) were added thereto, followed by heating and stirring at about 85° C. for about 6 hours. The reaction solution was cooled to room temperature, extracted with toluene, washed with water ($H_2O$) and a brine solution, and dried with $Na_2SO_4$. The solution thus obtained was concentrated and separated by silica gel column chromatography to obtain Compound A21 (2.9 g, 3.4 mmol, yield 68%, FAB-MS m/z 840.4).

Synthesis of Compound A19

Amine Compound A19 according to an embodiment may be synthesized, for example, by the following Reaction 9.

Reaction 9

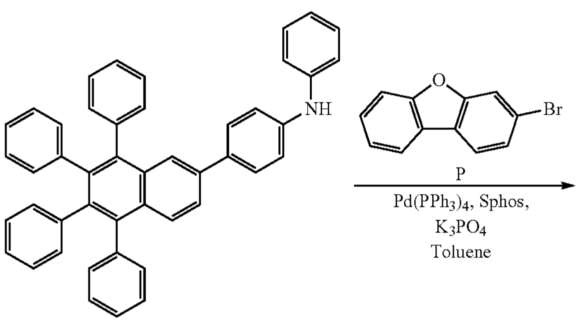

L

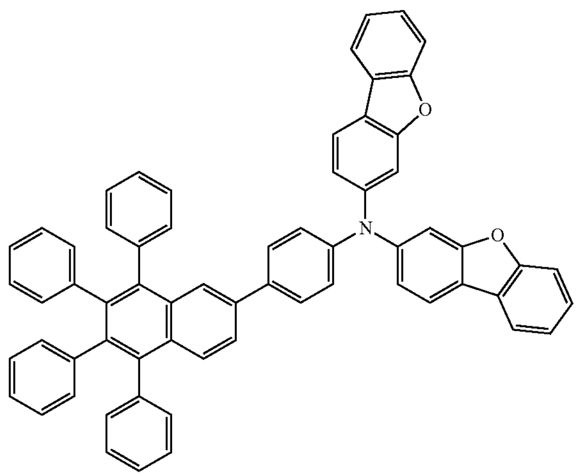

A19

Toluene (100 ml) was added to Intermediate Compound L (7.0 g, 5 mmol), which was explained in the synthesis of Compound A5, Compound P (1.2 g, 5 mmol), and $K_3PO_4$ (2.0 g, 10 mmol), and the resultant was degassed. Under an argon atmosphere, tri-tert-butylphosphine (0.1 ml, 1 M in toluene) and tetrakis(triphenylphosphine) palladium (0.35 g, 0.30 mmol) were added thereto, followed by heating and stirring at about 85° C. for about 6 hours. The reaction solution was cooled to room temperature, extracted with toluene, washed with water ($H_2O$) and a brine solution, and dried with $Na_2SO_4$. The solution thus obtained was concentrated and separated by silica gel column chromatography to obtain Compound A19 (1.9 g, 2.3 mmol, yield 45%, FAB-MS m/z 855.3).

Synthesis of Compound A38

Amine Compound A38 according to an embodiment may be synthesized, for example, by the following Reaction 10.

Reaction 10

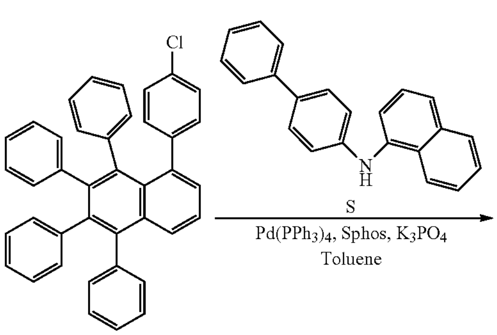

R

-continued

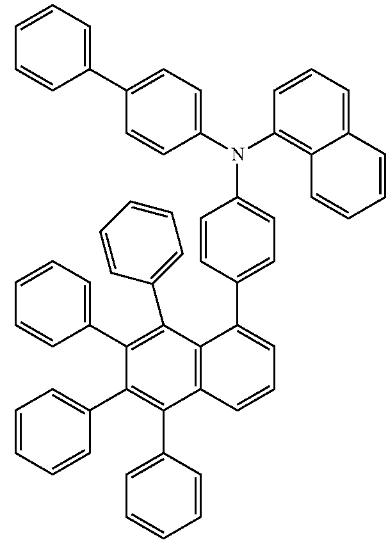

A38

Toluene (100 ml) was added to Intermediate Compound R (2.7 g, 5 mmol), Compound S (1.5 g, 5 mmol), and $K_3PO_4$ (2.0 g, 10 mmol), and the resultant was degassed. Under an argon atmosphere, tri-tert-butylphosphine (0.1 ml, 1 M in toluene) and tetrakis(triphenylphosphine) palladium (0.35 g, 0.30 mmol) were added thereto, followed by heating and stirring at about 85° C. for about 6 hours. The reaction solution was cooled to room temperature, extracted with toluene, washed with water ($H_2O$) and a brine solution, and dried with $Na_2SO_4$. The solution thus obtained was concentrated and separated by silica gel column chromatography to obtain Intermediate Compound A38 (1.6 g, 2.0 mmol, yield 40%, FAB-MS m/z 801.3).

Synthesis of Compound A58

Amine Compound A58 according to an embodiment may be synthesized, for example, by the following Reaction 11.

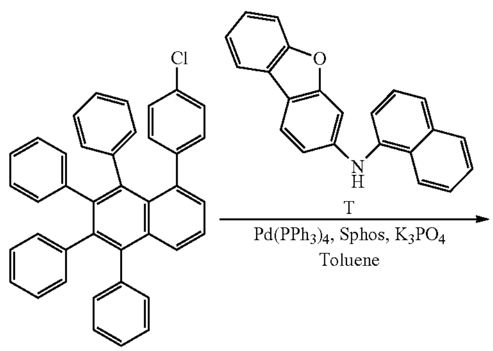

R

-continued

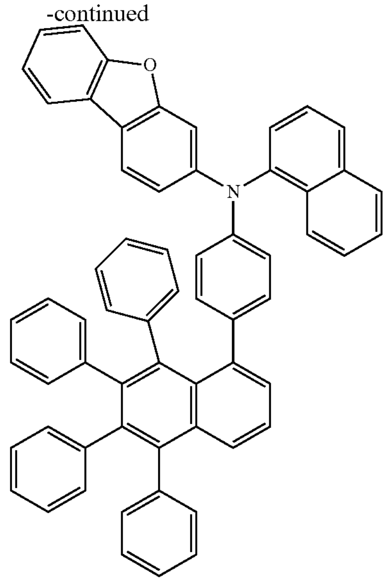

A58

Toluene (100 ml) was added to Intermediate Compound R (2.7 g, 5 mmol), Compound T (1.5 g, 5 mmol), and $K_3PO_4$ (2.0 g, 10 mmol), and the resultant was degassed. Under an argon atmosphere, tri-tert-butylphosphine (0.1 ml, 1 M in toluene) and tetrakis(triphenylphosphine) palladium (0.35 g, 0.30 mmol) were added thereto, followed by heating and stirring at about 85° C. for about 6 hours. The reaction solution was cooled to room temperature, extracted with toluene, washed with water ($H_2O$) and a brine solution, and dried with $Na_2SO_4$. The solution thus obtained was concentrated and separated by silica gel column chromatography to obtain Compound A58 (1.4 g, 1.8 mmol, yield 35%, MS m/z 815.3).

Synthesis of Compound A98

Amine Compound A98 according to an embodiment may be synthesized, for example, by the following Reaction 12.

Reaction 12

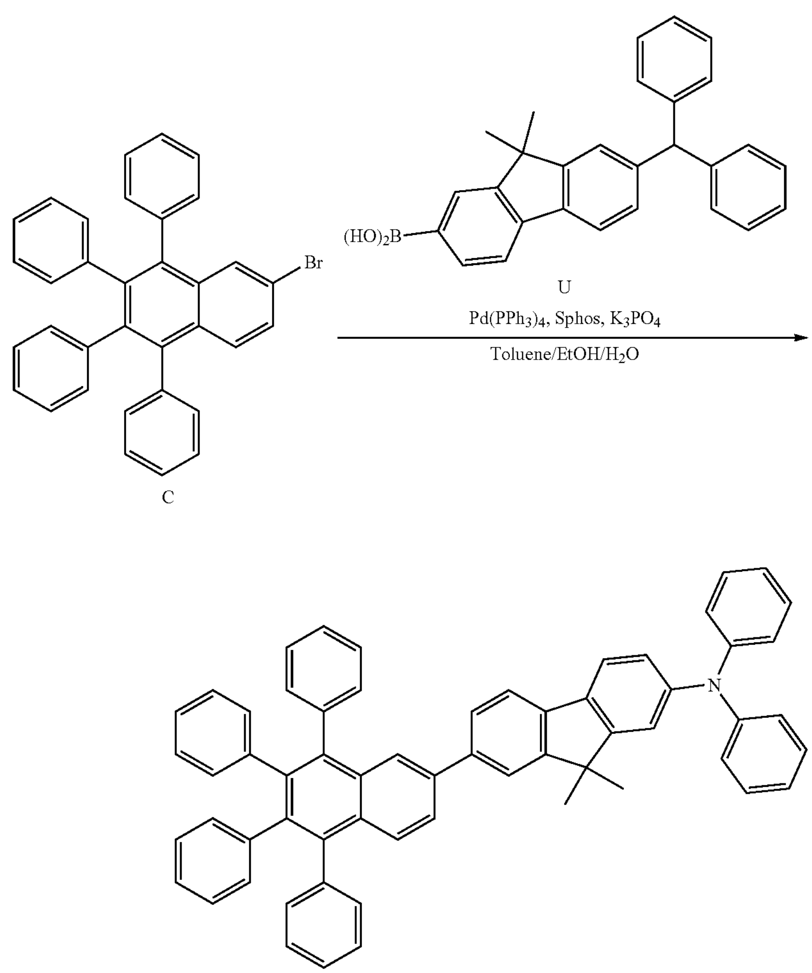

Toluene/EtOH/$H_2O$ (with a volume ratio of 4/2/1, 250 ml) was added to Intermediate Compound C (10.2 g, 20 mmol), which was used for the synthesis of Compound A4, Intermediate Compound U (8.1 g, 20 mmol), and $K_3PO_4$ (8.5 g, 40 mmol), and the resultant was degassed. Under an argon atmosphere, 2-dicyclohexylphosphino-2',6'-dimethoxybiphenyl (1.6 g, 4.0 mmol) and tetrakis(triphenylphosphine) palladium (1.6 g, 1.0 mmol) were added thereto, followed by heating and stirring at about 85° C. for about 6 hours. The reaction solution was cooled to room temperature, extracted with toluene, washed with water ($H_2O$) and a brine solution, and dried with $Na_2SO_4$. The solution thus obtained was concentrated and separated by silica gel column chromatography to obtain Compound A98 (6.3 g, 8.0 mmol, yield 40%, MS m/z 791.4).

2. Manufacture and Evaluation of Organic Electroluminescence Device Including an Amine Compound Manufacture of Organic Electroluminescence Devices Organic electroluminescence devices of exemplary embodiments including the amine compounds of exemplary embodiments in a hole transport layer were manufactured by a method described below. Organic electroluminescence devices of Examples 1 to 12 were manufactured using the amine compounds of Compound A4, Compound A5, Compound A9, Compound A153, Compound A21, Compound A19, Compound A38, Compound A58, Compound A97, Compound A77, Compound A96, and Compound A157, respectively, as materials for a hole transport layer. In Comparative Examples 1 to 6, organic electroluminescence devices were manufactured using Comparative Compounds R1 to R6 as the materials for a hole transport layer, respectively.

Compounds used in the hole transport layer in Examples 1 to 4 and Comparative Examples 1 to 4 are shown below.

TABLE 1

Compound A4

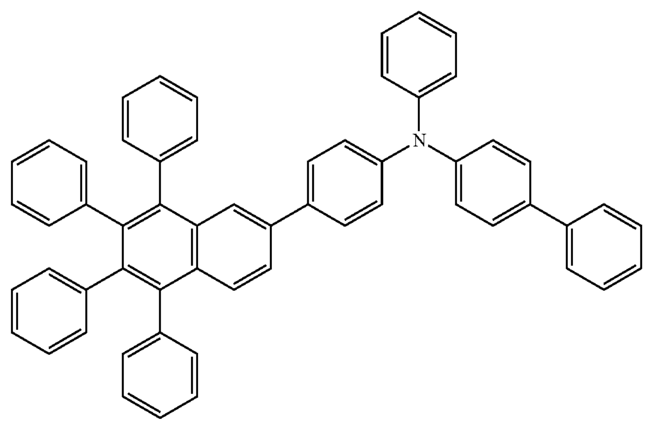

A4

Compound A5

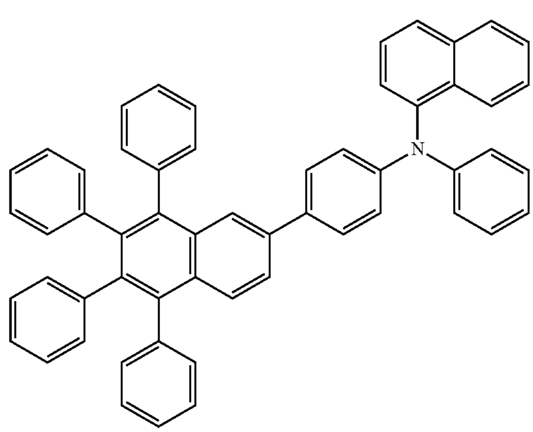

A5

TABLE 1-continued
Compound A9
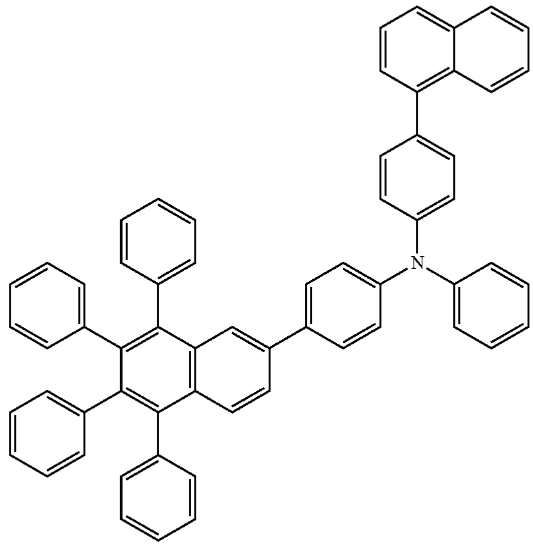
A9
Compound A153
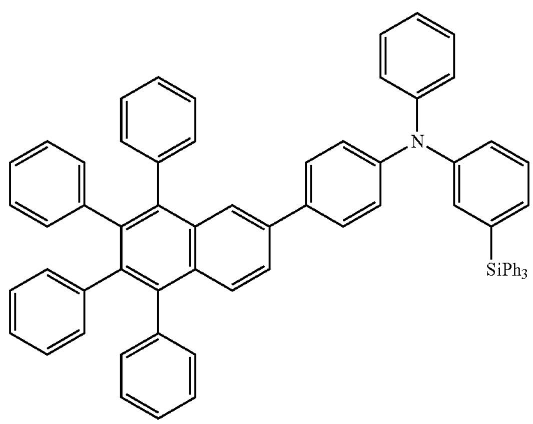
A153
Compound A21
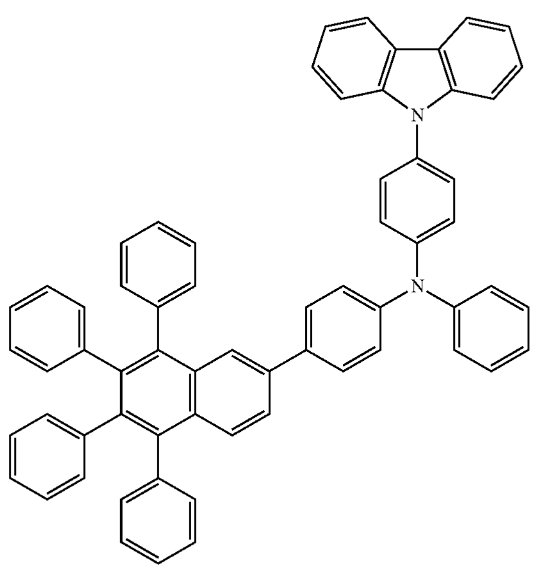
A21

TABLE 1-continued
Compound A19
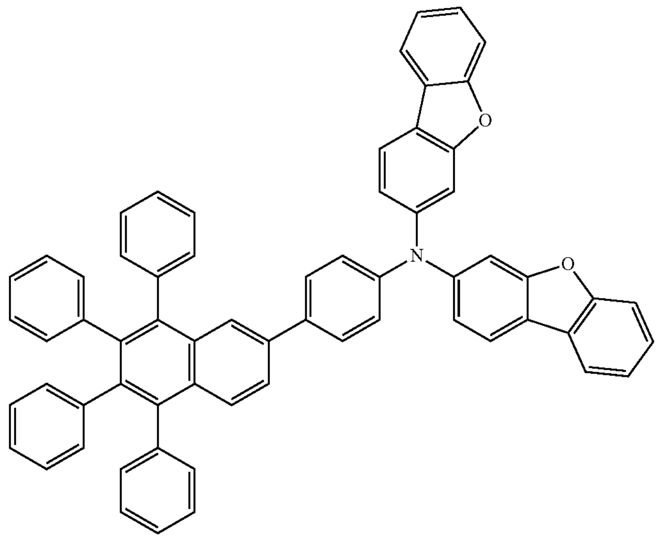
A19
Compound A38
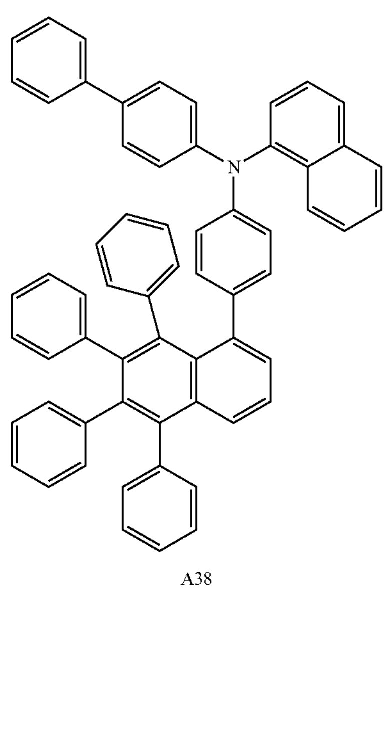
A38

TABLE 1-continued
Compound A58
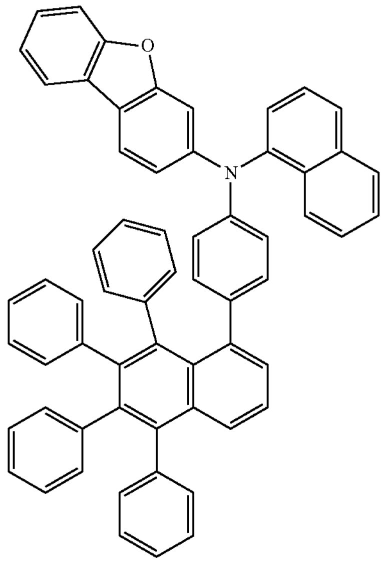
A58
Compound A97
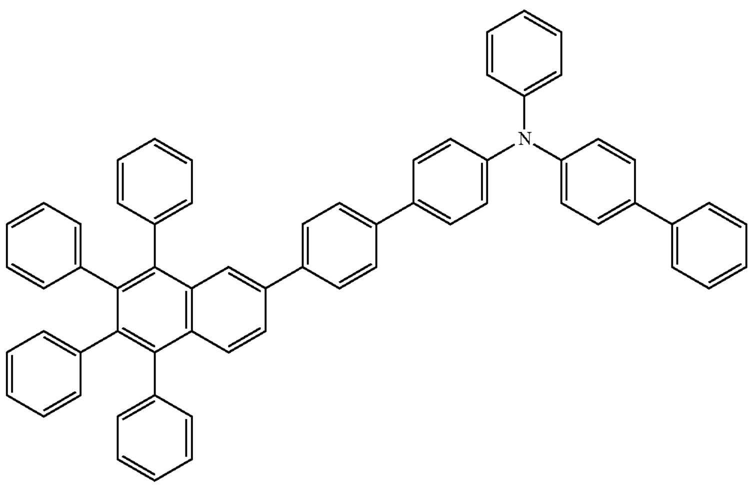
A97
Compound A77
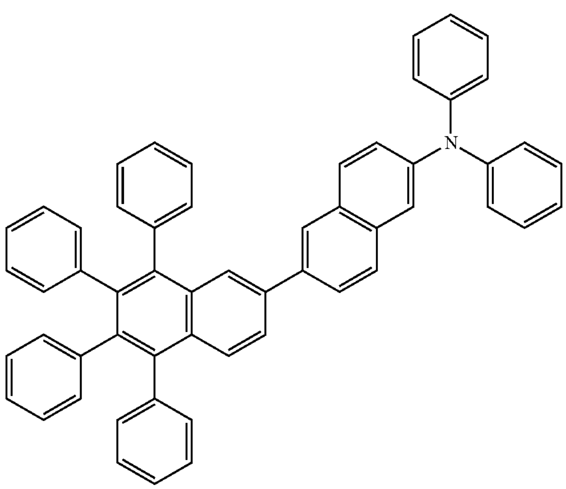
A77

TABLE 1-continued
Compound A98
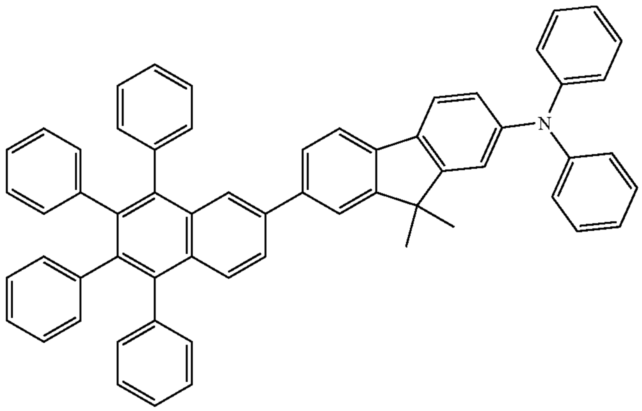
A98
Compound A157
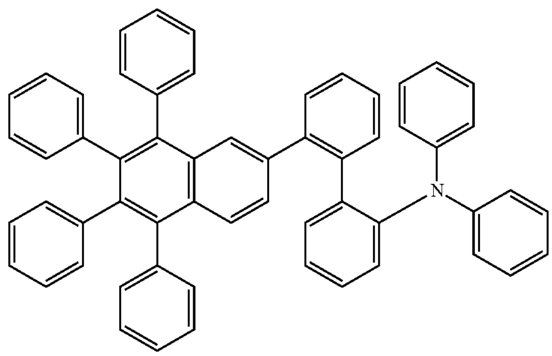
A157
Comparative Compound R1
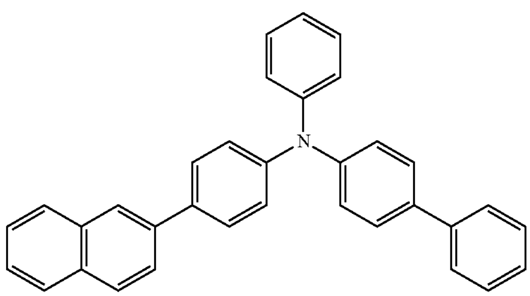
R1
Comparative Compound R2
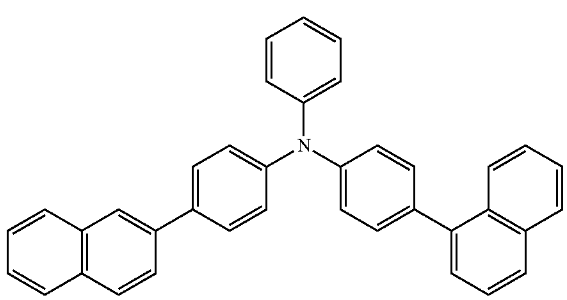
R2

TABLE 1-continued
Comparative Compound R3
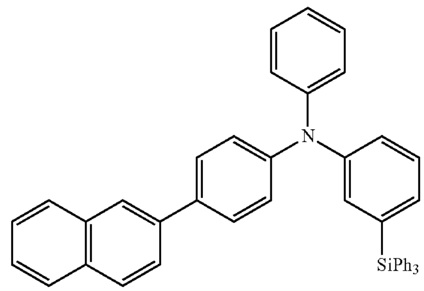
R3
Comparative Compound R4
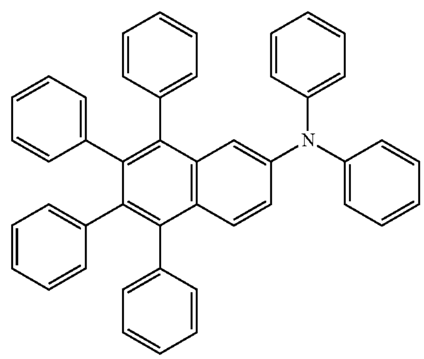
R4
Comparative Compound R5
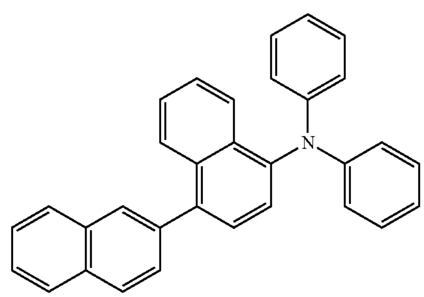
R5
Comparative Compound R6
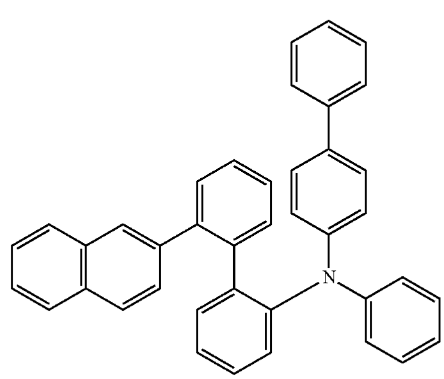
R6

On a glass substrate, ITO was patterned to a thickness of about 1,500 Å and washed with ultra-pure water, and a UV ozone treatment was conducted for about 10 minutes. Then, 2-TNATA was deposited to a thickness of about 600 Å to form a hole injection layer. Then, one selected from the Example Compounds and the Comparative Compounds was deposited to a thickness of about 300 Å to form a hole transport layer.

Then, an emission layer was formed using ADN doped with 3% TBP to a thickness of about 250 Å. Then, an electron transport layer was formed by depositing $Alq_3$ to a thickness of about 250 Å and an electron injection layer was formed by depositing LiF to a thickness of about 10 Å.

Then, a second electrode was formed by providing Al to a thickness of about 1,000 Å.

In an embodiment, a hole injection layer, a hole transport layer, an emission layer, an electron transport layer, an electron injection layer and a second electrode were formed by using a vacuum deposition apparatus.

Evaluation of Properties of Organic Electroluminescence Device

The evaluation results of the organic electroluminescence devices according to Example 1 to Example 12, and Comparative Example 1 to Comparative Example 6 are shown in Table 2. In Table 2, the device efficiency and device life of the organic electroluminescence devices thus manufactured are compared and shown. The evaluation results on the device efficiency and the device life are shown as relative values with respect to 100% of the device efficiency and the device life of Example 1.

In the evaluation results of the properties of the Examples and the Comparative Examples in Table 2, the device efficiency represents efficiency values at a current density of 10 $mA/cm^2$, and the device life represents half life at 1.0 $mA/cm^2$.

The current density and device efficiency of the organic electroluminescence devices of the Examples and the Comparative Examples were measured using a 2400 series Source Meter of Keithley Instrument Co., a luminous brightness measurement apparatus, CS-200 of Konica Minolta Co., and PC Program LabVIEW 2.0 for measurement of National Instrument Co., in Japan, in a dark room.

TABLE 2

| Device manufacturing example | Hole transport layer material | Device efficiency | Device life |
|---|---|---|---|
| Example 1 | Example Compound A4 | 100% | 100% |
| Example 2 | Example Compound A5 | 105% | 101% |
| Example 3 | Example Compound A9 | 101% | 111% |
| Example 4 | Example Compound A153 | 114% | 102% |
| Example 5 | Example Compound A21 | 105% | 99% |
| Example 6 | Example Compound A19 | 113% | 104% |
| Example 7 | Example Compound A38 | 102% | 90% |
| Example 8 | Example Compound A58 | 104% | 98% |
| Example 9 | Example Compound A97 | 91% | 101% |
| Example 10 | Example Compound A77 | 105% | 104% |
| Example 11 | Example Compound A98 | 111% | 104% |
| Example 12 | Example Compound A157 | 91% | 91% |

TABLE 2-continued

| Device manufacturing example | Hole transport layer material | Device efficiency | Device life |
|---|---|---|---|
| Comparative Example 1 | Comparative Compound R1 | 78% | 78% |
| Comparative Example 2 | Comparative Compound R2 | 69% | 80% |
| Comparative Example 3 | Comparative Compound R3 | 76% | 74% |
| Comparative Example 4 | Comparative Compound R4 | 80% | 73% |
| Comparative Example 5 | Comparative Compound R5 | 74% | 82% |
| Comparative Example 6 | Comparative Compound R6 | 69% | 75% |

Referring to the results of Table 2, it was found that the organic electroluminescence devices of the Examples, which used the amine compound of an embodiment as a hole transport layer material, showed excellent device efficiency and good device life characteristics. For example, it was found that the organic electroluminescence devices of Examples 1 to 12 showed higher emission efficiency and long life properties when compared with Comparative Examples 1 to 6.

All the amine compounds used in Example 1 to Example 6 have a structure in which the nitrogen atom of a tertiary amine derivative and the naphthalene part of a tetraphenyl naphthalene derivative are connected via a phenylene group as a linker. The amine compounds used in Comparative Example 1 to Comparative Example 3 include an unsubstituted naphthalene derivative and a tertiary amine derivative, and are different from the amine compounds of embodiments used in Example 1 to Example 6. When comparing the device properties of Example 1 to Example 6 with the device properties of Comparative Example 1 to Comparative Example 3, markedly improved device efficiency and life properties were found to be obtained in Example 1 to Example 6 when compared with Comparative Example 1 to Comparative Example 3. For example, referring to the results of Example 1 to Example 6 and Comparative Example 1 to Comparative Example 3, the steric effects due to the tetraphenyl naphthalene derivative are thought to improve the device efficiency and life characteristics, but the present disclosure is not limited by any particular mechanism or theory.

In addition, Example 3 and Comparative Example 2, and Example 4 and Comparative Example 3, respectively, have the same linker and amine derivative part, and have a difference in using an unsubstituted naphthalene instead of the tetraphenyl naphthalene. For example, from the comparison of the device properties of Example 3 and Comparative Example 2, or the comparison of the device properties of Example 4 and Comparative Example 3, the influence of steric effects due to the tetraphenyl naphthalene derivative may be more noticeably secured.

In addition, in Example 1 to Example 6, the combination of $Ar_1$ and $Ar_2$ in a tertiary amine derivative ( 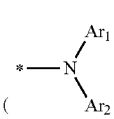 )

is changed, and it may be found that if the kind of an aryl group or a heteroaryl group which was substituted at the nitrogen atom of the amine derivative was changed, the Examples showed excellent device properties due to the steric effects and electronic effects of the amine compound of an embodiment.

Example 7 and Example 8 correspond to cases having different bonding position of a linker to which a naphthalene part is bonded with respect to Example 1 to Example 6. As in Example 1 to Example 6, in Example 7 and Example 8, which have different bonding positions of the amine derivative bonded via a linker, better emission efficiency and life properties were attained, as compared to the Comparative Examples.

In addition, when compared with Example 1 to Example 6, Example 9 to Example 12 correspond to cases having a different kind of the linker. For example, Example 9 and Example 12 used an amine compound having a divalent biphenyl group as a linker, Example 10 used an amine compound having a divalent naphthylene group as a linker, and Example 11 used an amine compound having a divalent dimethylfluorene group as a linker. For example, referring to the evaluation results of Example 9 to Example 12, better device properties were attained for the cases where the kind of the linker was changed than in Comparative Example 1 to Comparative Example 6.

The amine compound used in Comparative Example 4 included both the tetraphenyl naphthalene derivative and the tertiary amine derivative, but the nitrogen atom of the tertiary amine derivative and the naphthalene part of the tetraphenyl naphthalene derivative were directly bonded, and was different from the amine compounds of the Examples in which the bonding was accomplished via a linker. Accordingly, the organic electroluminescence devices of Example 1 to Example 12 were found to show excellent emission efficiency and life characteristics when compared with the organic electroluminescence device of Comparative Example 4.

The excellent device properties shown in the Examples are thought to be obtained due to the electronic delocalization effect if the nitrogen atom of the tertiary amine derivative and the naphthalene part are combined via a linker as well as the steric factors by four phenyl groups which are present in a tetraphenyl naphthalene derivative skeleton, but the present disclosure is not limited by any particular mechanism or theory. For example, the device efficiency due to the delocalization effect of electrons was improved, and the orientation of the amine compounds used in the Examples was improved in a device due to the skeleton of the tetraphenyl naphthalene derivative and the steric properties of the linker, thereby improving the life of the organic electroluminescence devices of the Examples. In comparison, Comparative Example 4 in which the nitrogen atom of the tertiary amine derivative and the naphthalene part of the tetraphenyl naphthalene derivative were connected via a single bond was found to show markedly decreased life when compared with the Examples.

Accordingly, the amine compound of an embodiment used in the Examples used a ring compound other than a single bond as a linker and introduced a structure obtained by bonding the tetraphenyl naphthalene derivative and the tertiary amine derivative, and if used in an organic electroluminescence device, marked increase of the life of a device may be achieved. For example, when comparing Comparative Example 4 with Example 1, Comparative Example 4 showed somewhat improved results of device efficiency when compared with other Comparative Examples, but showed low emission efficiency and short life properties when compared with the amine compounds used in the Examples. When compared with the amine compounds used in the Examples, it is thought that effects due to a linker connecting the tetraphenyl naphthalene derivative and the amine derivative were decreased and steric effect and charge transfer properties were deteriorated, but the present disclosure is not limited by any particular mechanism or theory.

For example, when comparing the results of the Examples with the Comparative Examples in Table 2, the amine compounds used in the Examples are expected to have increased charge transport properties and improved orientation properties due to the linker connecting the nitrogen atom of the tertiary amine derivative and the naphthalene of the tetraphenyl naphthalene derivative and the electronic and spatial effects of four phenyl groups introduced to the naphthalene part. Accordingly, the organic electroluminescence devices of the Examples are thought to show excellent device efficiency and long life characteristics.

For example, by including the amine compound of an embodiment in a hole transport layer which is laminated at a position adjacent to the emission layer, the orientation and charge transfer properties in the hole transport layer may be improved, and the device characteristics of the organic electroluminescence device of an embodiment may be further improved.

The amine compound of an embodiment includes a tetraphenyl naphthalene part and an amine part having an aryl group or a heteroaryl group, and combines the tetraphenyl naphthalene part and the amine part via an arylene ring or a heteroarylene ring, thereby showing excellent hole injection and hole transport properties. For example, the amine compound of an embodiment has excellent charge transfer properties due to the steric effects due to four phenyl groups in the tetraphenyl naphthalene part and the charge transfer effects by naphthalene, and may show improved charge injection properties and improved charge transport properties. In addition, the amine compound of an embodiment is used as a material of an organic layer of an organic electroluminescence device, and the device efficiency and the device life of the organic electroluminescence device of an embodiment may be improved.

The amine compound of an embodiment may improve the emission efficiency and device life of an organic electroluminescence device.

The organic electroluminescence device of an embodiment includes the amine compound of an embodiment in a hole transport region and may accomplish high efficiency and long life characteristics.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all sub-ranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the exemplary embodiments of the present disclosure have been described, it is understood that the present disclosure should not be limited to these exemplary embodiments but various changes and modifications can be made by one ordinary skilled in the art within the spirit and scope of the present invention as defined by the appended claims, and equivalents thereof.

What is claimed is:

1. An organic electroluminescence device, comprising:

a first electrode;

a second electrode on the first electrode; and a plurality of organic layers between the first electrode and the second electrode, wherein at least one organic layer among the organic layers comprises an amine compound, wherein the amine compound comprises a tetraphenyl naphthalene derivative, a sole tertiary amine derivative, and a linker comprising a hydrocarbon ring or a heterocycle connecting a naphthalene part of the tetraphenyl naphthalene derivative and a nitrogen atom of the tertiary amine derivative.

2. The organic electroluminescence device of claim 1, wherein the organic layers comprise:

an emission layer; and a hole transport region between the first electrode and the emission layer, wherein the hole transport region comprises the amine compound.

3. The organic electroluminescence device of claim 1, wherein the organic layers comprise:

an emission layer;

a hole injection layer between the first electrode and the emission layer; and a hole transport layer between the hole injection layer and the emission layer, wherein the hole transport layer comprises the amine compound.

4. The organic electroluminescence device of claim 1, wherein the tertiary amine derivative comprises a substituted or unsubstituted aryl group of 6 to 50 carbon atoms for forming a ring, or a substituted or unsubstituted heteroaryl group of 2 to 50 carbon atoms for forming a ring.

5. The organic electroluminescence device of claim 1, wherein the linker is a substituted or unsubstituted phenylene group, a substituted or unsubstituted naphthylene group, a substituted or unsubstituted divalent biphenyl group, a substituted or unsubstituted divalent fluorene group, a substituted or unsubstituted divalent phenanthrene group, a substituted or unsubstituted divalent dibenzofuran group, or a substituted or unsubstituted divalent dibenzothiophene group.

6. The organic electroluminescence device of claim 1, wherein the amine compound is represented by the following Formula 1:

Formula 1

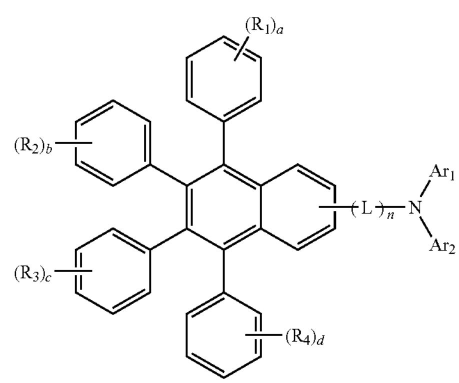

in Formula 1, $R_1$ to $R_4$ are each independently a hydrogen atom, a deuterium atom, a halogen atom, a cyano group, a substituted or unsubstituted silyl group, a substituted or unsubstituted alkyl group of 1 to 30 carbon atoms, a substituted or unsubstituted alkoxy group of 1 to 30 carbon atoms, a substituted or unsubstituted aryloxy group of 6 to 30 carbon atoms, a substituted or unsubstituted alkylthio group of 1 to 30 carbon atoms, a substituted or unsubstituted arylthio group of 6 to 30 carbon atoms, a substituted or unsubstituted aryl group of 6 to 50 carbon atoms for forming a ring, or a substituted or unsubstituted heteroaryl group of 2 to 50 carbon atoms for forming a ring, a to d are each independently an integer of 0 to 5, L is a substituted or unsubstituted arylene group of 6 to 50 carbon atoms for forming a ring, or a substituted or unsubstituted heteroarylene group of 2 to 50 carbon atoms for forming a ring, n is an integer of 1 to 3, $Ar_1$ and $Ar_2$ are each independently a substituted or unsubstituted aryl group of 6 to 50 carbon atoms for forming a ring, or a substituted or unsubstituted heteroaryl group of 2 to 50 carbon atoms for forming a ring.

7. The organic electroluminescence device of claim 6, wherein Formula 1 is represented by the following Formula 1-1 or Formula 1-2:

Formula 1-1

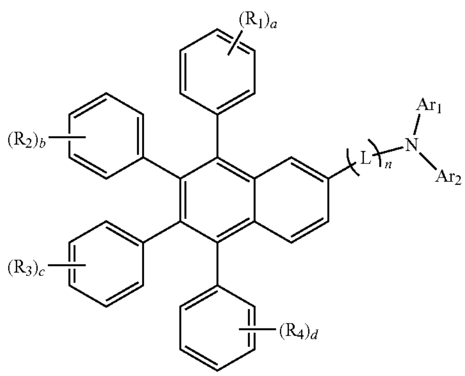

Formula 1-2

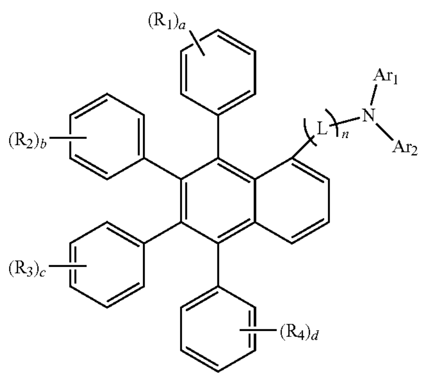

wherein, in Formula 1-1 and Formula 1-2, $R_1$ to $R_4$, a to d, L, n, $Ar_1$, and $Ar_2$ are the same as defined with respect to Formula 1.

8. The organic electroluminescence device of claim 6, wherein L is represented by any one selected from the following Formulae L-1 to L-7:

L-1

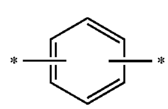

L-2

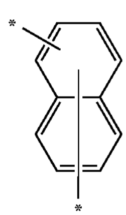

-continued

L-3

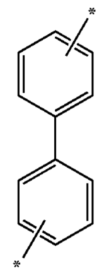

L-4

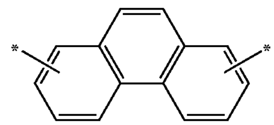

L-5

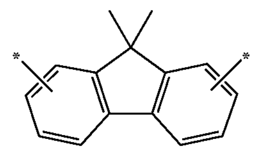

L-6

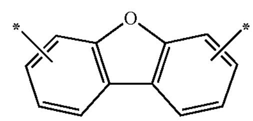

L-7

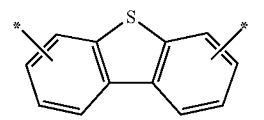

9. The organic electroluminescence device of claim 6, wherein a to d are each 0.

10. The organic electroluminescence device of claim 2, wherein the emission layer comprises an anthracene derivative represented by the following Formula 2:

Formula 2

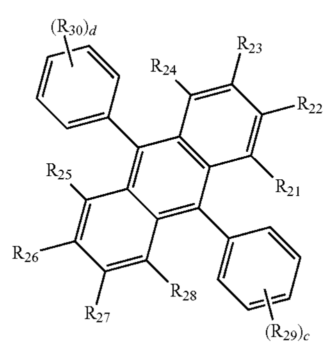

wherein, in Formula 2, $R_{21}$ to $R_{30}$ are each independently a hydrogen atom, a deuterium atom, a halogen atom, a substituted or unsubstituted silyl group, a substituted or unsubstituted alkyl group of 1 to 10 carbon atoms, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring, and c and d are each independently an integer of 0 to 5.

11. The organic electroluminescence device of claim 1, wherein the amine compound comprises at least one selected from compounds represented in the following Compound Group 1:
Compound Group 1
A1
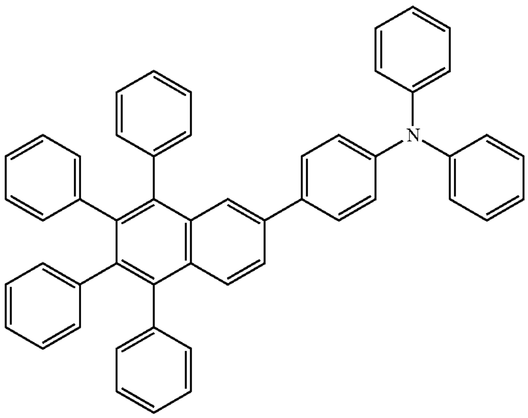
A2
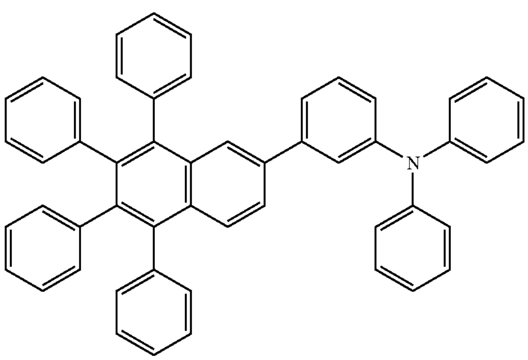
A3
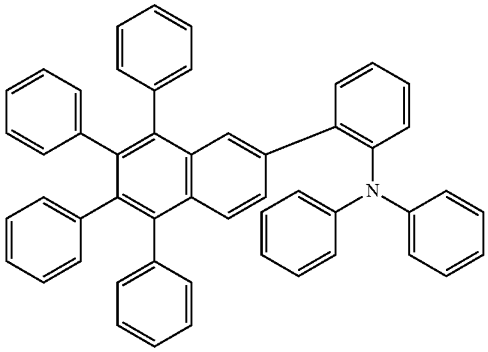
-continued
A4
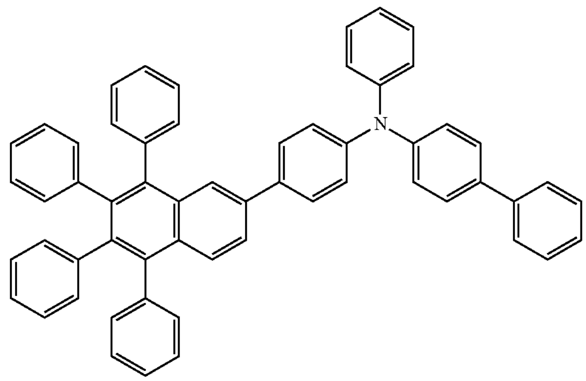
A5
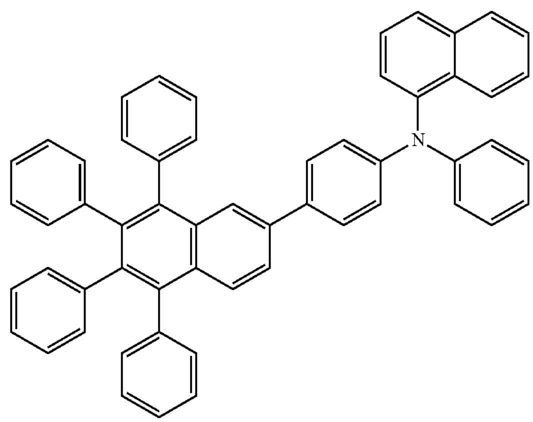
A6
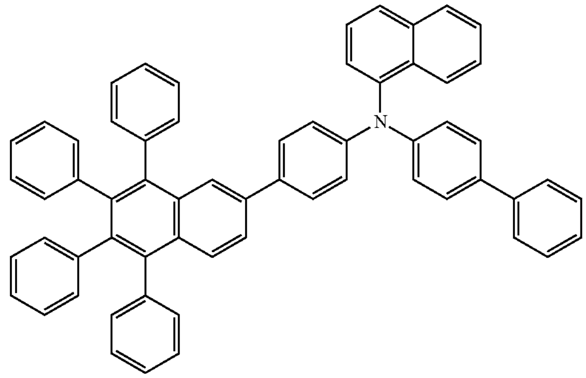

-continued
A7
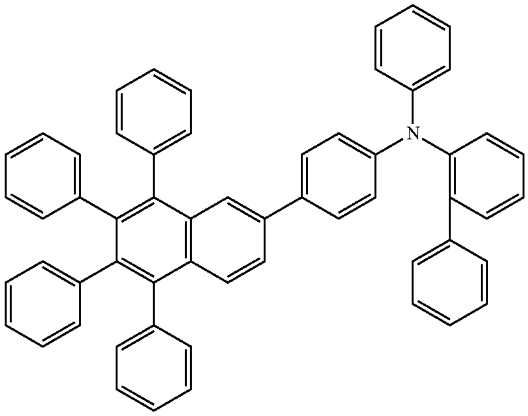
A8
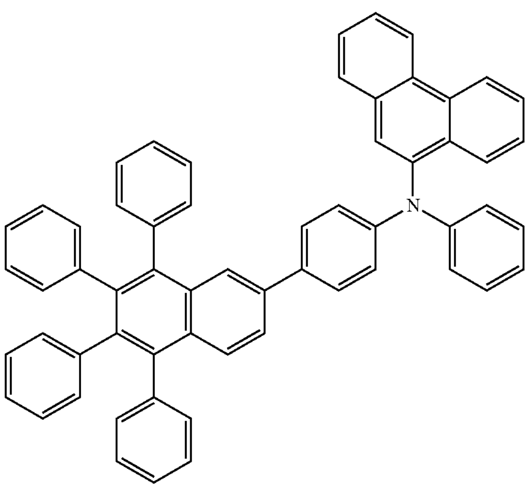
A9
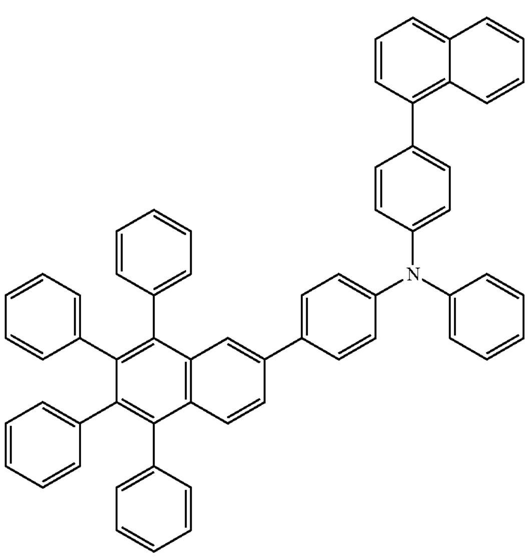
-continued
A10
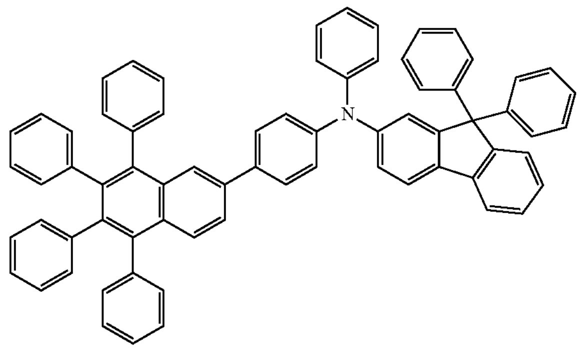
A11
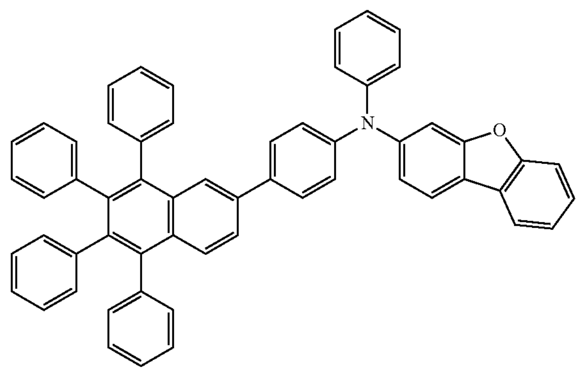
A12
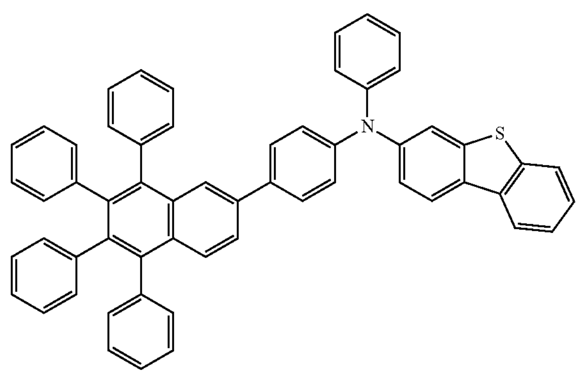
A13
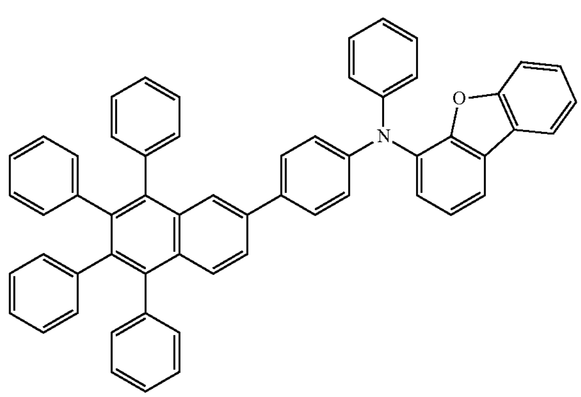

A14
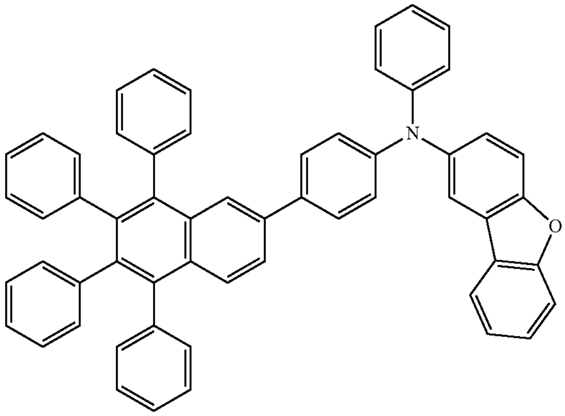
A15
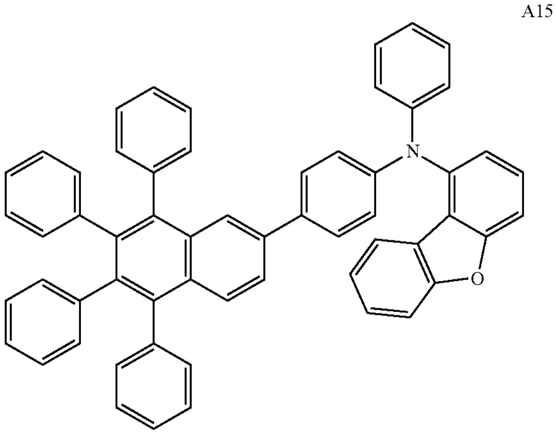
A16
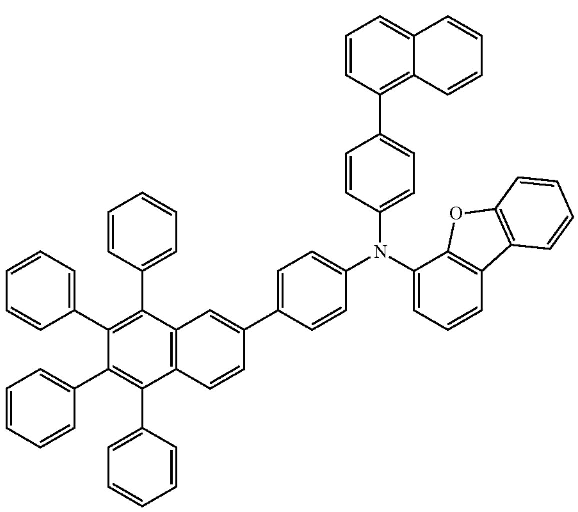
A17
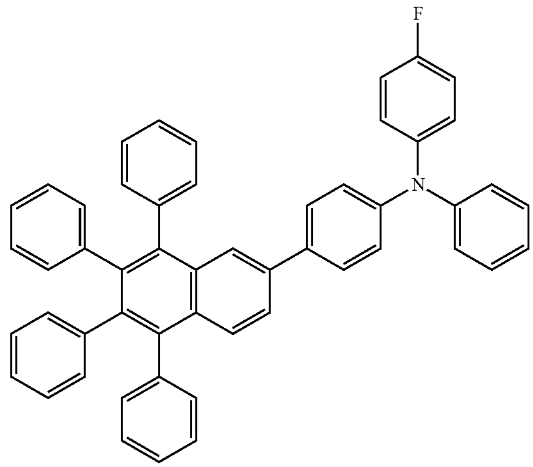
A18
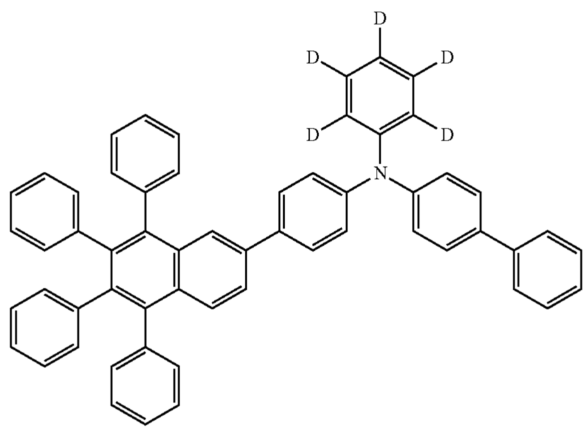
A19
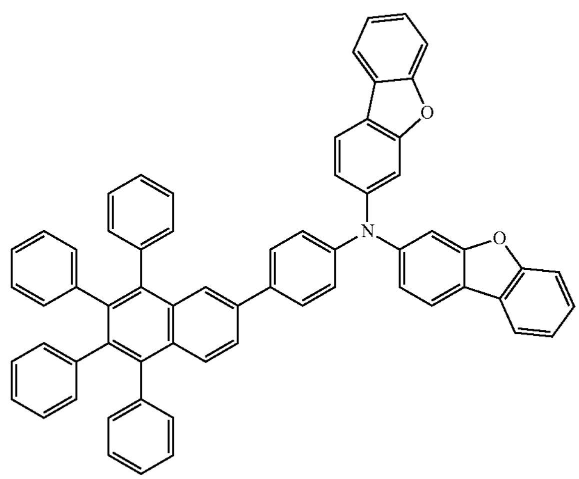

-continued
A20
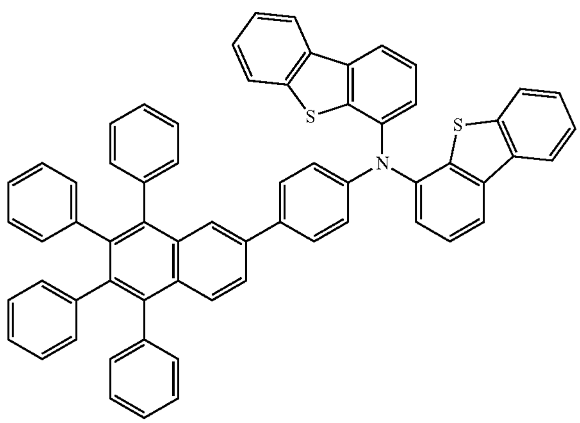
A21
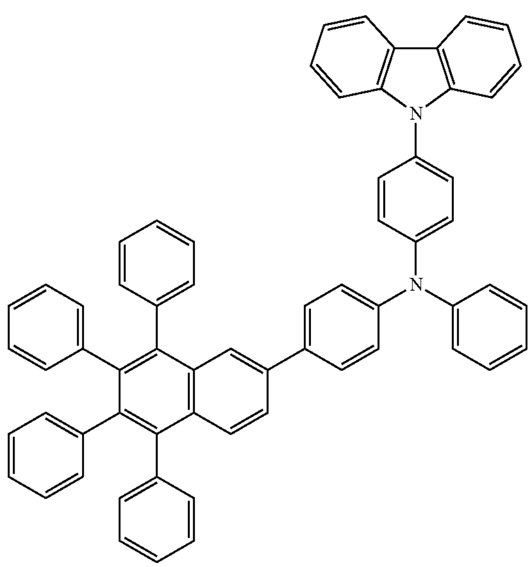
A22
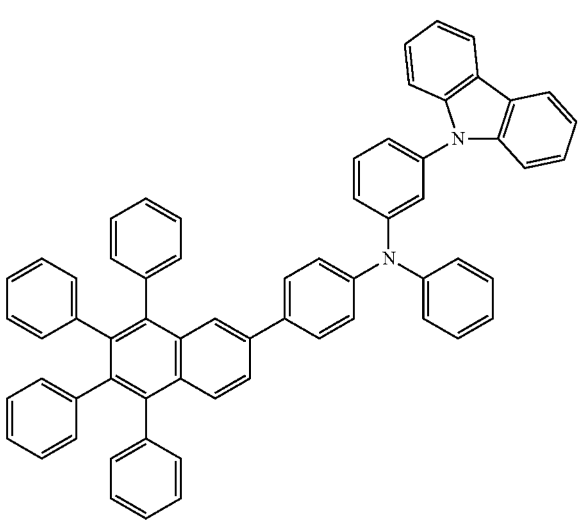
-continued
A23
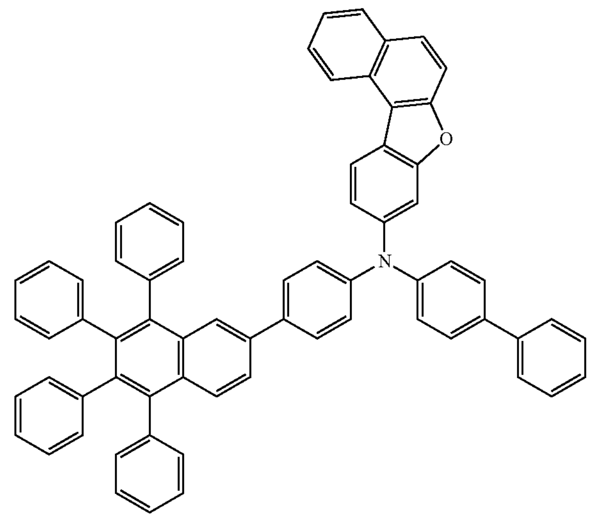
A24
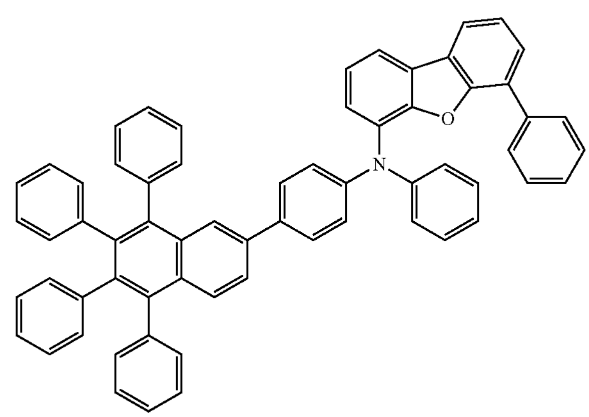
A25
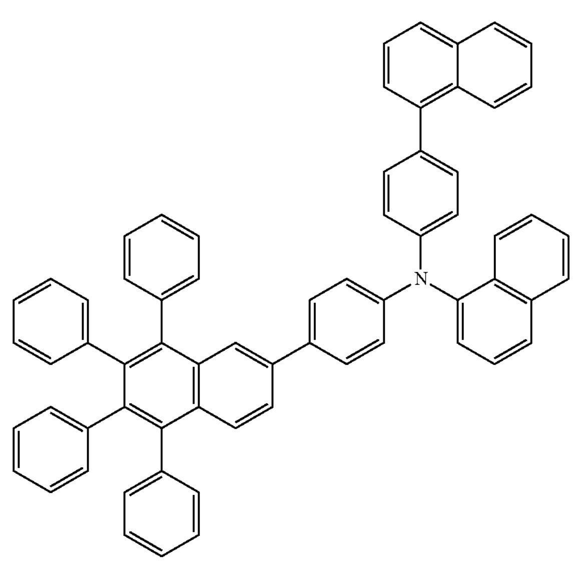

-continued
A26
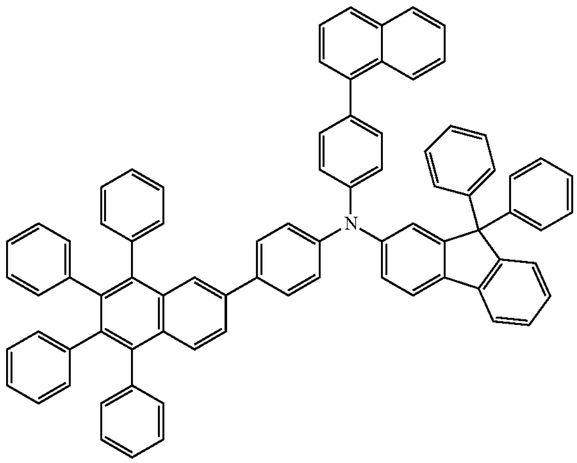
A27
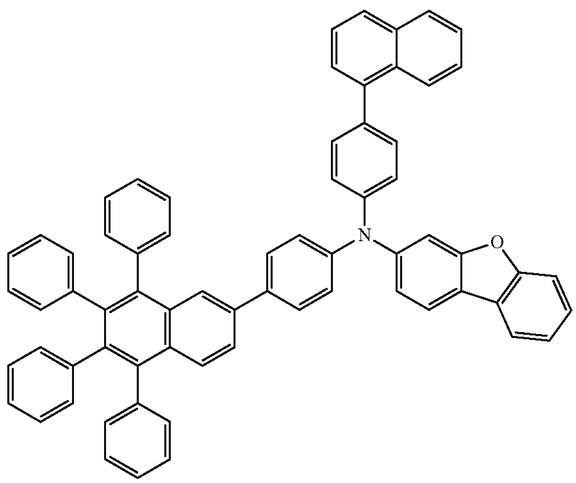
A28
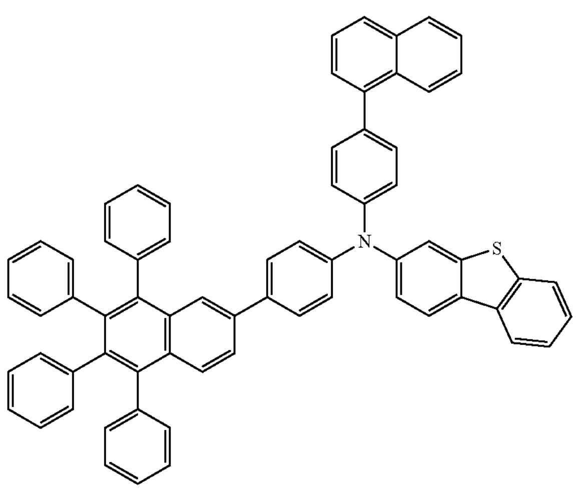
-continued
A29
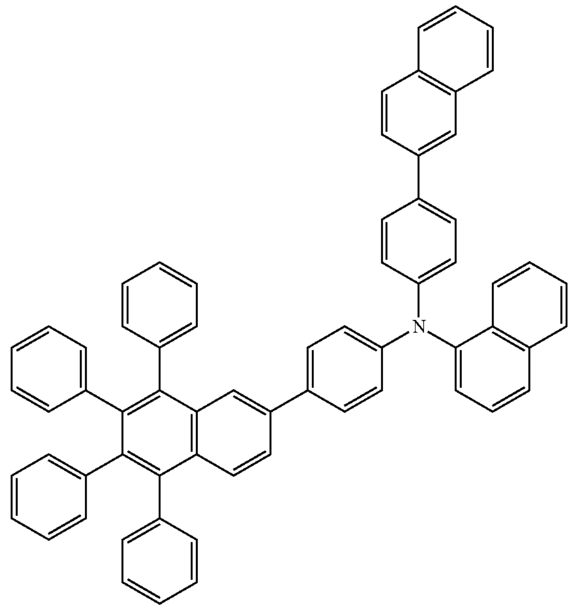
A30
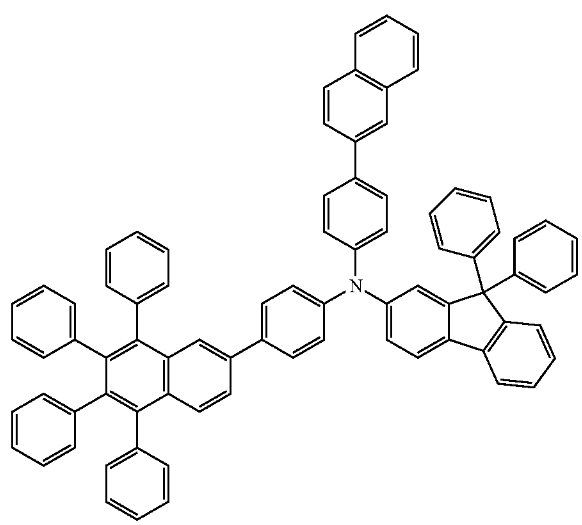

A31
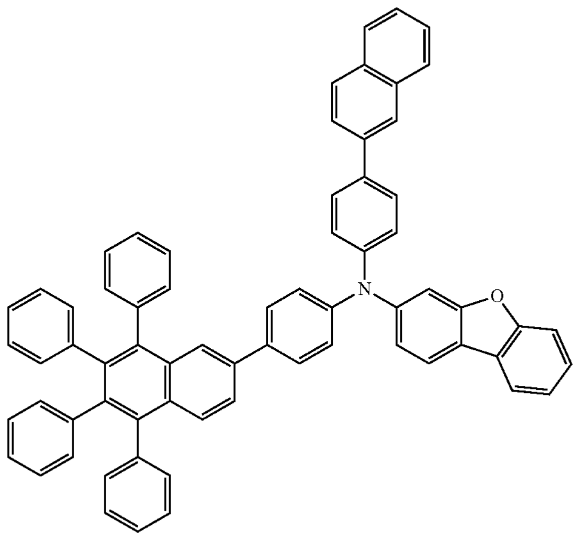
A32
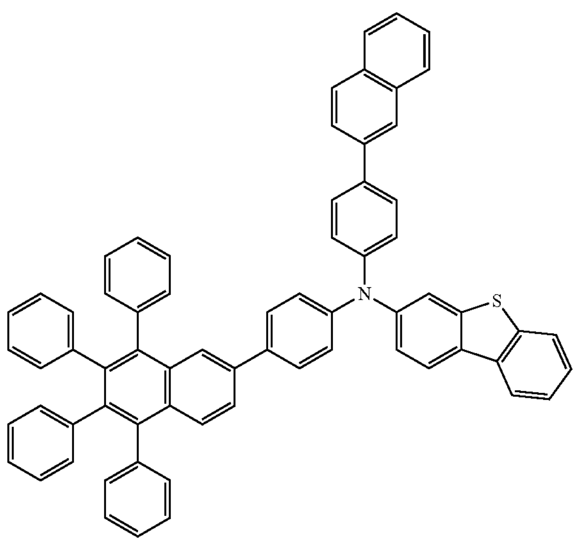
A33
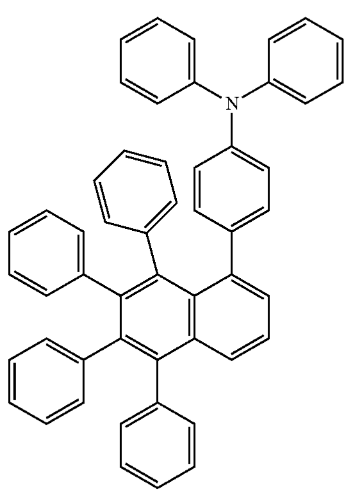
A34
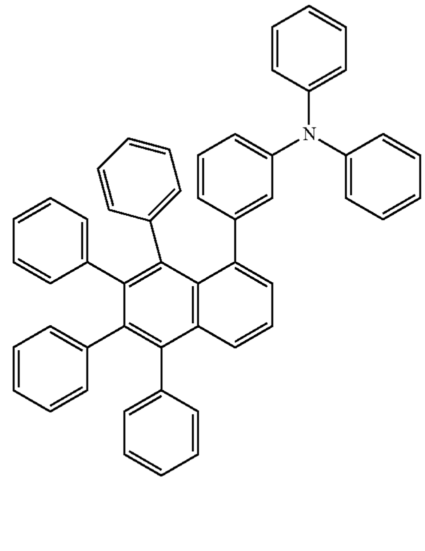
A35
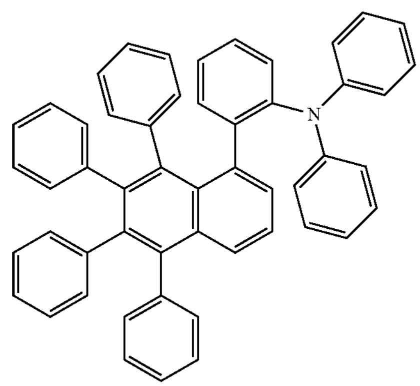
A36
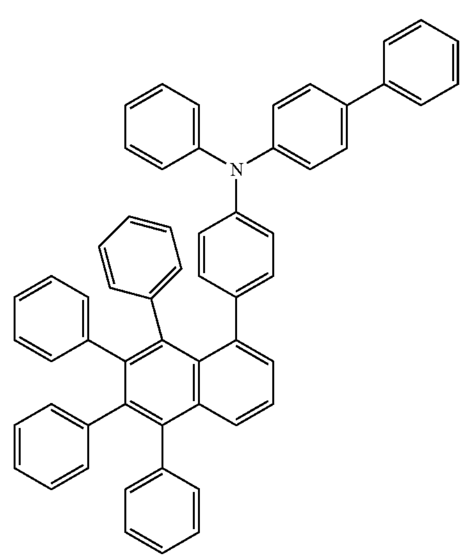

-continued
A37
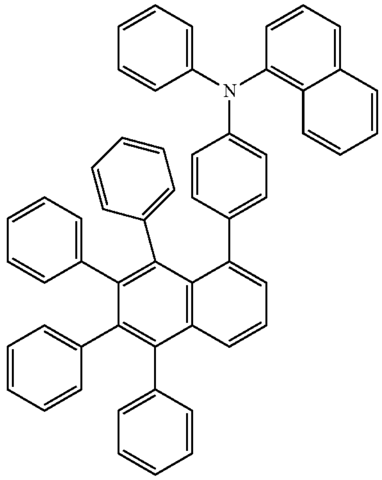
A38
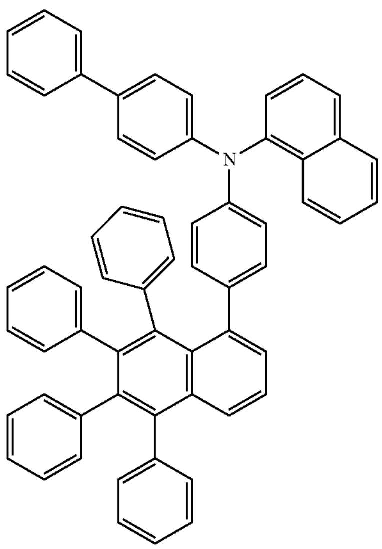
A39
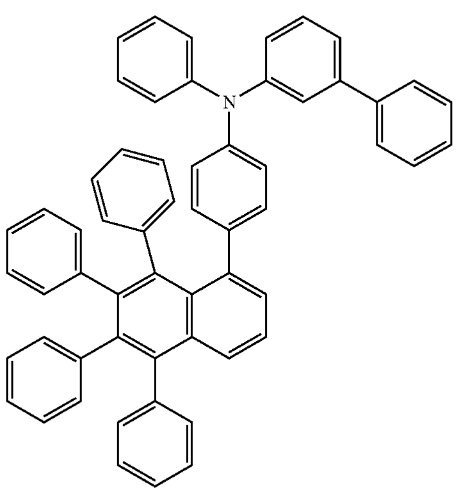
-continued
A40
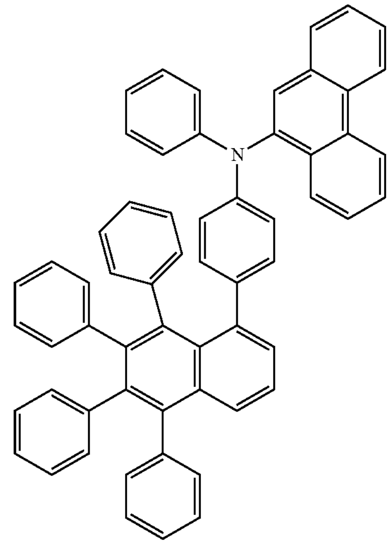
A41
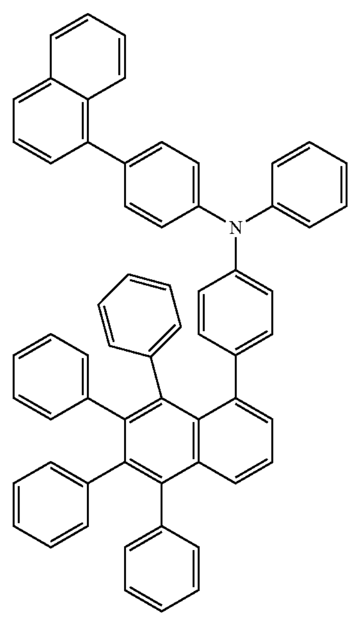

-continued
A42
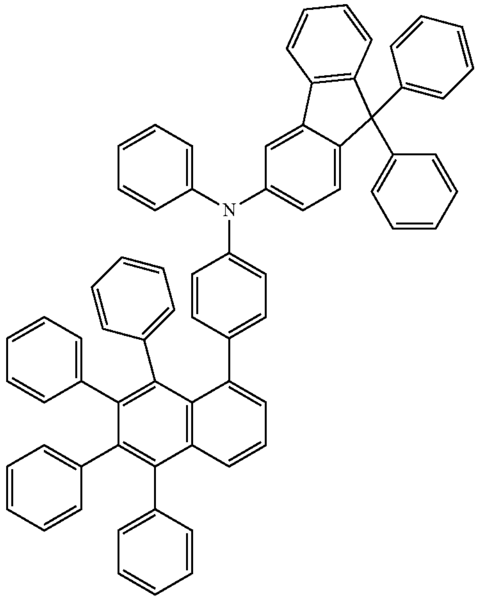
A43
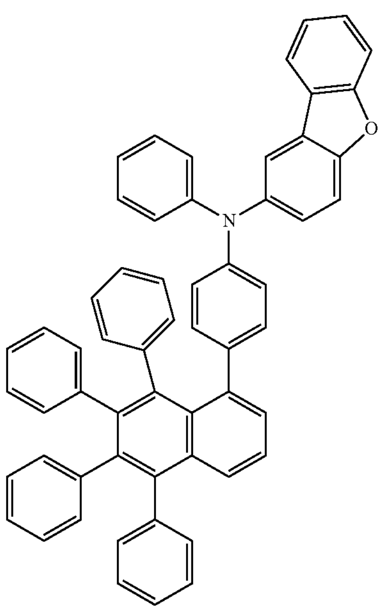
-continued
A44
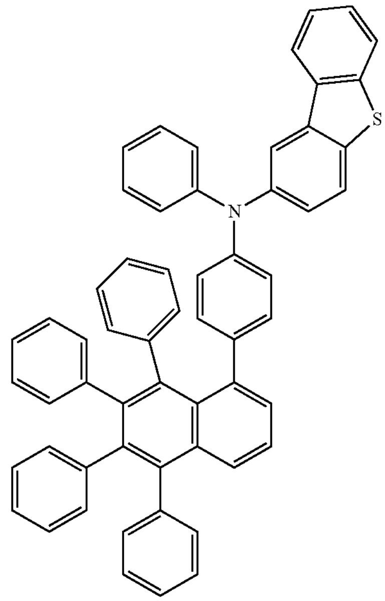
A45
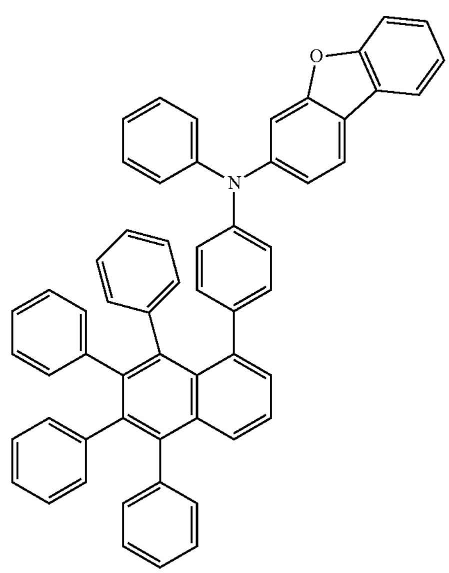

-continued
A46
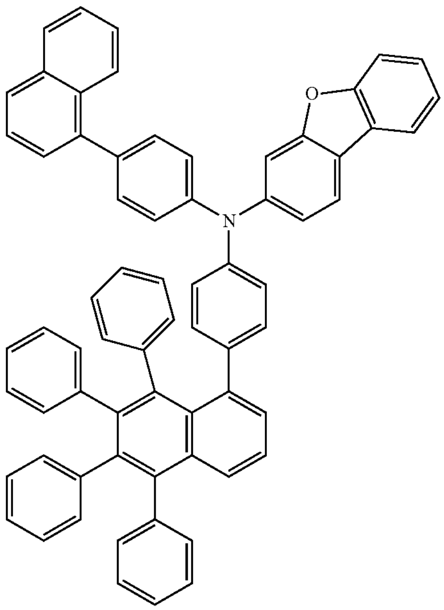
A47
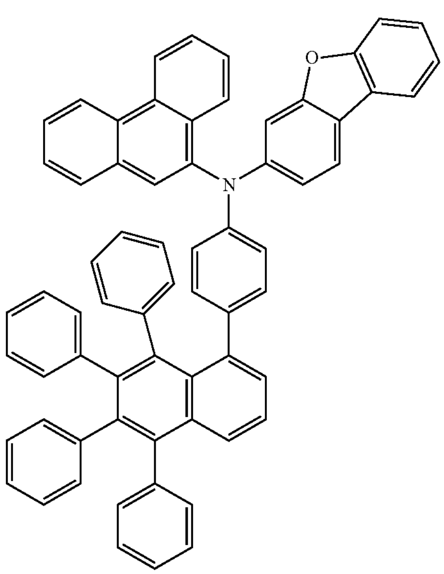
-continued
A48
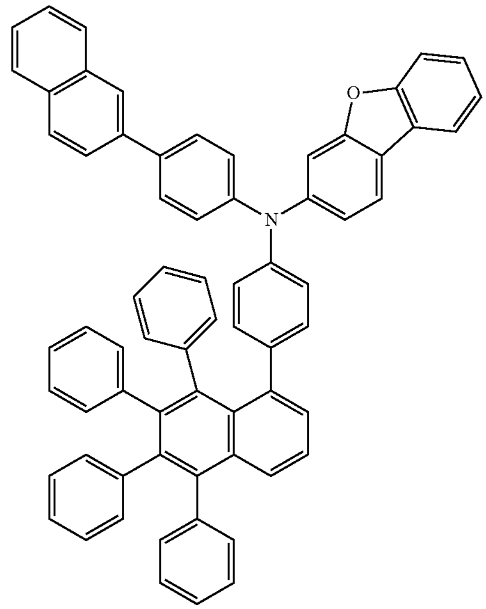
A49
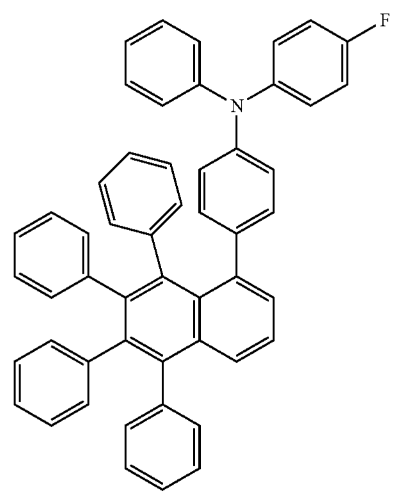
A50
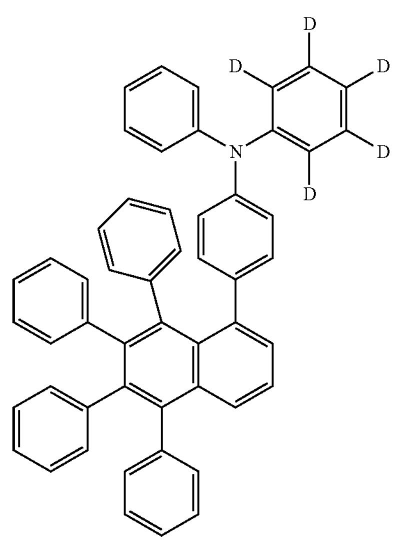

-continued
A51
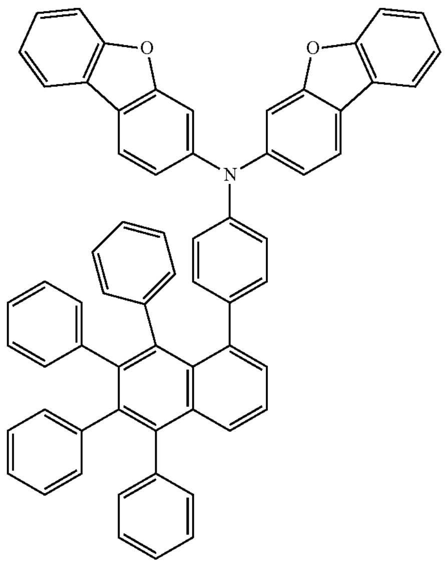
A52
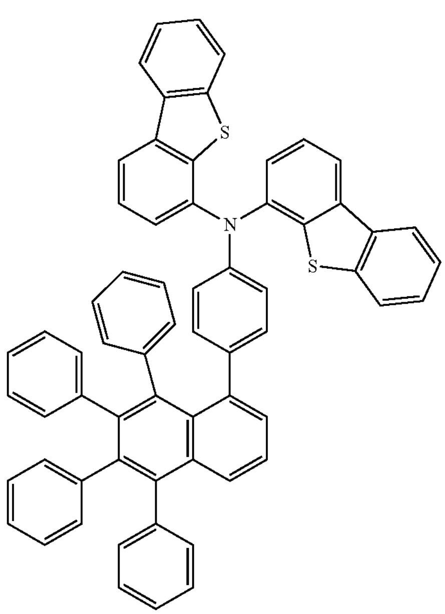
-continued
A53
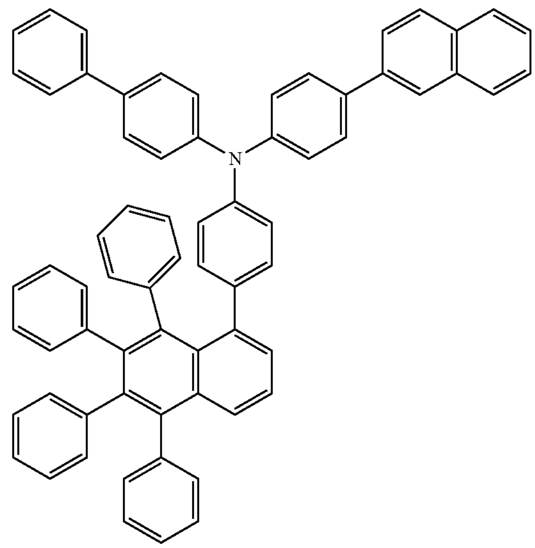
A54
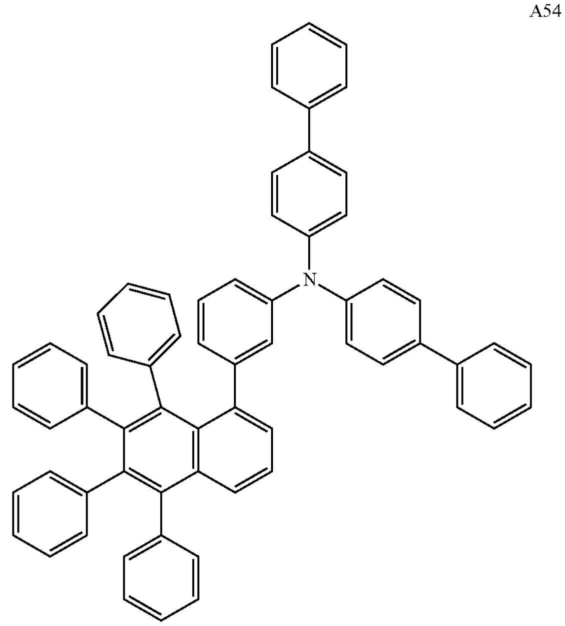
A55
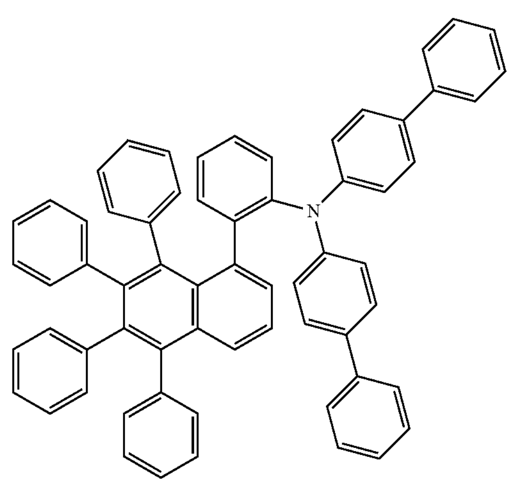

-continued
A56
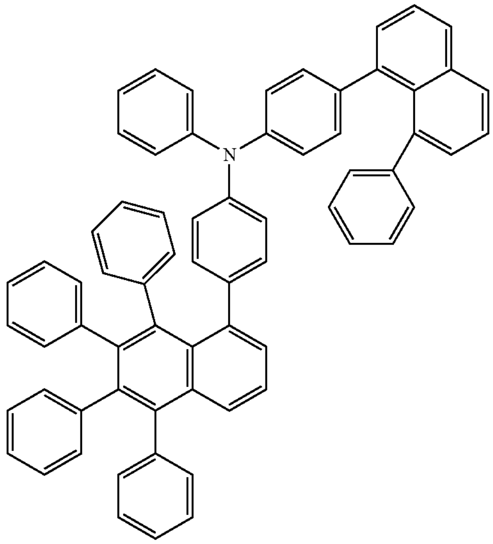
A57
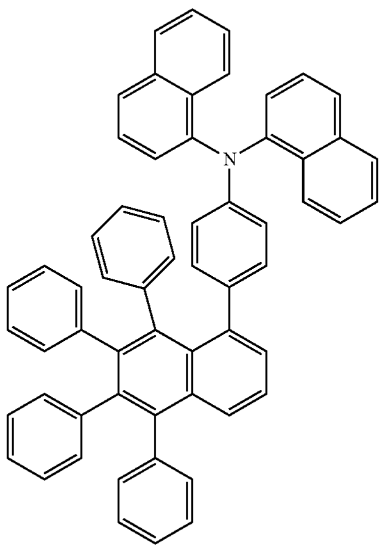
A58
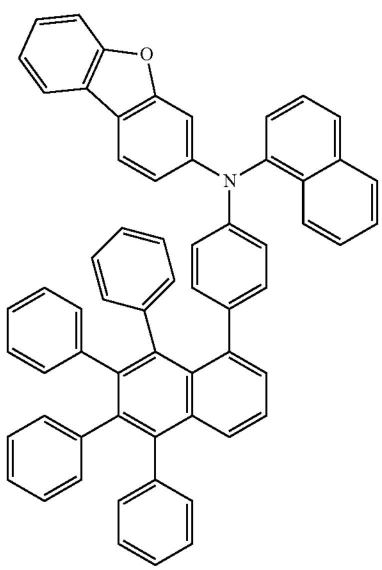
-continued
A59
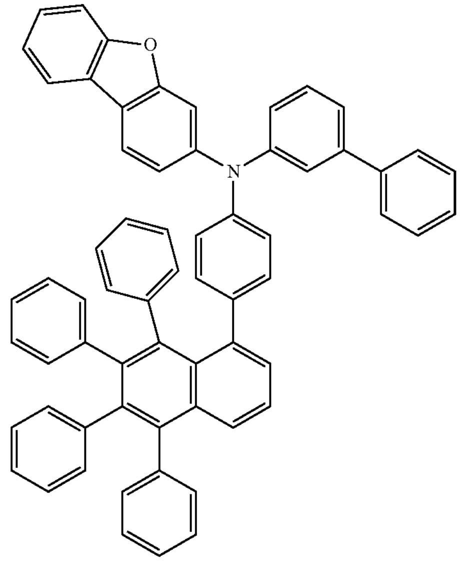
A60
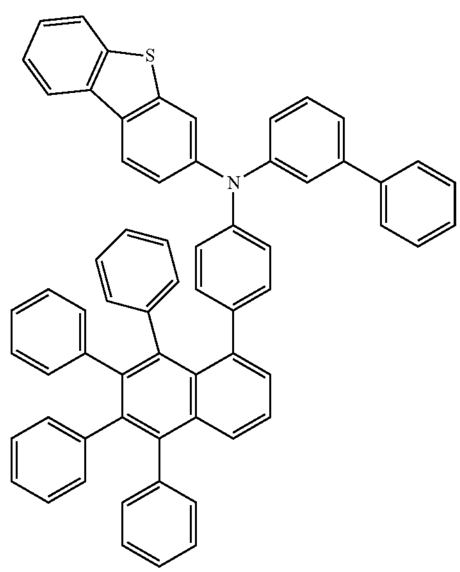

-continued
A61
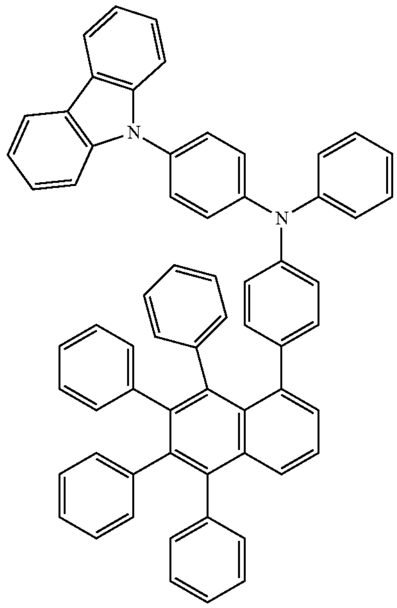
A62
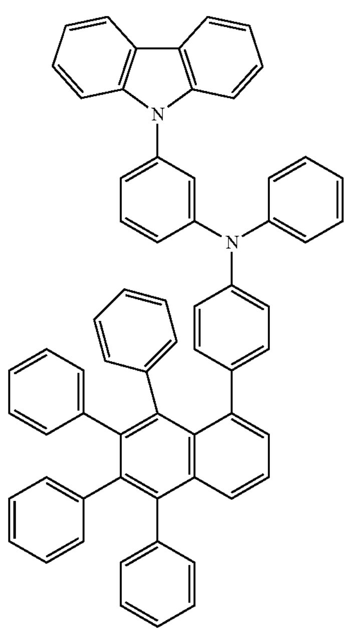
A63
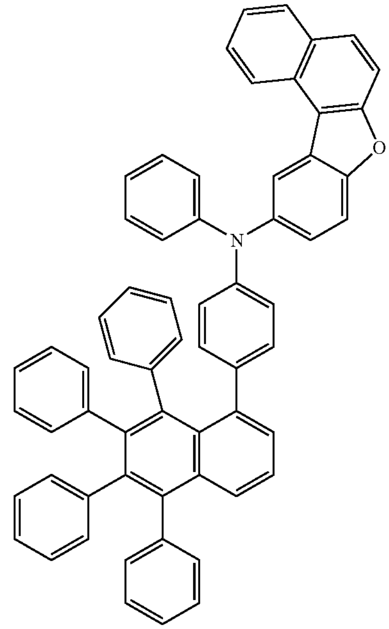
A64
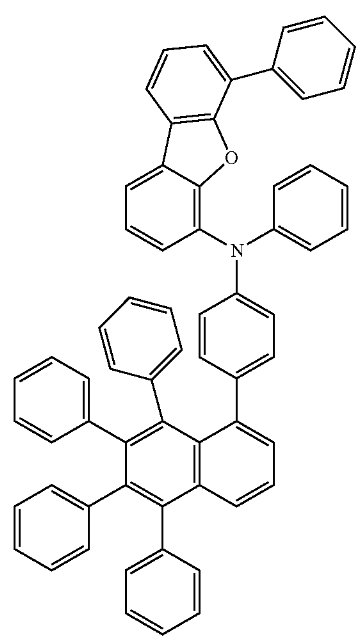

-continued
A65
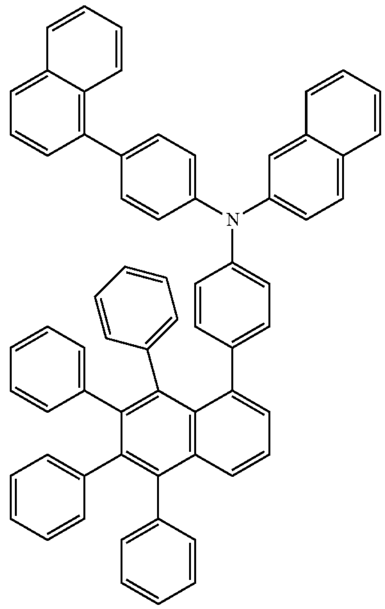
A66
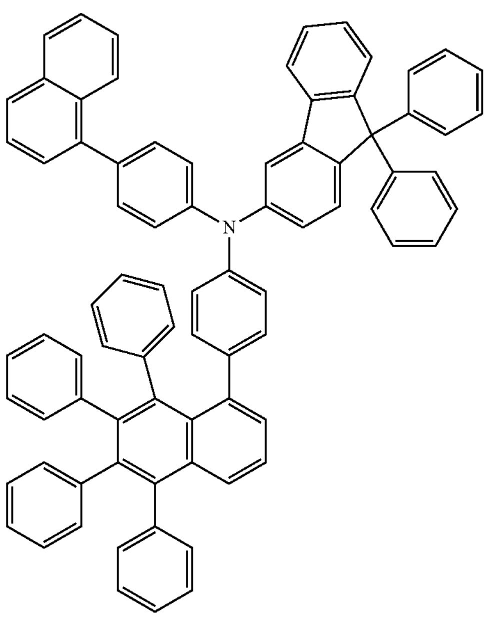
-continued
A67
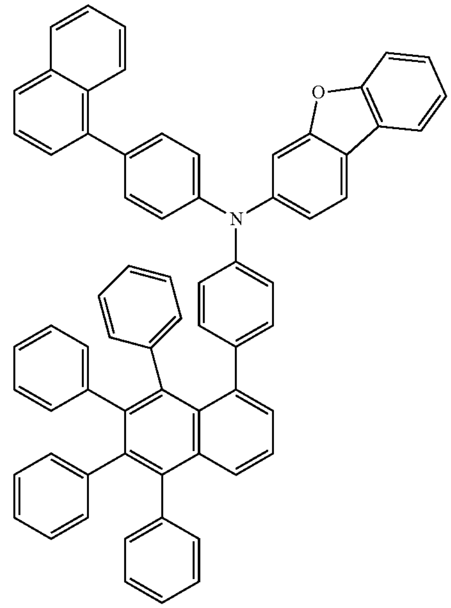
A68
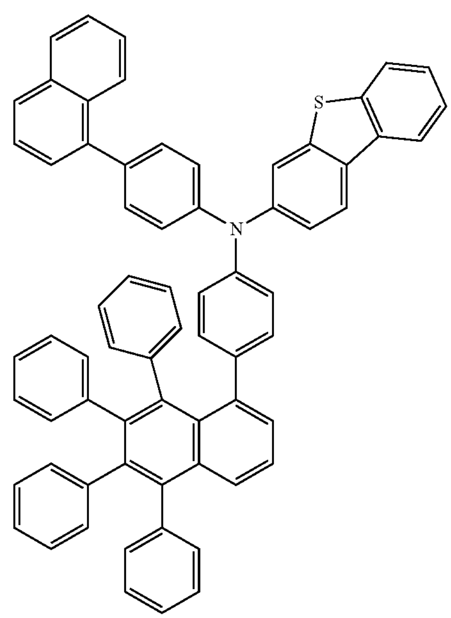

-continued
A69
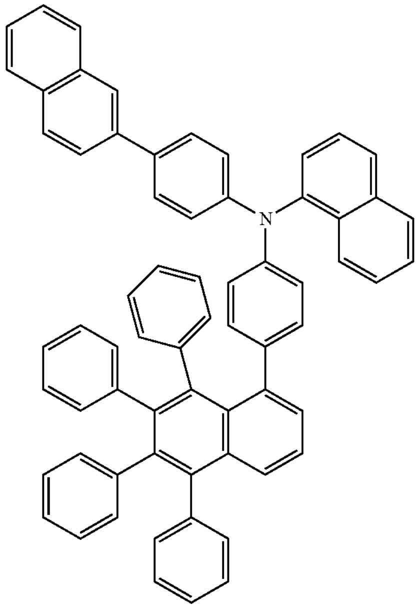
A70
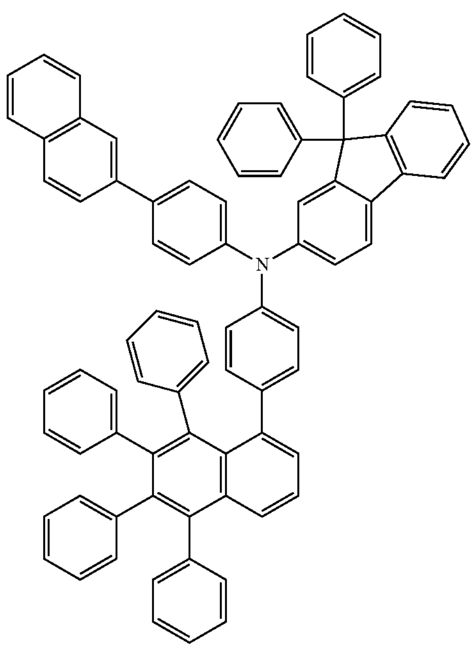
-continued
A71
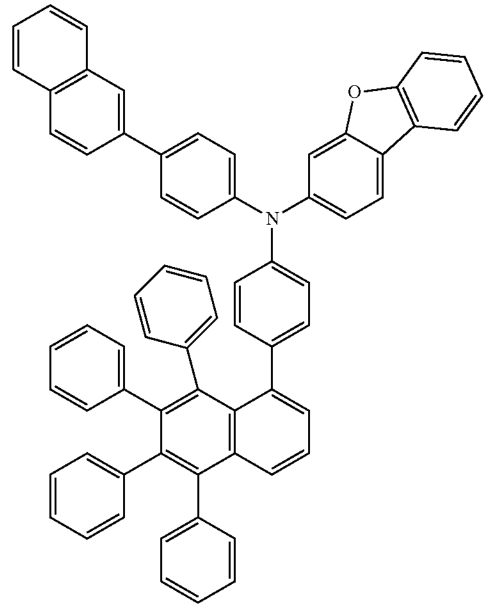
A72
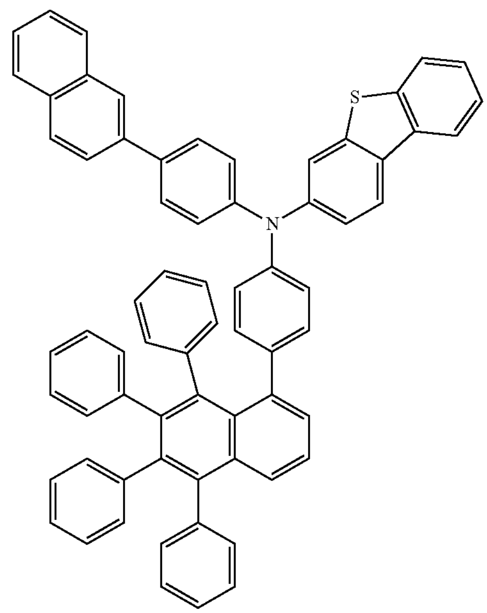
A73
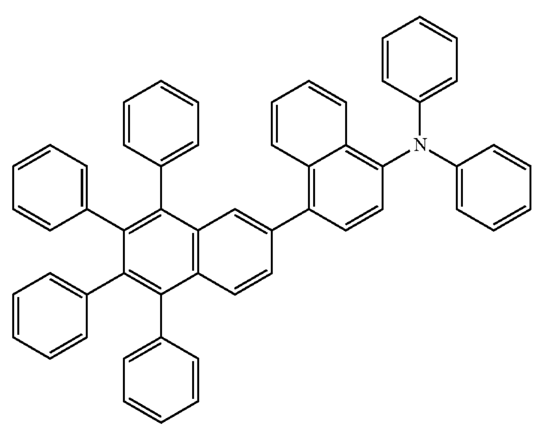

-continued
A74
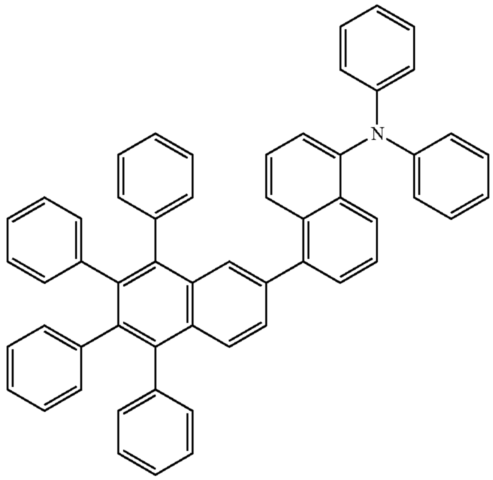
A75
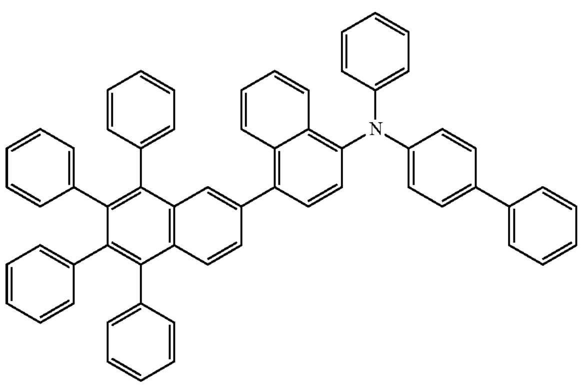
A76
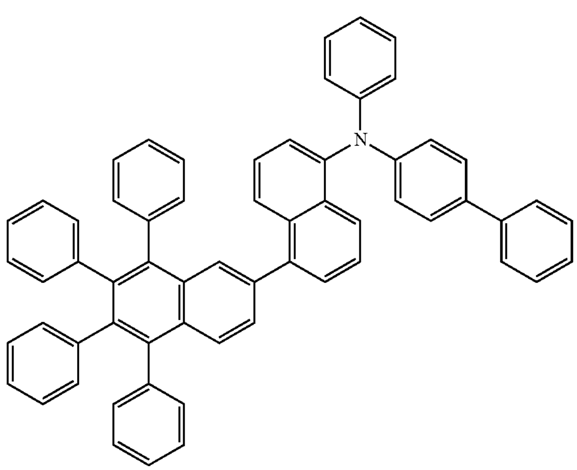
-continued
A77
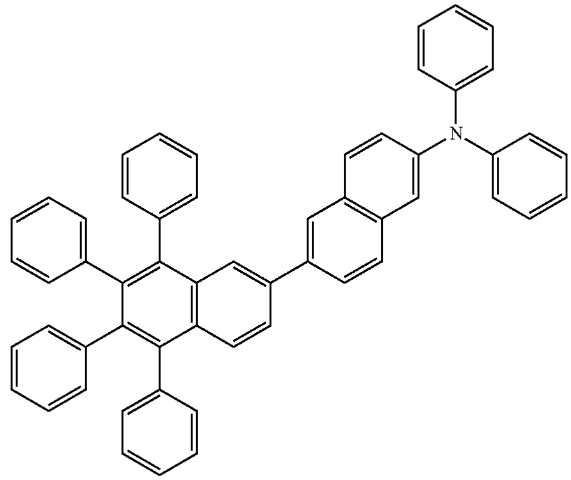
A78
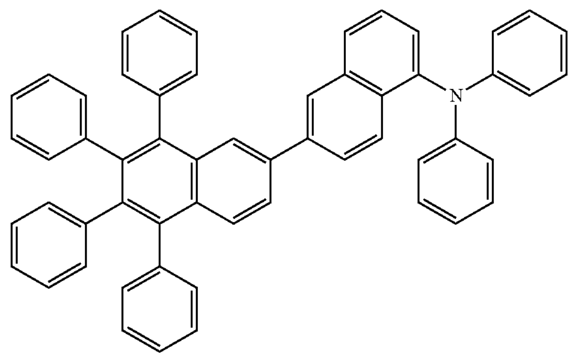
A79
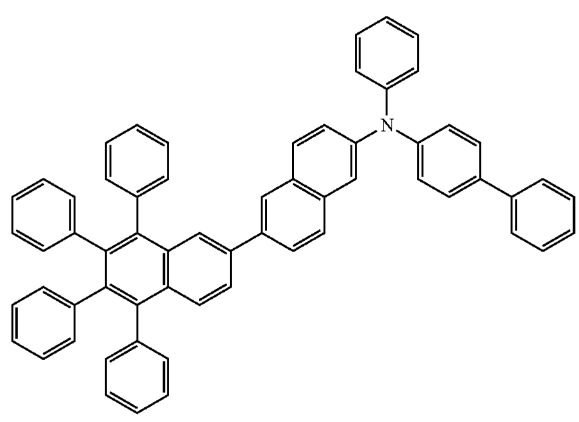

-continued
A80
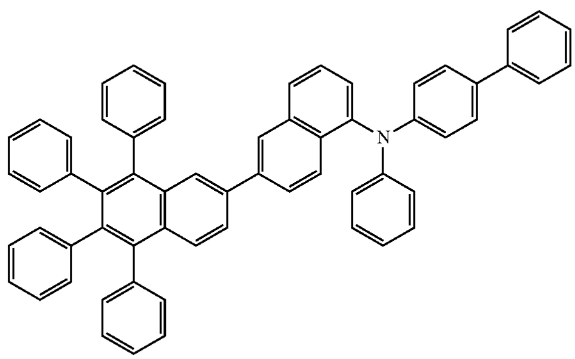
A81
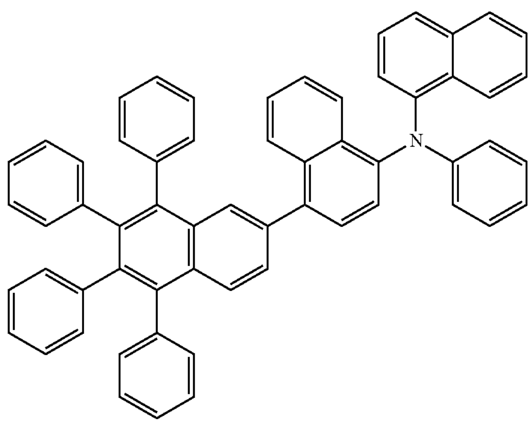
A82
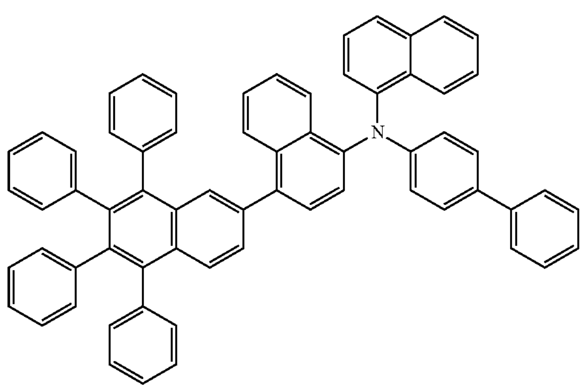
A83
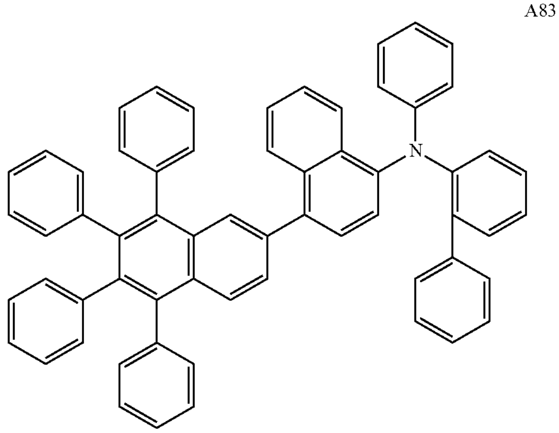
-continued
A84
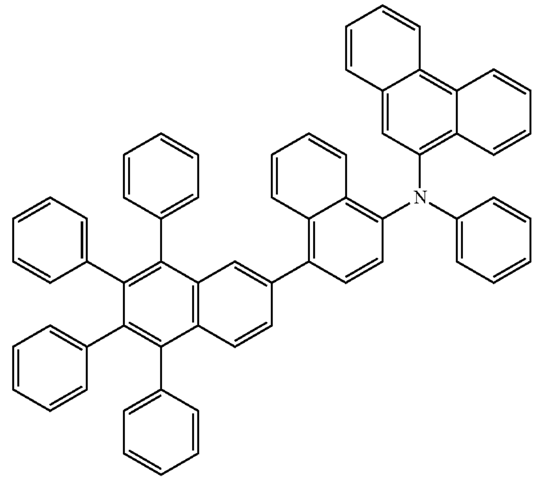
A85
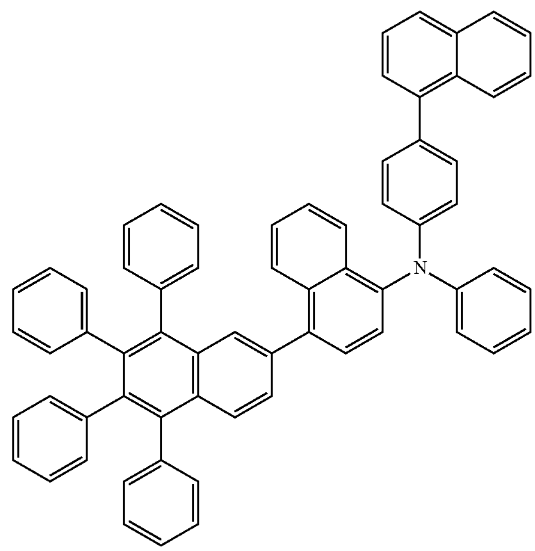
A86
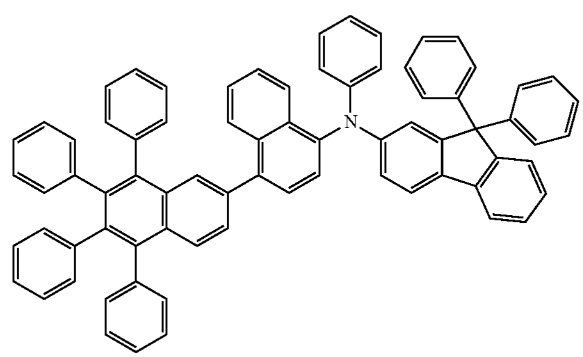

-continued
A87
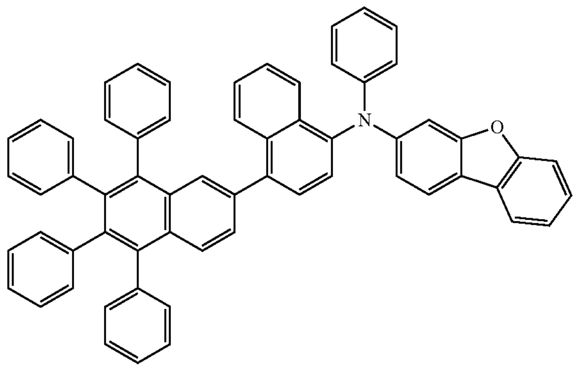
A88
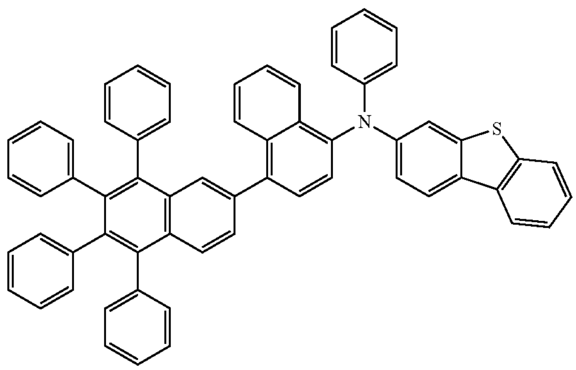
A89
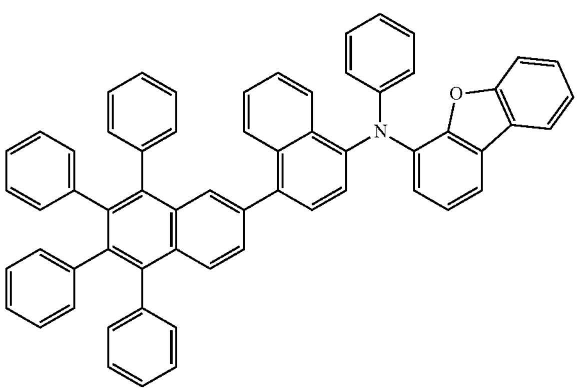
A90
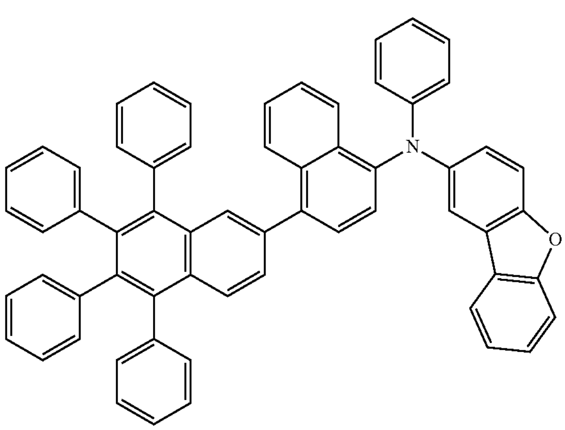
-continued
A91
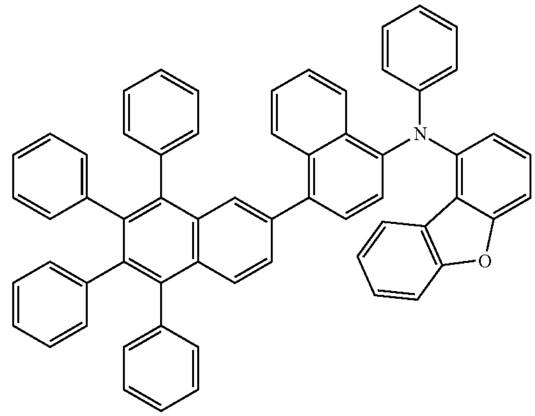
A92
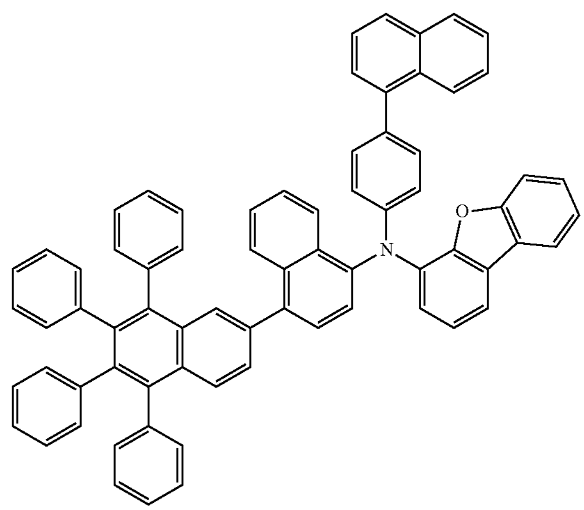
A93
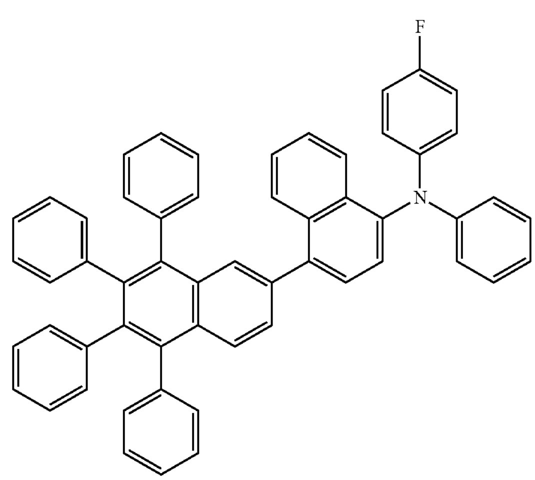

A94
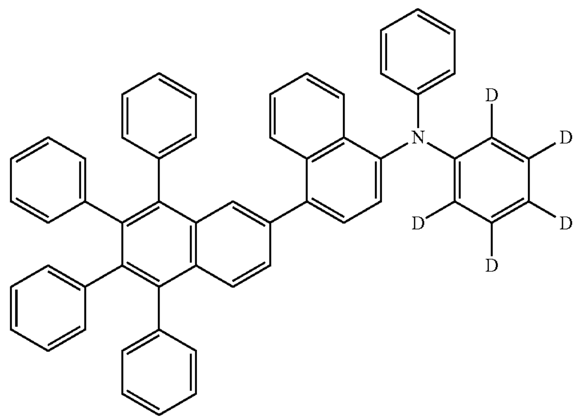
A95
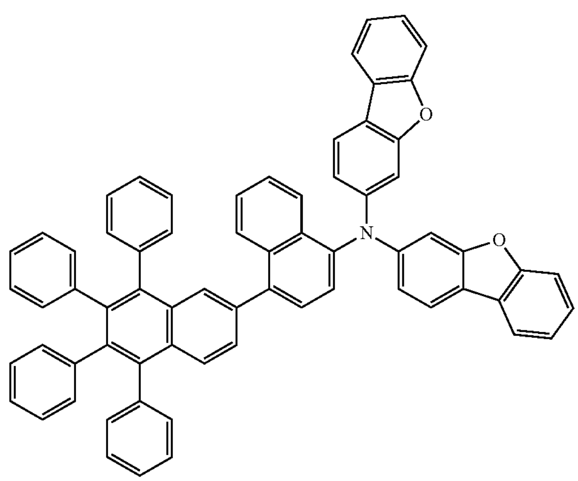
A96
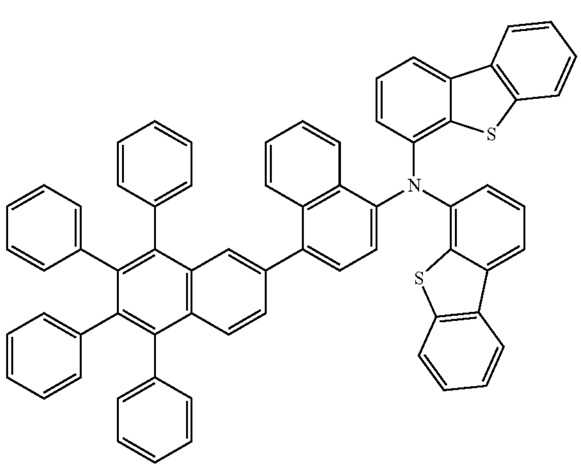
A97
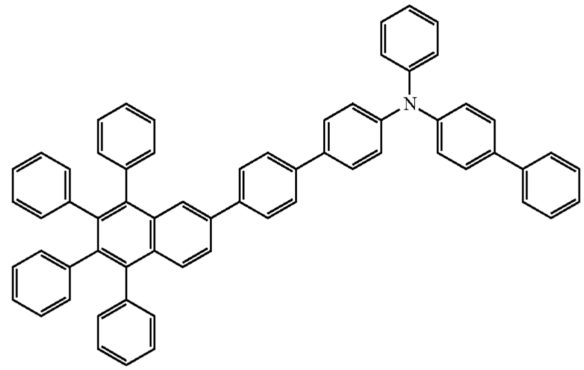
A98
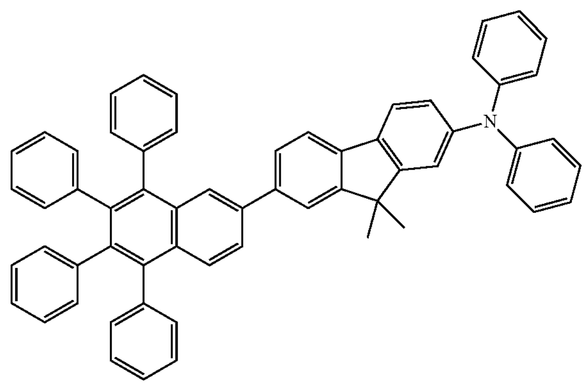
A99
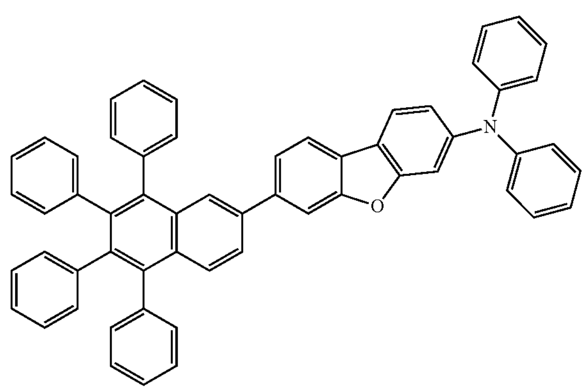
A100
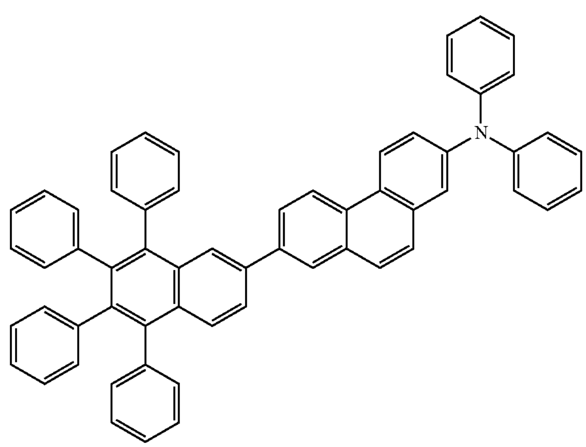

-continued
A101
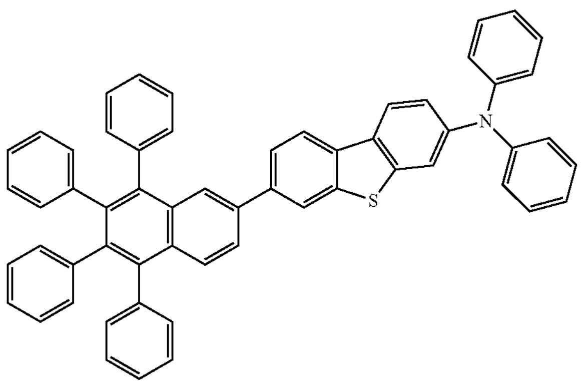
A102
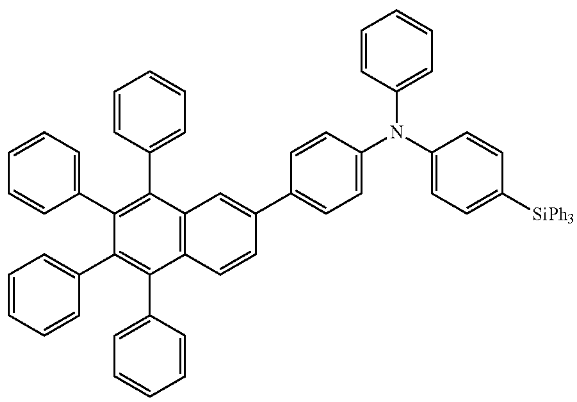
A103
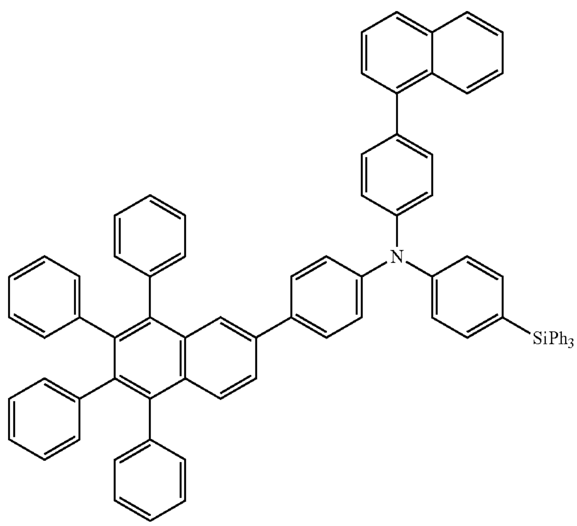
-continued
A104
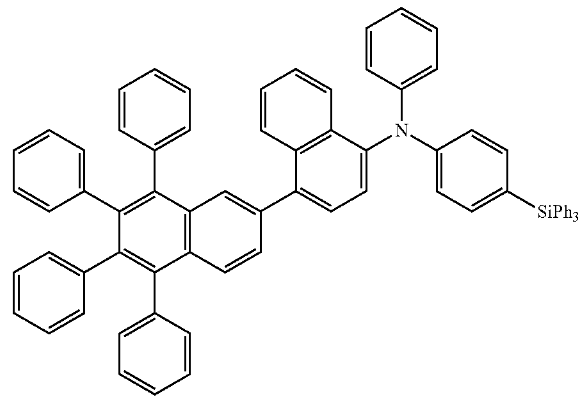
A105
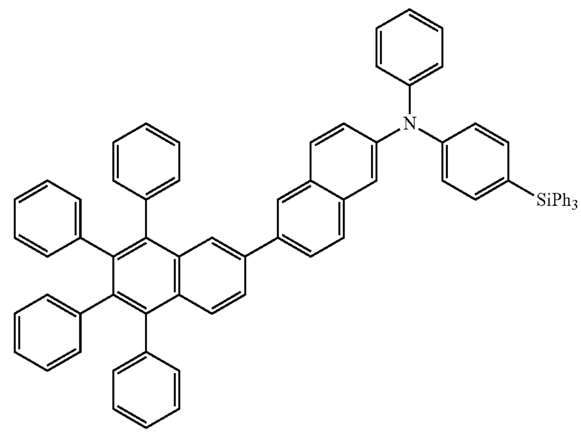
A106
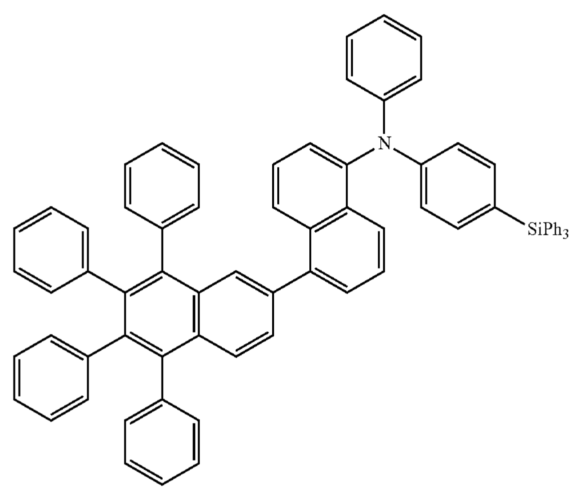

-continued
A107
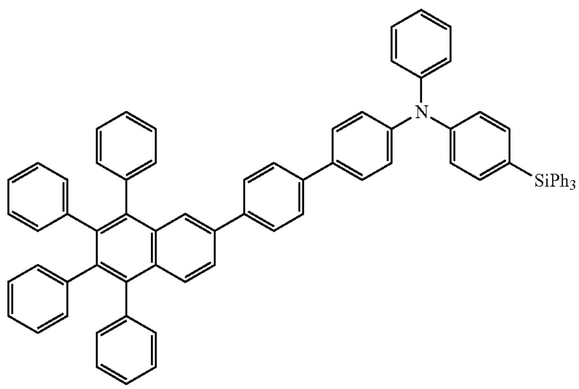
A108
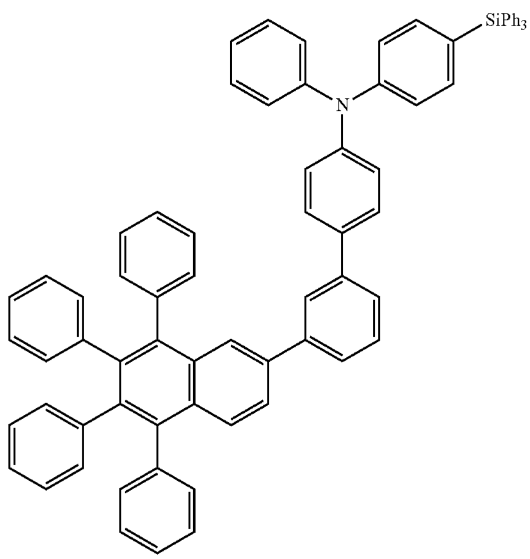
A109
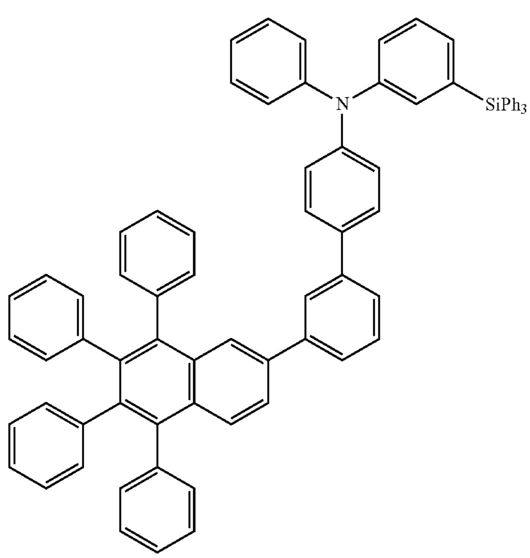
-continued
A110
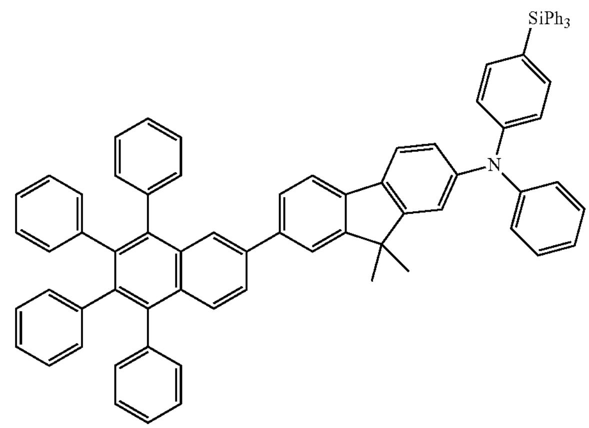
A111
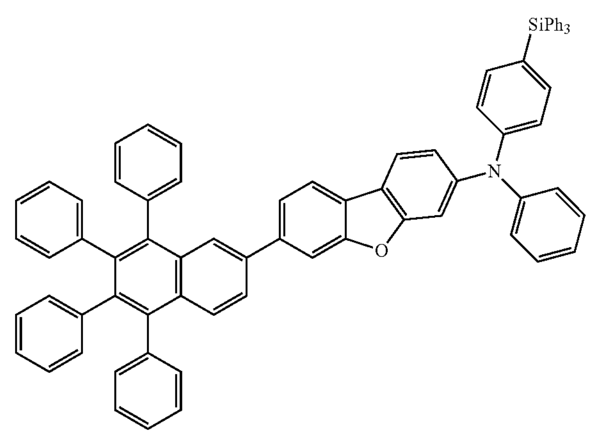
A112
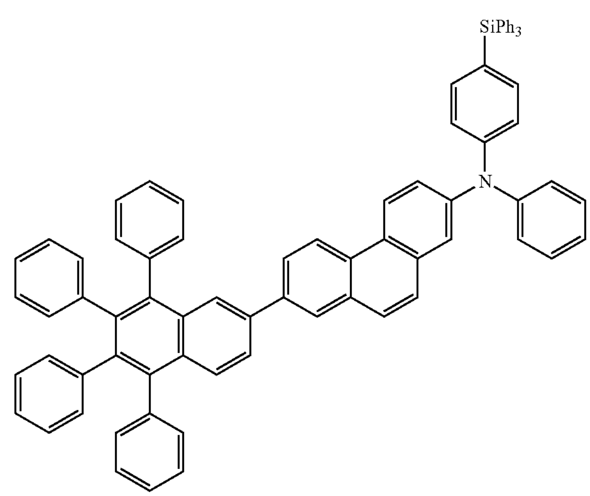

-continued
A113
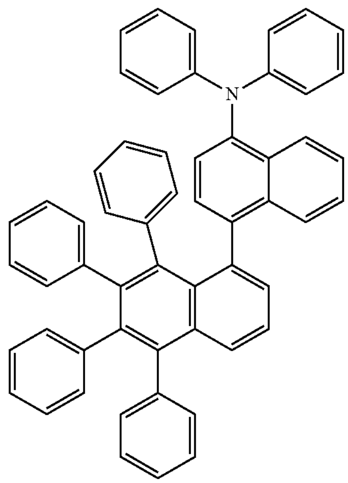
A114
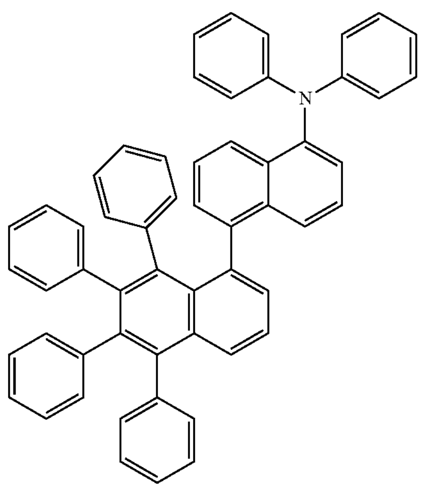
A115
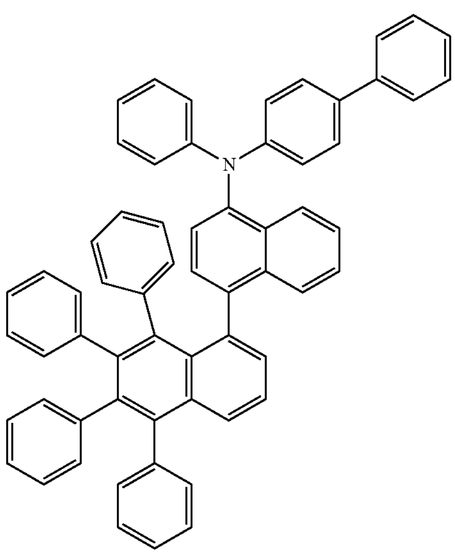
-continued
A116
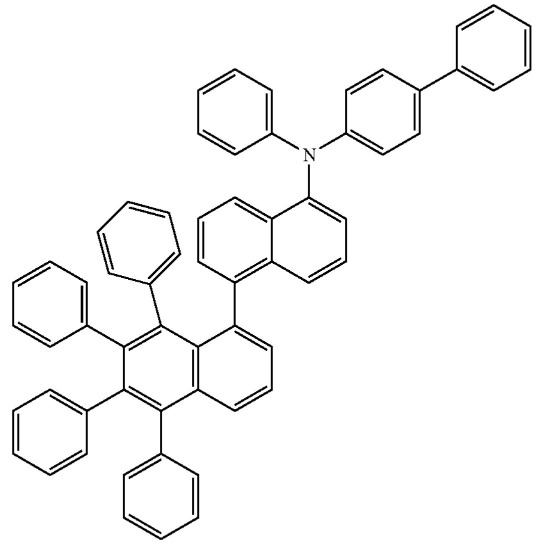
A117
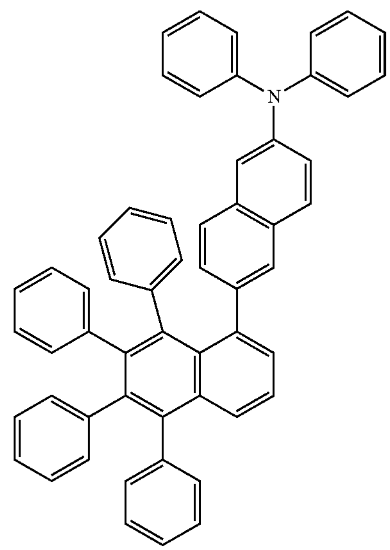
A118
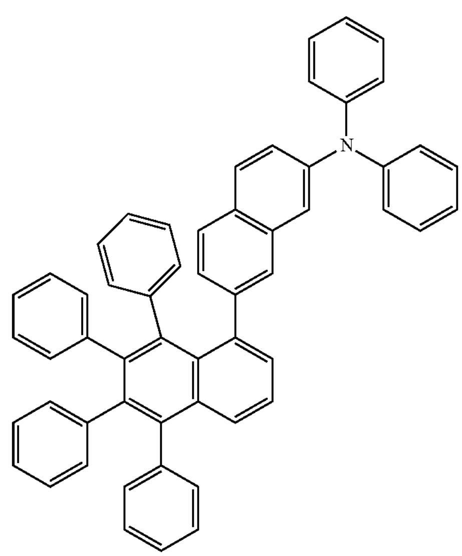

-continued
A119
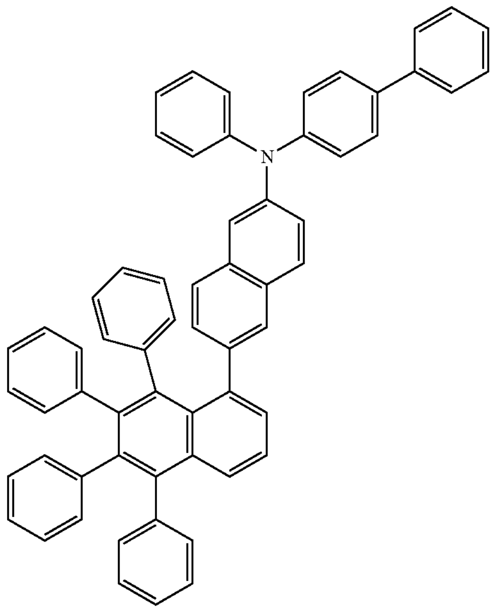
A120
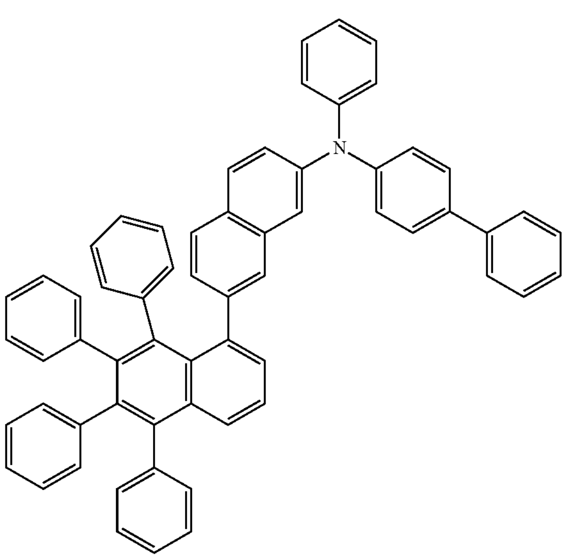
-continued
A121
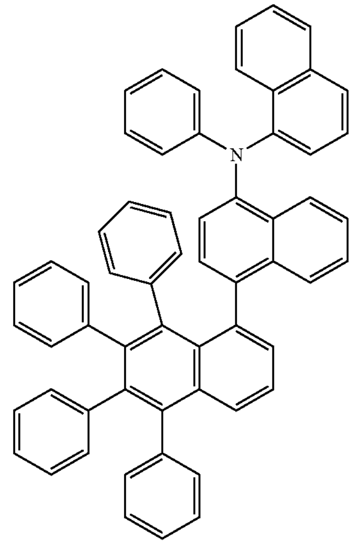
A122
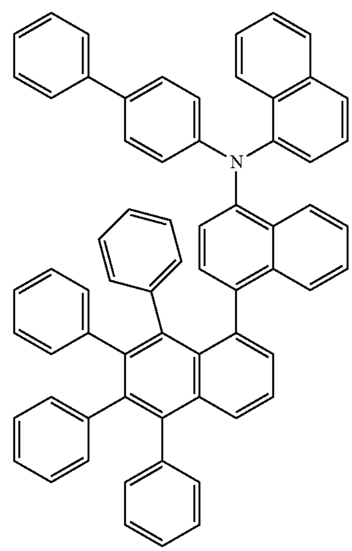
A123
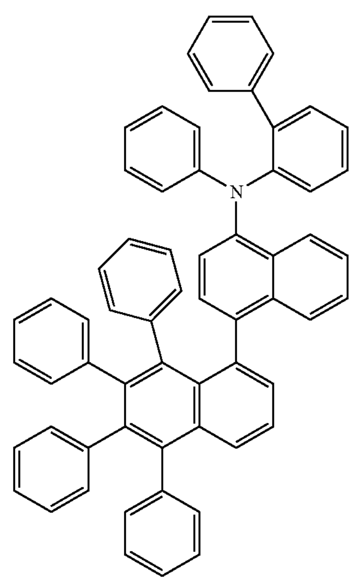

-continued
A124
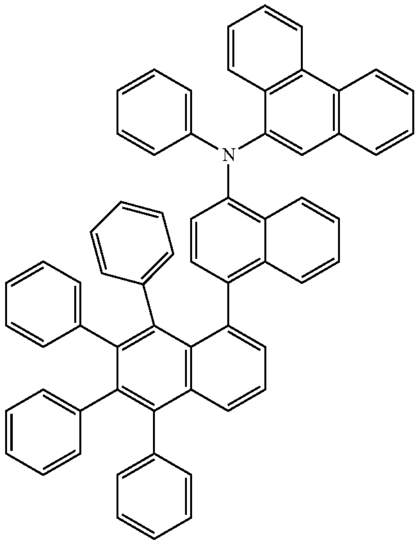
A125
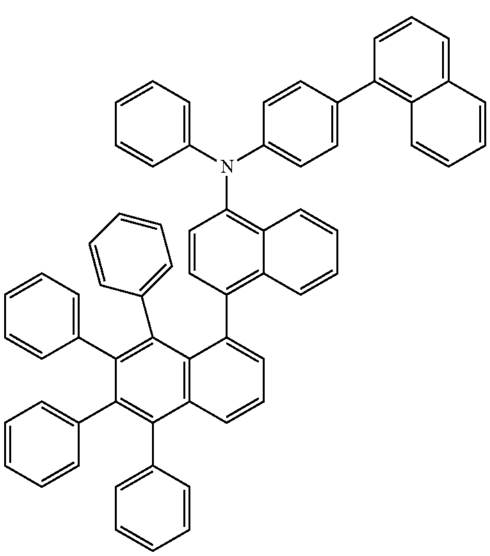
-continued
A126
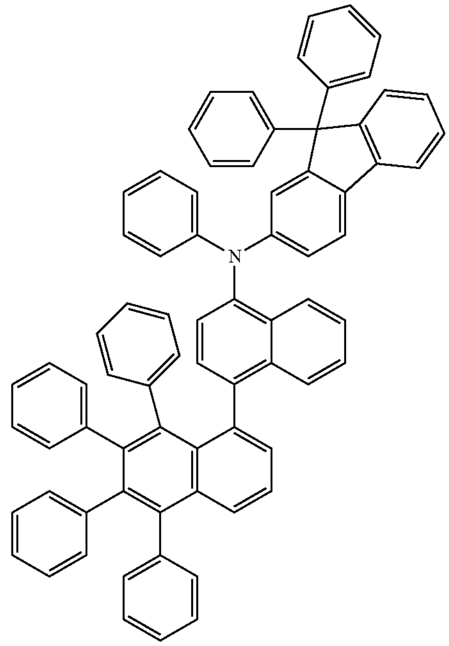
A127
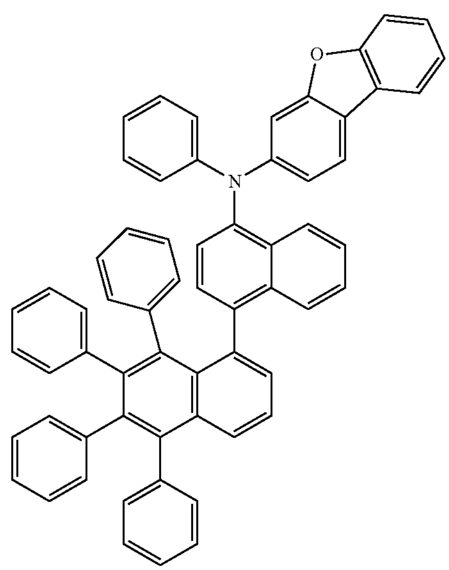

A128
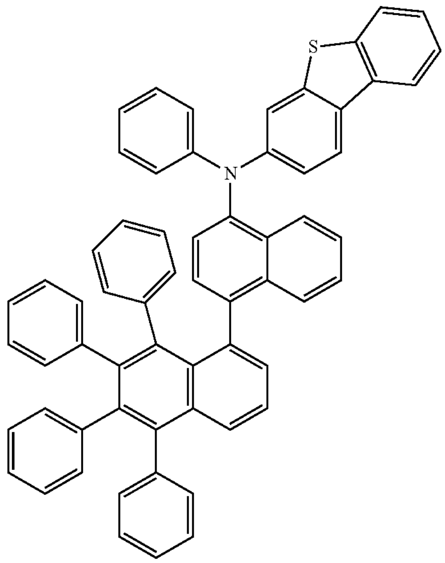
A129
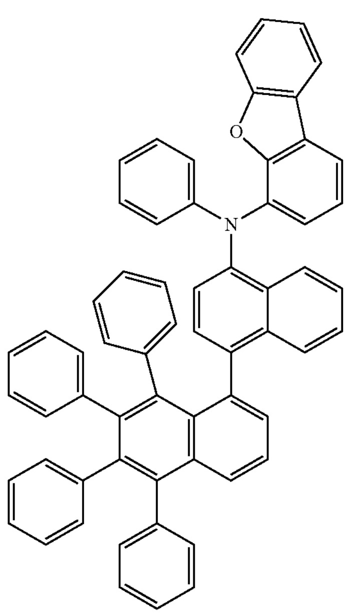
A130
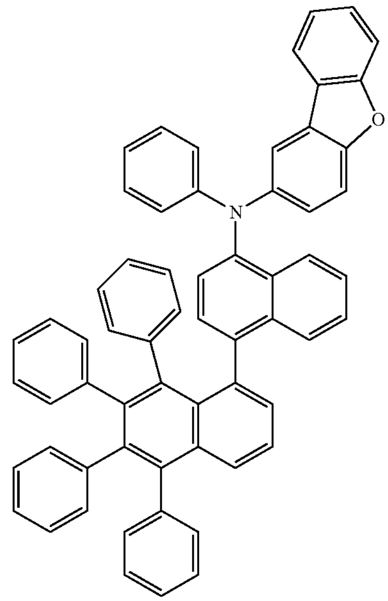
A131
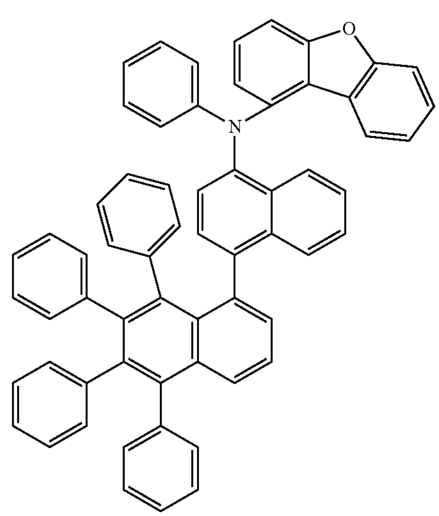

A132
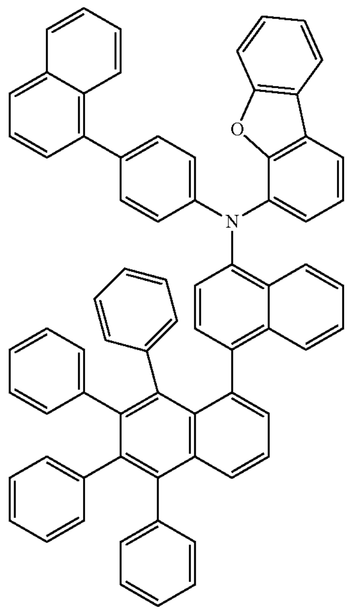
A133
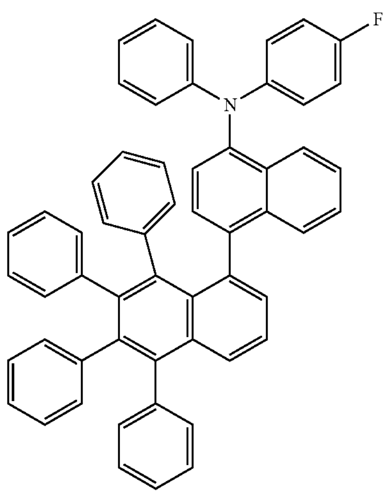
A134
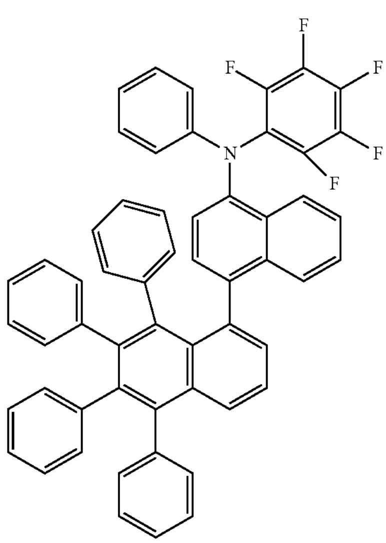
A135
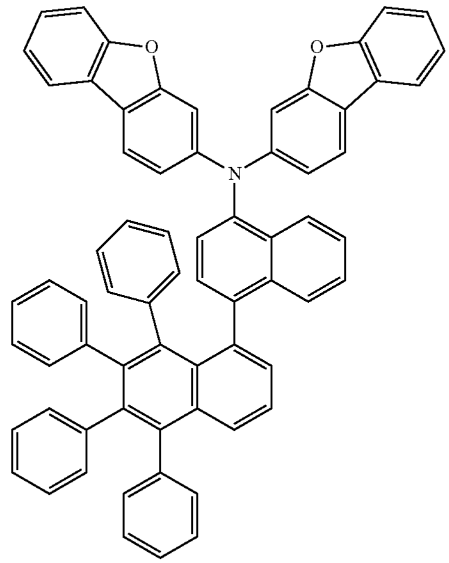
A136
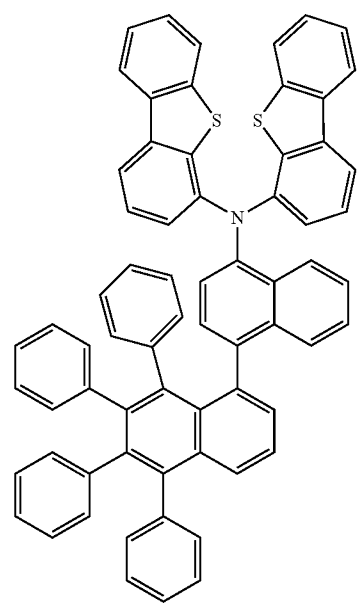

-continued
A137
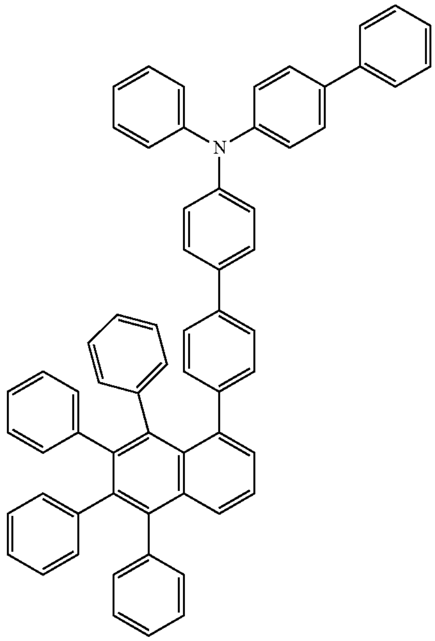
A138
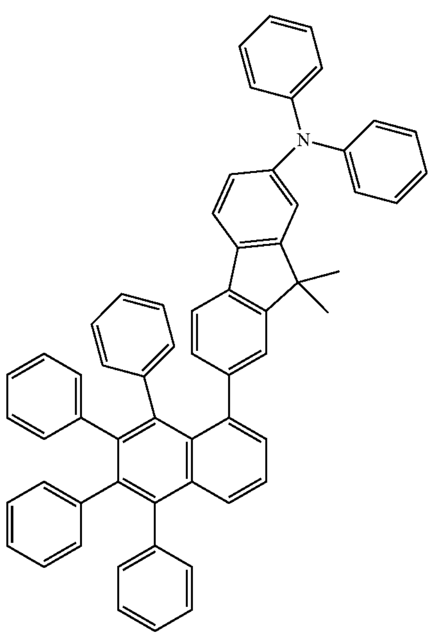
-continued
A139
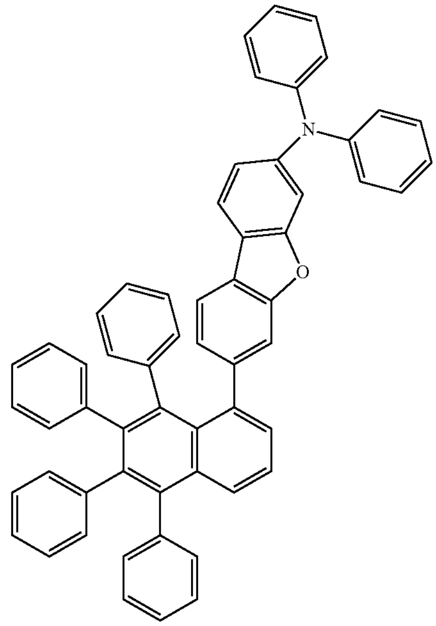
A140
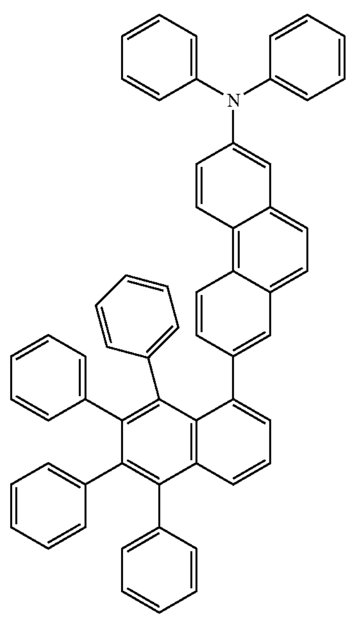

A141
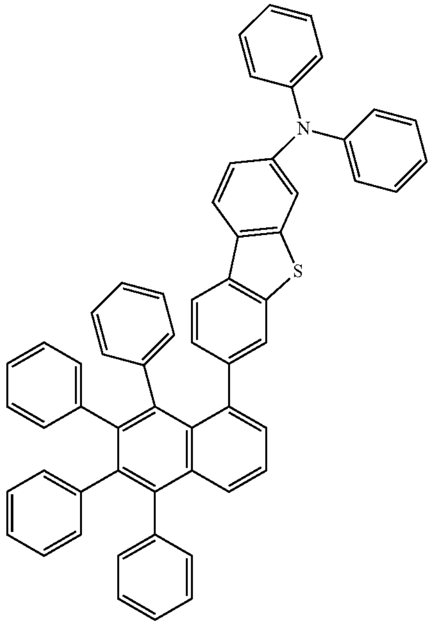
A142
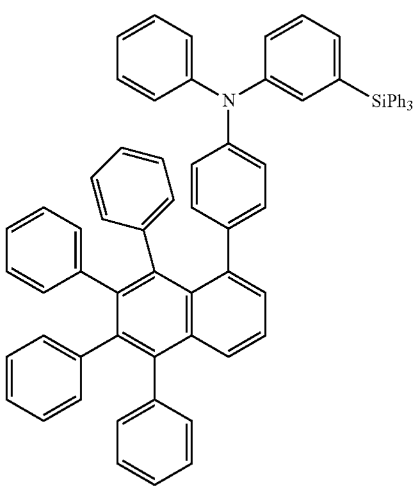
A143
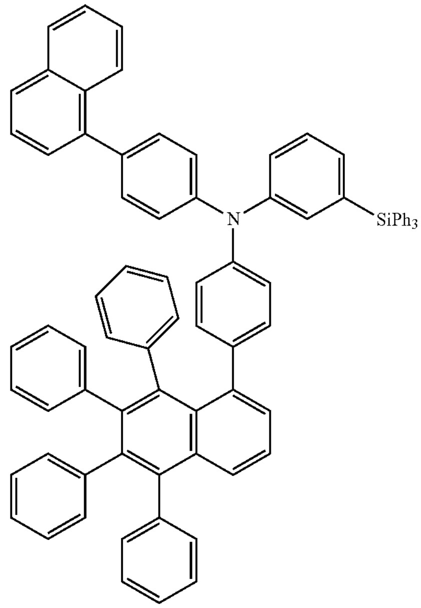
A144
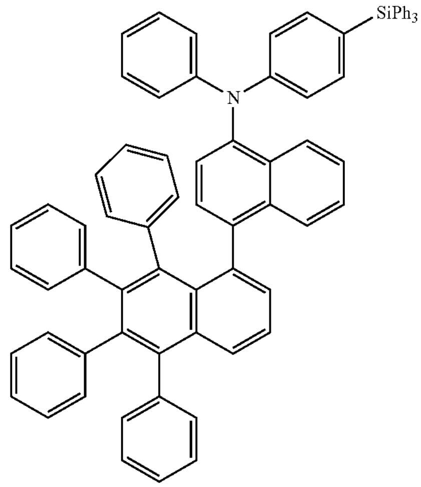
A145
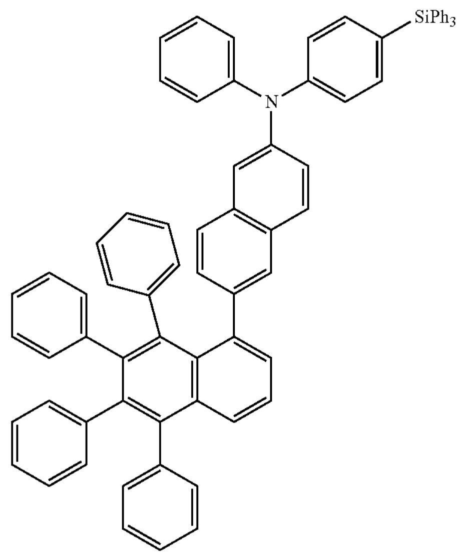

-continued
A146
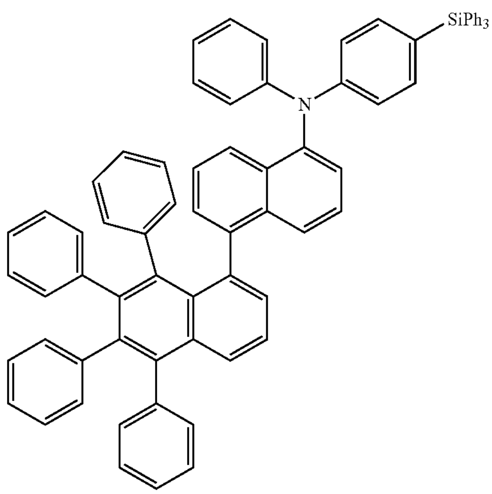
A147
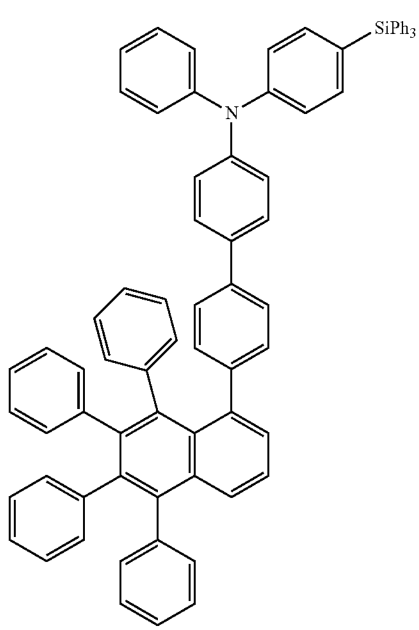
-continued
A148
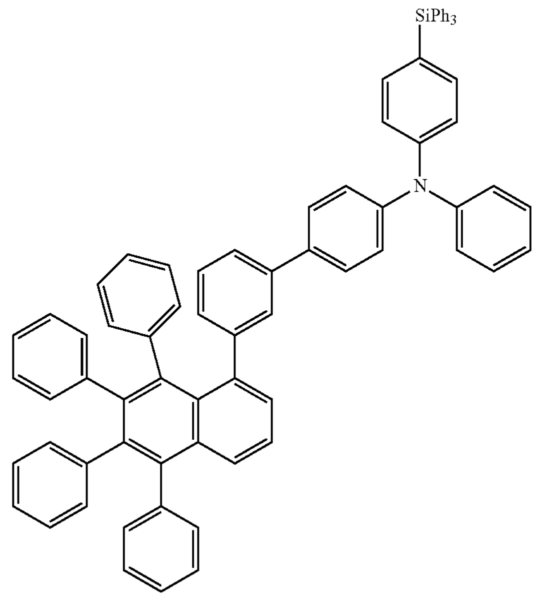
A149
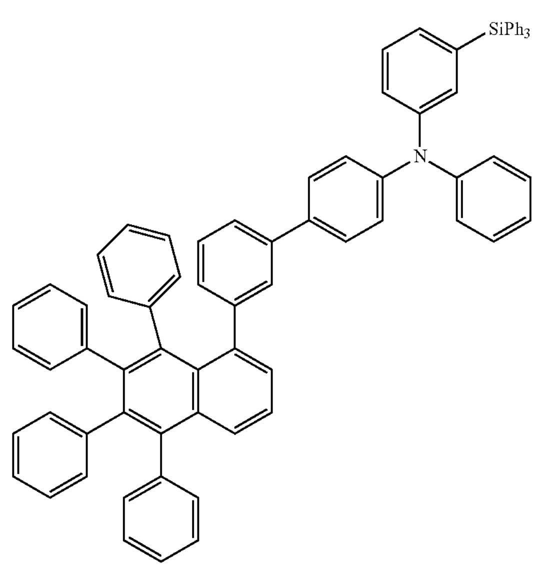

-continued
A150
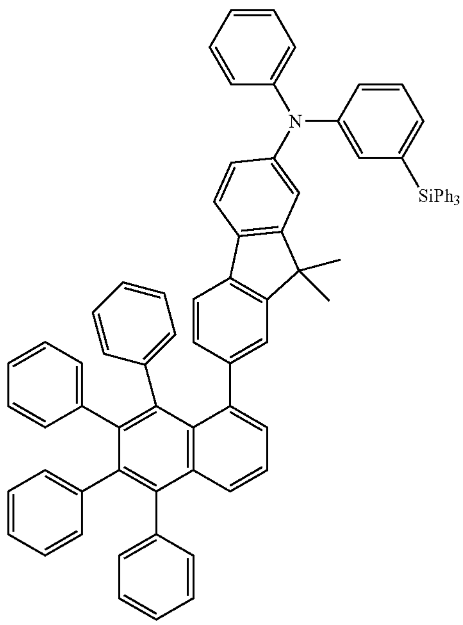
A151
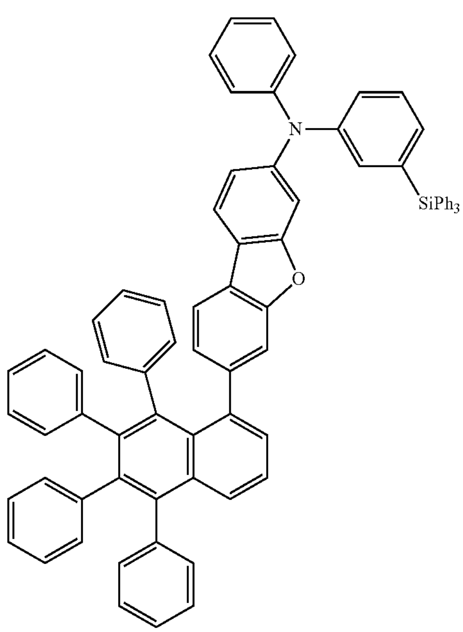
-continued
A152
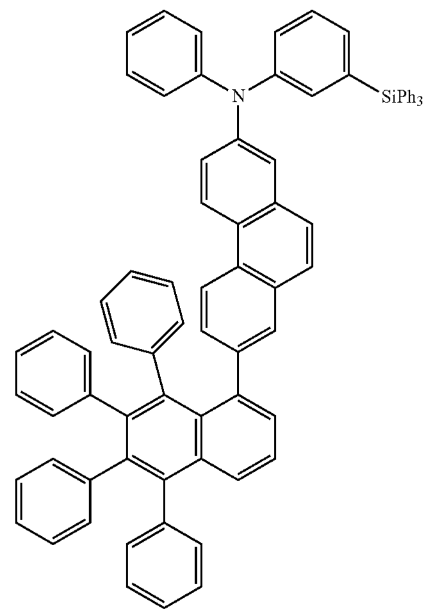
A153
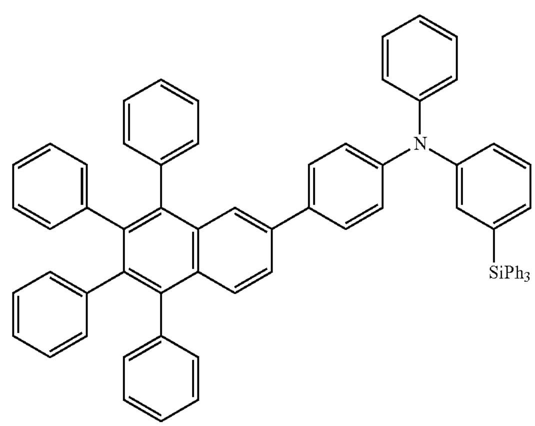
A154
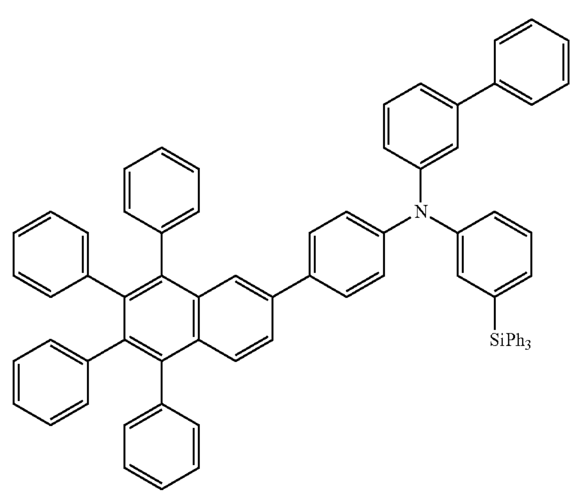

-continued
A155
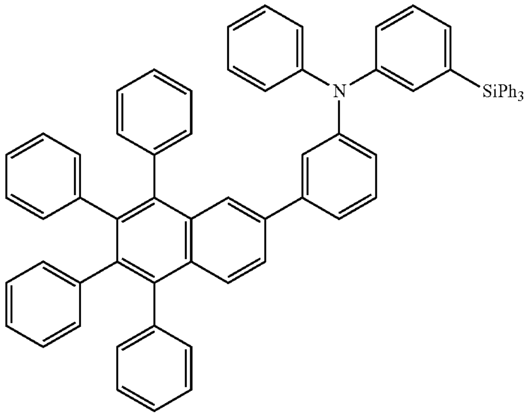
A156
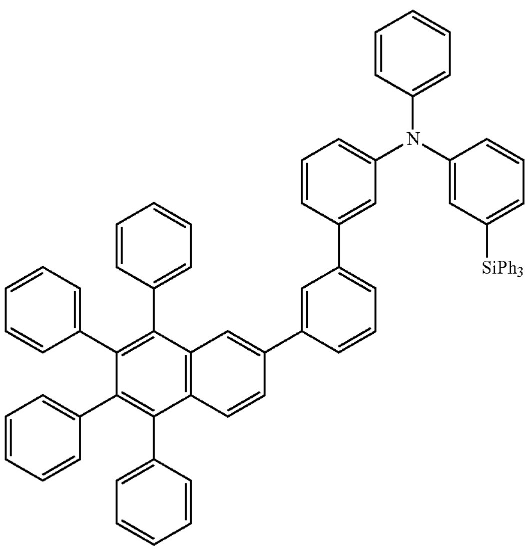
A157
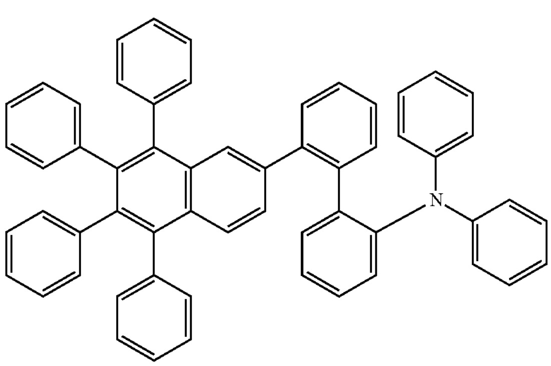
-continued
A158
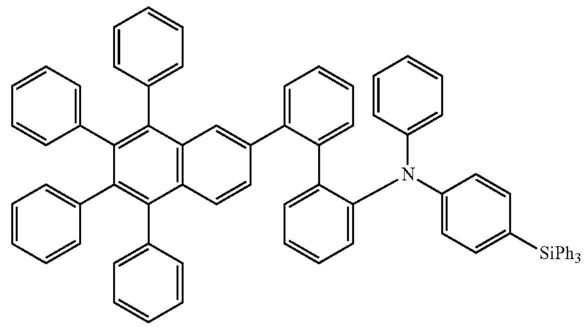
A159
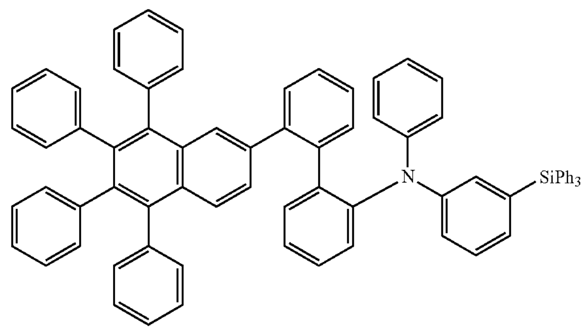
A160
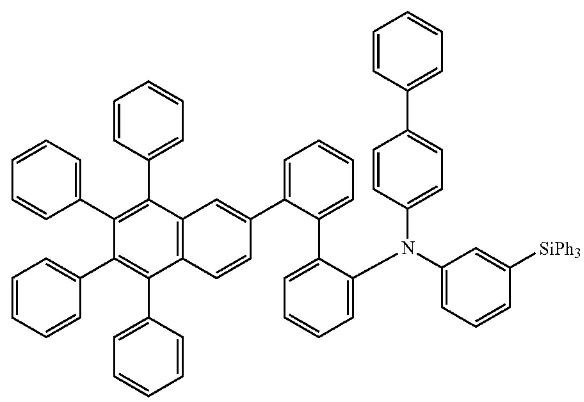
A161
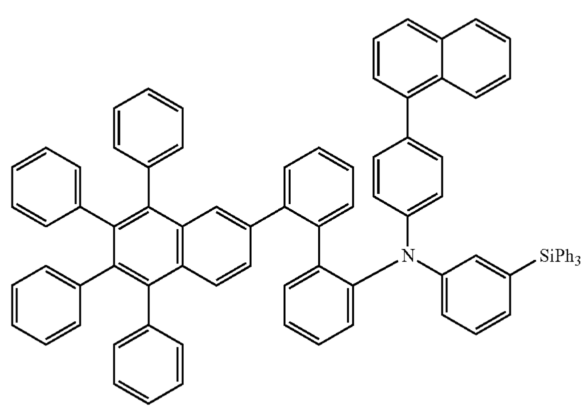

-continued
A162
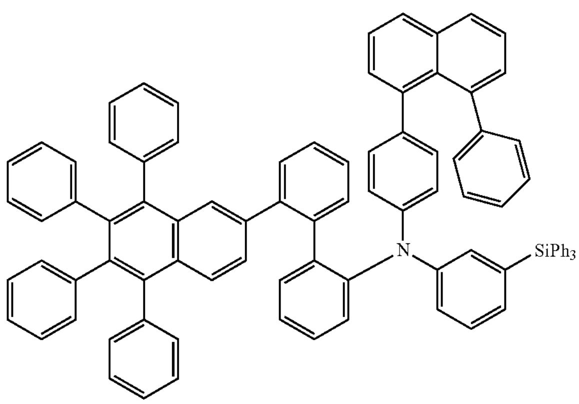
A163
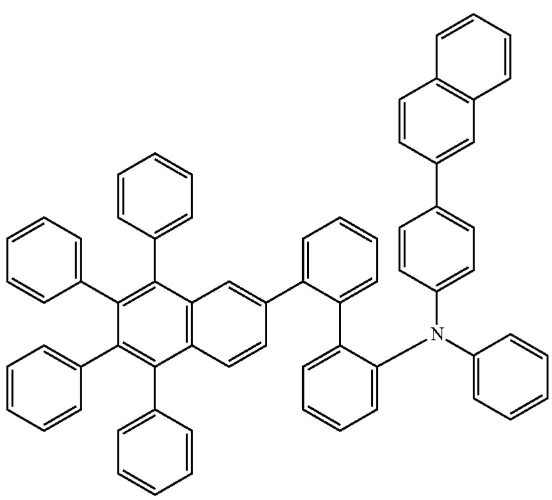
A164
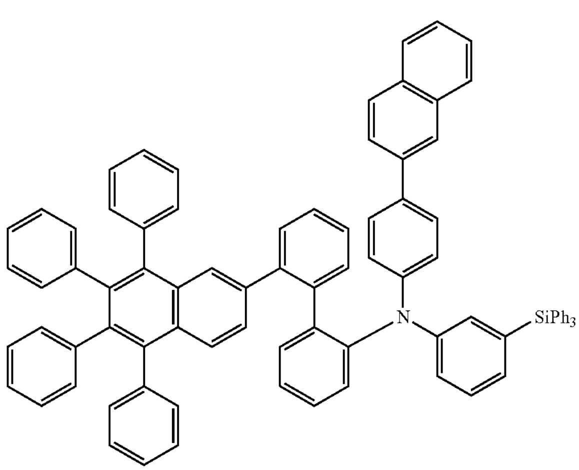
A165
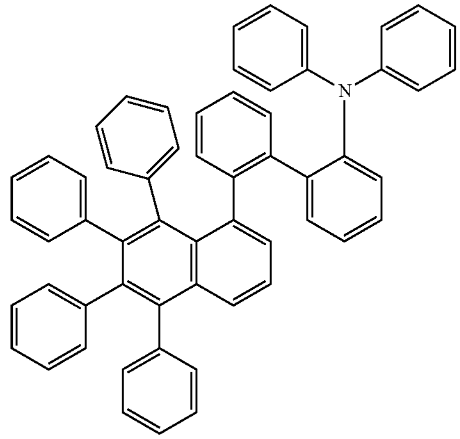
A166
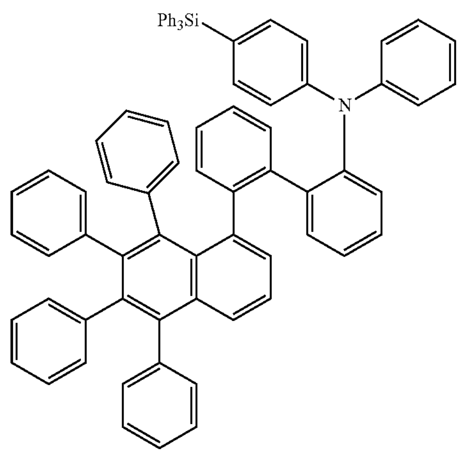
A167
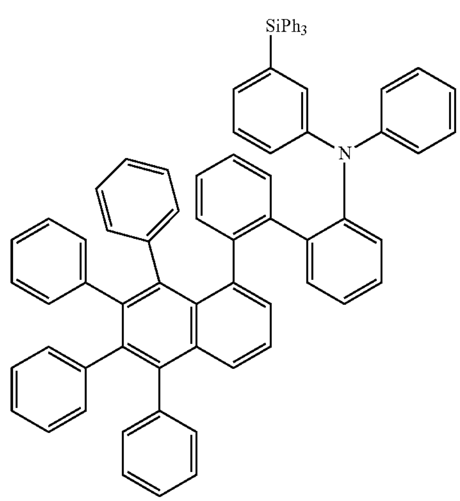

-continued
A168
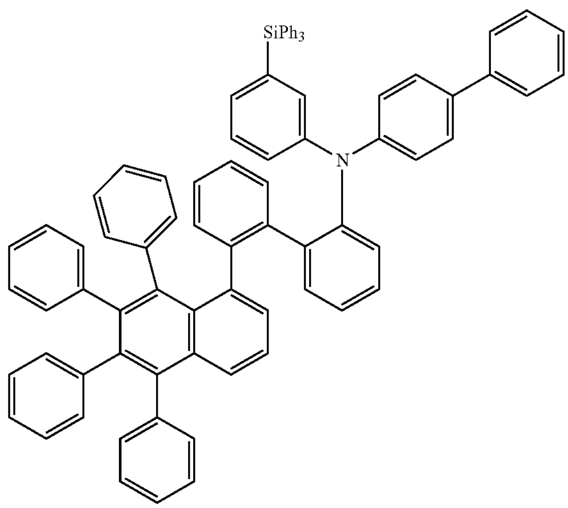
A169
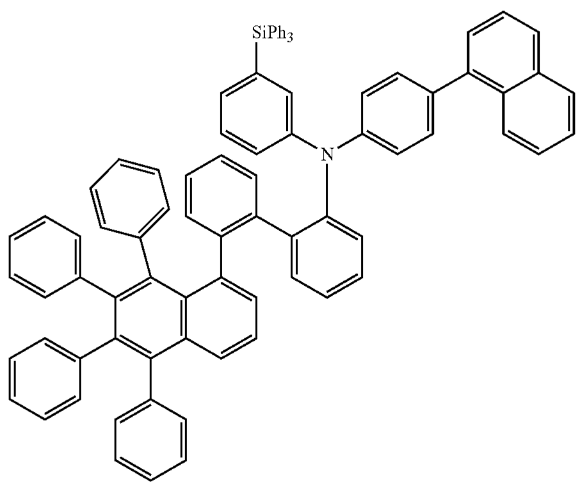
A170
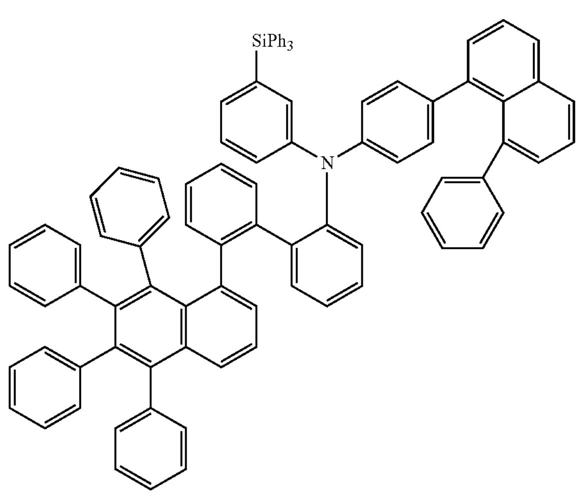
-continued
A171
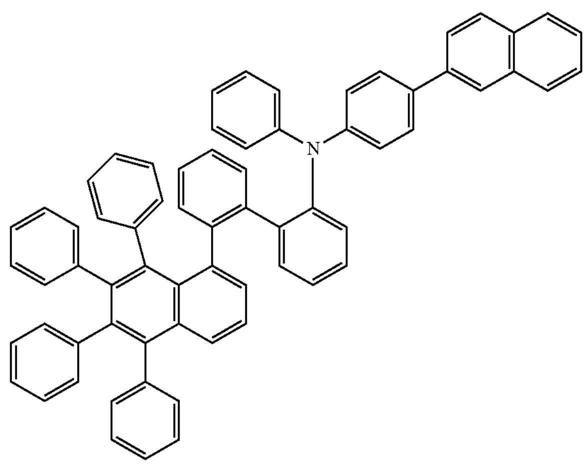
A172
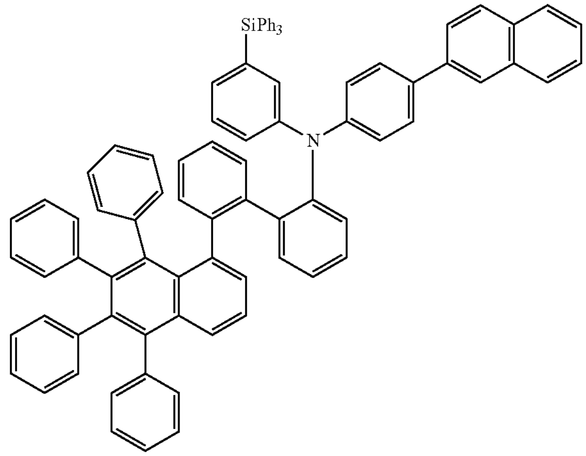
A173
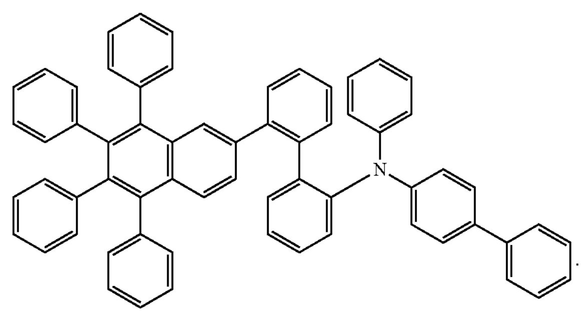
12. An organic electroluminescence device comprising:
a first electrode;
a second electrode on the first electrode; and
a plurality of organic layers between the first electrode and the second electrode,
wherein at least one organic layer among the organic layers comprises an amine compound represented by the following Formula 1:

Formula 1

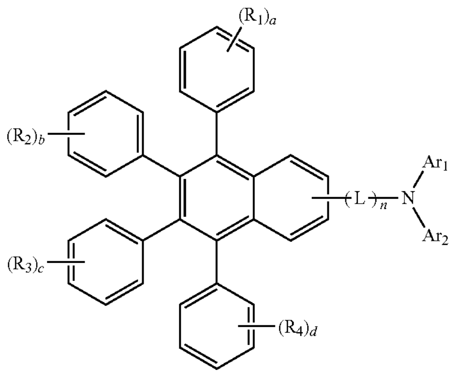

wherein, in Formula 1, $R_1$ to $R_4$ are each independently a hydrogen atom, a deuterium atom, a halogen atom, a cyano group, a substituted or unsubstituted silyl group, a substituted or unsubstituted alkyl group of 1 to 30 carbon atoms, a substituted or unsubstituted alkoxy group of 1 to 30 carbon atoms, a substituted or unsubstituted aryloxy group of 6 to 30 carbon atoms, a substituted or unsubstituted alkylthio group of 1 to 30 carbon atoms, a substituted or unsubstituted arylthio group of 6 to 30 carbon atoms, a substituted or unsubstituted aryl group of 6 to 50 carbon atoms for forming a ring, or a substituted or unsubstituted heteroaryl group of 2 to 50 carbon atoms for forming a ring, a to d are each independently an integer of 0 to 5, L is a substituted or unsubstituted arylene group of 6 to 50 carbon atoms for forming a ring, or a substituted or unsubstituted heteroarylene group of 2 to 50 carbon atoms for forming a ring, n is an integer of 1 to 3, and $Ar_1$ and $Ar_2$ are each independently a substituted or unsubstituted aryl group of 6 to 50 carbon atoms for forming a ring, or a substituted or unsubstituted heteroaryl group of 2 to 50 carbon atoms for forming a ring.

13. The organic electroluminescence device of claim 12, wherein the organic layers respectively comprise:

an emission layer; and a hole transport region between the first electrode and the emission layer, wherein the hole transport region comprises an amine compound represented by Formula 1.

14. The organic electroluminescence device of claim 13, wherein the hole transport region comprises at least one selected from compounds represented in the following Compound Group 1:

Compound Group 1

A1

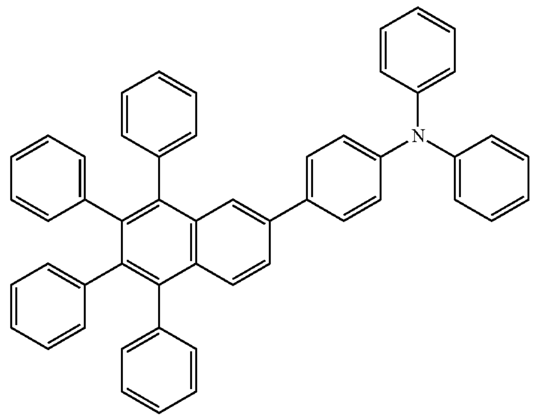

A2

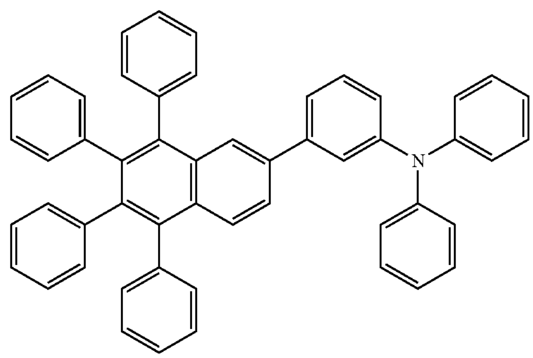

A3

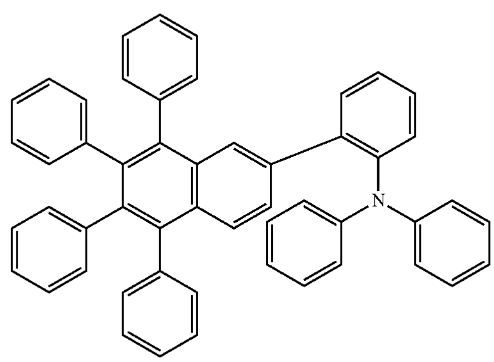

A4

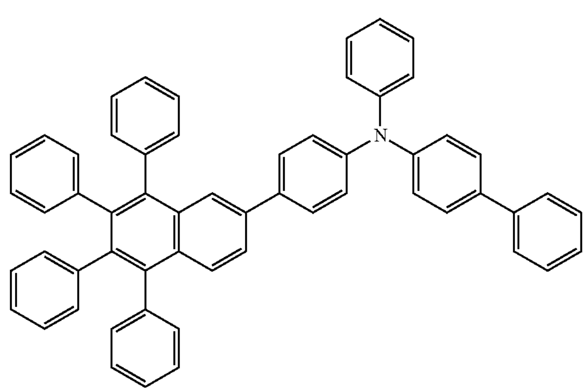

-continued
A5
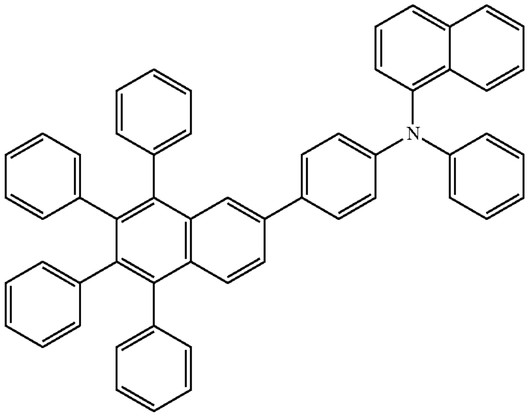
A6
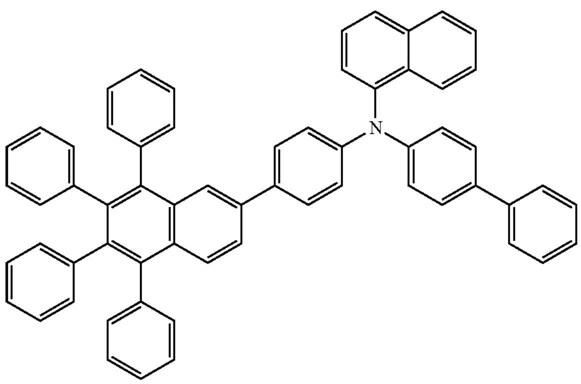
A7
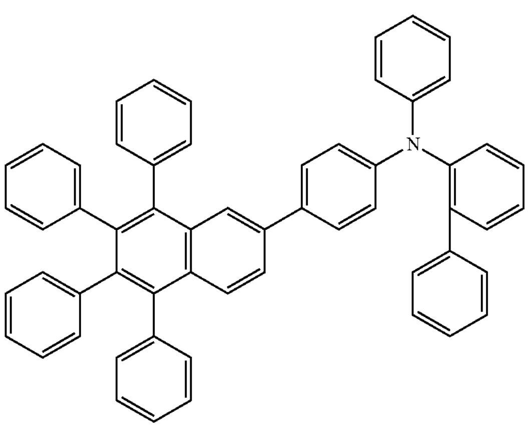
-continued
A8
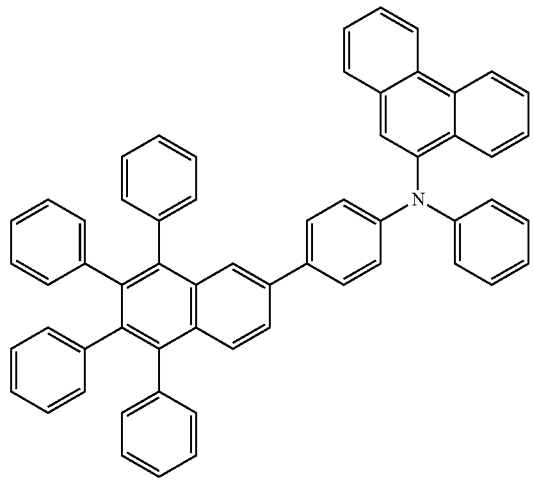
A9
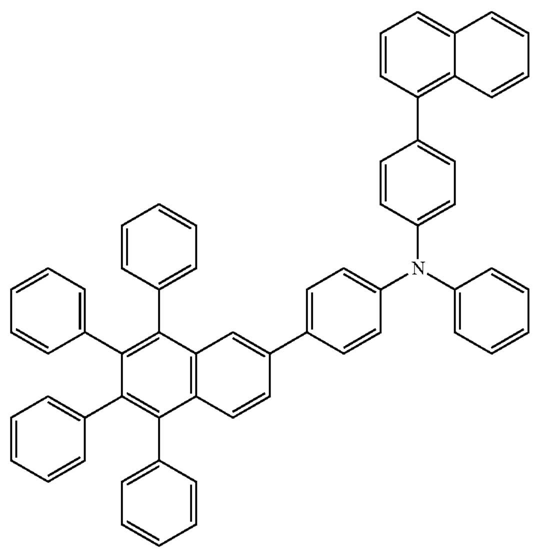
A10
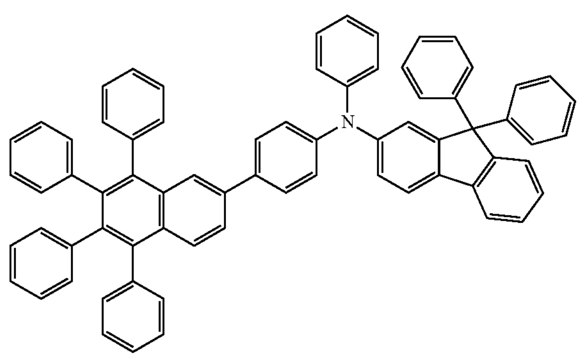

-continued
A11
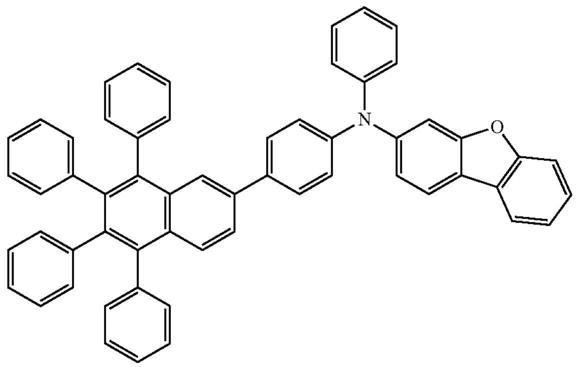
A12
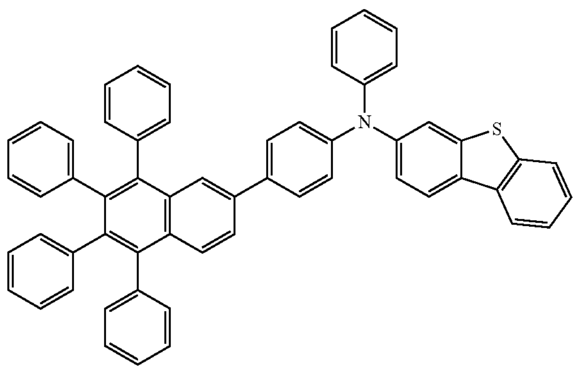
A13
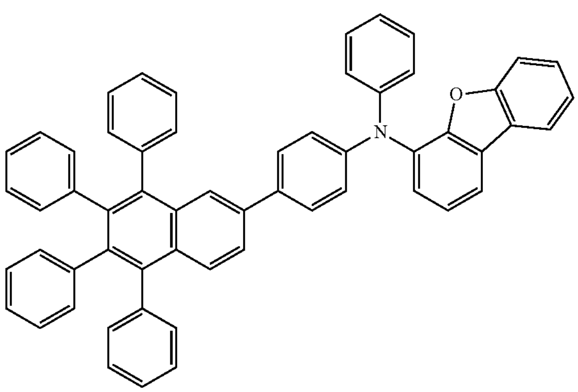
A14
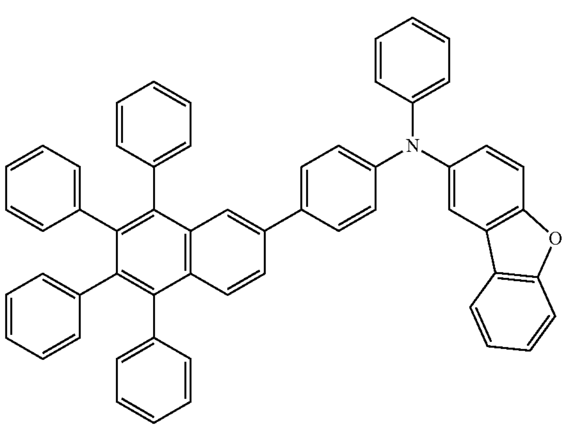
-continued
A15
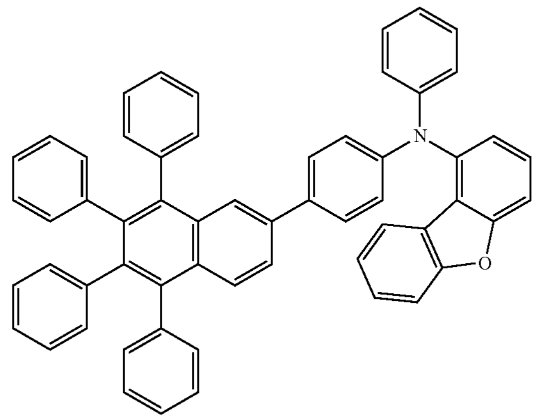
A16
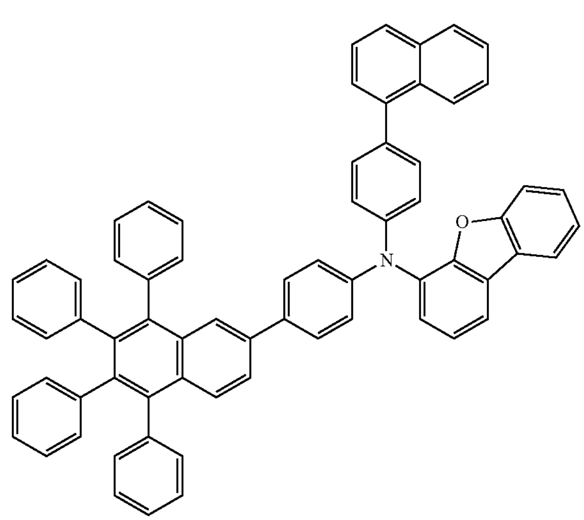
A17
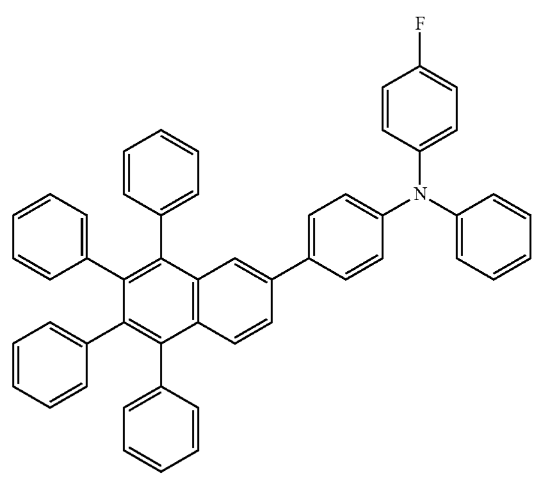

A18
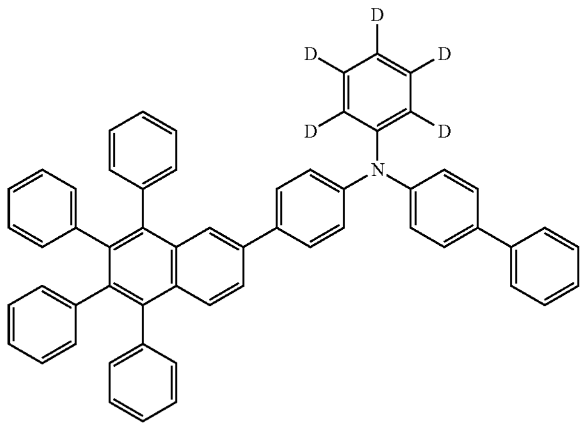
A19
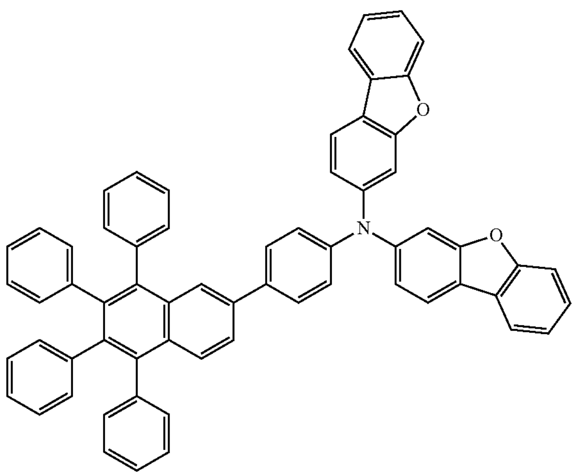
A20
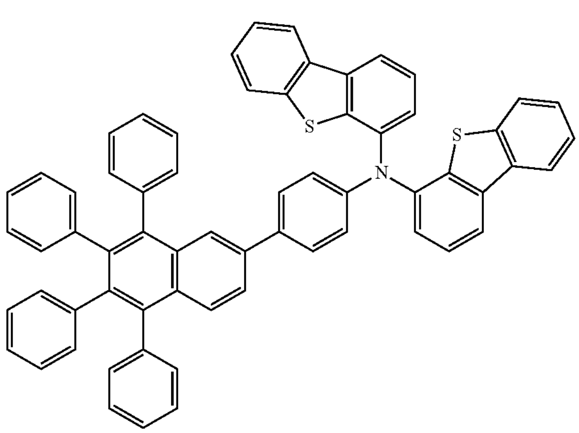
A21
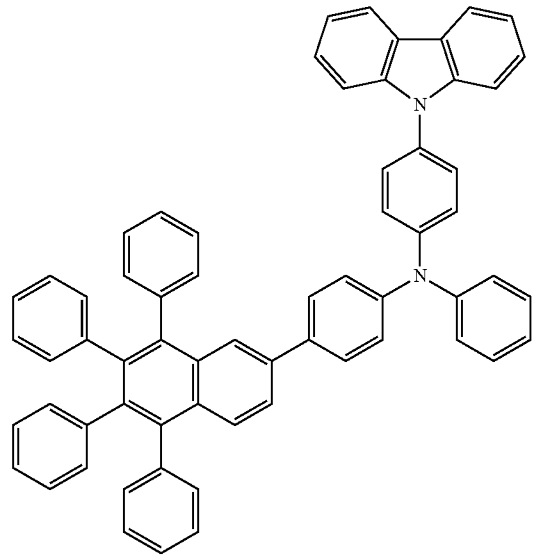
A22
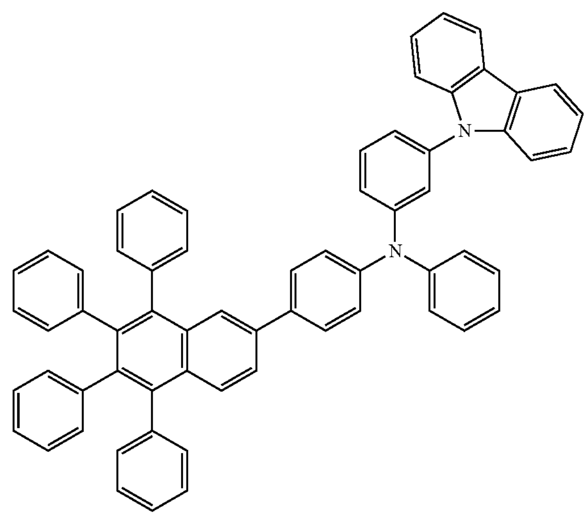
A23
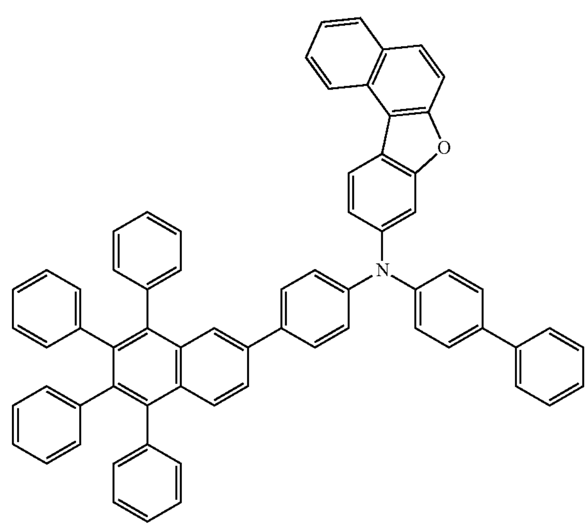

-continued
A24
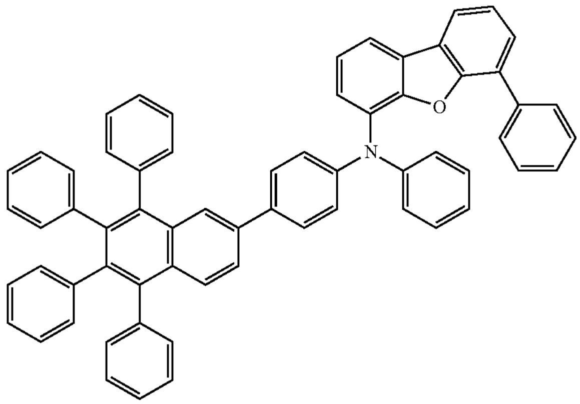
A25
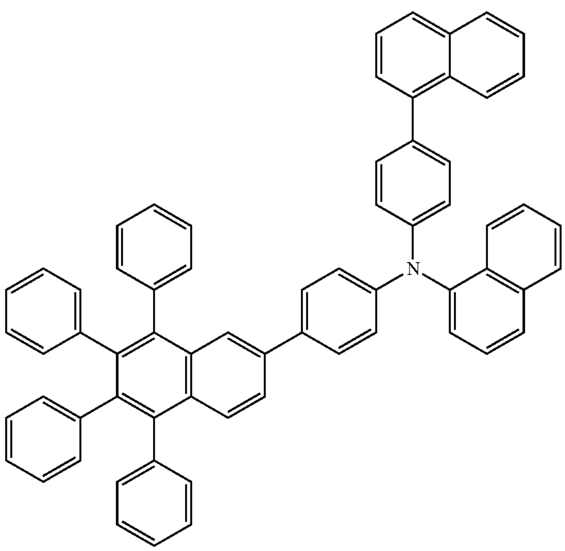
A26
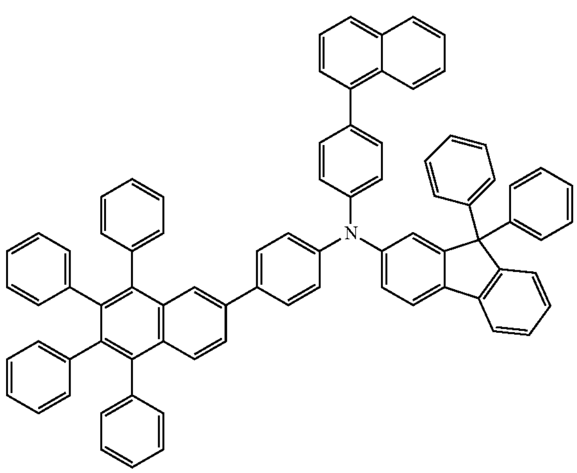
-continued
A27
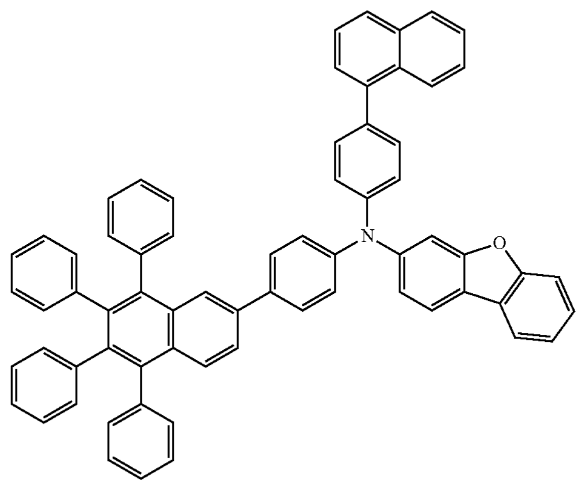
A28
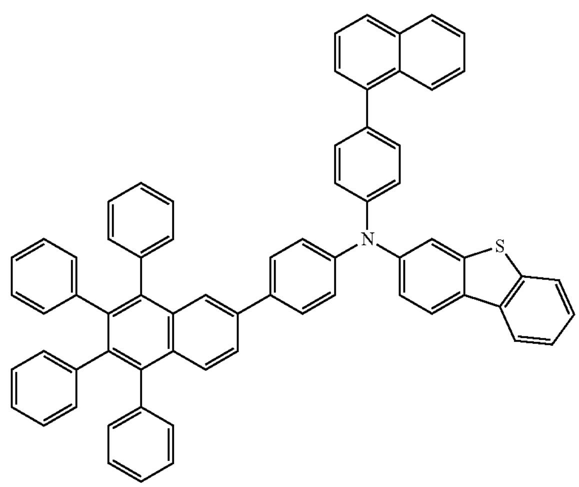
A29
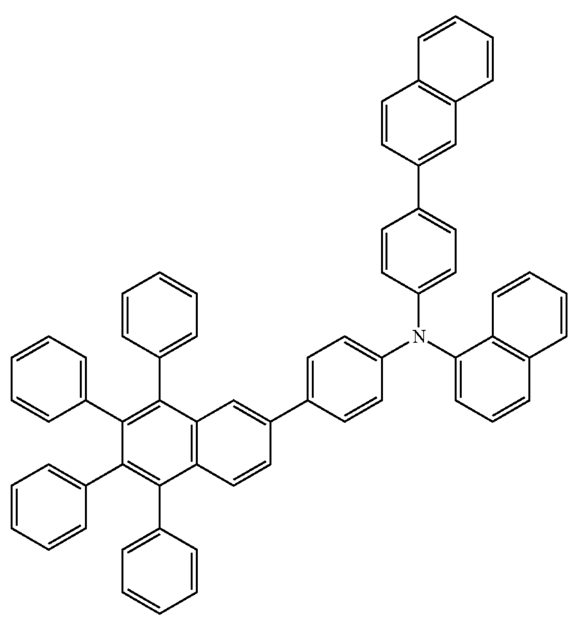

-continued
A30
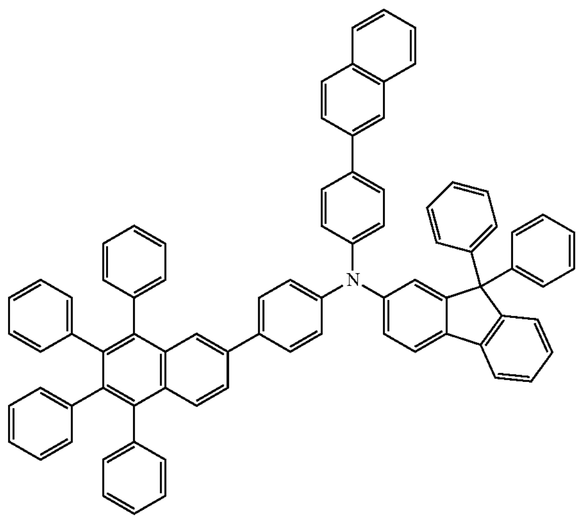
A31
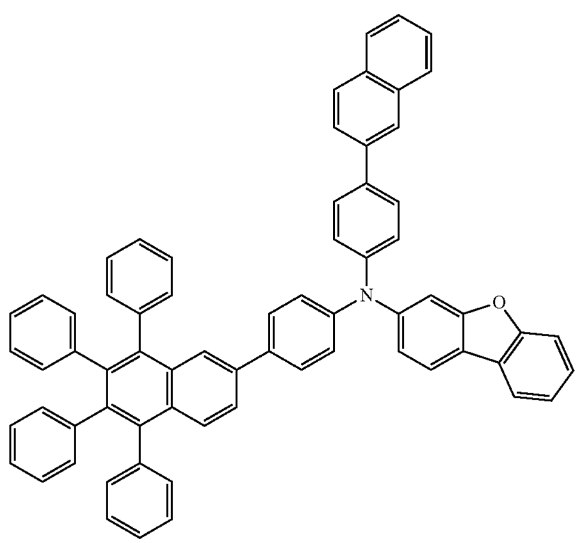
A32
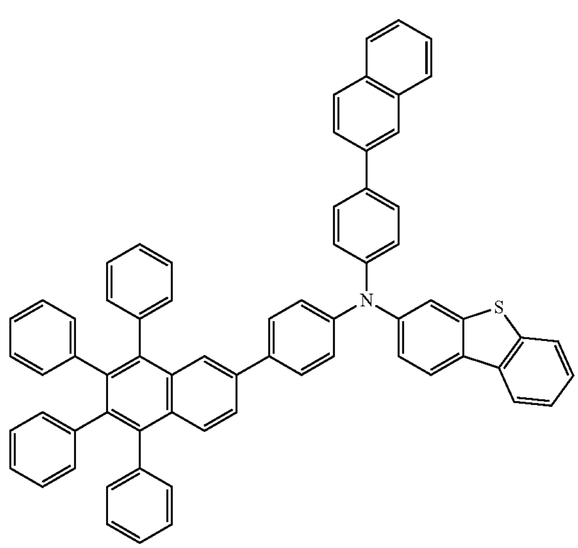
-continued
A33
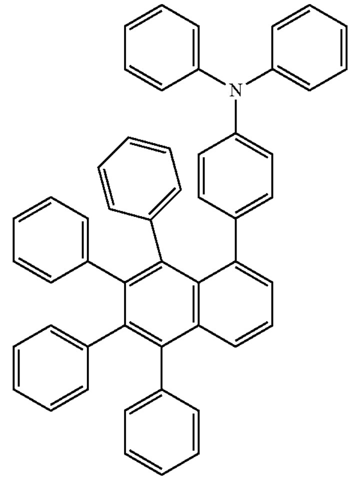
A34
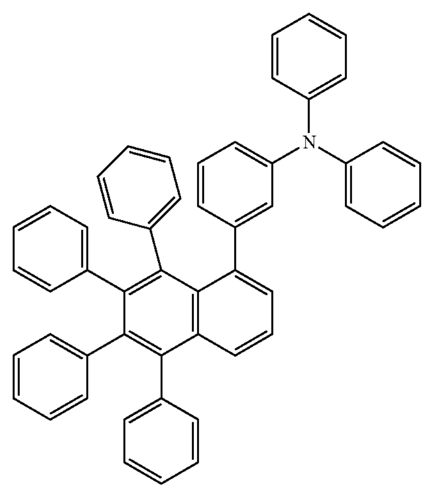
A35
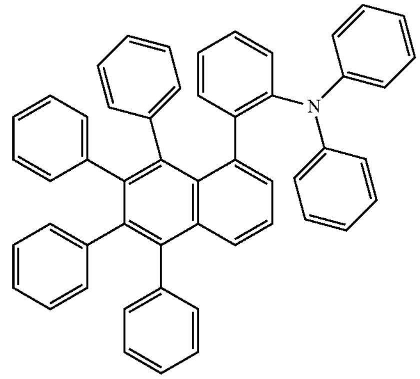

-continued
A36
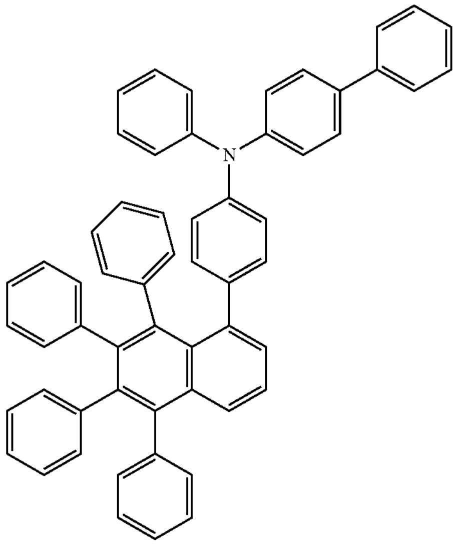
A37
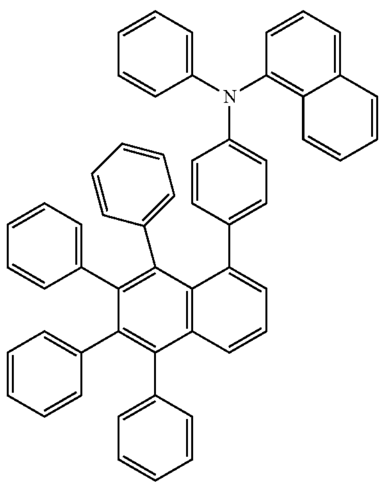
A38
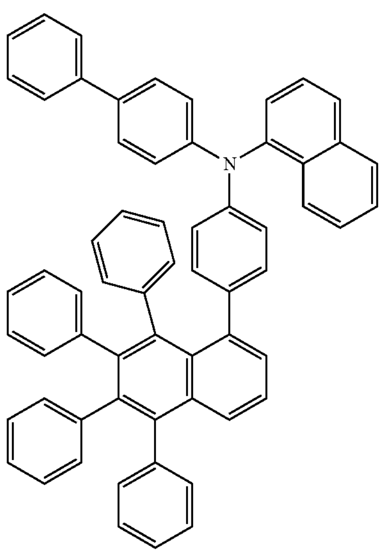
-continued
A39
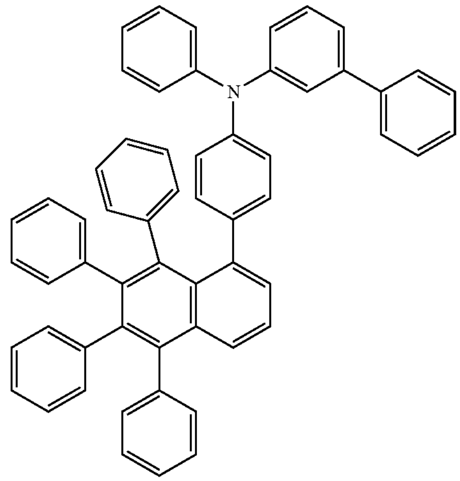
A40
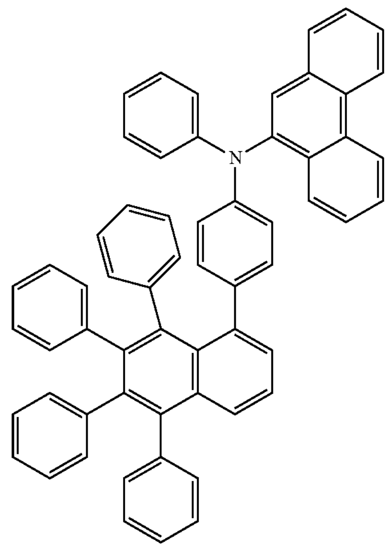
A41
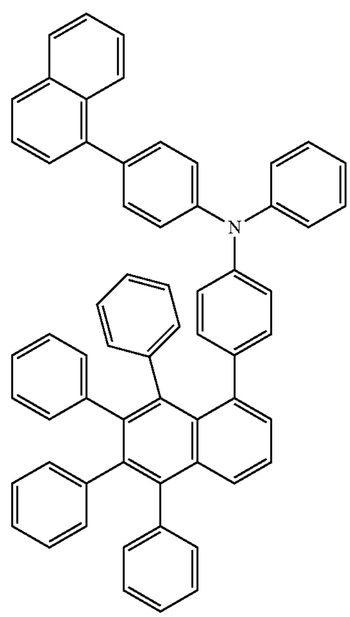

-continued
A42
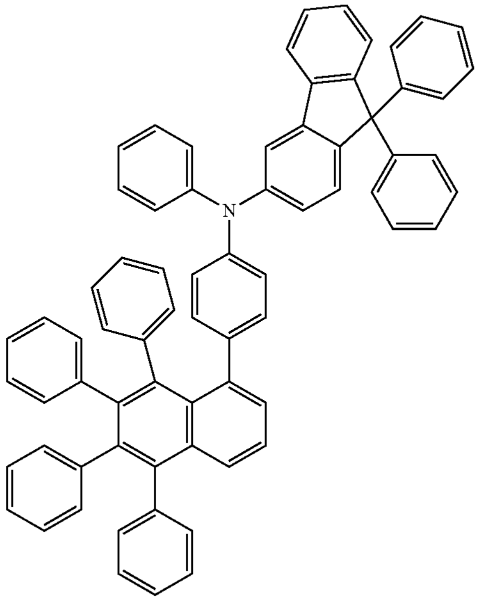
A43
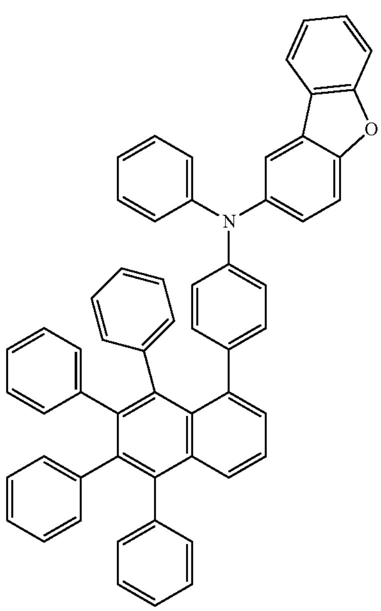
-continued
A44
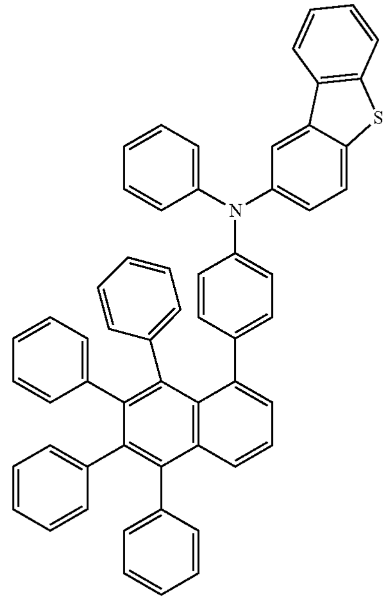
A45
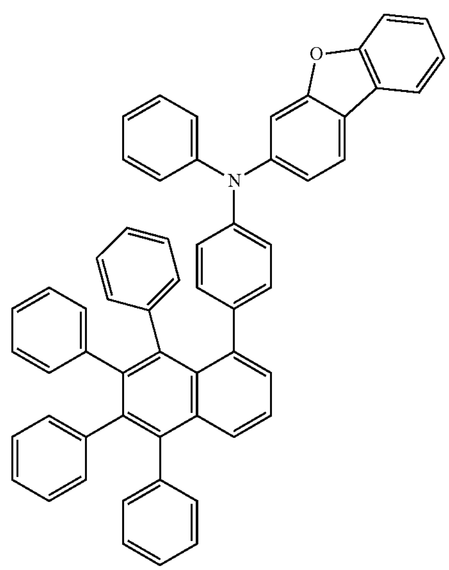

-continued
A46
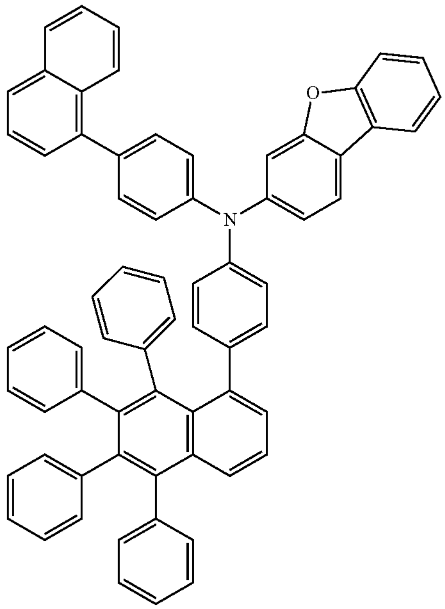
A47
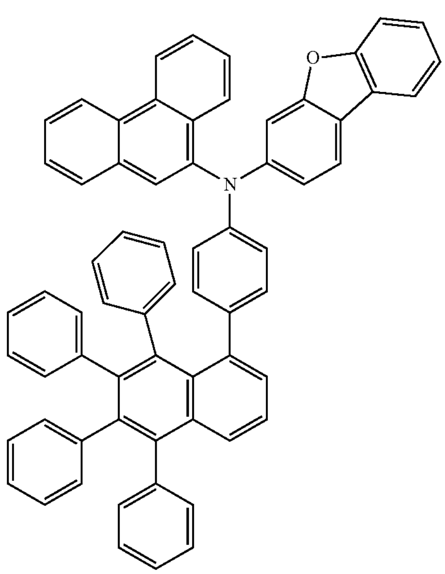
-continued
A48
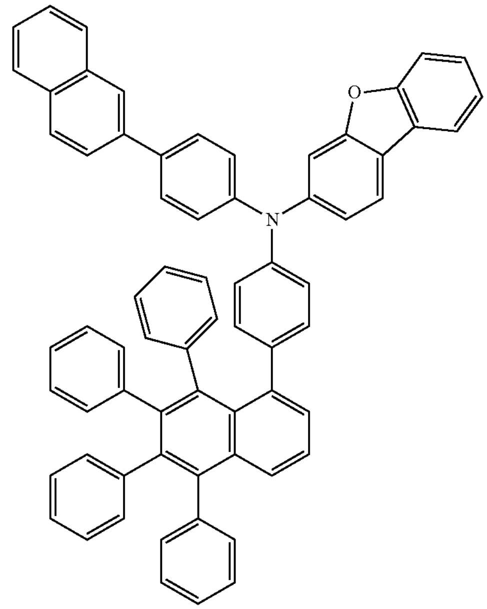
A49
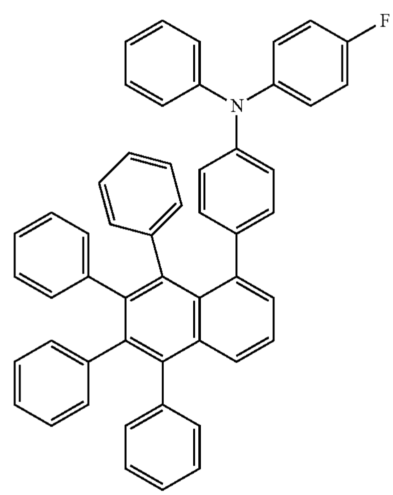
A50
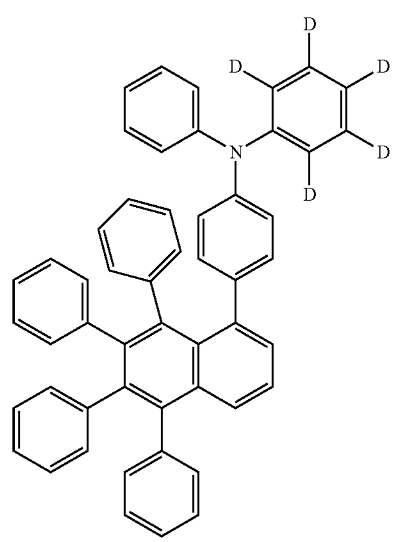

-continued
A51
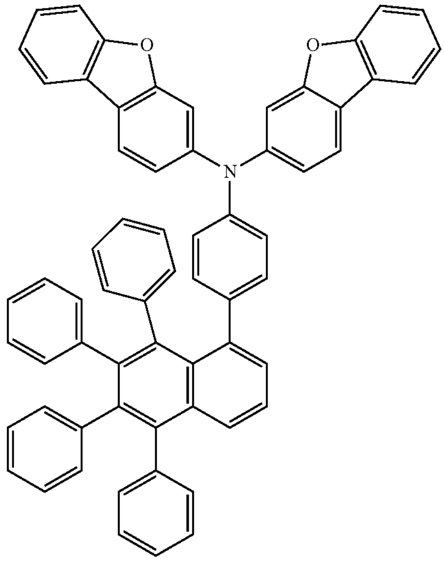
A52
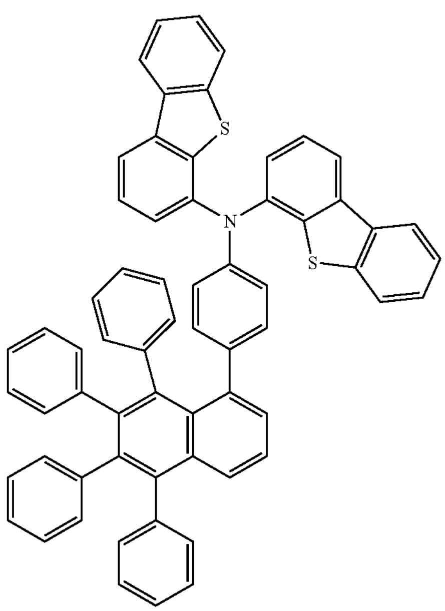
-continued
A53
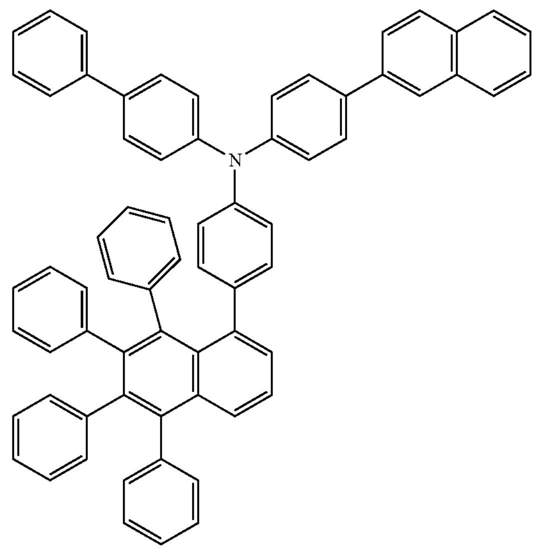
A54
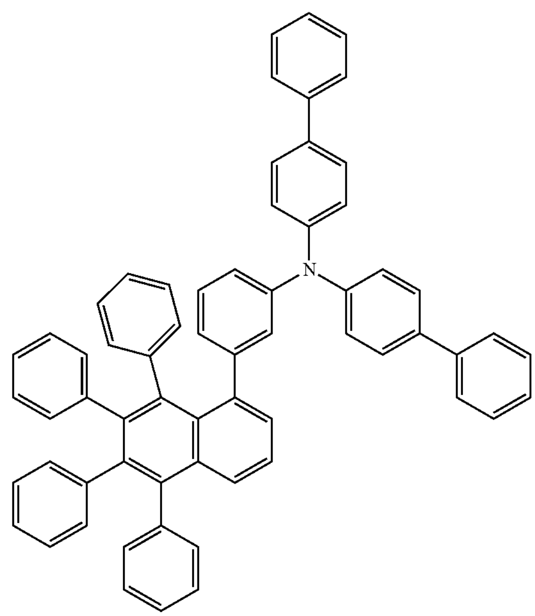
A55
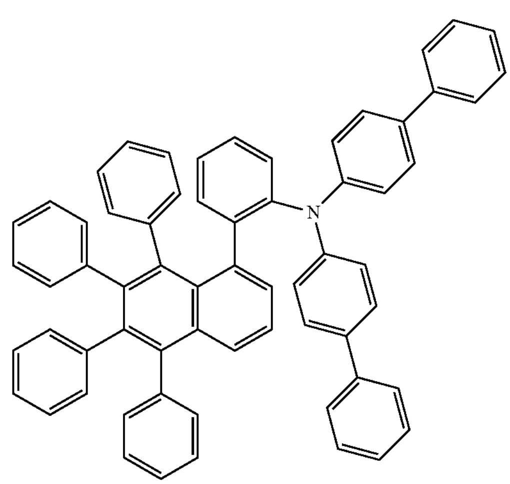

-continued
A56
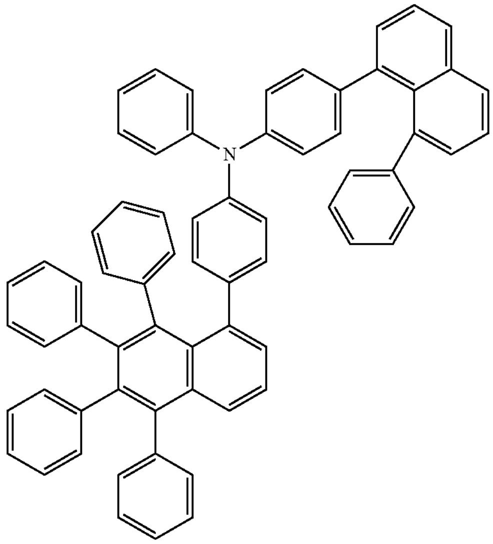
A57
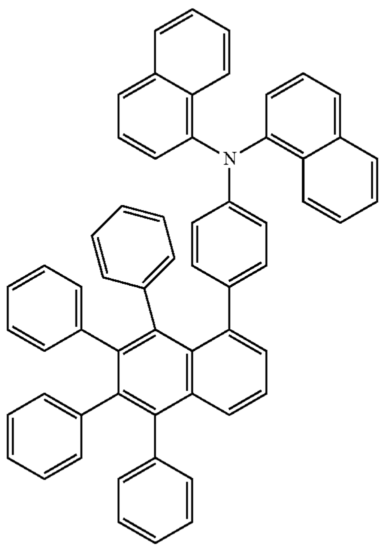
A58
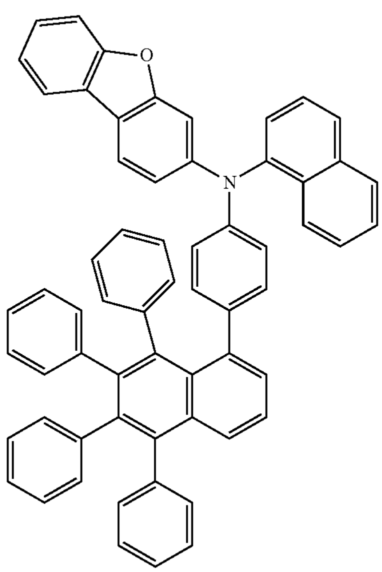
-continued
A59
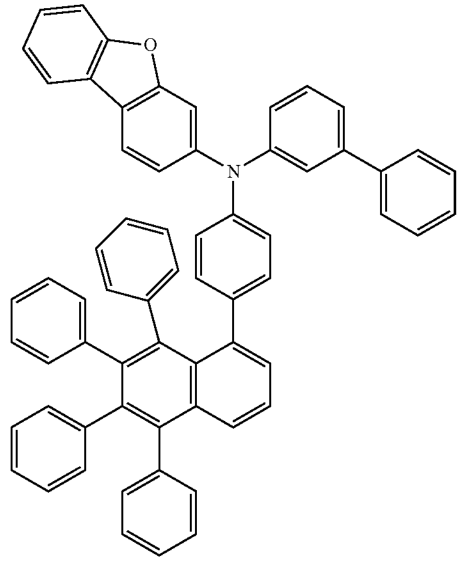
A60
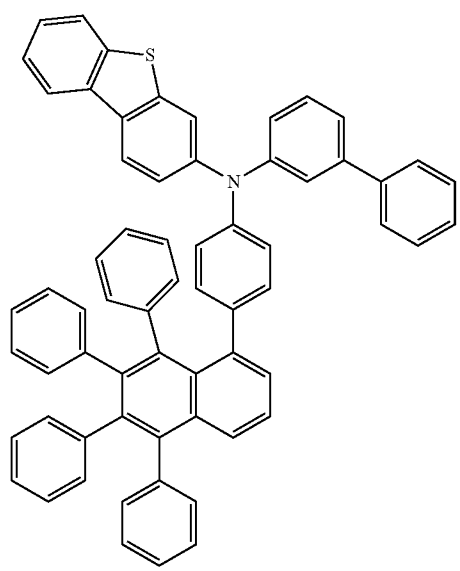

-continued
A61
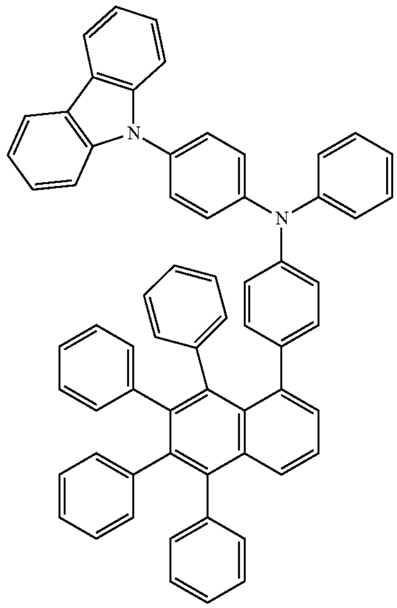
A62
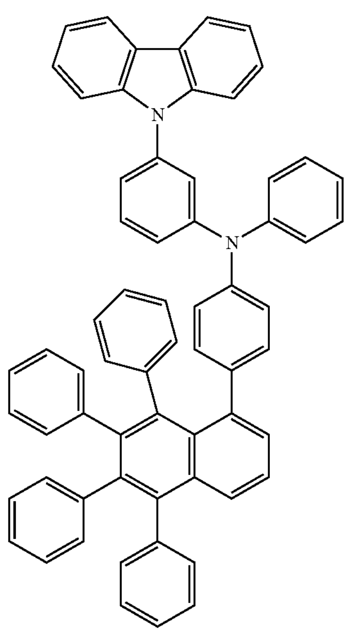
-continued
A63
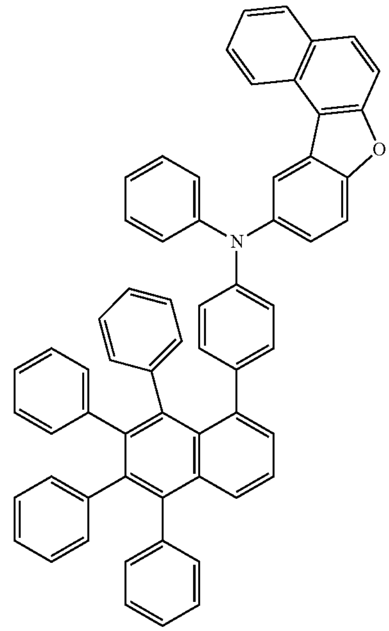
A64
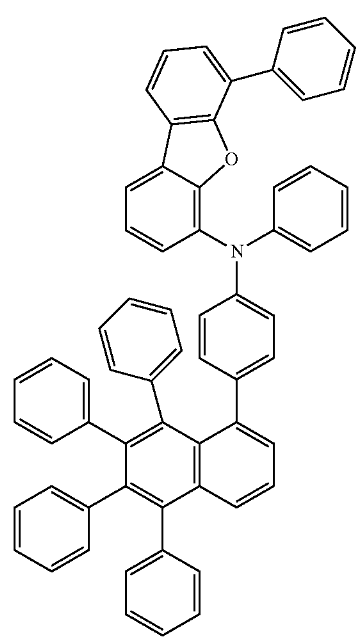

-continued
A65
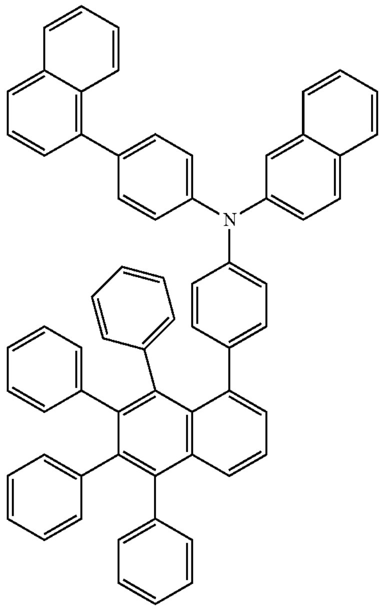
A66
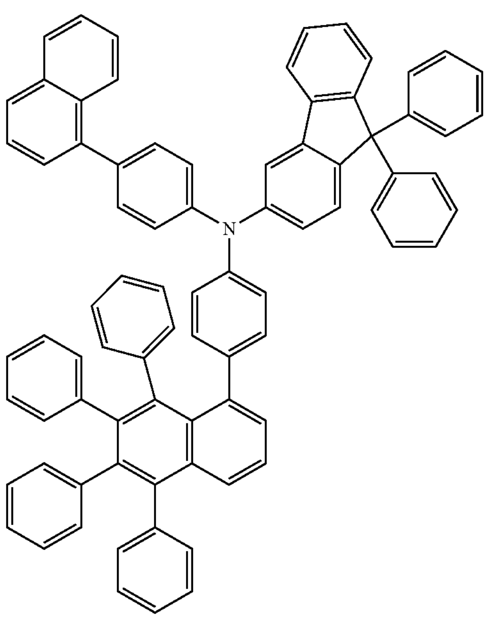
-continued
A67
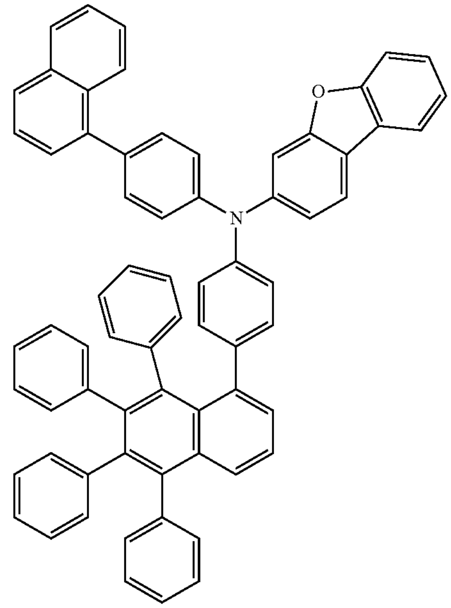
A68
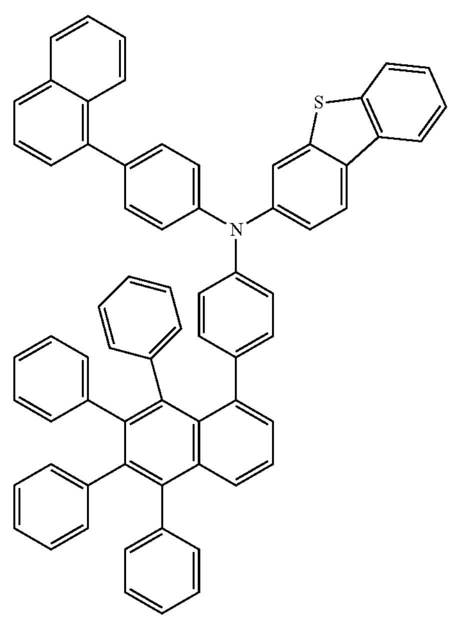

-continued
A69
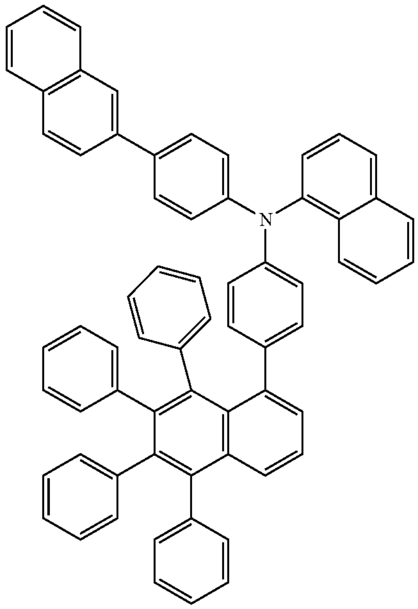
A70
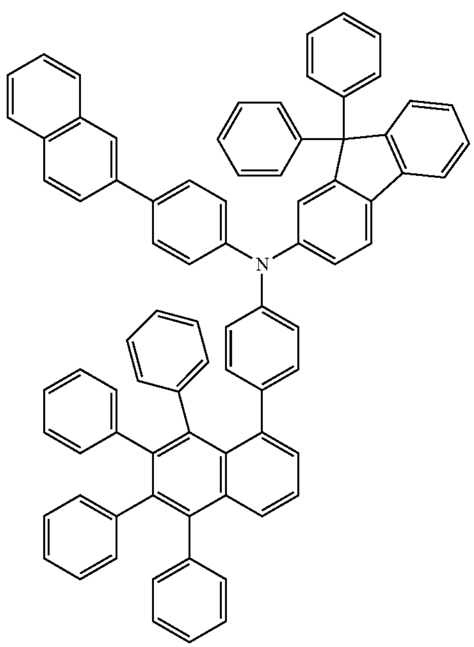
-continued
A71
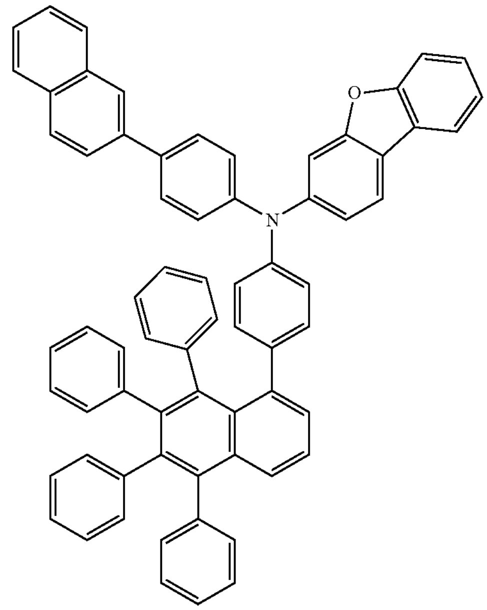
A72
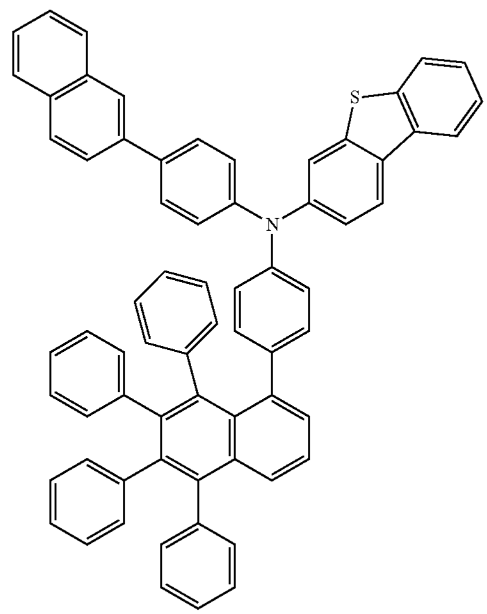
A73
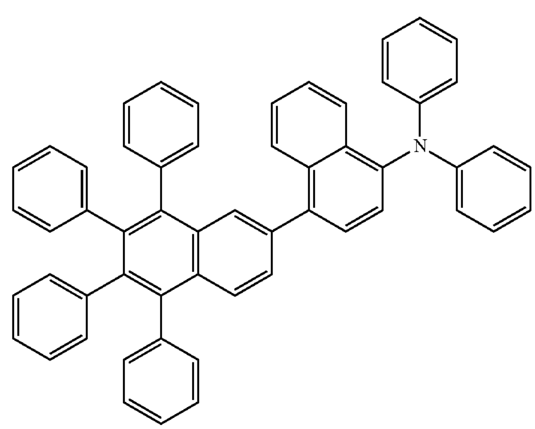

-continued
A74
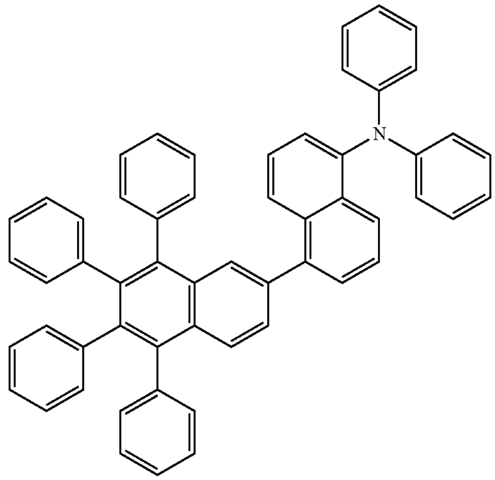
A75
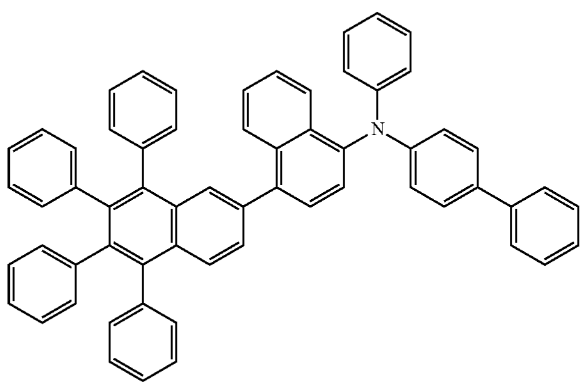
A76
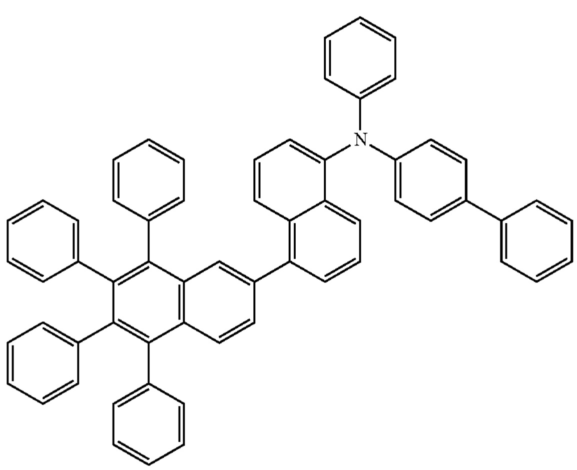
-continued
A77
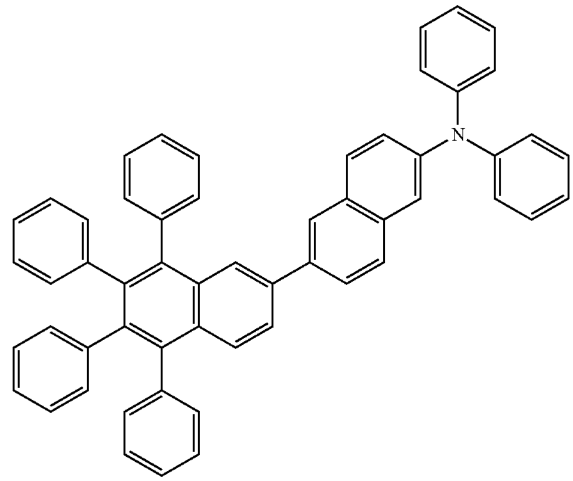
A78
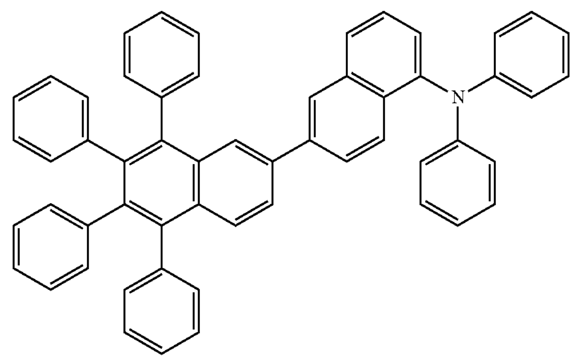
A79
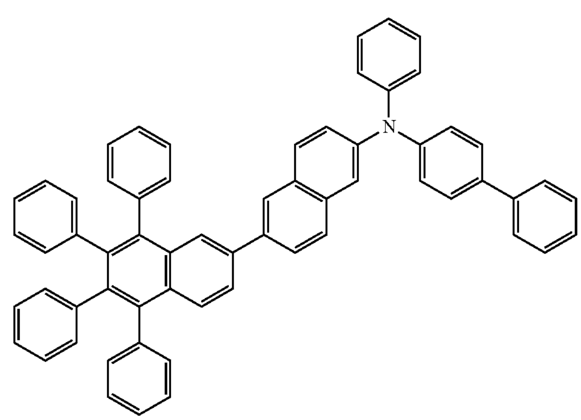

-continued
A80
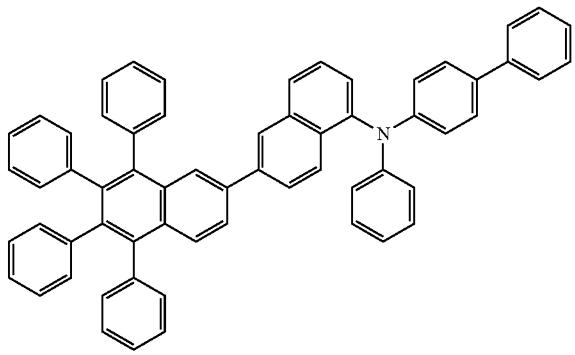
A81
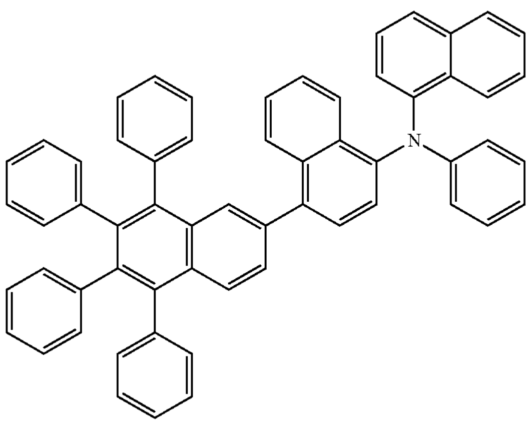
A82
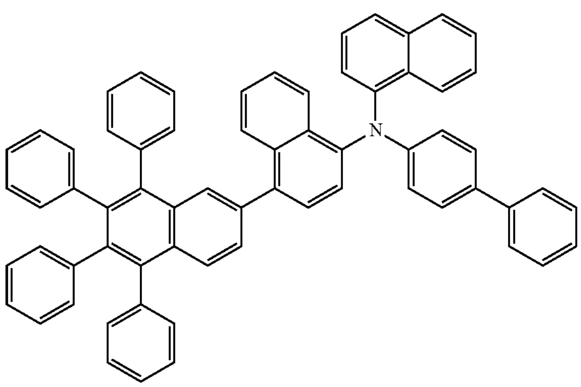
A83
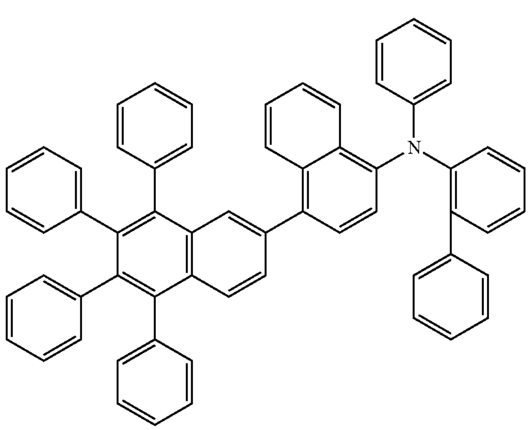
-continued
A84
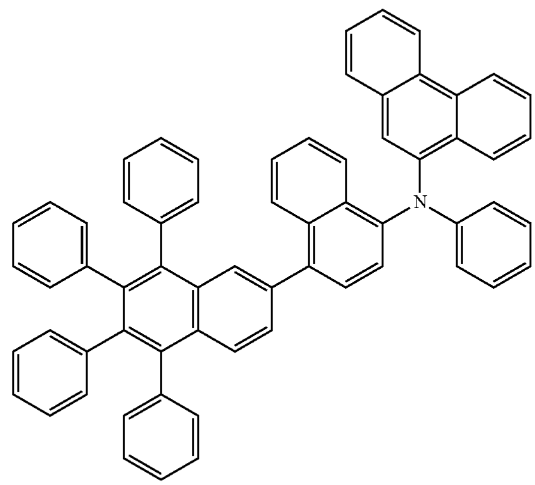
A85
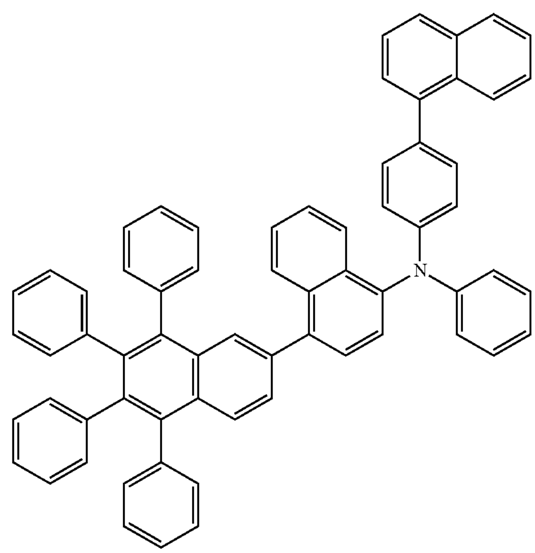
A86
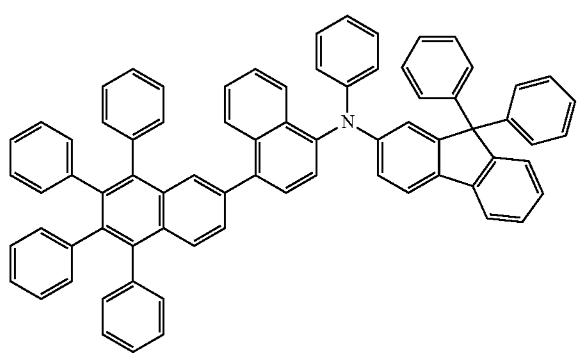

-continued
A87
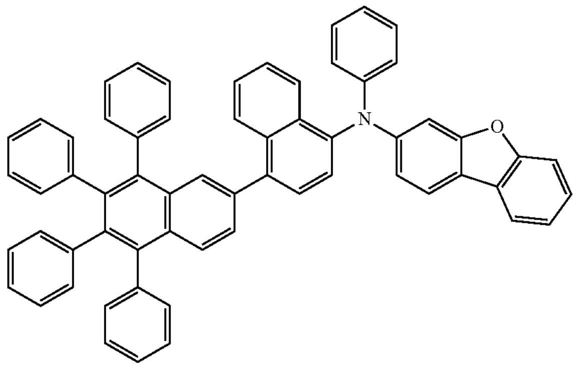
A88
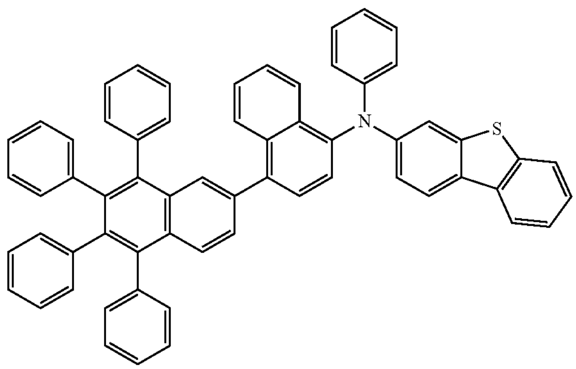
A89
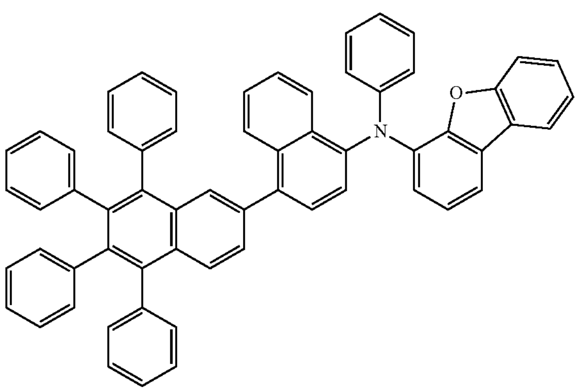
A90
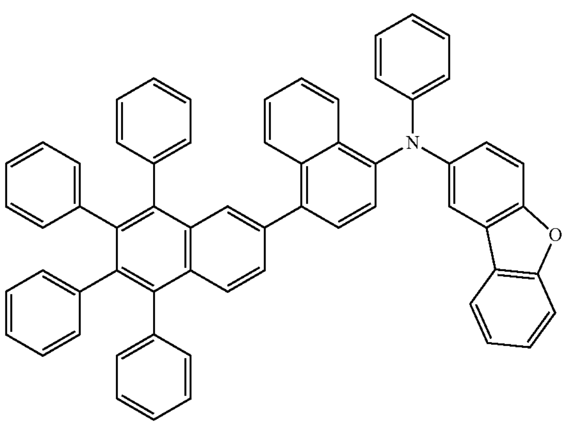
-continued
A91
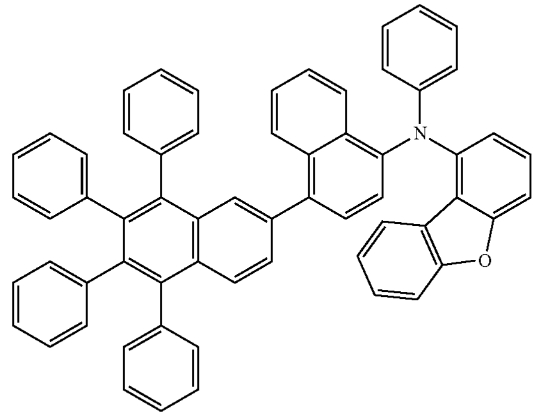
A92
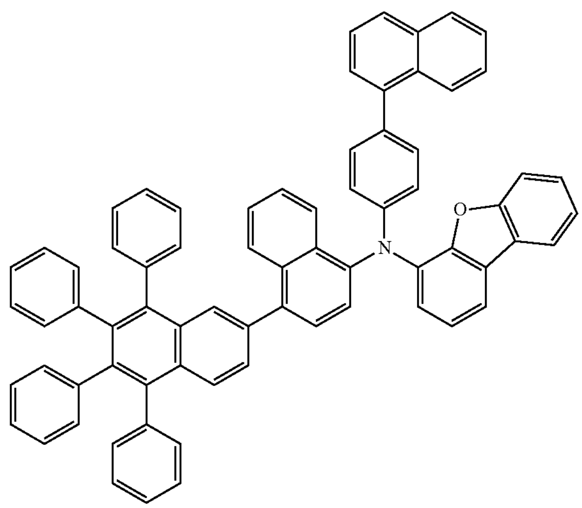
A93
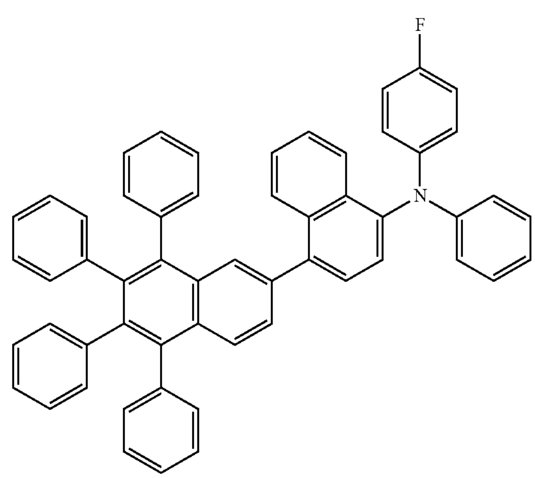

-continued
A94
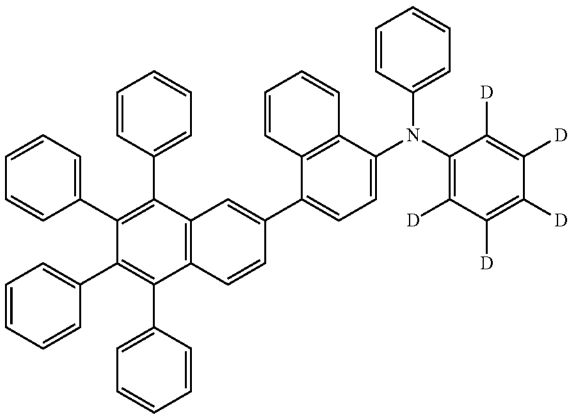
A95
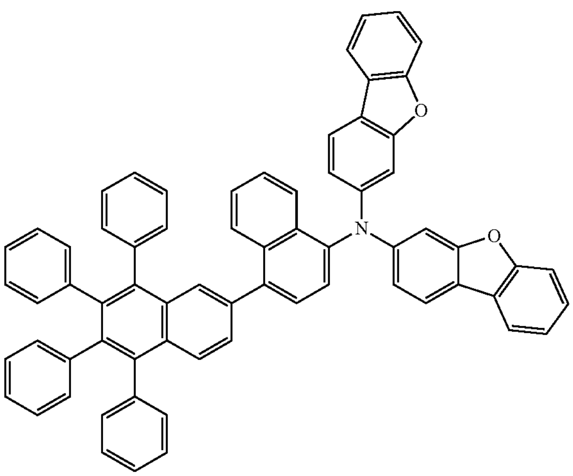
A96
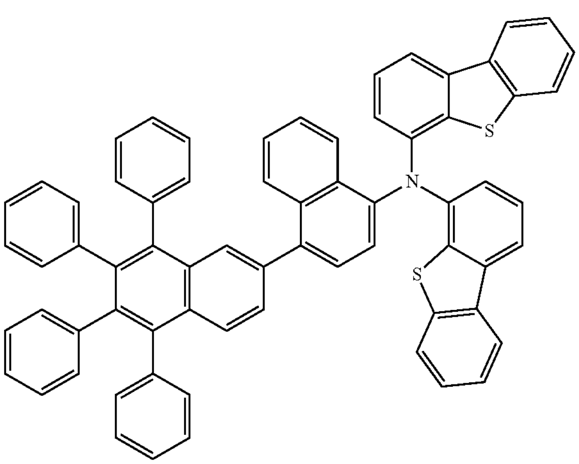
-continued
A97
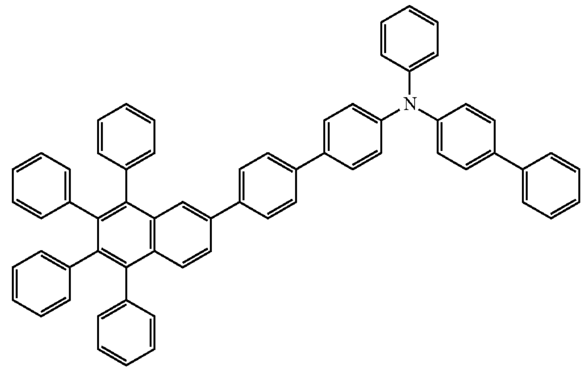
A98
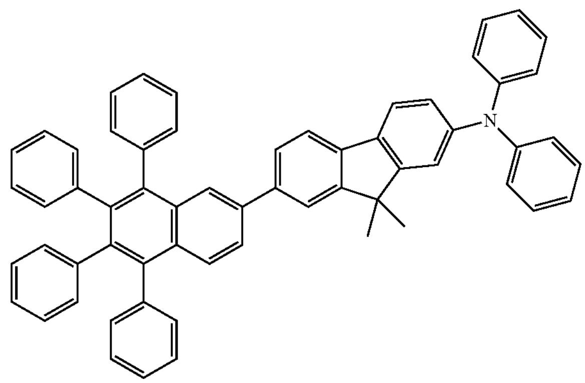
A99
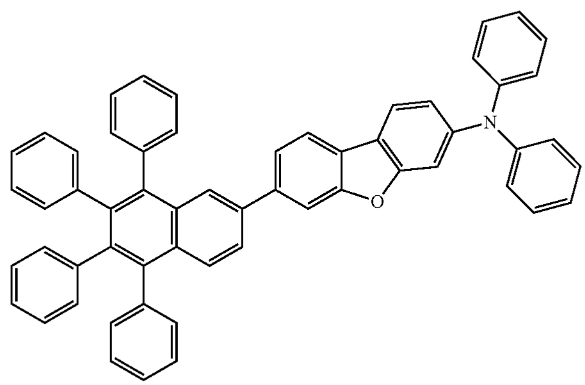
A100
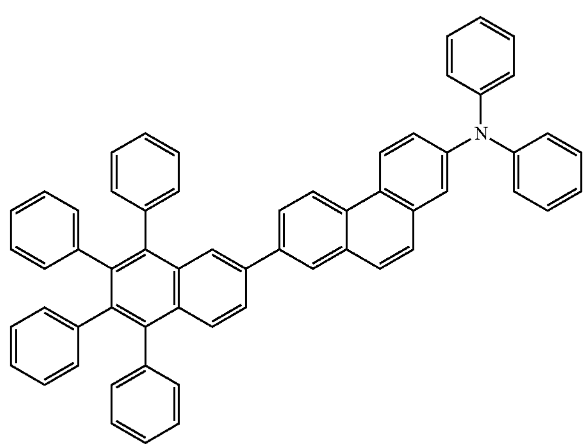

A101
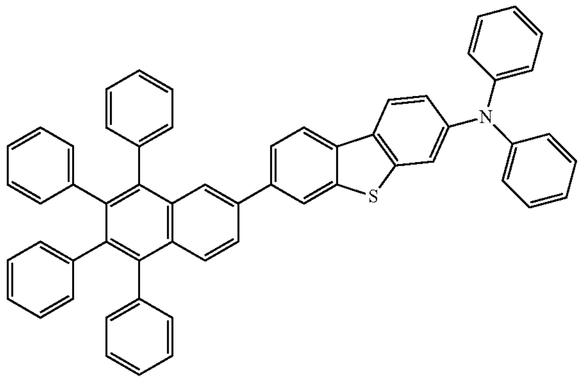
A102
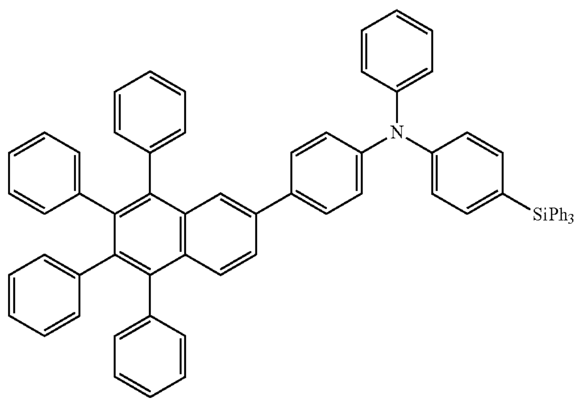
A103
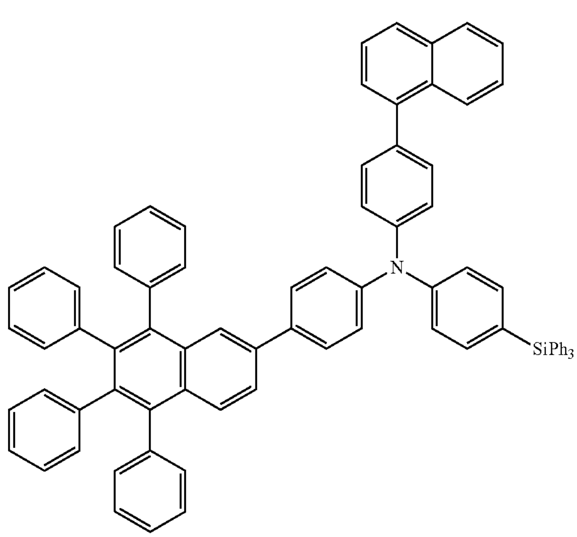
A104
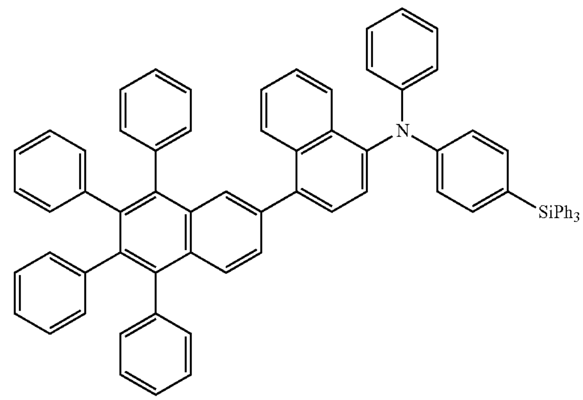
A105
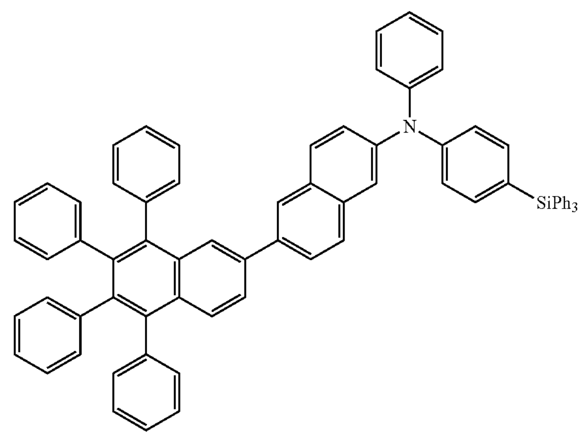
A106
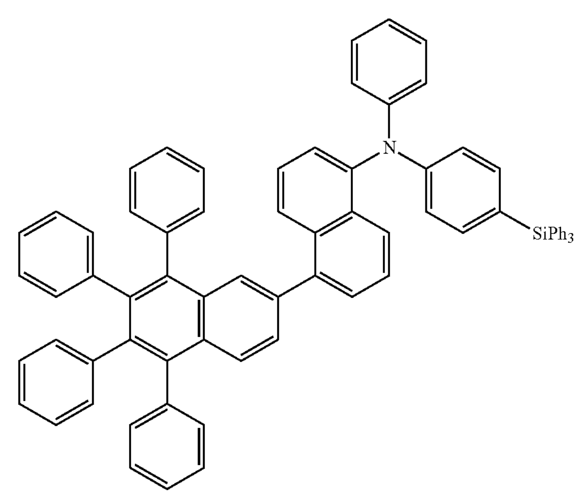

-continued
A107
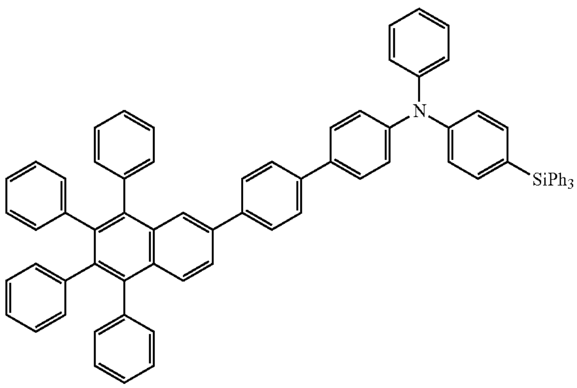
A108
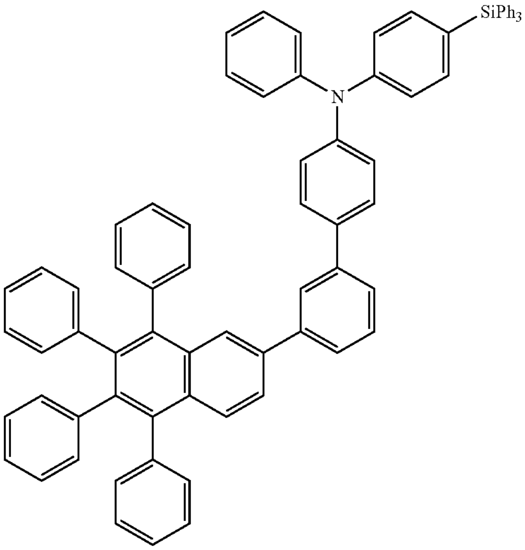
A109
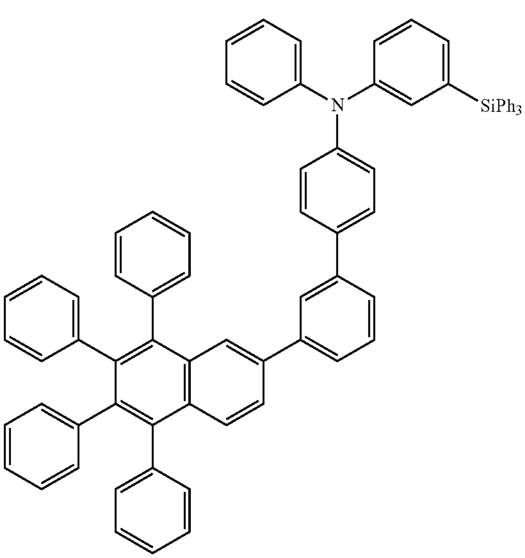
-continued
A110
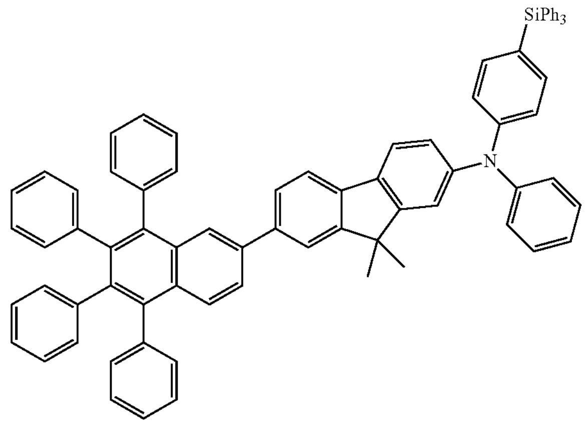
A111
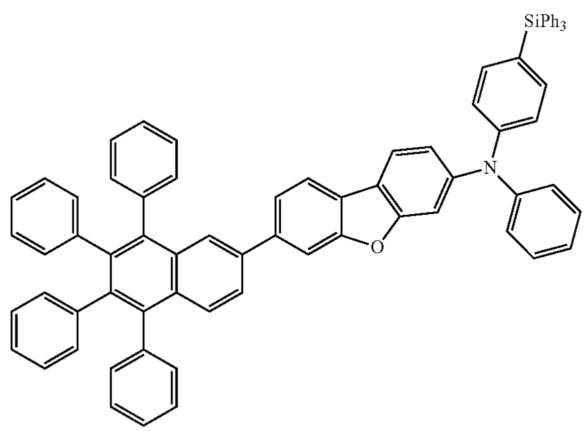
A112
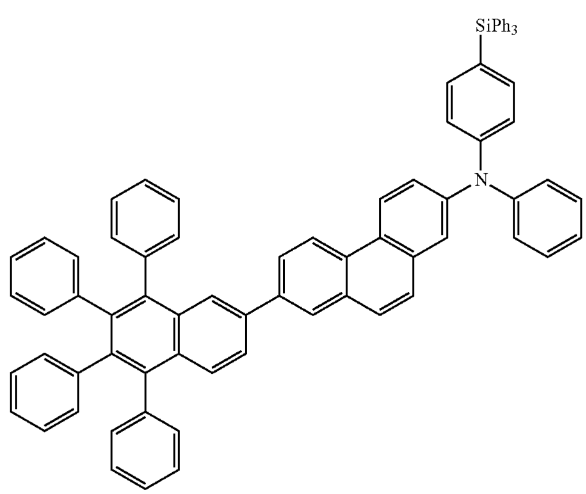

-continued
A113
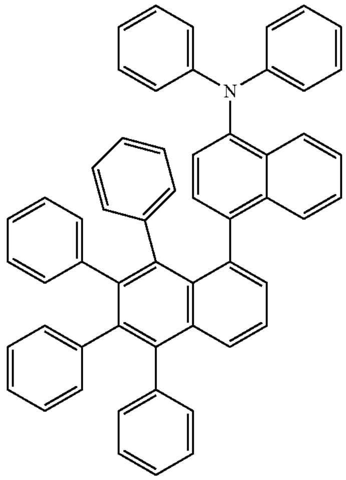
A114
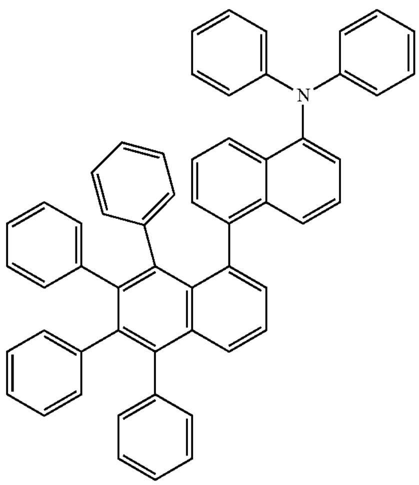
A115
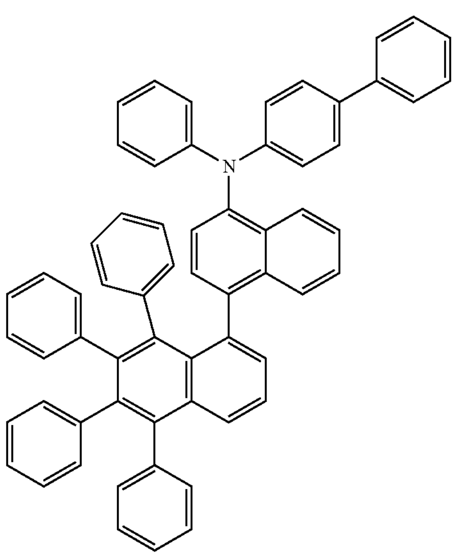
-continued
A116
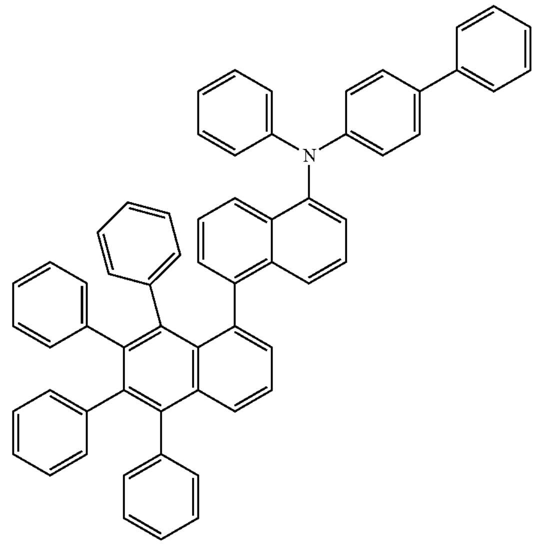
A117
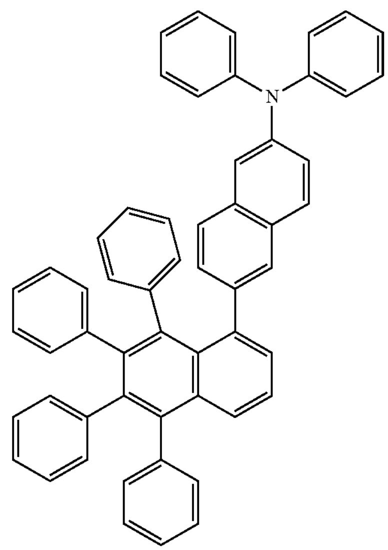
A118
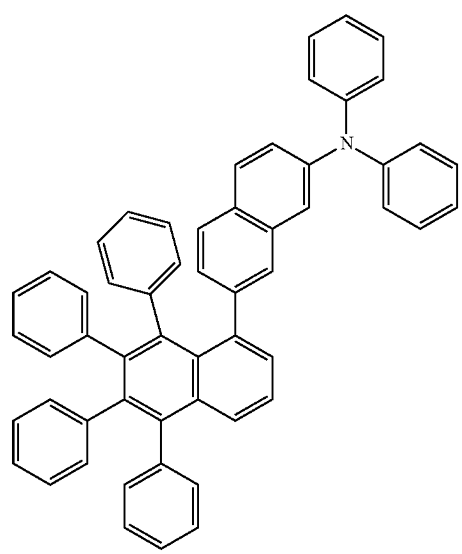

-continued
A119
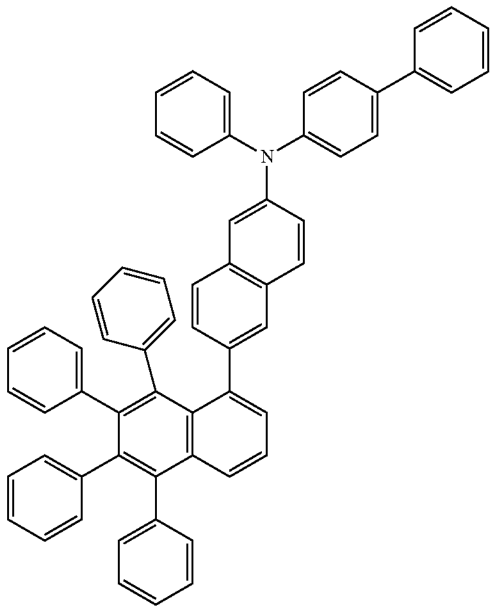
A120
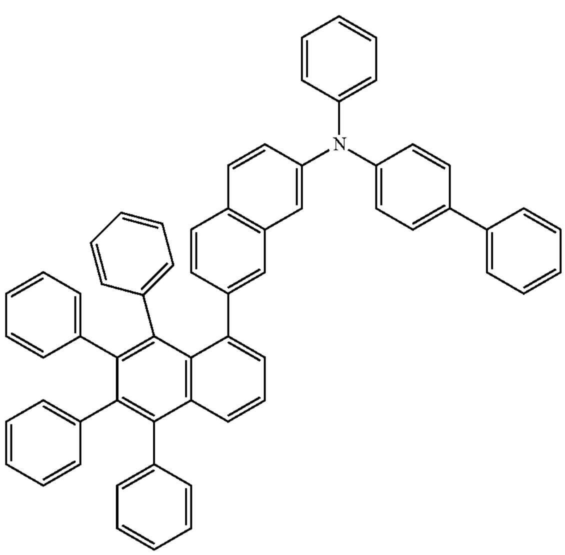
-continued
A121
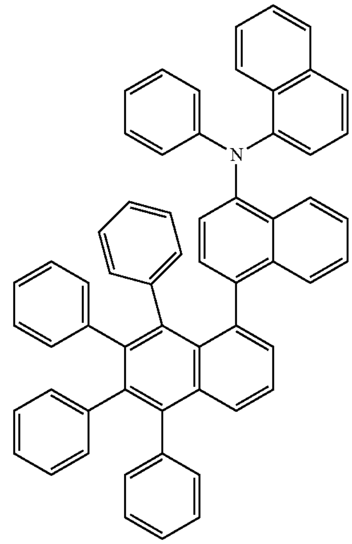
A122
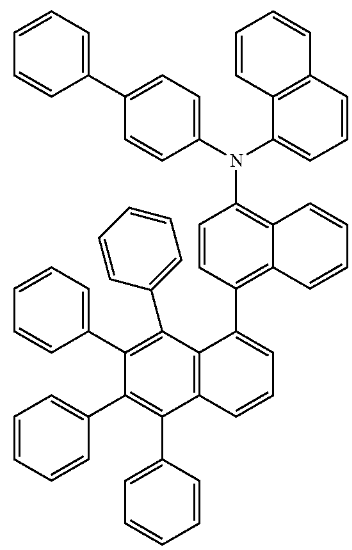
A123
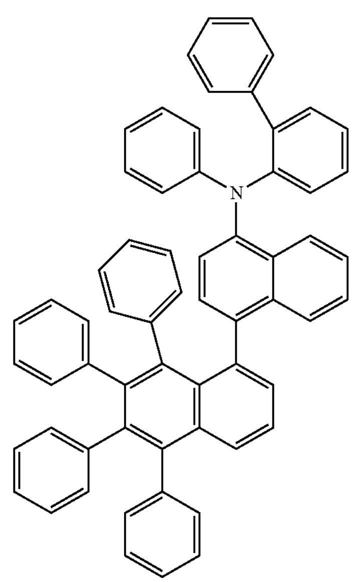

-continued
A124
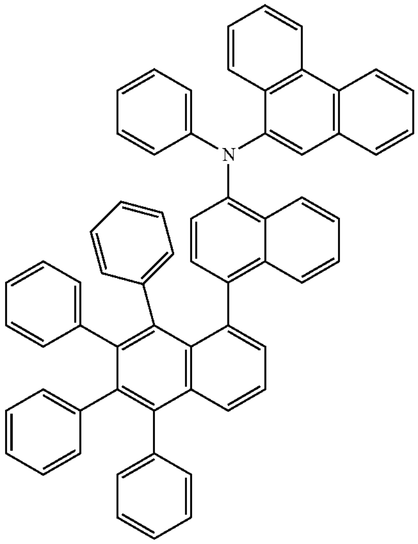
A125
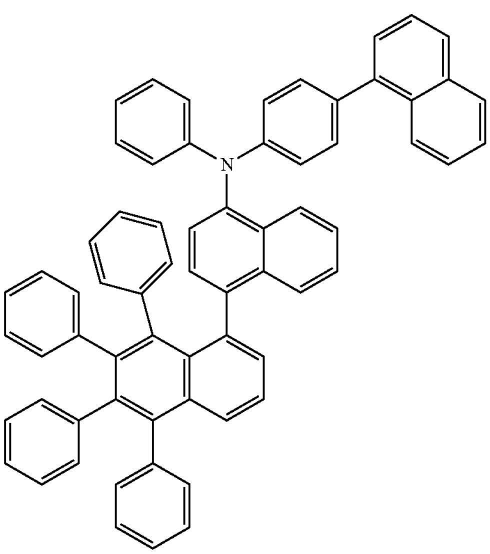
-continued
A126
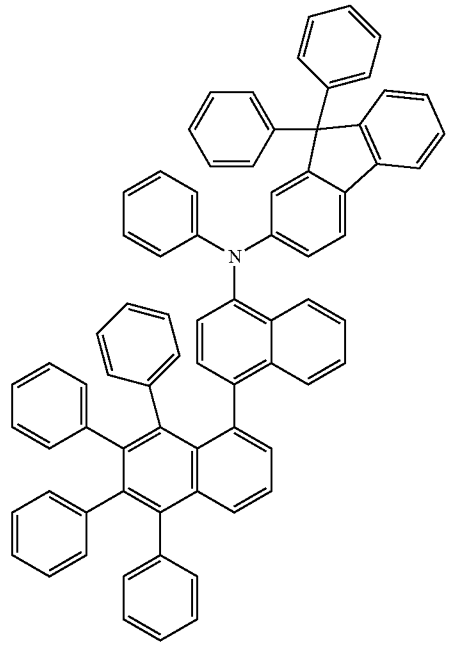
A127
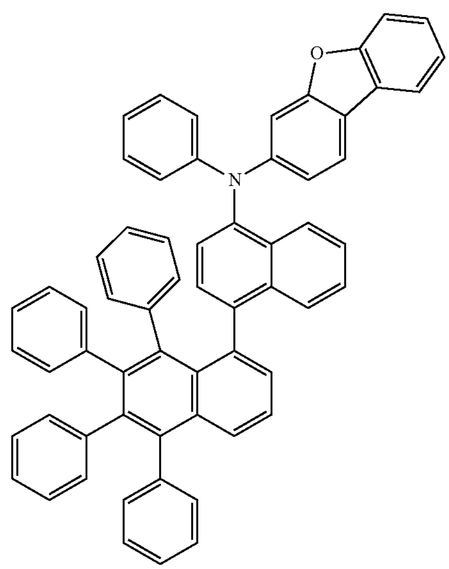

A128
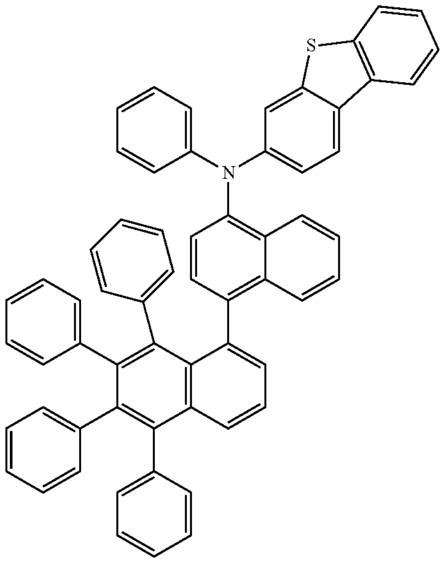
A129
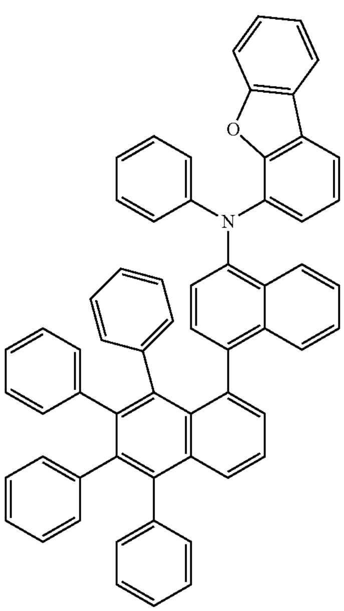
A130
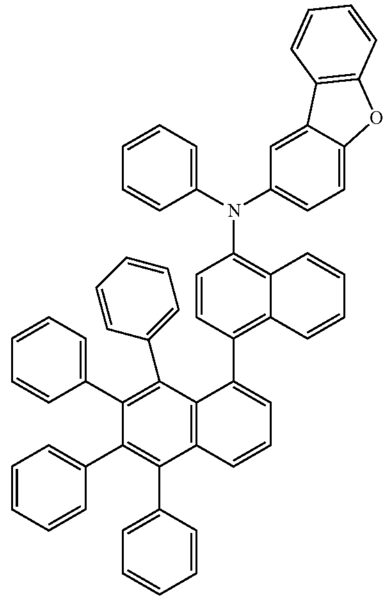
A131
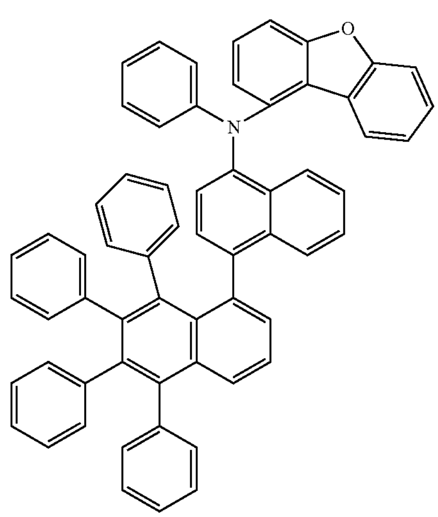

-continued
A132
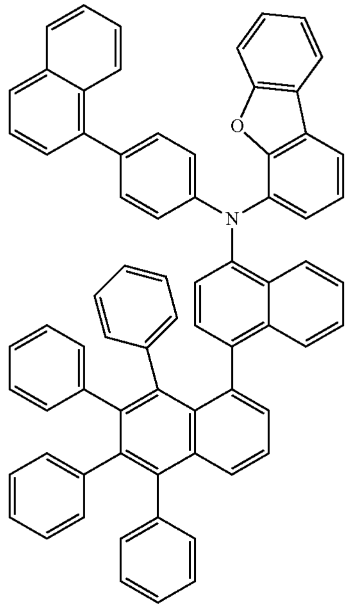
A133
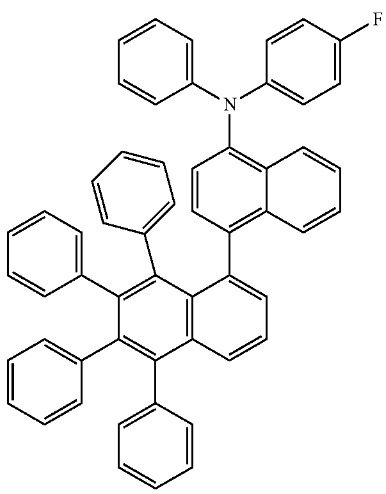
A134
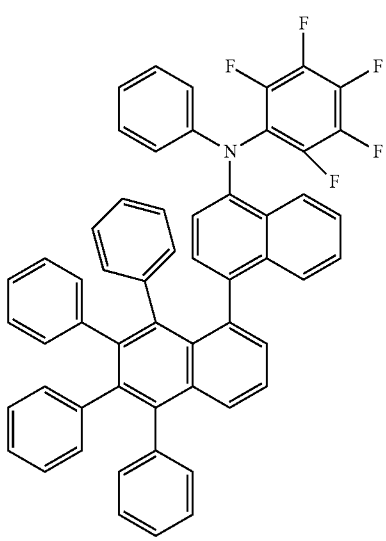
-continued
A135
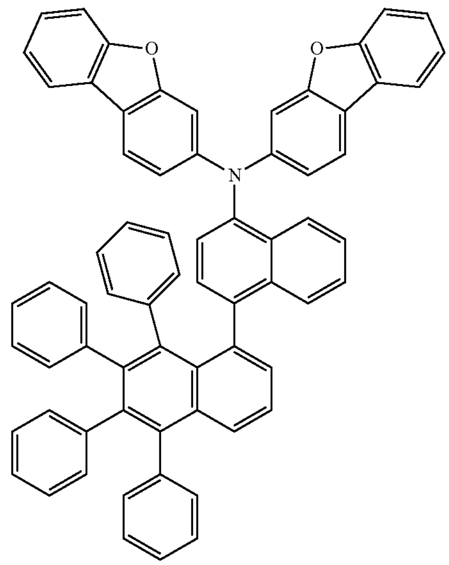
A136
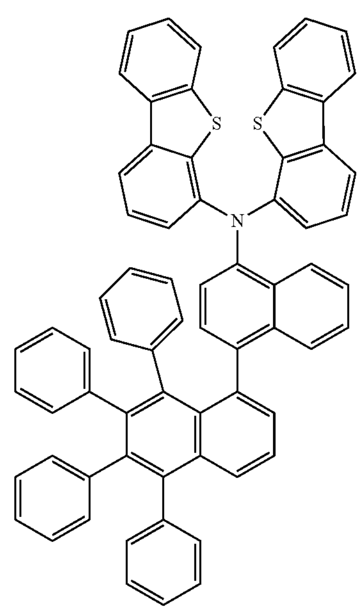

-continued
A137
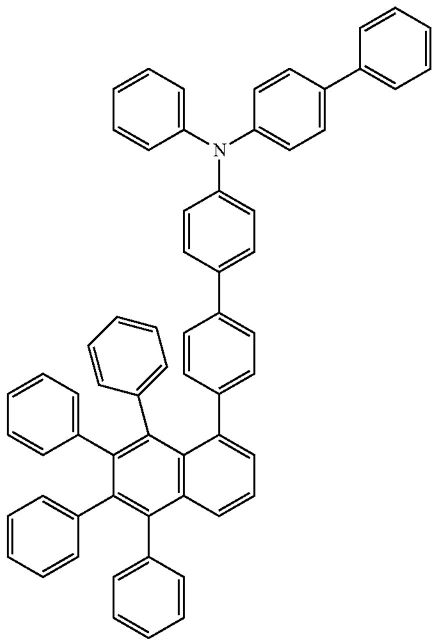
-continued
A139
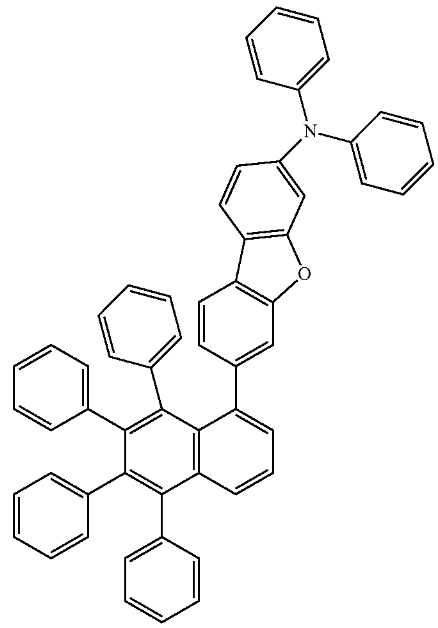
A138
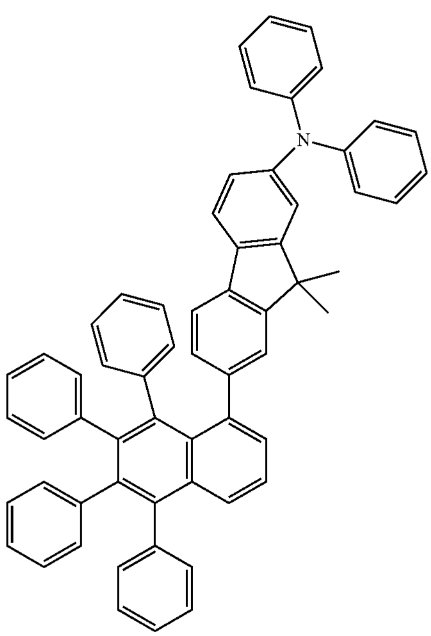
A140
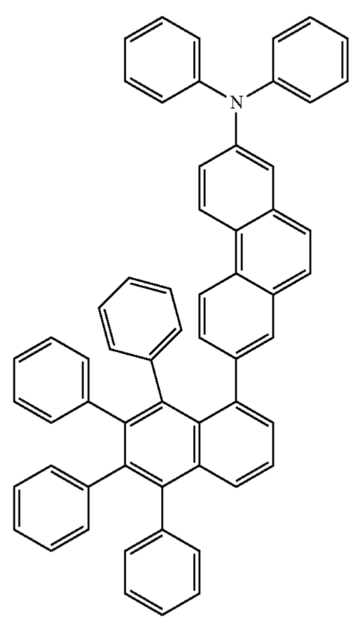

-continued
A141
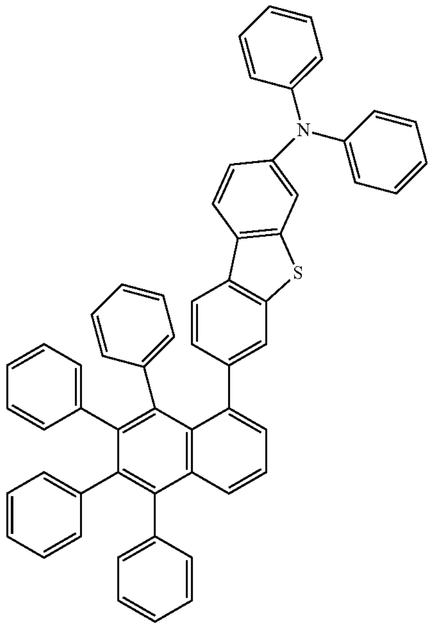
A142
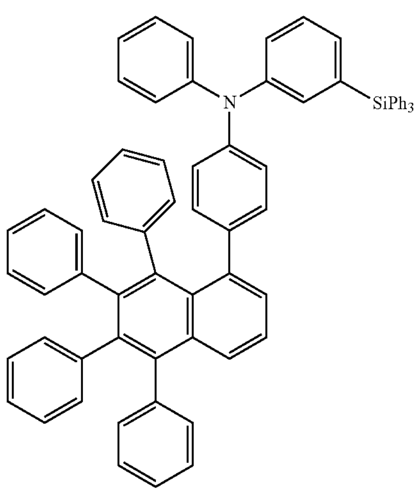
-continued
A143
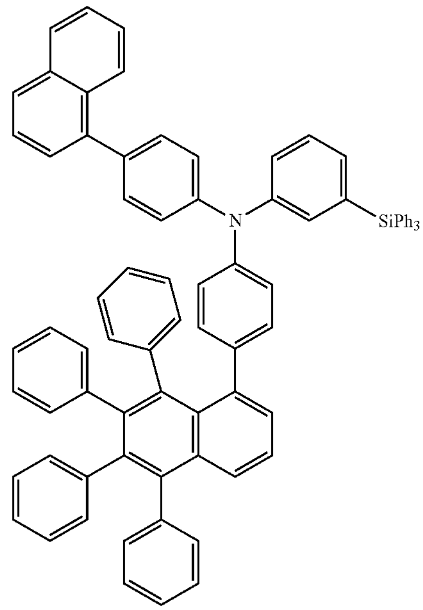
A144
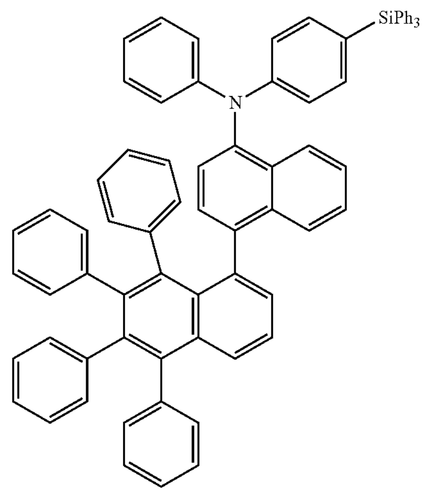
A145
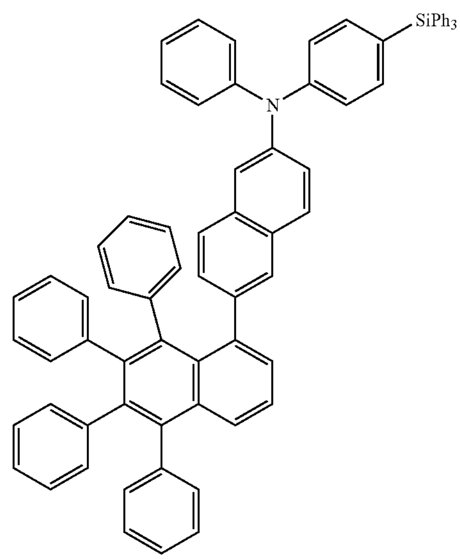

-continued
A146
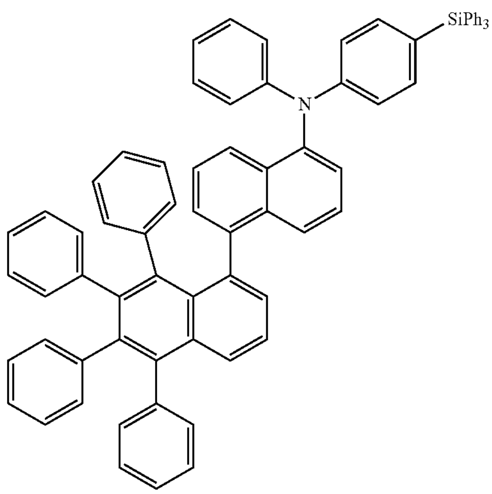
A147
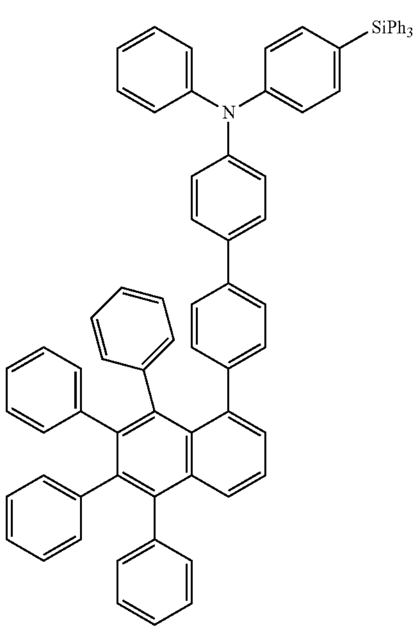
-continued
A148
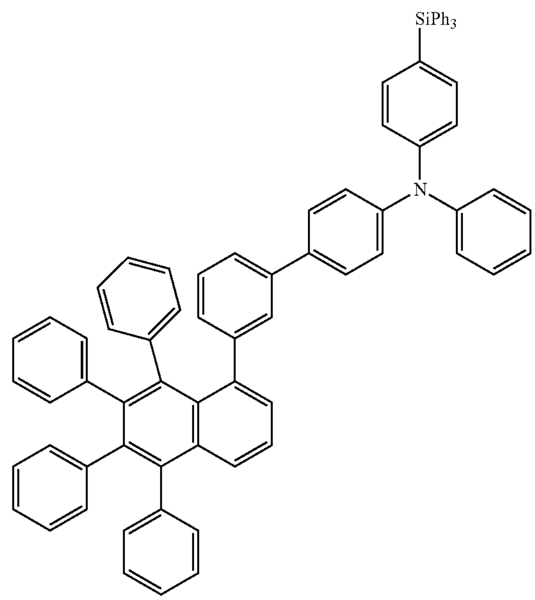
A149
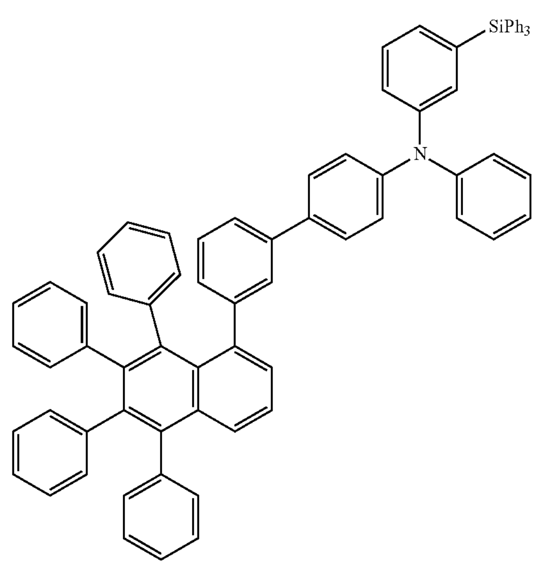

-continued
A150
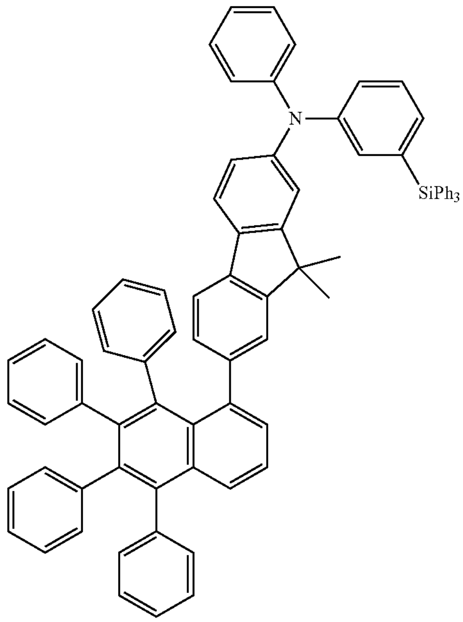
A151
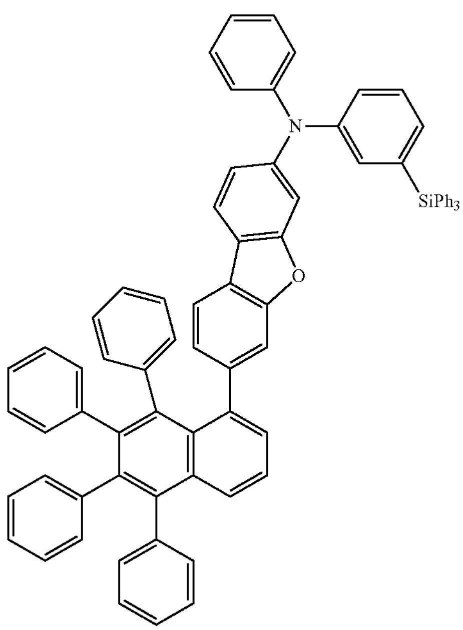
-continued
A152
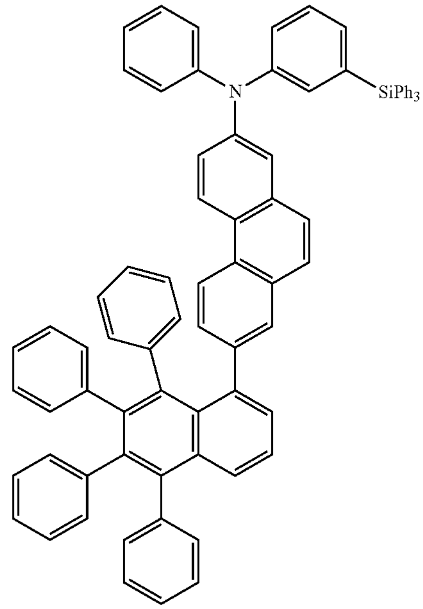
A153
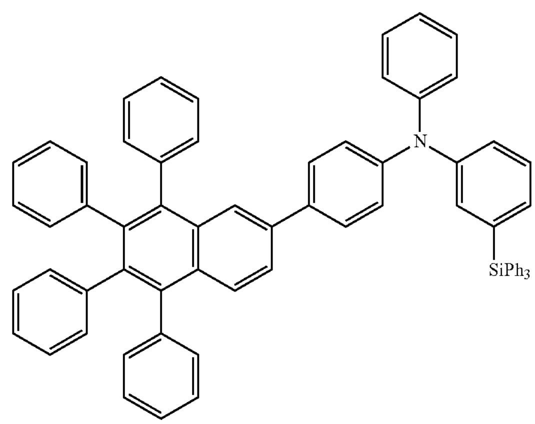
A154
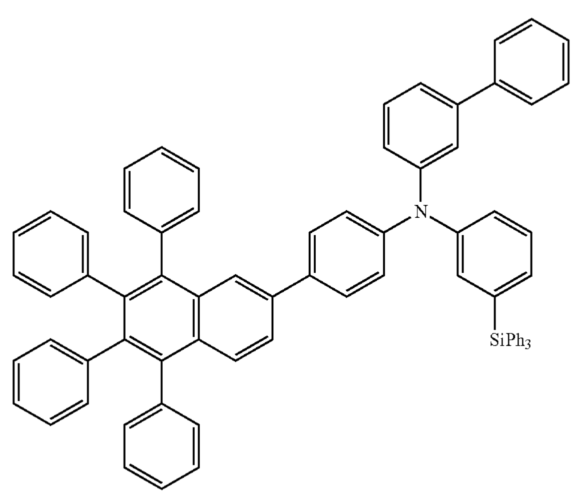

-continued
A155
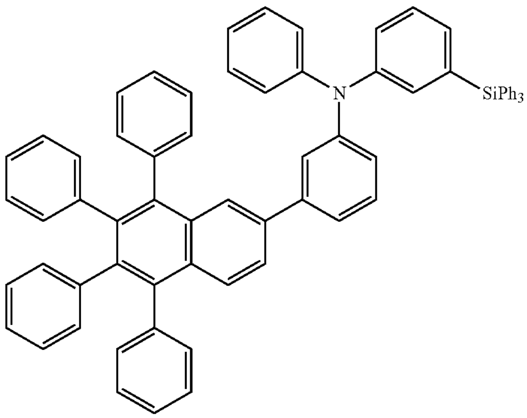
A156
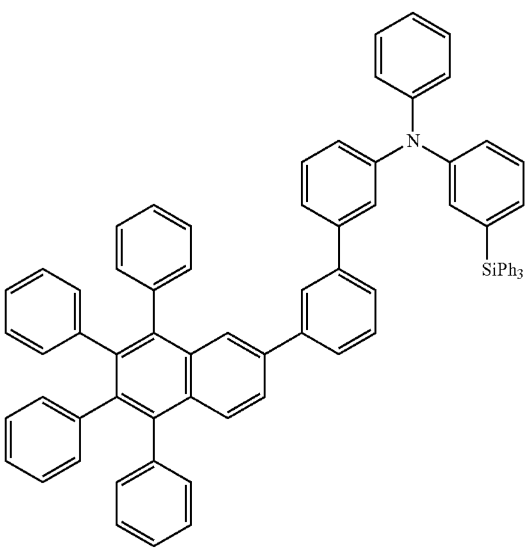
A157
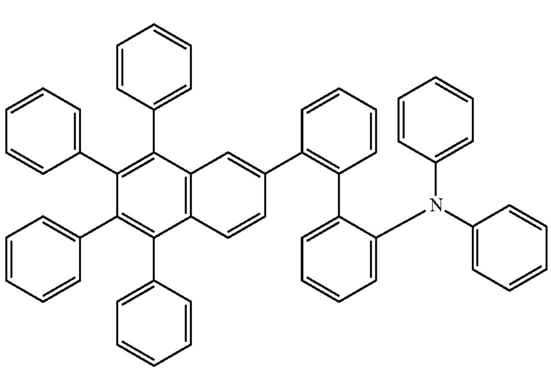
-continued
A158
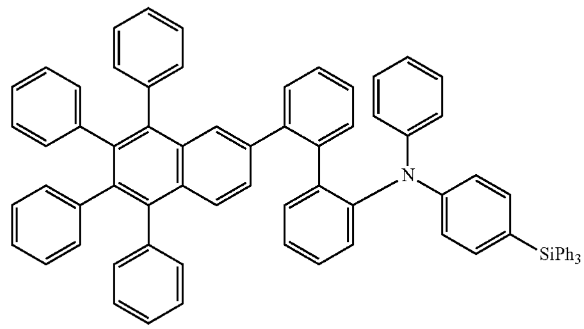
A159
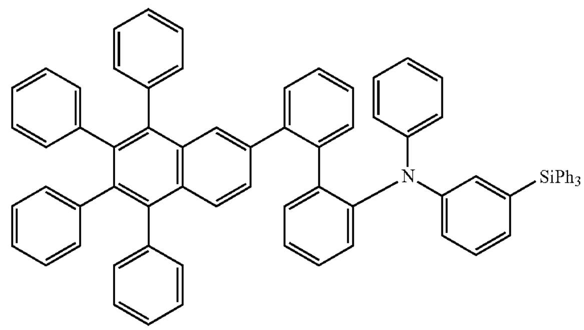
A160
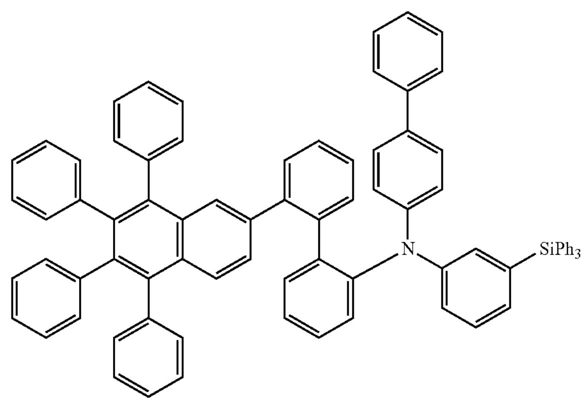
A161
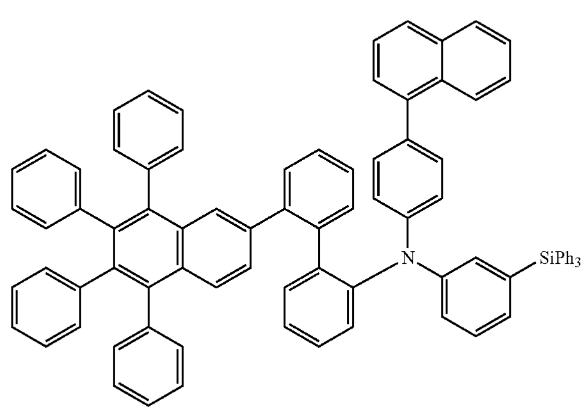

-continued
A162
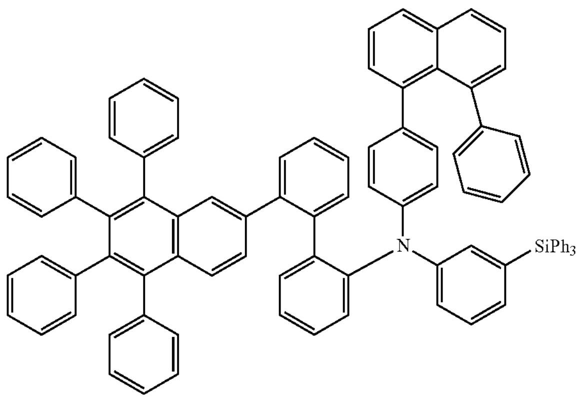
A163
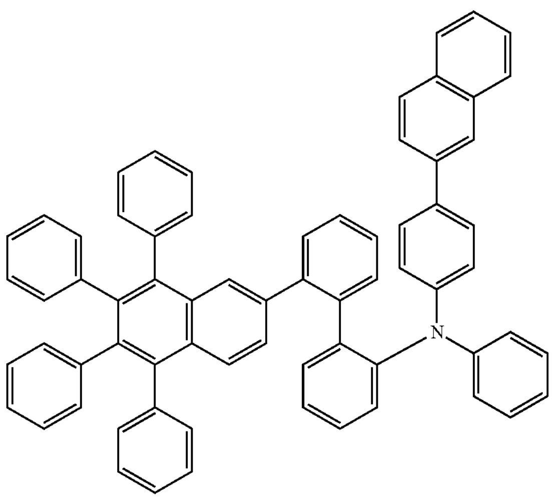
A164
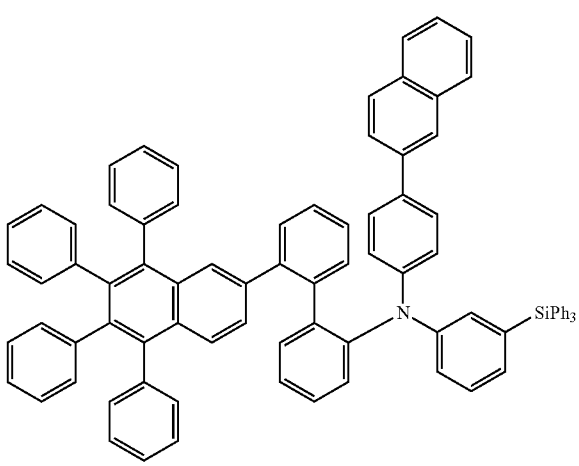
-continued
A165
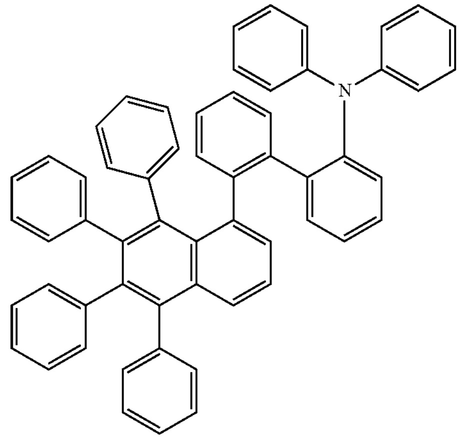
A166
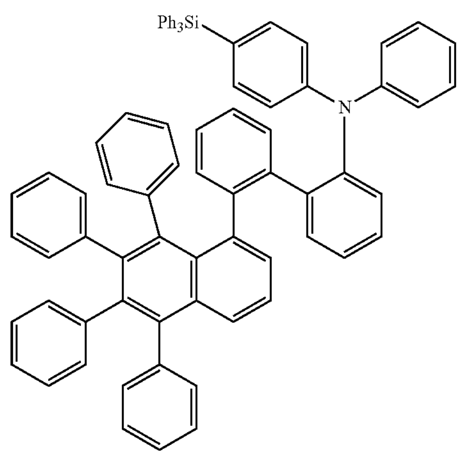
A167
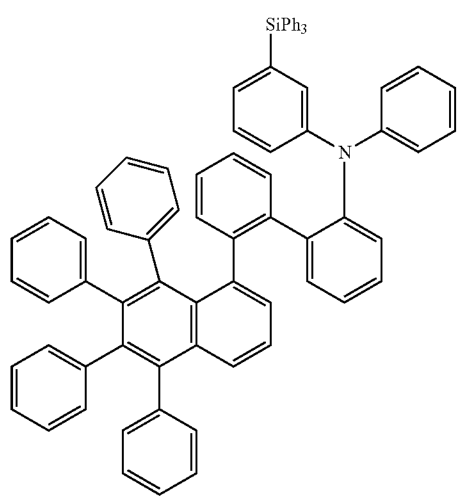

-continued
A168
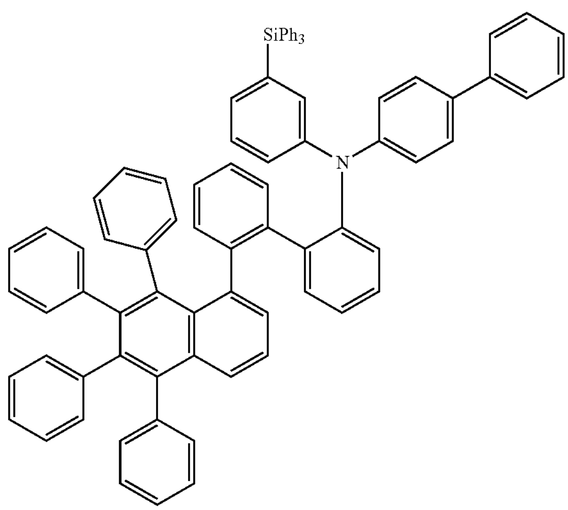
A169
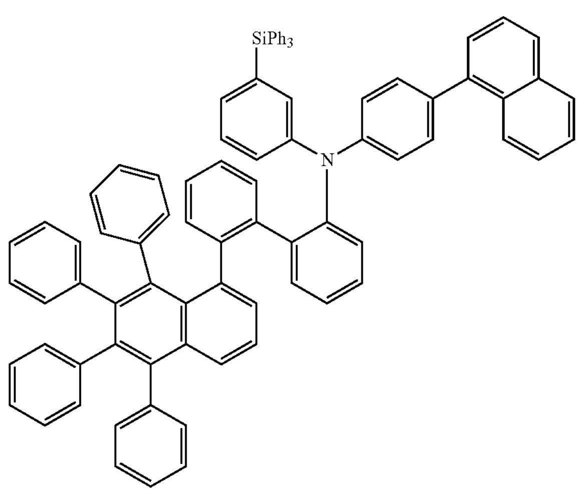
A170
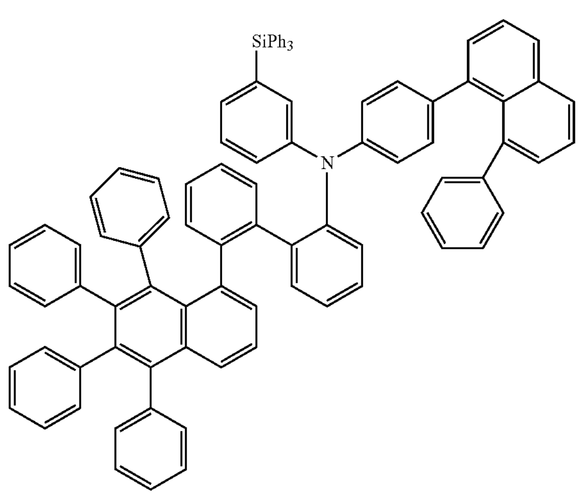
-continued
A171
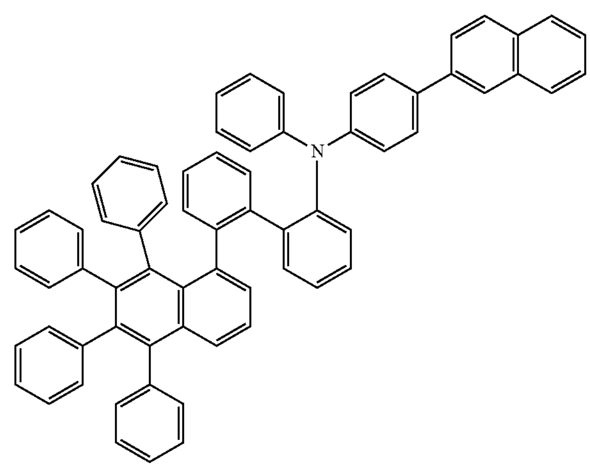
A172
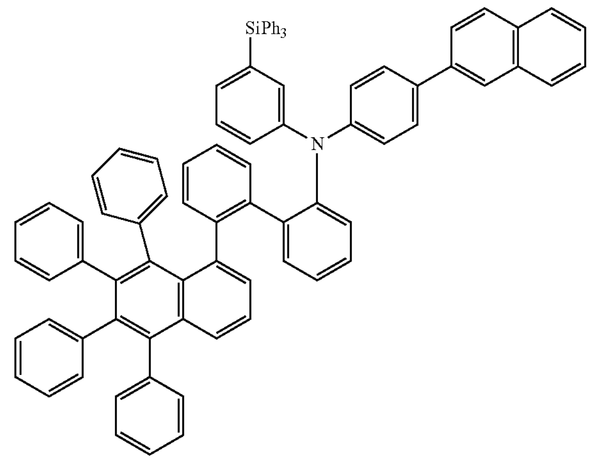
A173
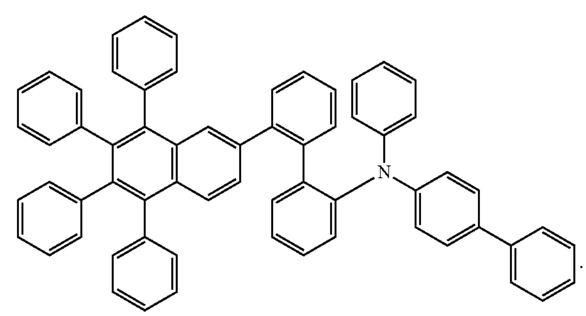
.

15. An amine compound represented by the following Formula 1:

Formula 1

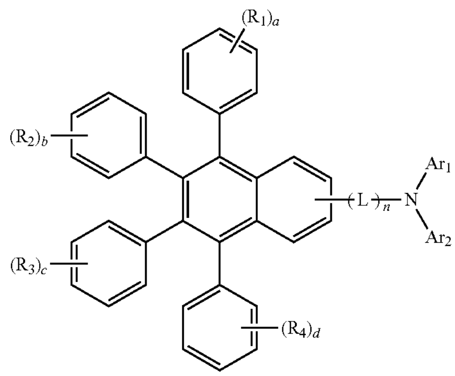

wherein, in Formula 1, $R_1$ to $R_4$ are each independently a hydrogen atom, a deuterium atom, a halogen atom, a cyano group, a substituted or unsubstituted silyl group, a substituted or unsubstituted alkyl group of 1 to 30 carbon atoms, a substituted or unsubstituted alkoxy group of 1 to 30 carbon atoms, a substituted or unsubstituted aryloxy group of 6 to 30 carbon atoms, a substituted or unsubstituted alkylthio group of 1 to 30 carbon atoms, a substituted or unsubstituted arylthiol group of 6 to 30 carbon atoms, a substituted or unsubstituted aryl group of 6 to 50 carbon atoms for forming a ring, or a substituted or unsubstituted heteroaryl group of 2 to 50 carbon atoms for forming a ring, a to d are each independently an integer of 0 to 5, L is a substituted or unsubstituted arylene group of 6 to 50 carbon atoms for forming a ring, or a substituted or unsubstituted heteroarylene group of 2 to 50 carbon atoms for forming a ring, n is an integer of 1 to 3, $Ar_1$ and $Ar_2$ are each independently a substituted or unsubstituted aryl group of 6 to 50 carbon atoms for forming a ring, or a substituted or unsubstituted heteroaryl group of 2 to 50 carbon atoms for forming a ring.

16. The amine compound of claim 15, wherein Formula 1 is represented by the following Formula 1-1 or Formula 1-2:

Formula 1-1

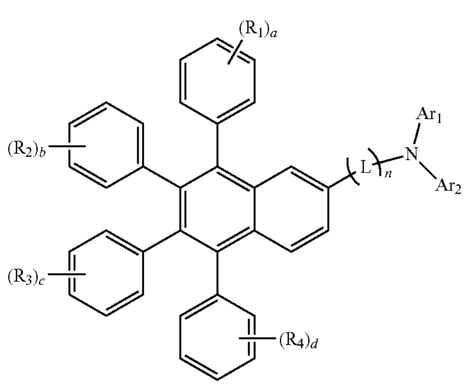

-continued

Formula 1-2

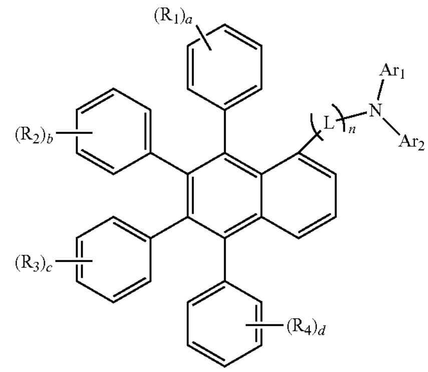

in Formula 1-1 and Formula 1-2, $R_1$ to $R_4$, a to d, L, n, $Ar_1$, and $Ar_2$ are the same as defined with respect to Formula 1.

17. The amine compound of claim 15, wherein L is a substituted or unsubstituted phenylene group, a substituted or unsubstituted naphthylene group, a substituted or unsubstituted divalent biphenyl group, a substituted or unsubstituted divalent fluorene group, a substituted or unsubstituted divalent phenanthrene group, a substituted or unsubstituted divalent dibenzofuran group, or a substituted or unsubstituted divalent dibenzothiophene group.

18. The amine compound of claim 15, wherein L is represented by any one selected from the following Formulae L-1 to L-7:

L-1

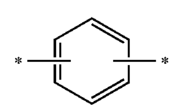

L-2

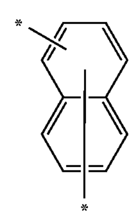

L-3

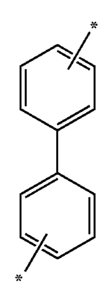

L-4

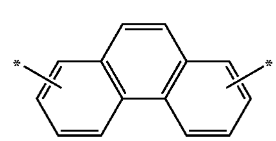

L-5
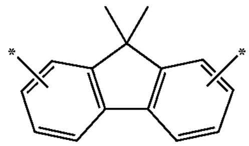
L-6
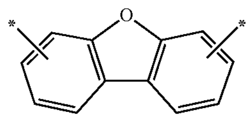
L-7
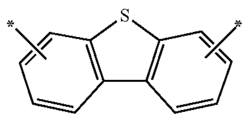
.
19. The amine compound of claim 15, wherein a to d are 0.
20. The amine compound of claim 15, wherein the amine compound represented by Formula 1 is at least one selected from compounds represented in the following Compound Group 1:
Compound Group 1
A1
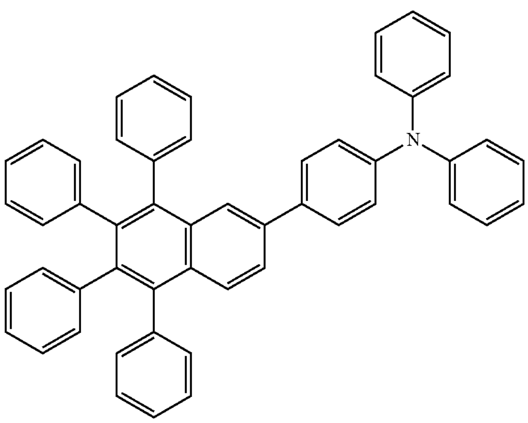
A2
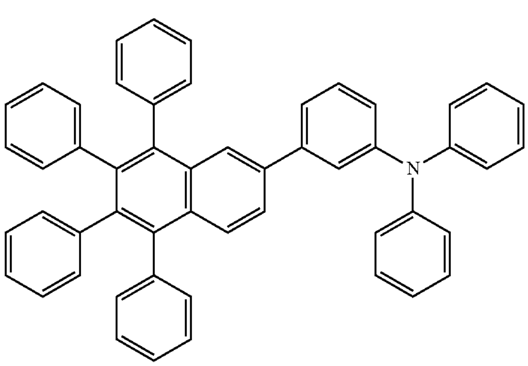
A3
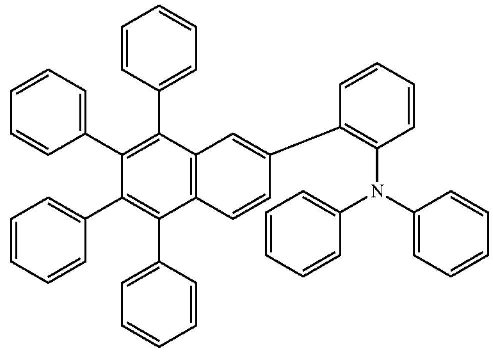
A4
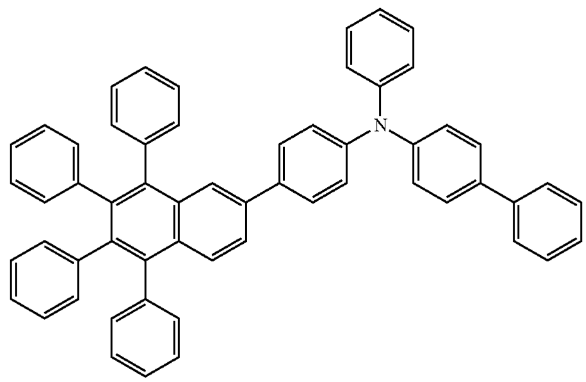
A5
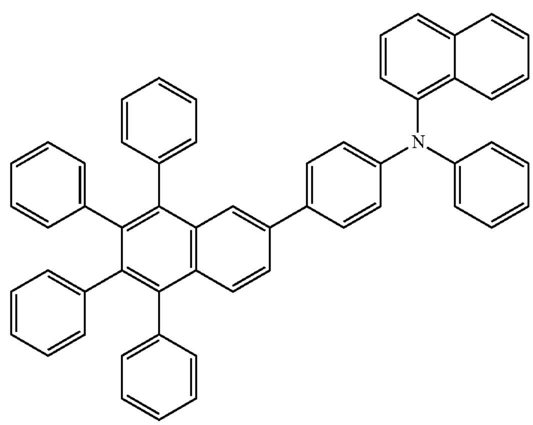
A6
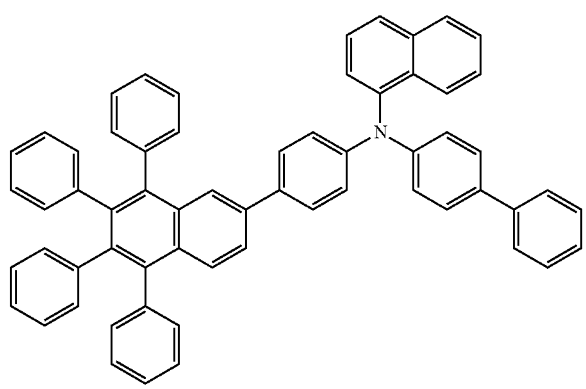

-continued
A7
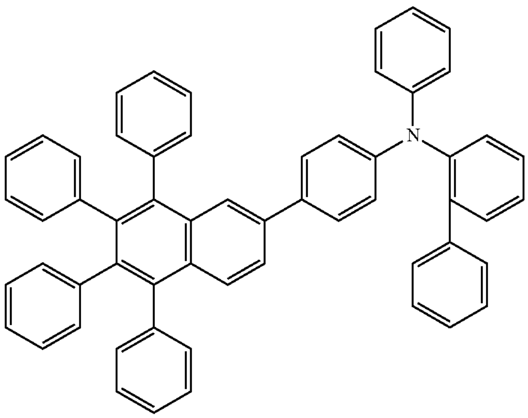
A8
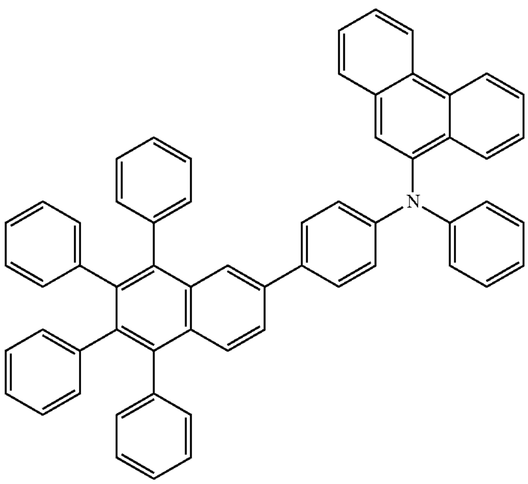
A9
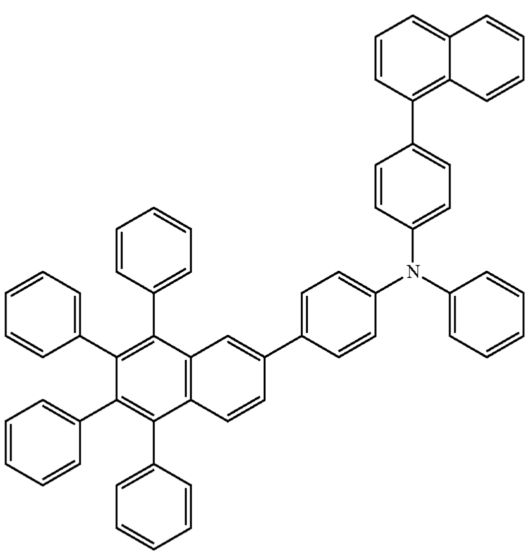
-continued
A10
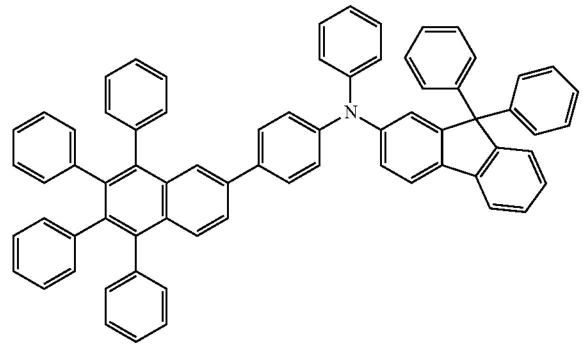
A11
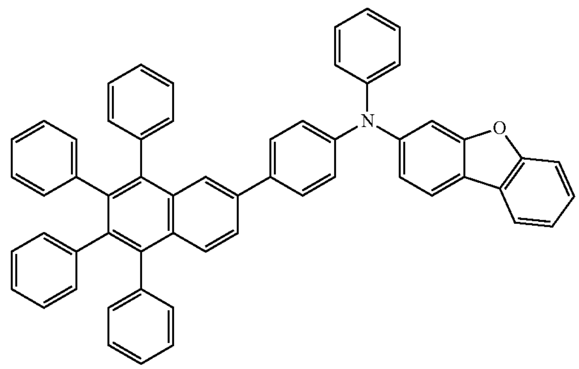
A12
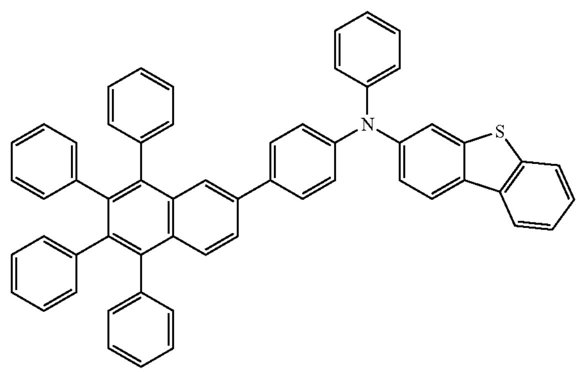
A13
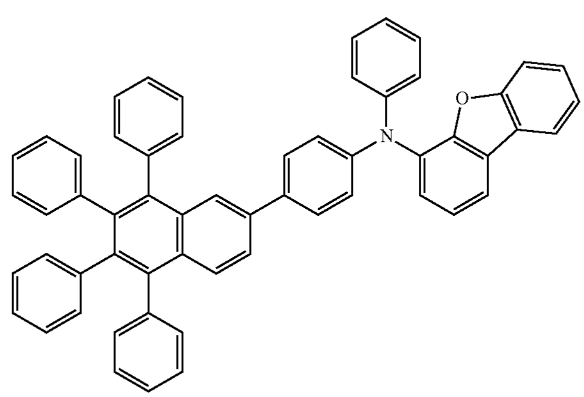

A14
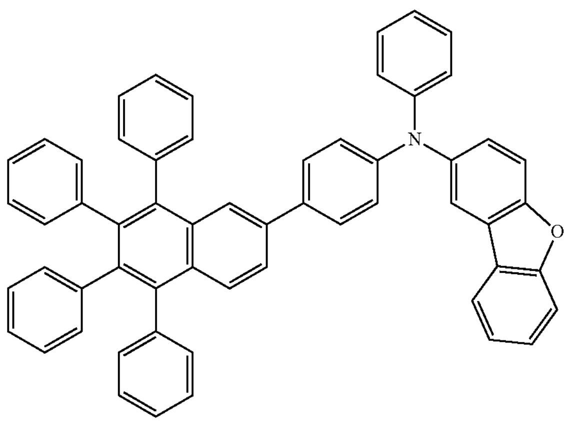
A15
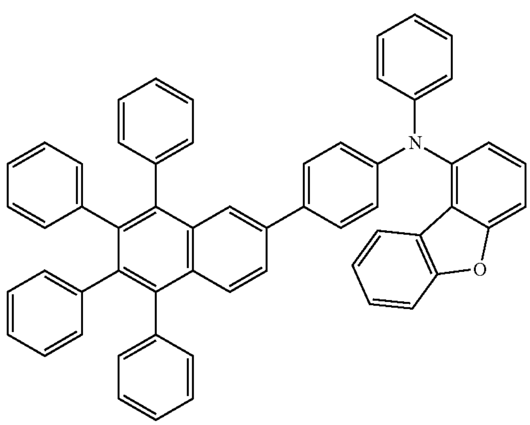
A16
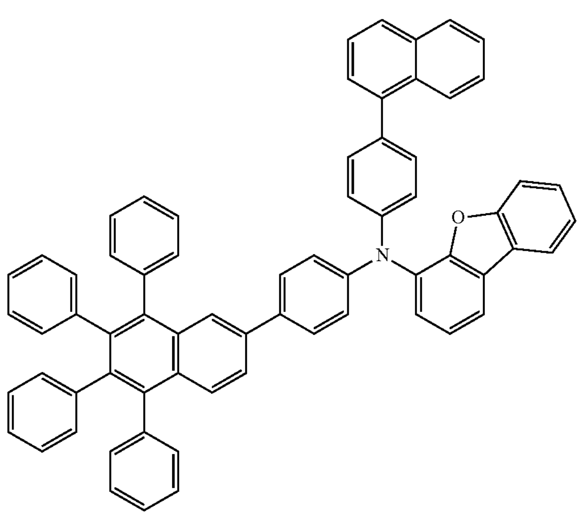
A17
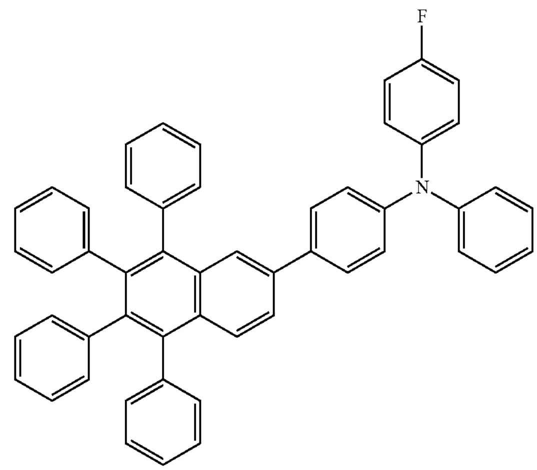
A18
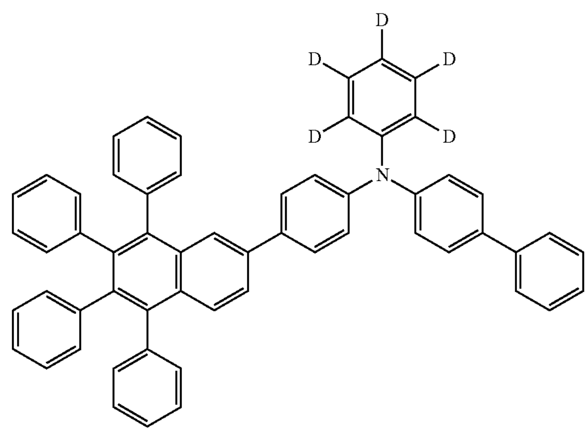
A19
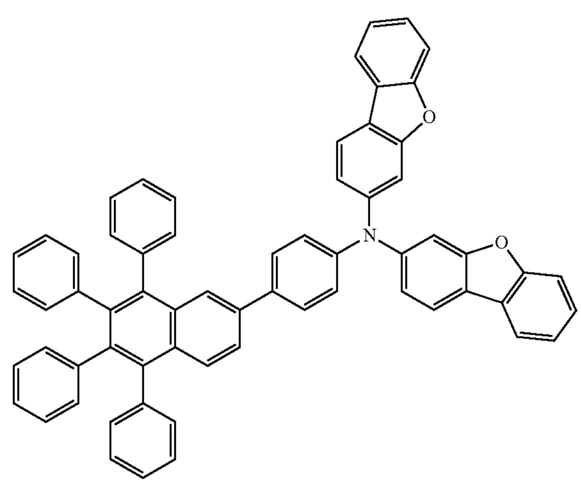

-continued
A20
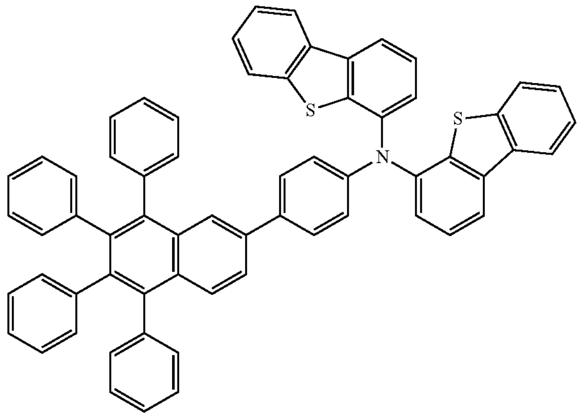
A21
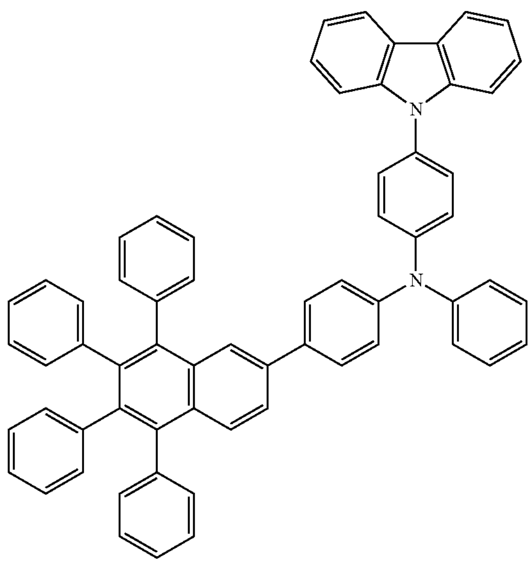
A22
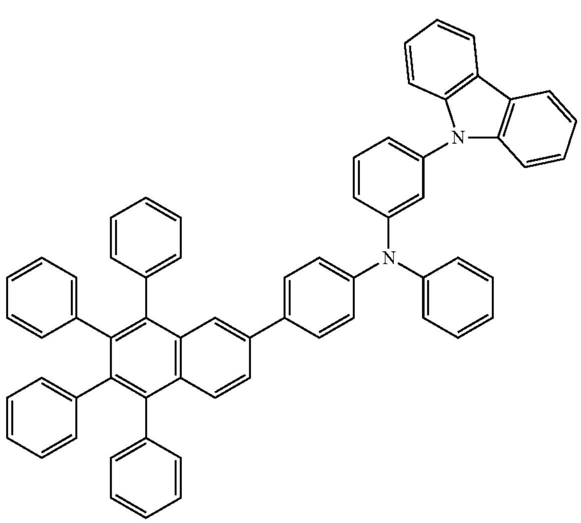
-continued
A23
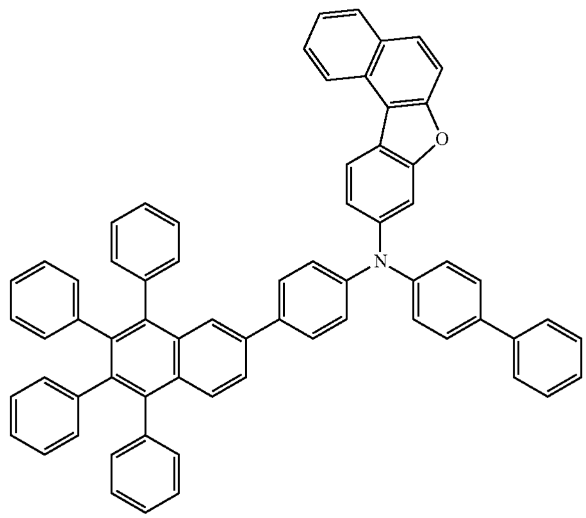
A24
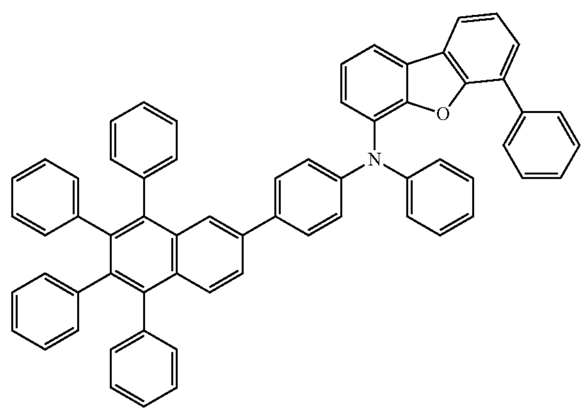
A25
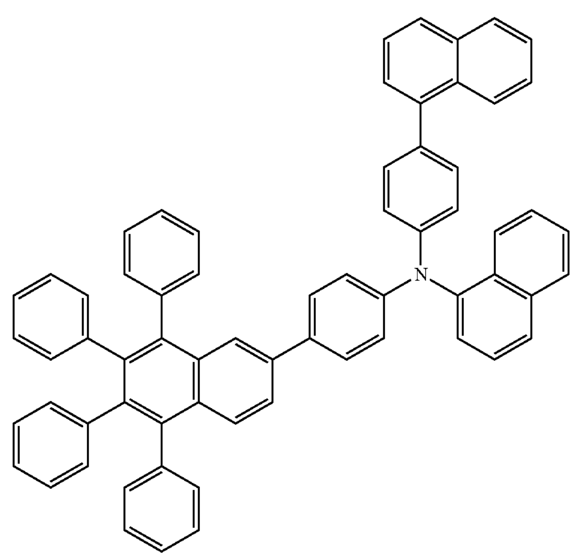

-continued
A26
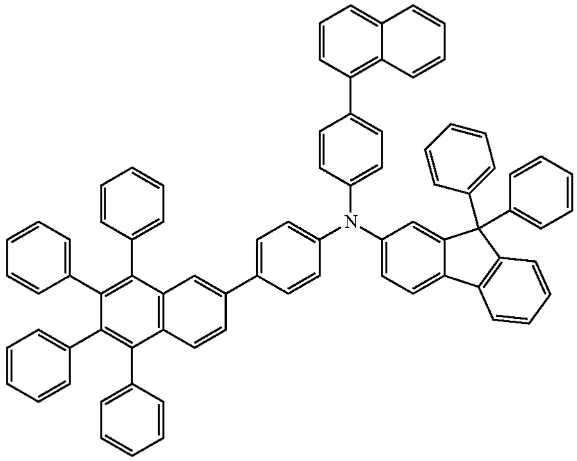
A27
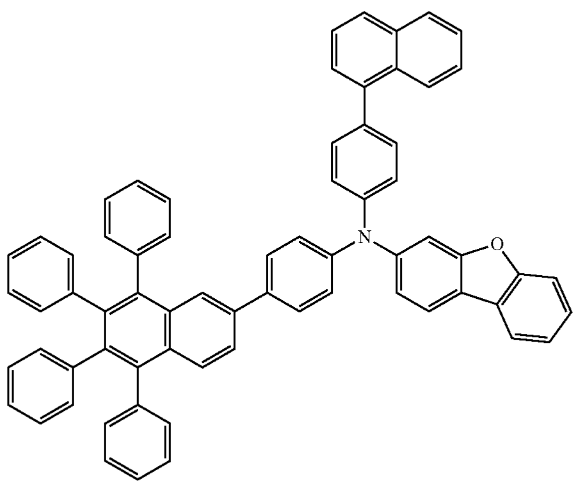
A28
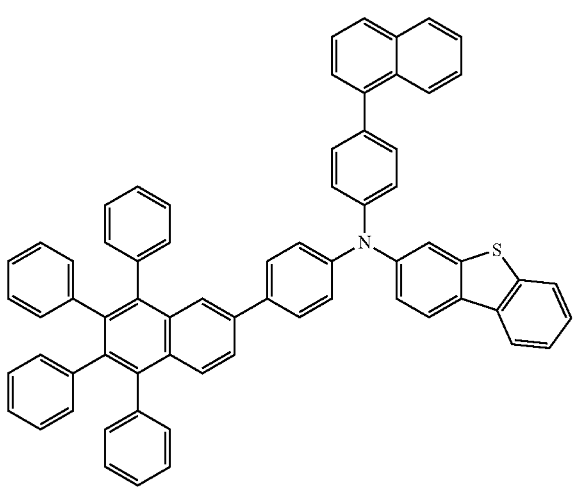
-continued
A29
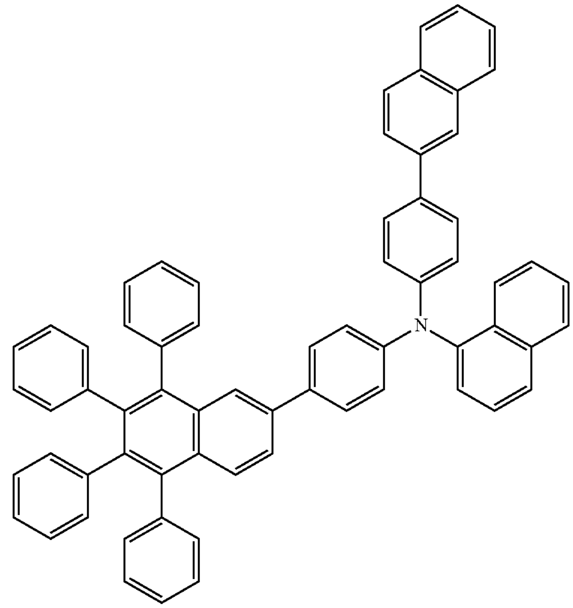
A30
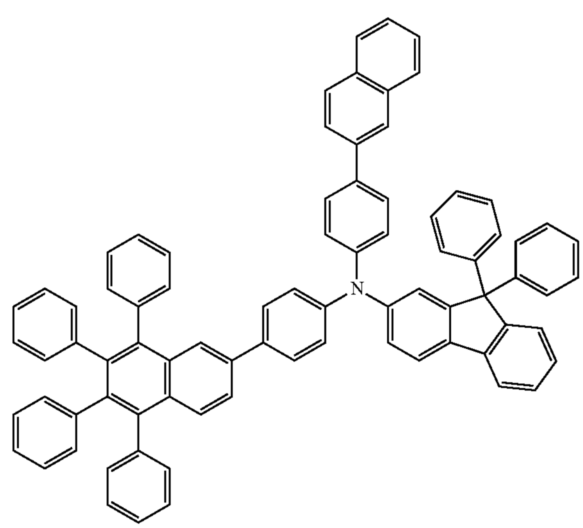

A31
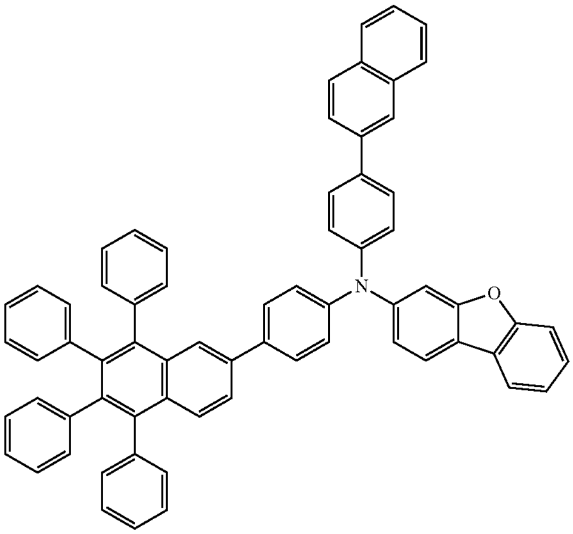
A32
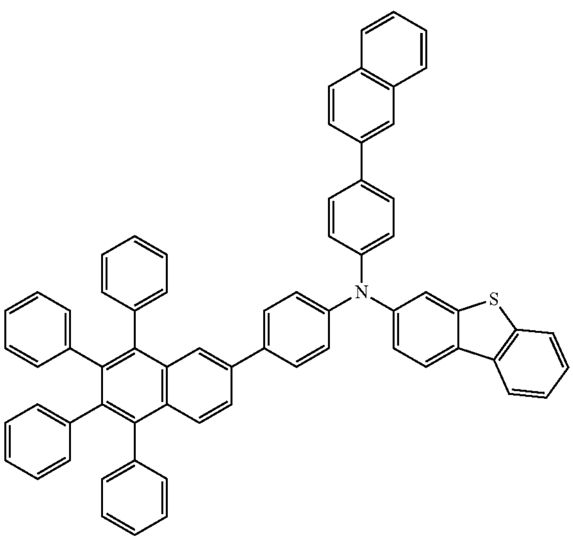
A33
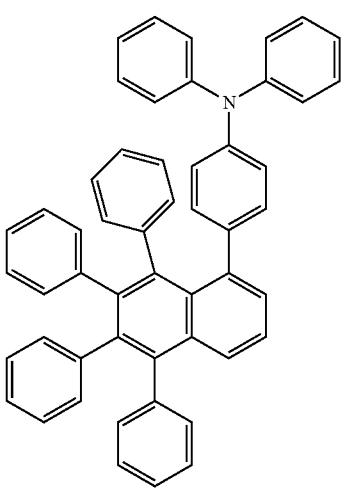
A34
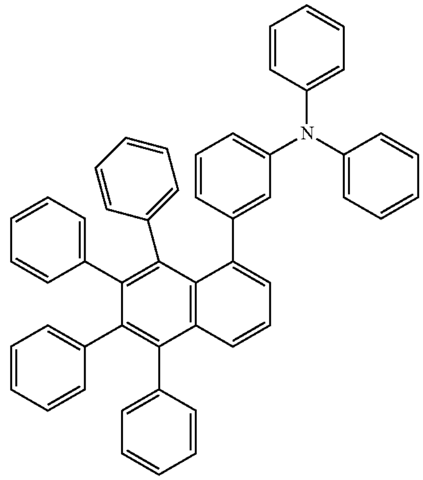
A35
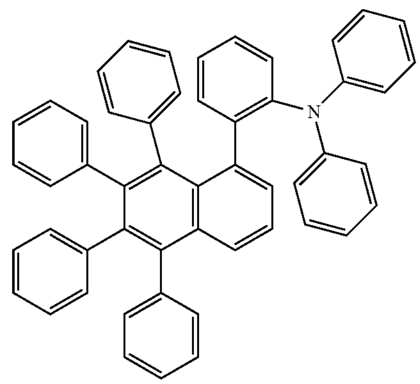
A36
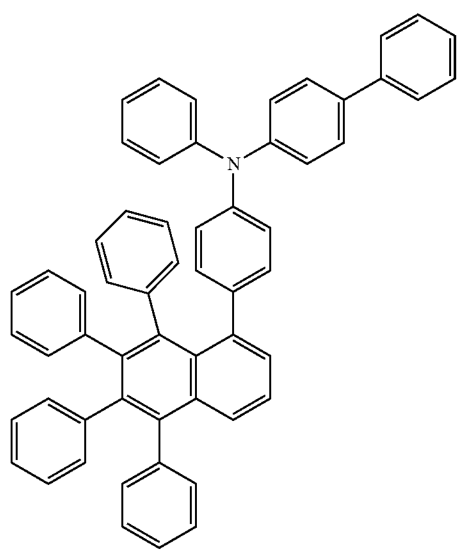

-continued
A37
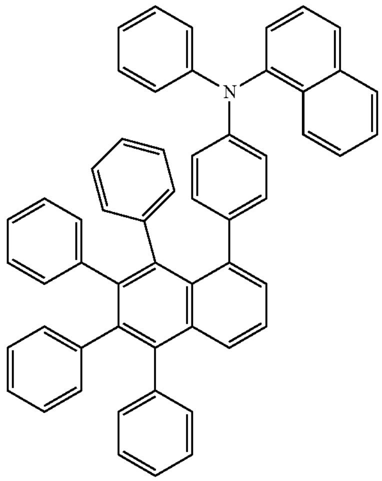
A38
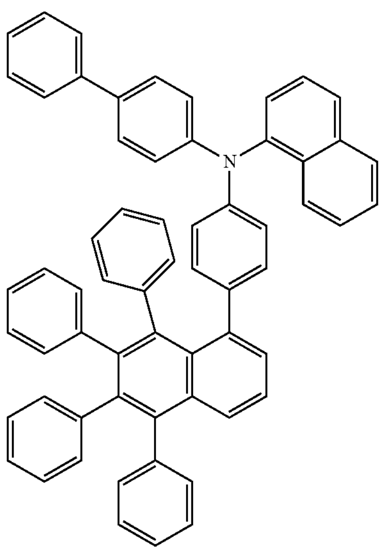
A39
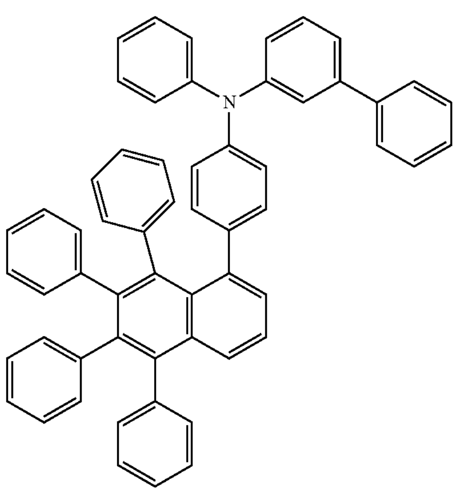
-continued
A40
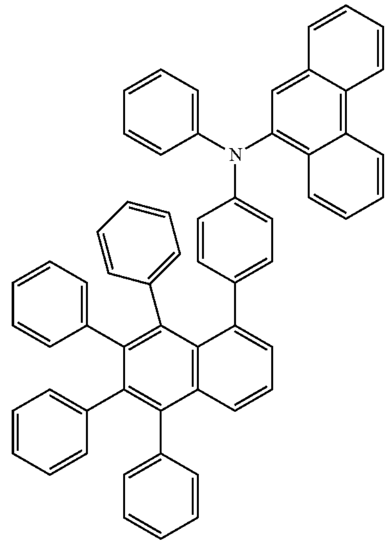
A41
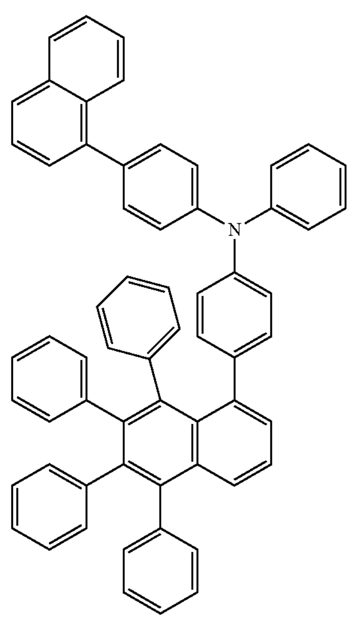

-continued
A42
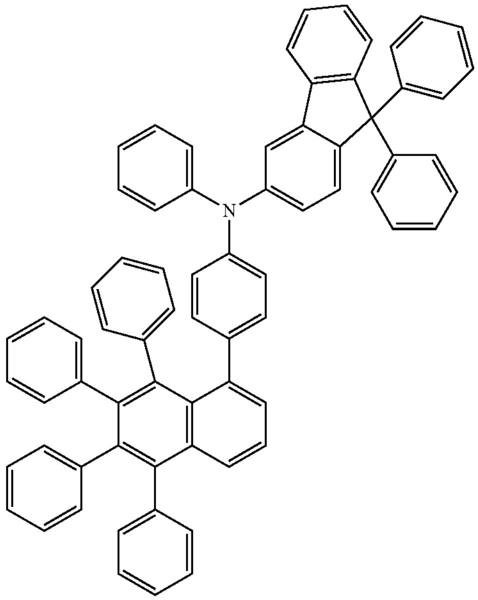
A43
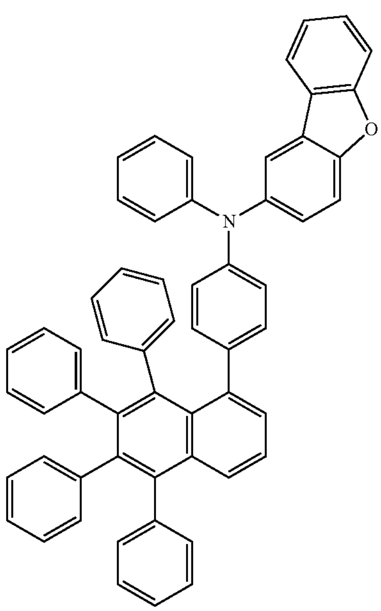
-continued
A44
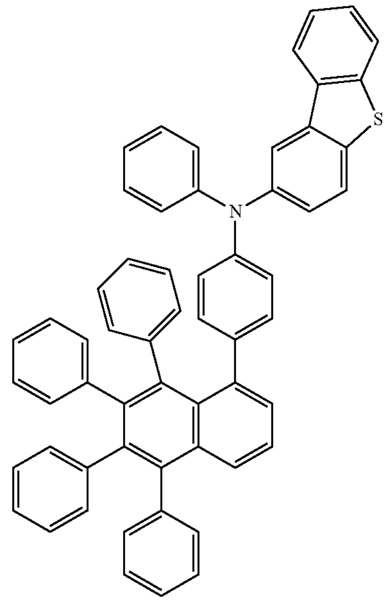
A45
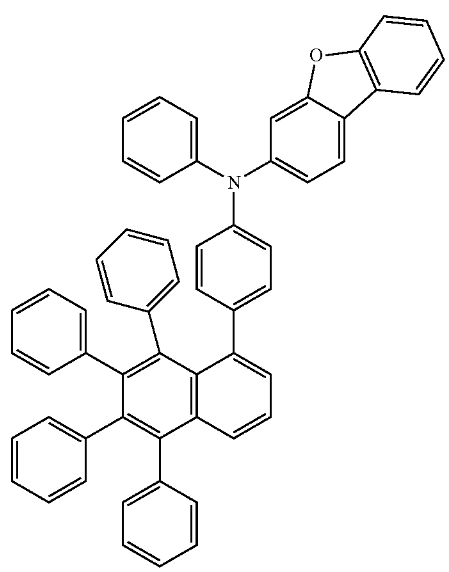

-continued
A46
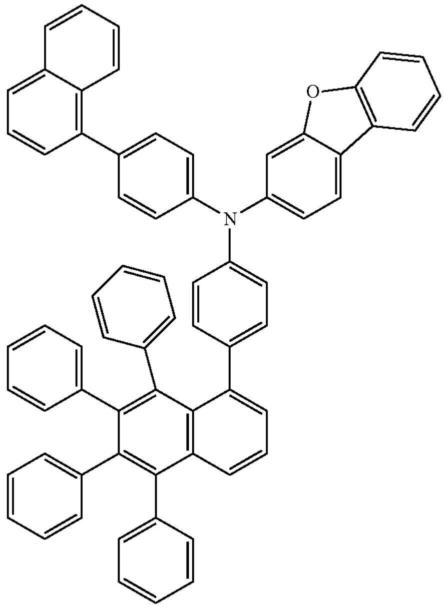
A47
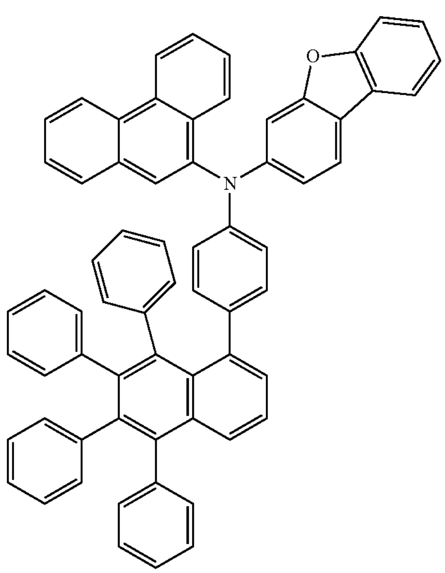
-continued
A48
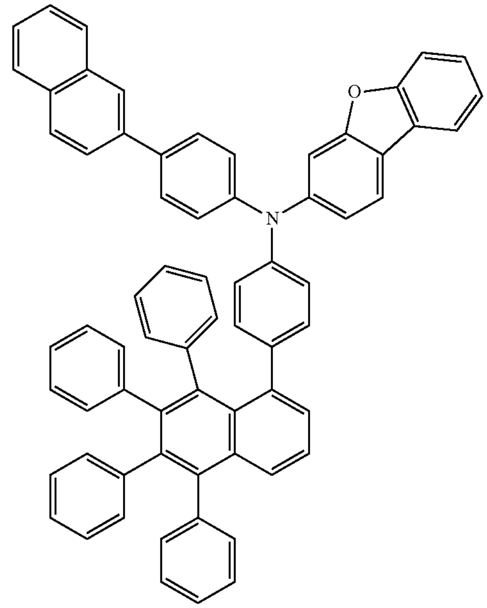
A49
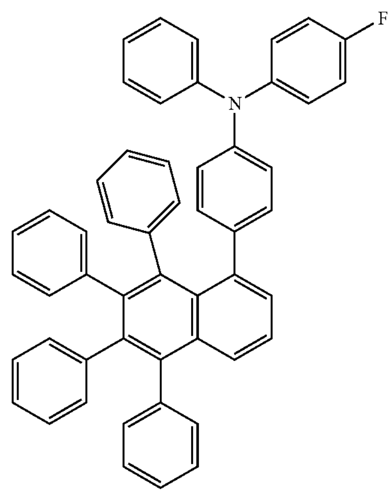
A50
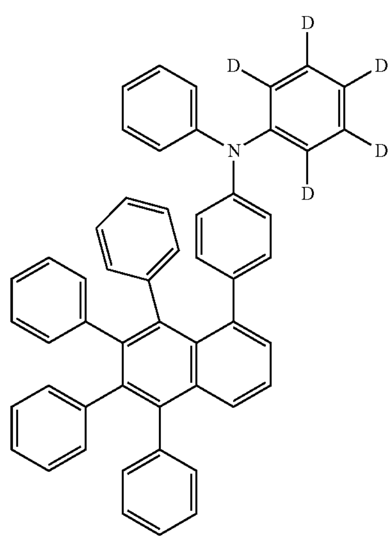

-continued
A51
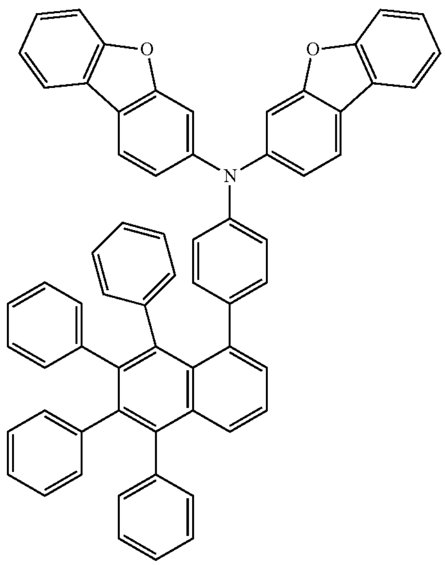
A52
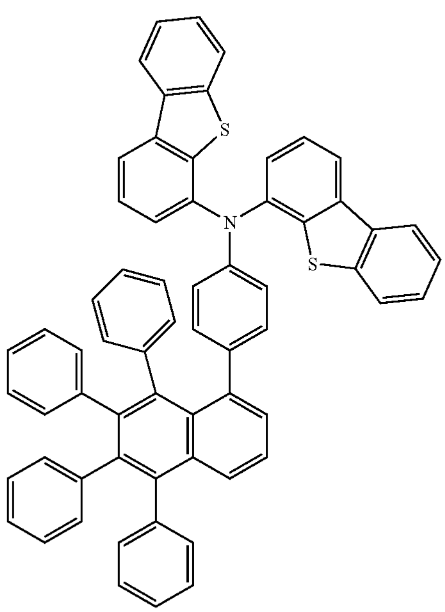
-continued
A53
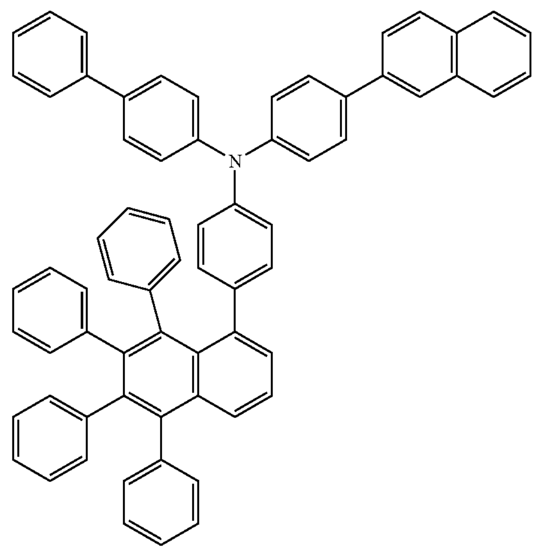
A54
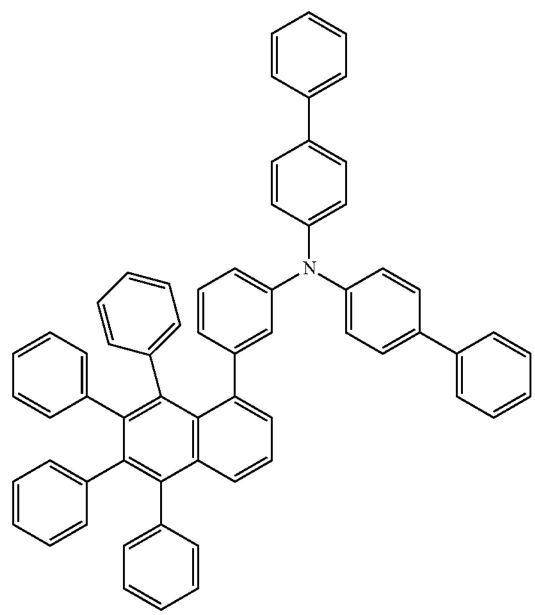
A55
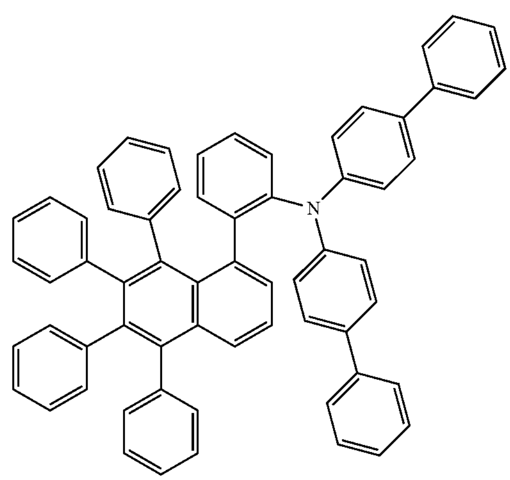

-continued
A56
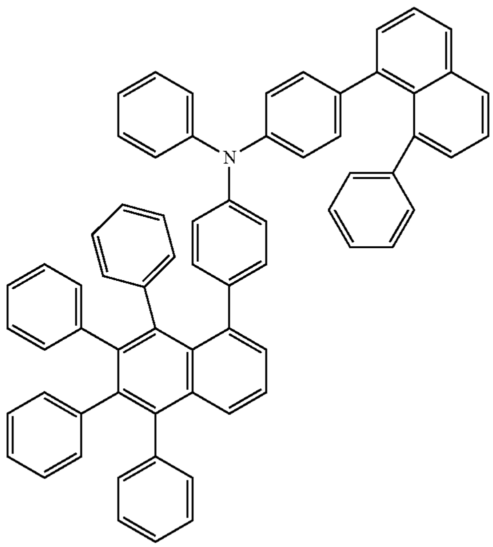
A57
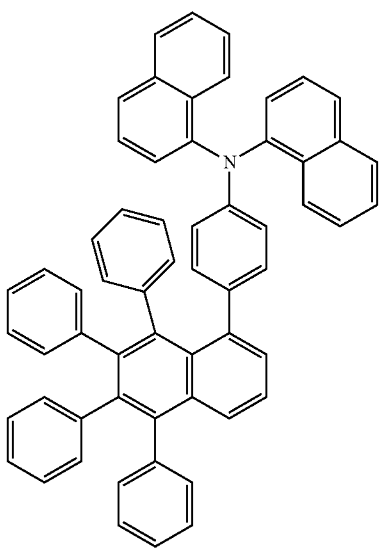
A58
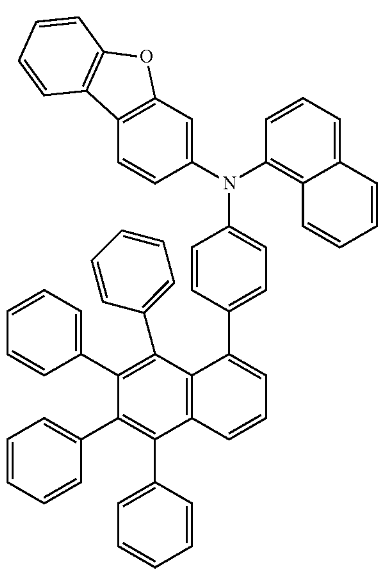
-continued
A59
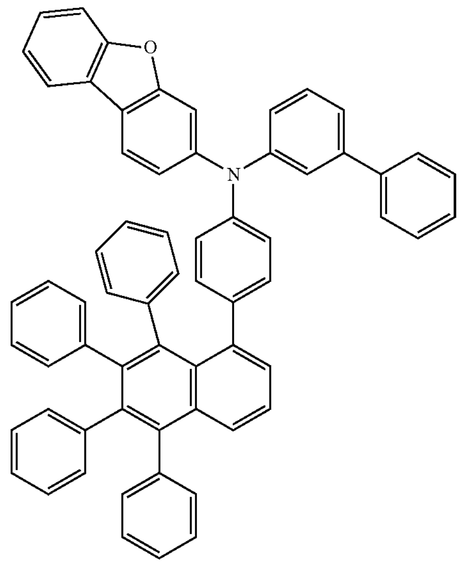
A60
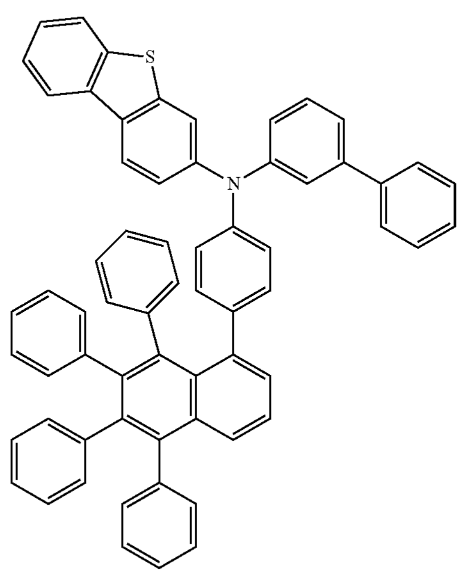

-continued
A61
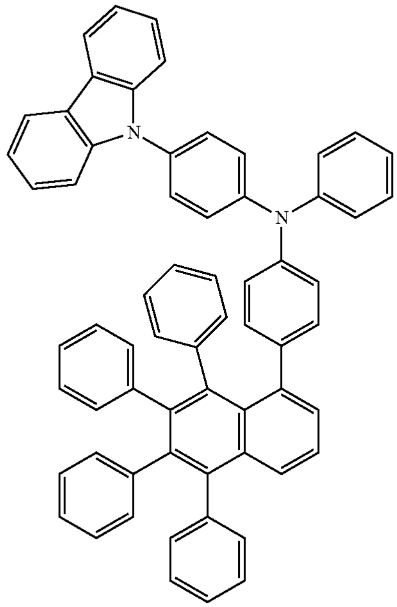
A62
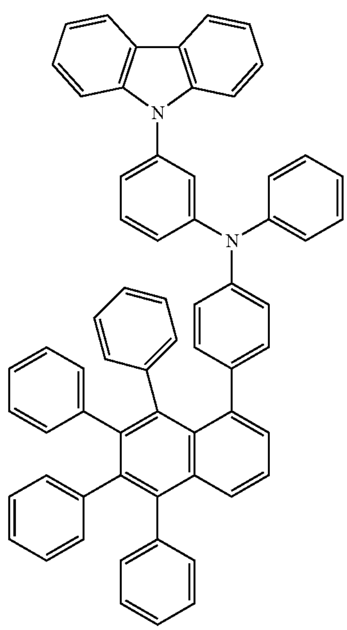
-continued
A63
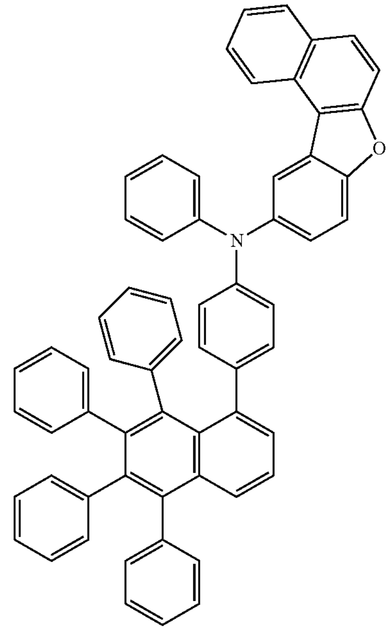
A64
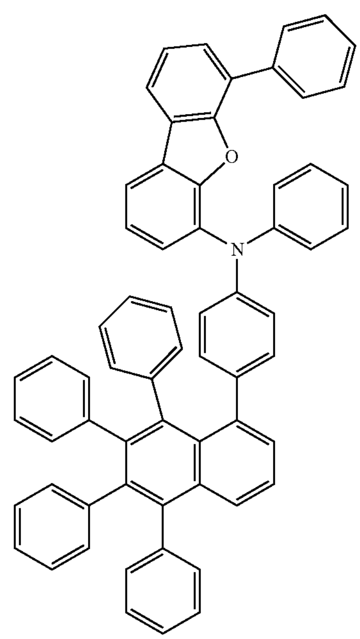

-continued
A65
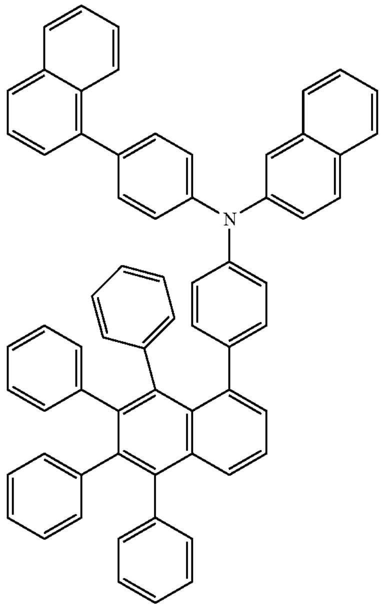
A66
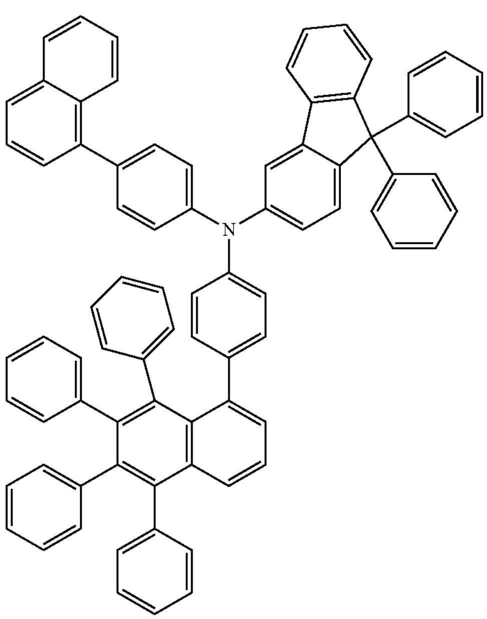
-continued
A67
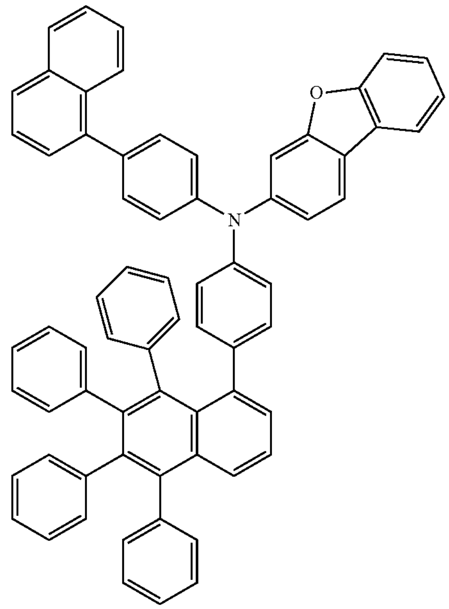
A68
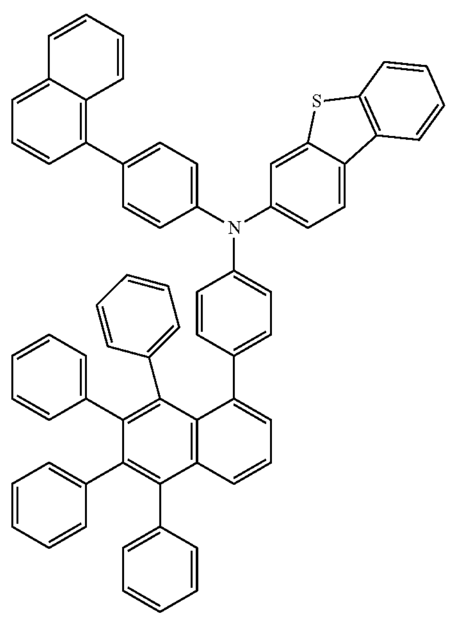

-continued
A69
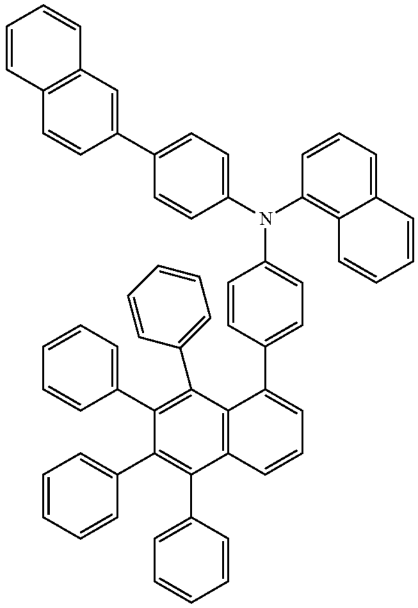
A70
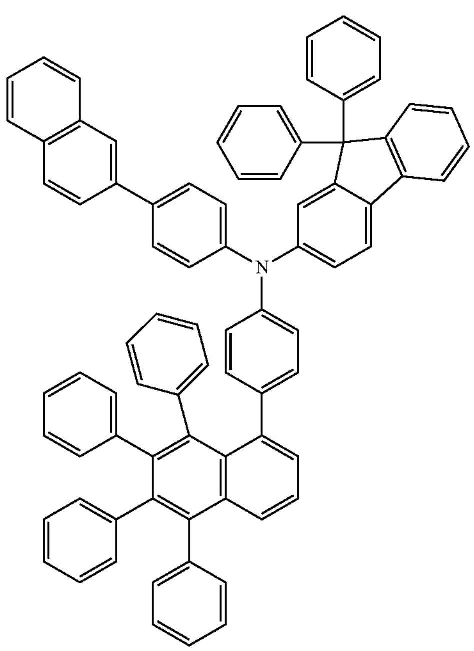
-continued
A71
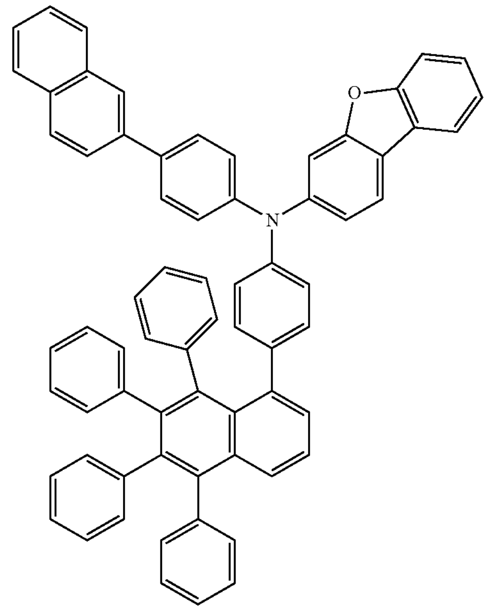
A72
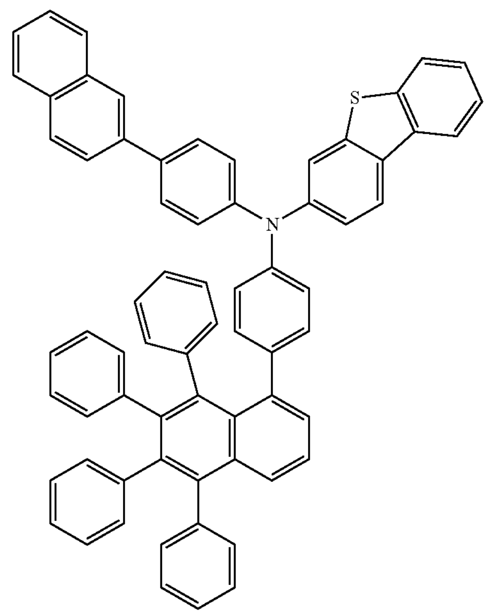
A73
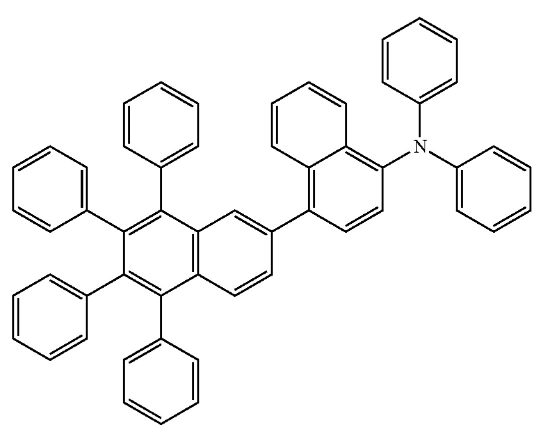

-continued
A74
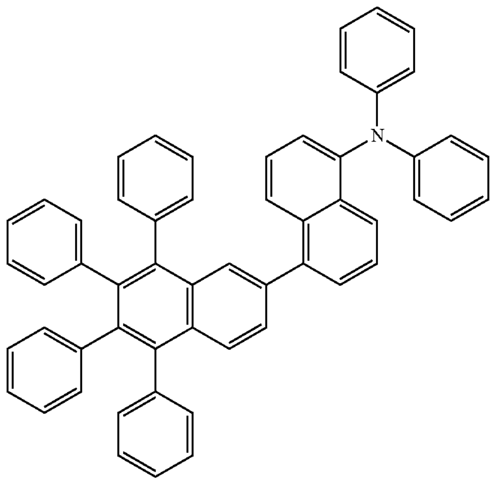
A75
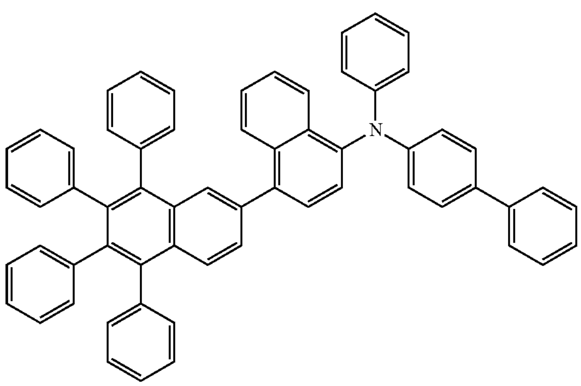
A76
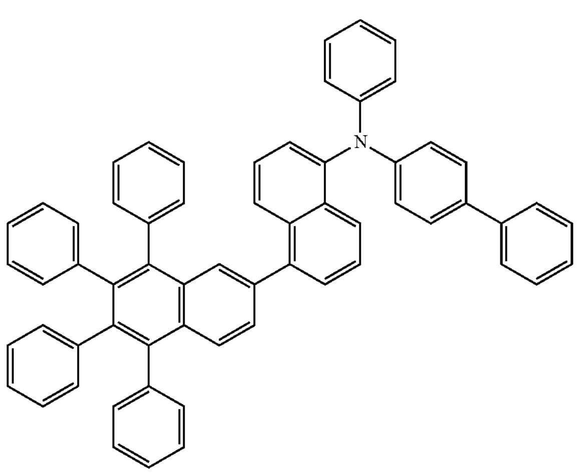
-continued
A77
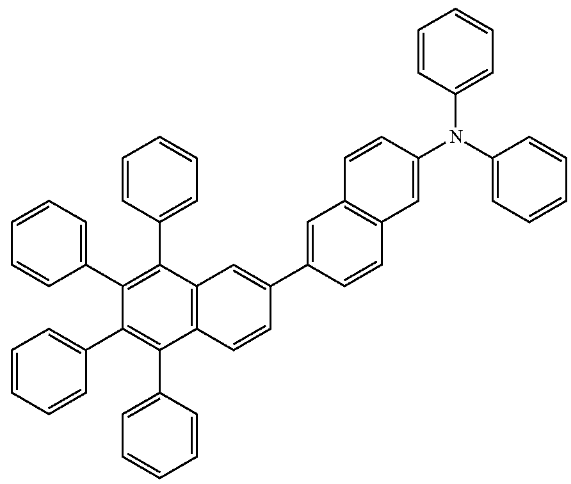
A78
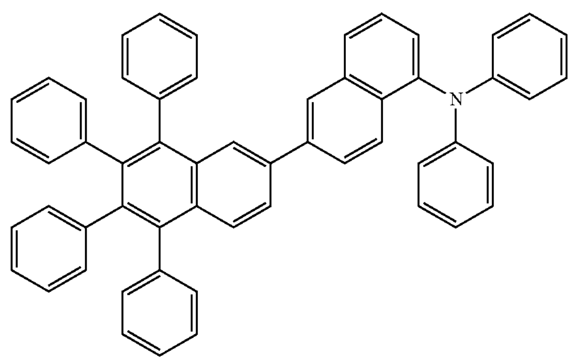
A79
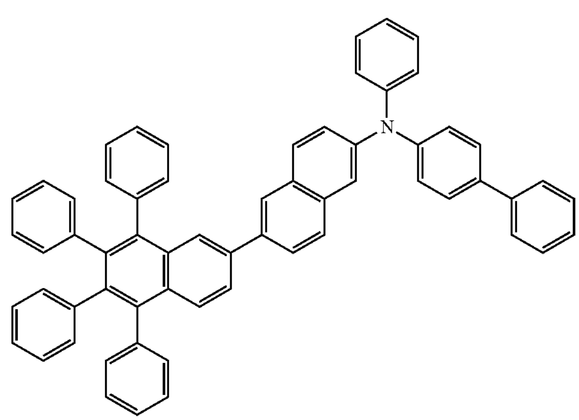

-continued
A80
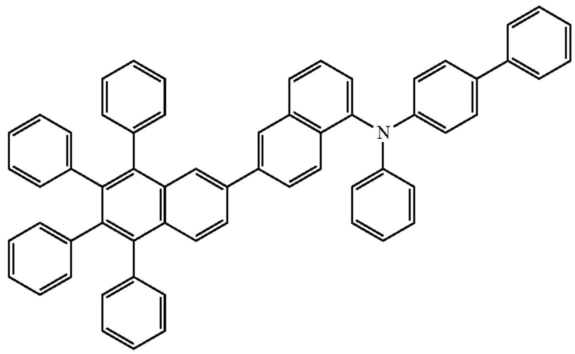
A81
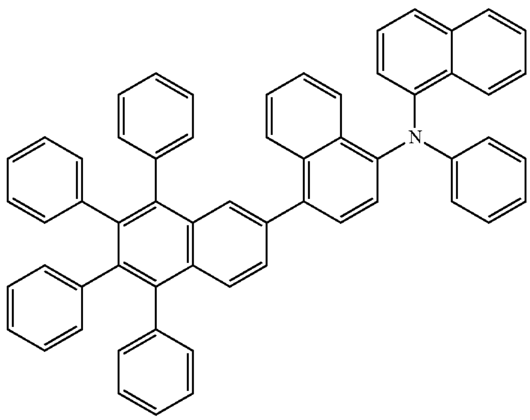
A82
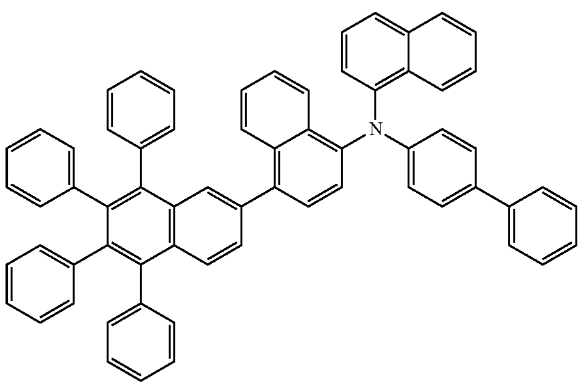
A83
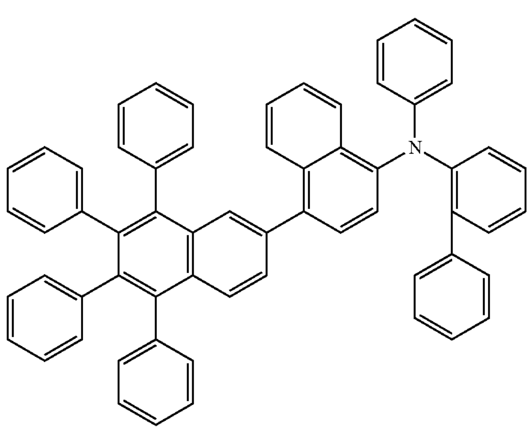
-continued
A84
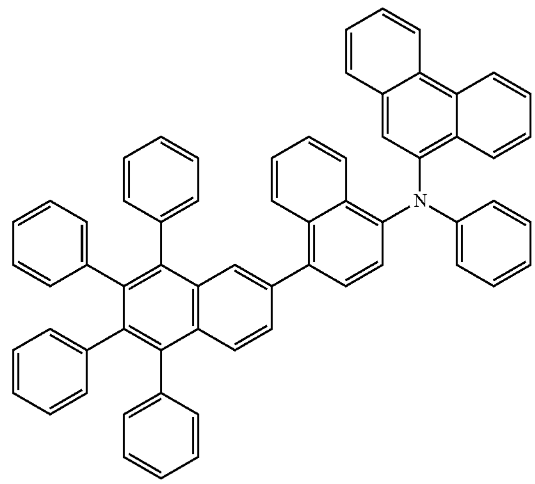
A85
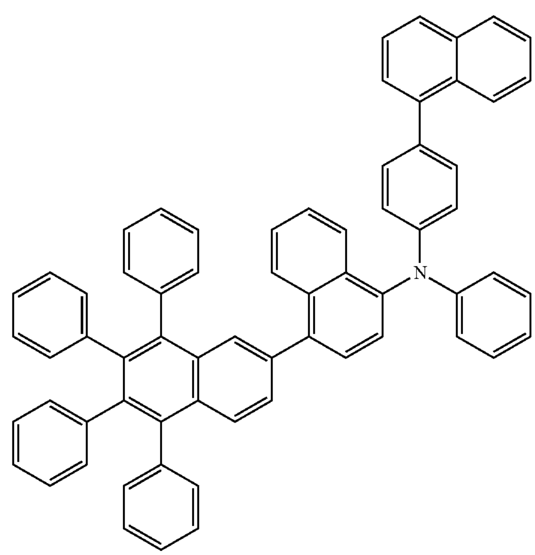
A86
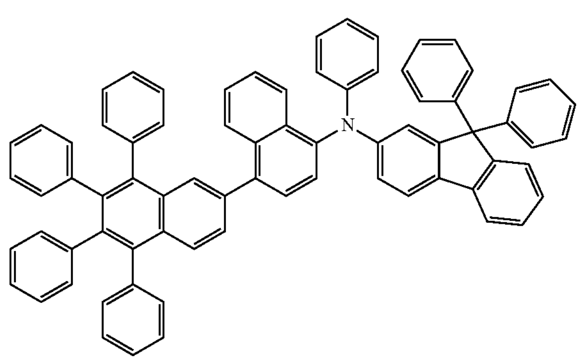

-continued
A87
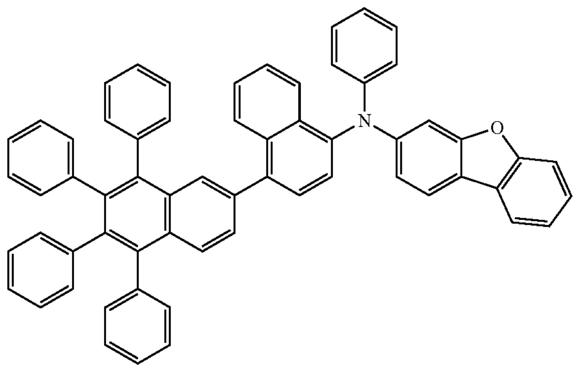
A88
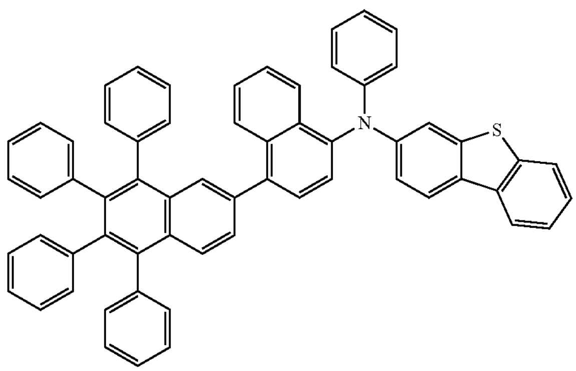
A89
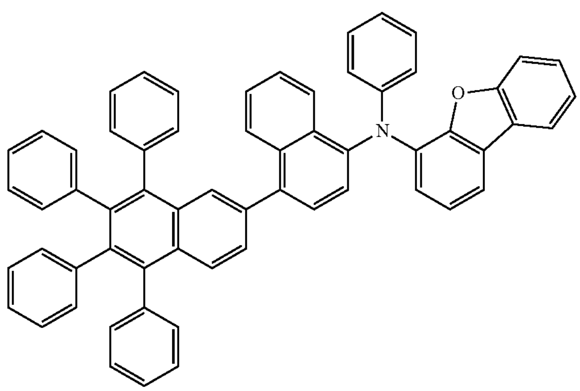
A90
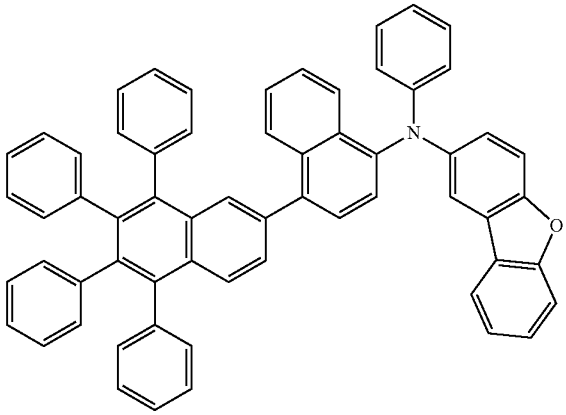
-continued
A91
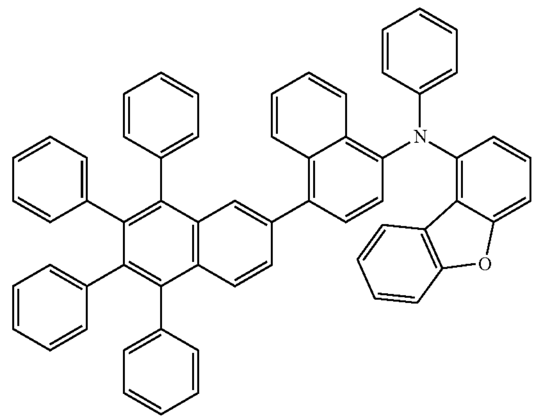
A92
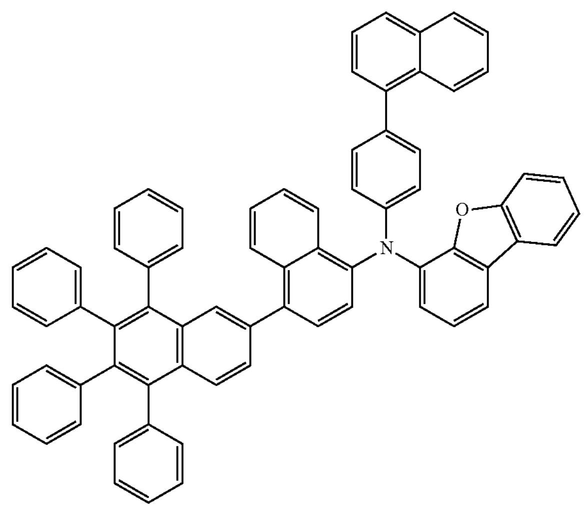
A93
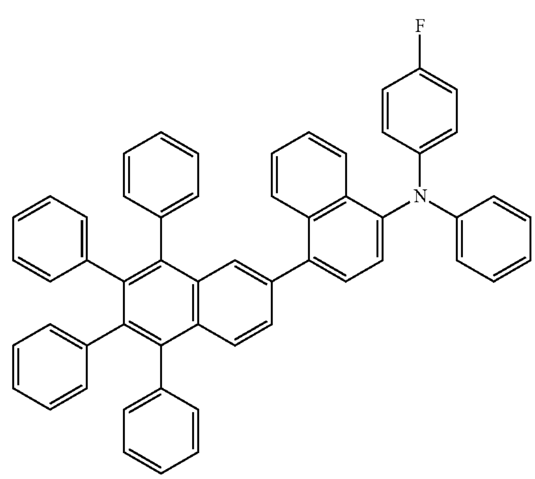

-continued
A94
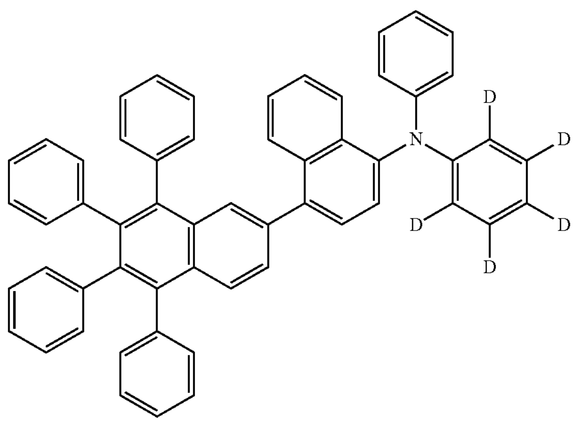
A95
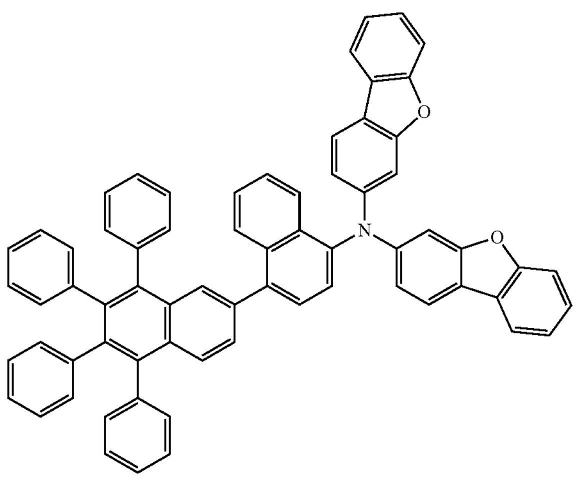
A96
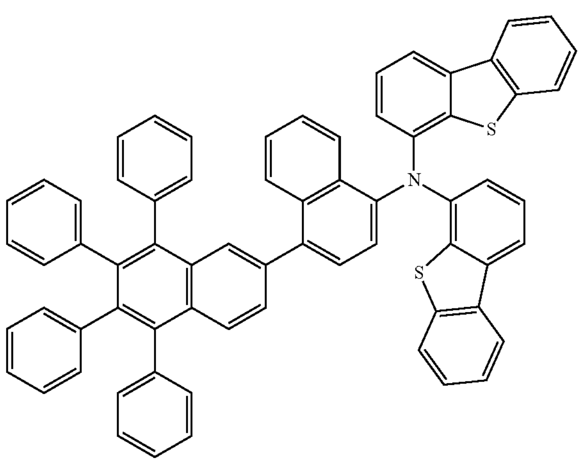
-continued
A97
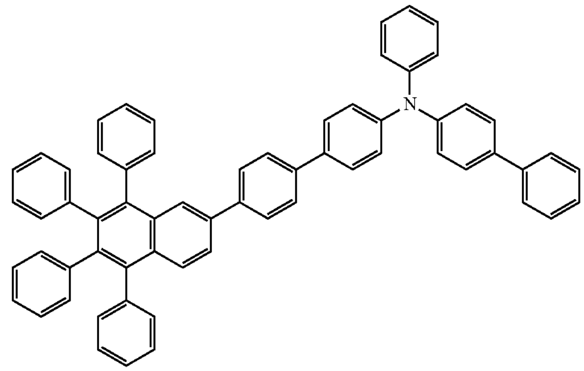
A98
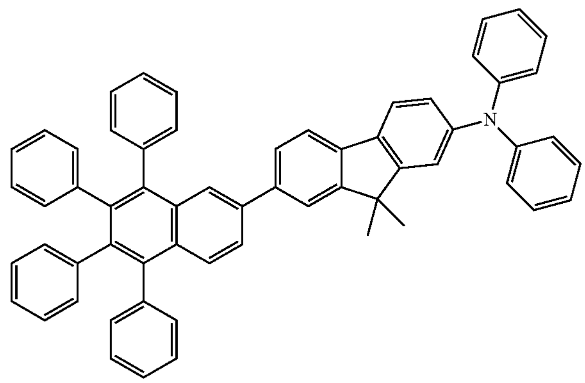
A99
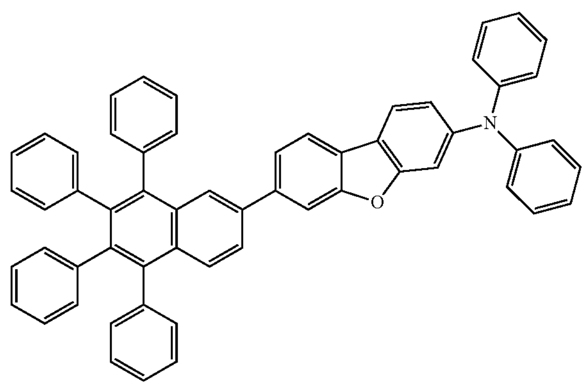
A100
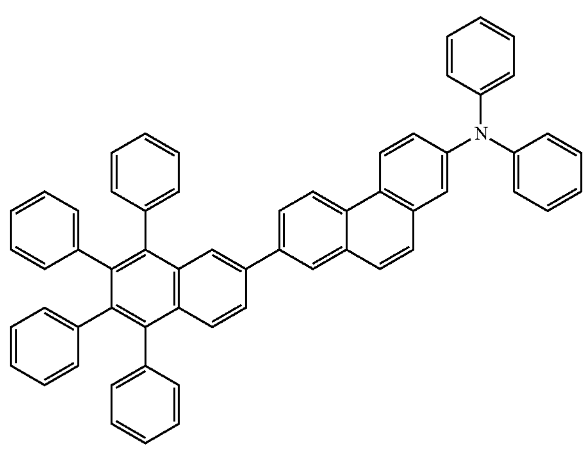

-continued
A101
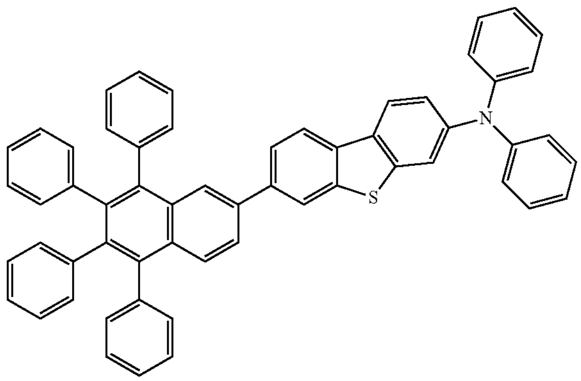
A102
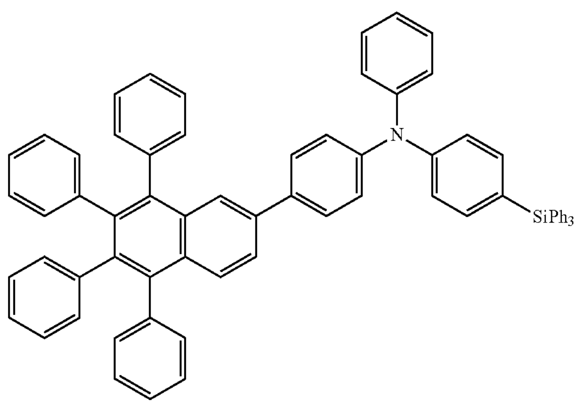
A103
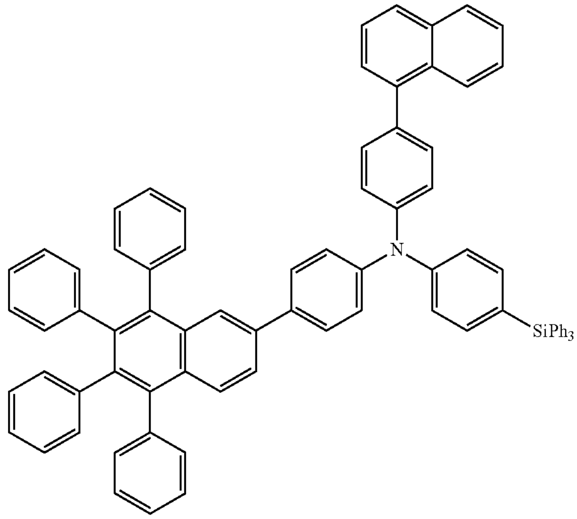
-continued
A104
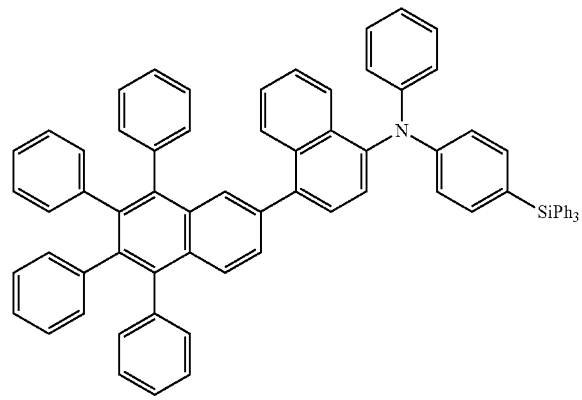
A105
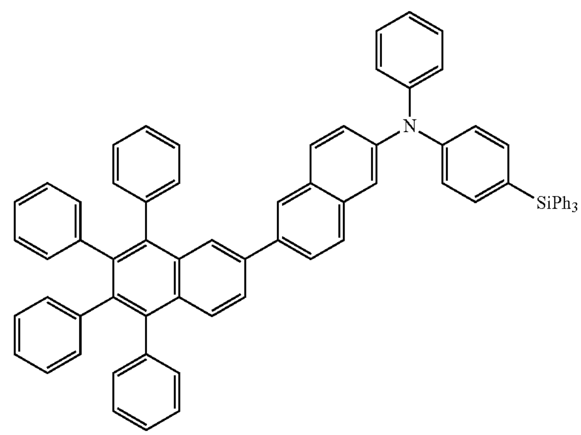
A106
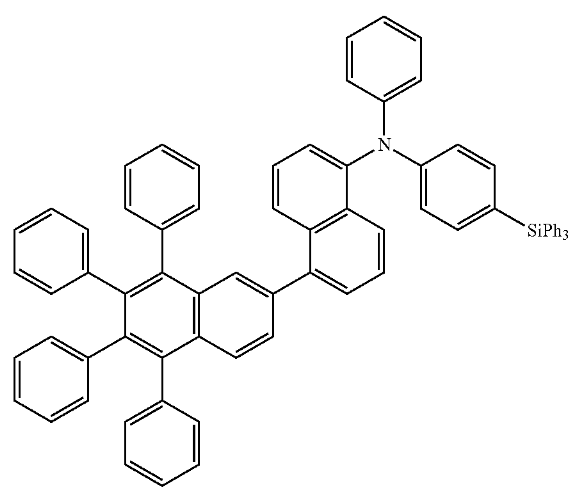

-continued
A107
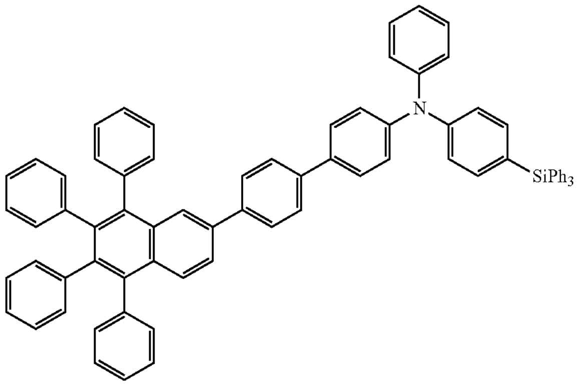
A108
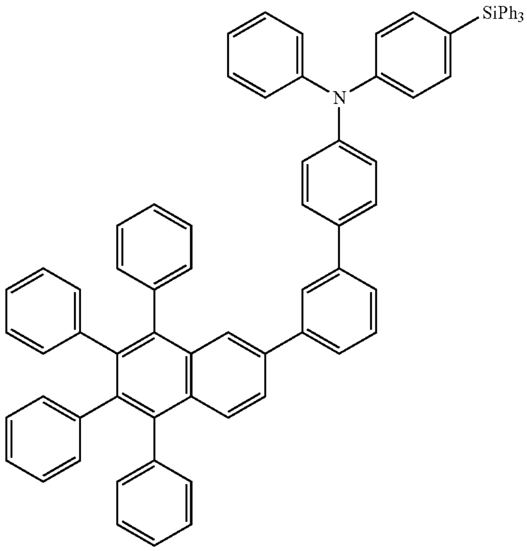
A109
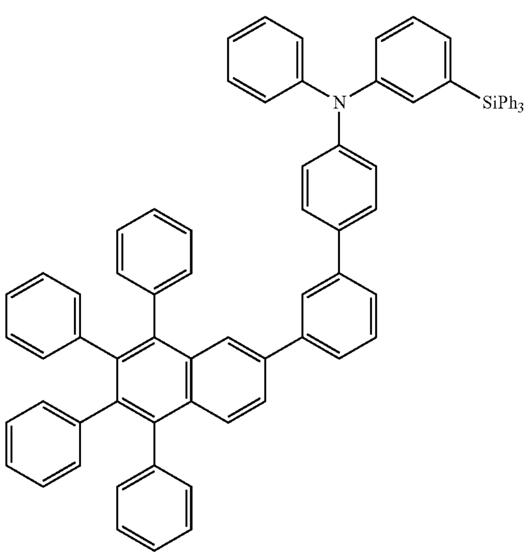
-continued
A110
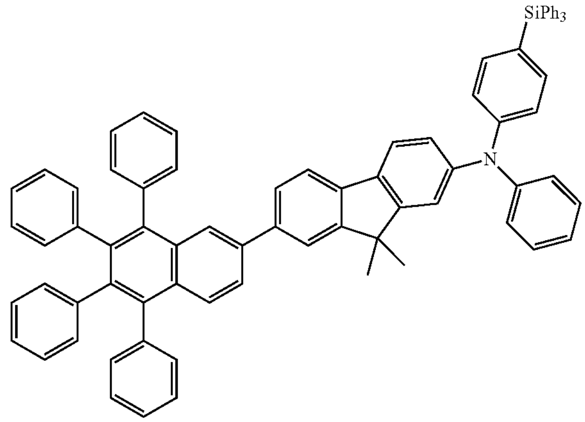
A111
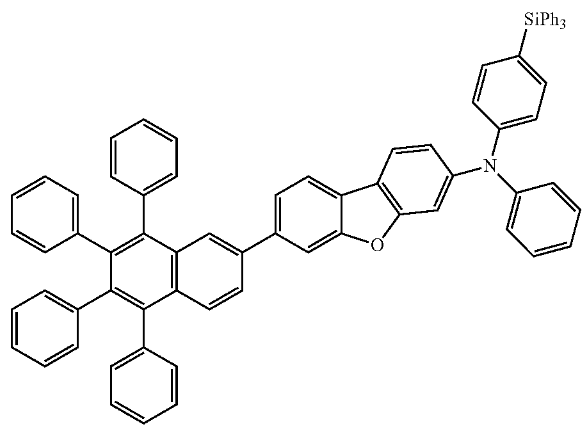
A112
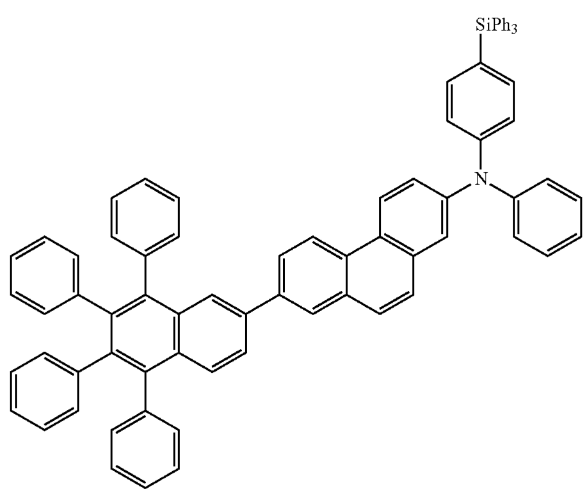

A113
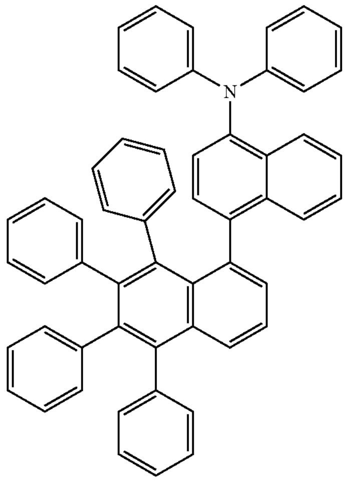
A114
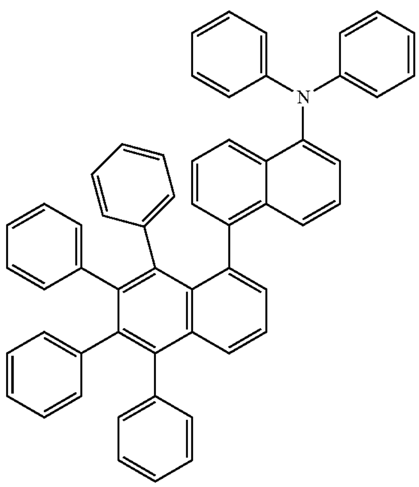
A115
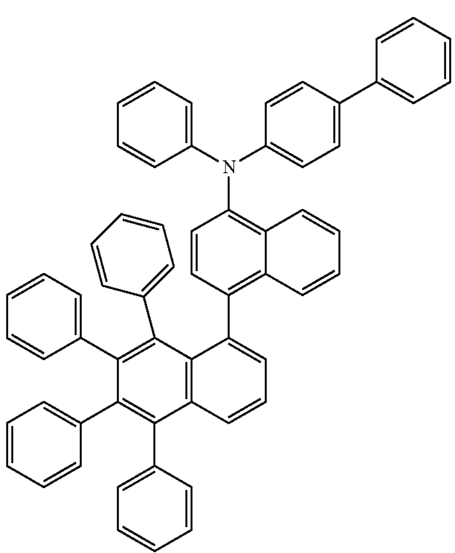
A116
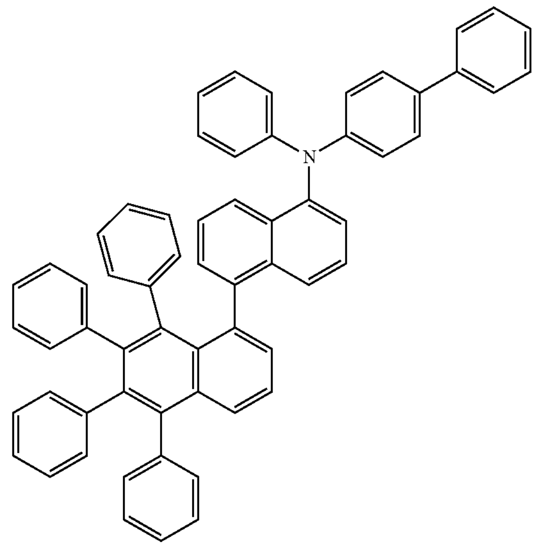
A117
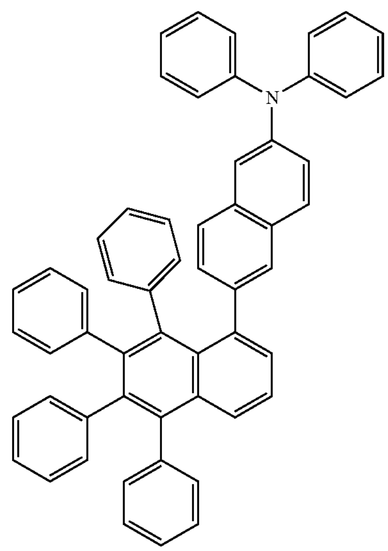
A118
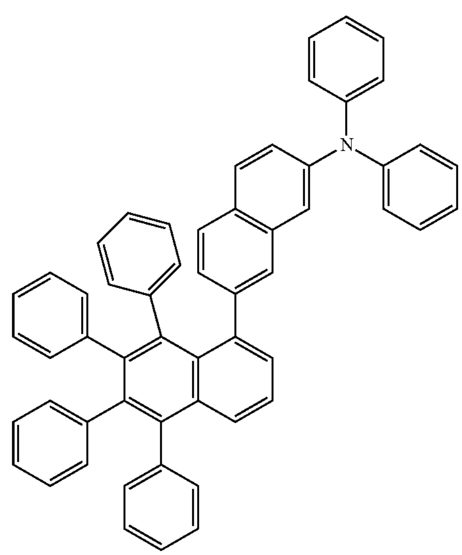

-continued
A119
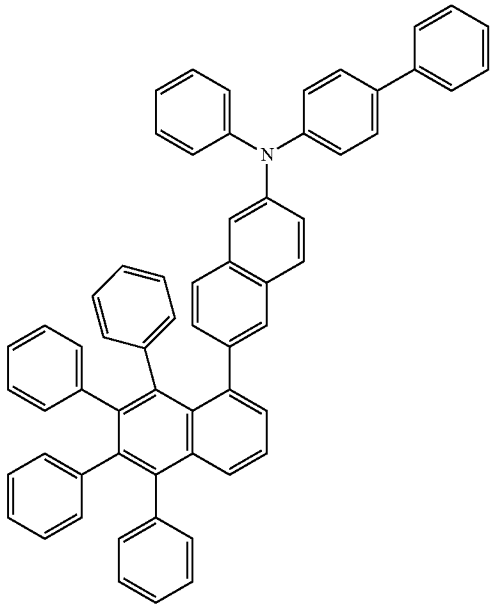
A120
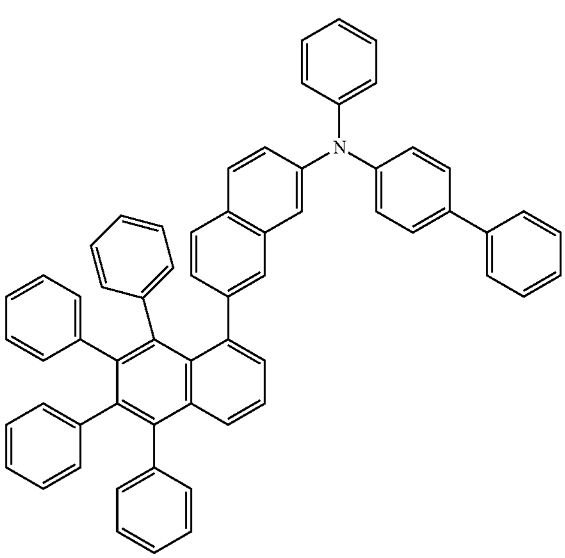
-continued
A121
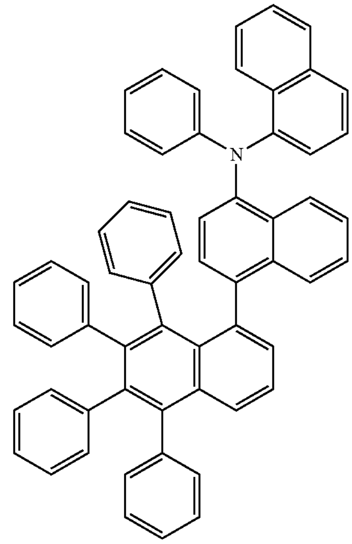
A122
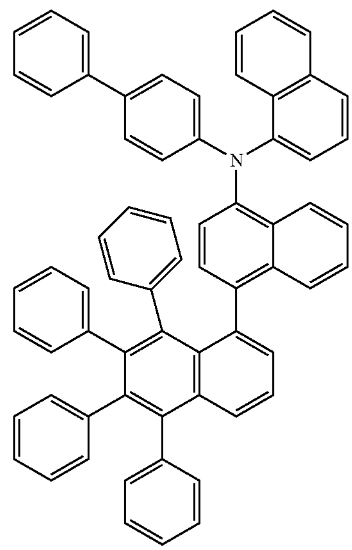
A123
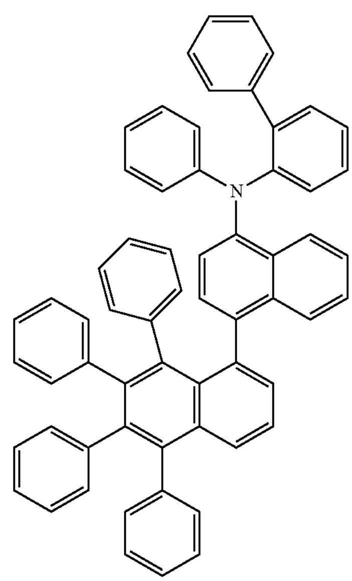

-continued
A124
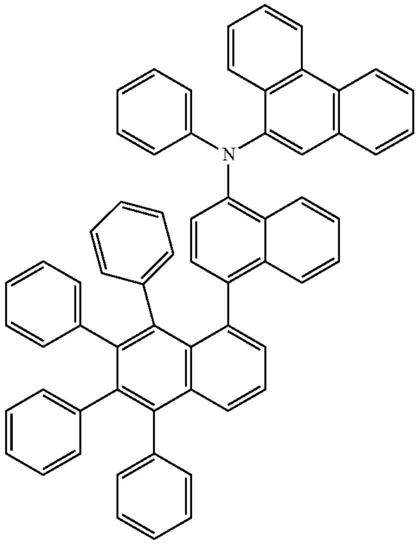
A125
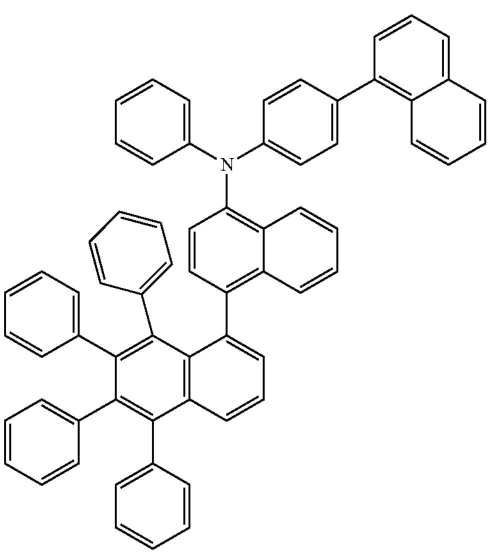
-continued
A126
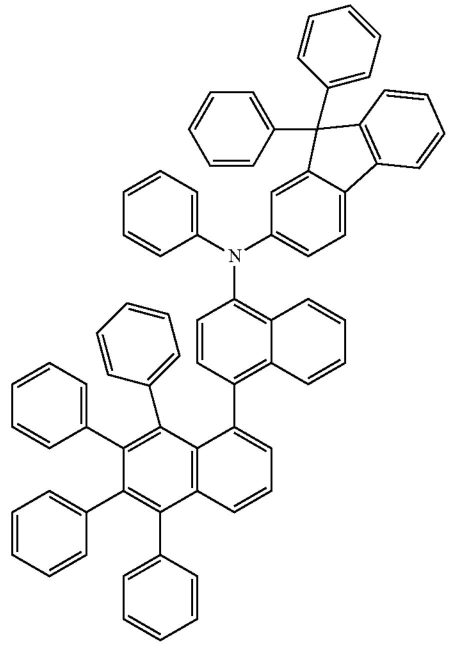
A127
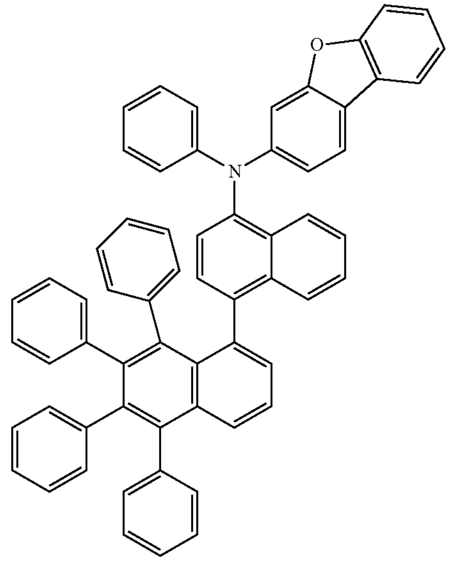

-continued
A128
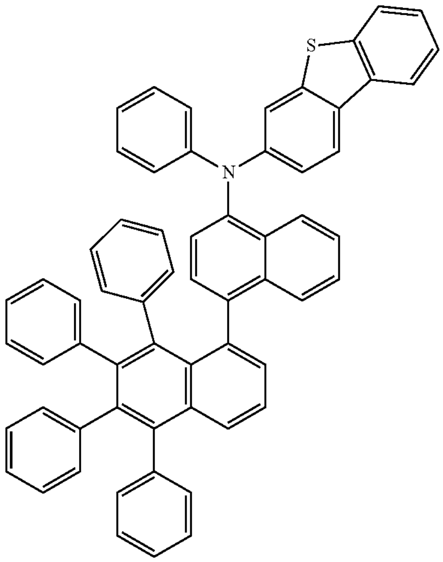
A129
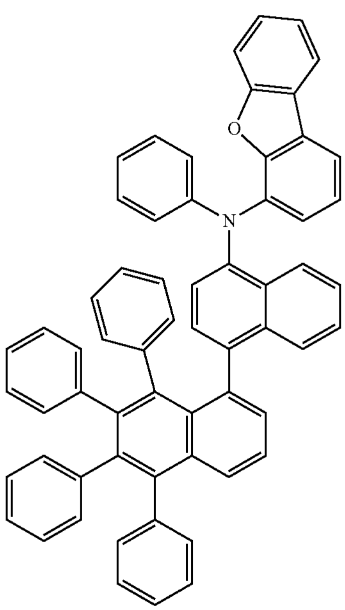
-continued
A130
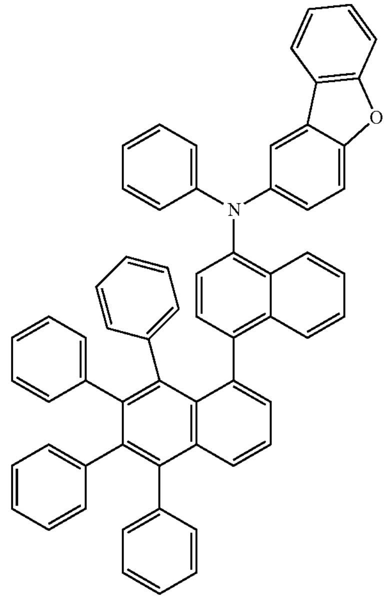
A131
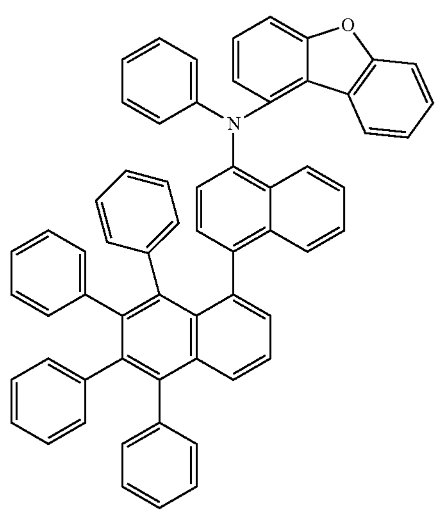

-continued
A132
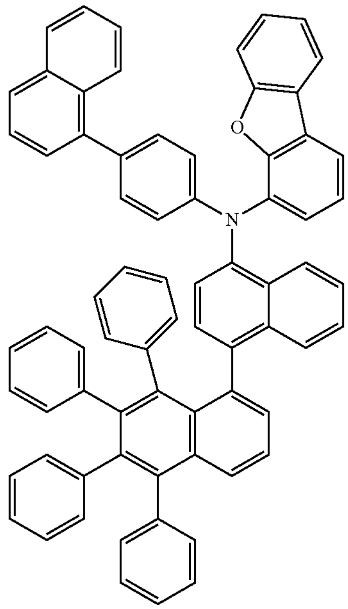
A133
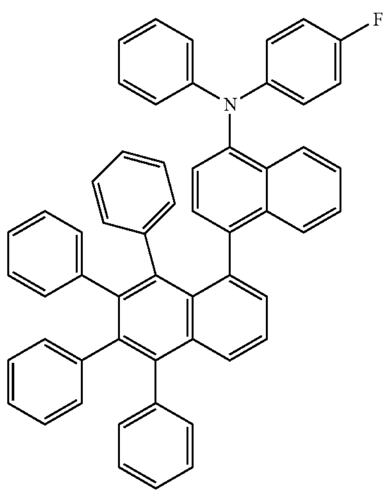
A134
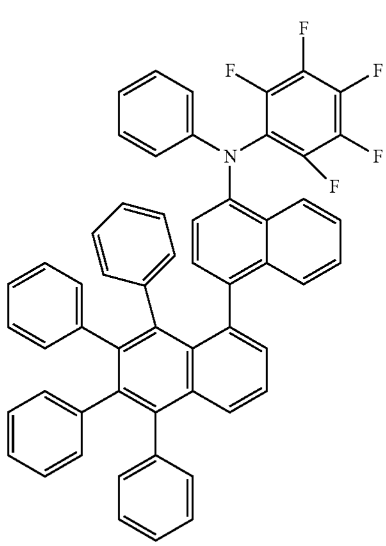
-continued
A135
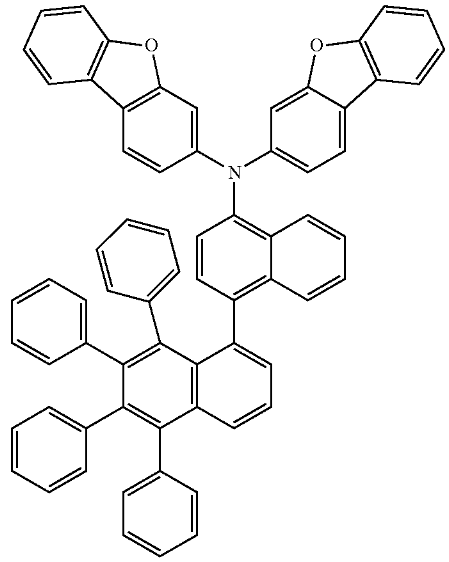
A136
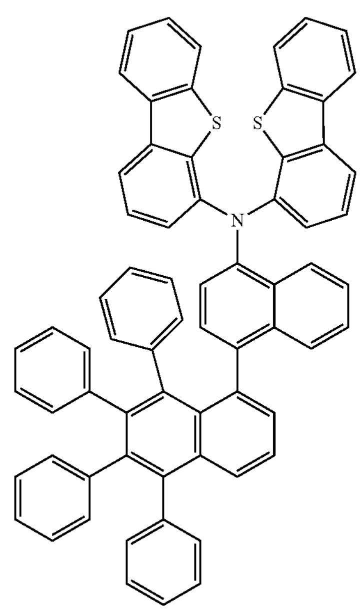

A137
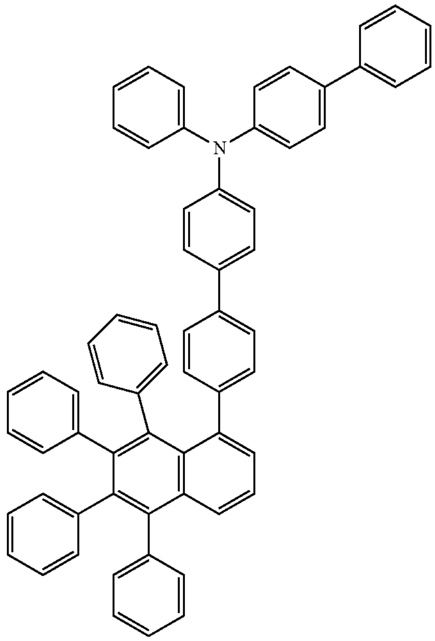
A138
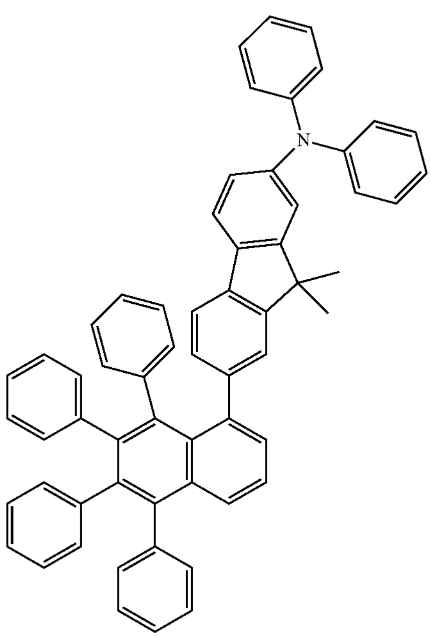
A139
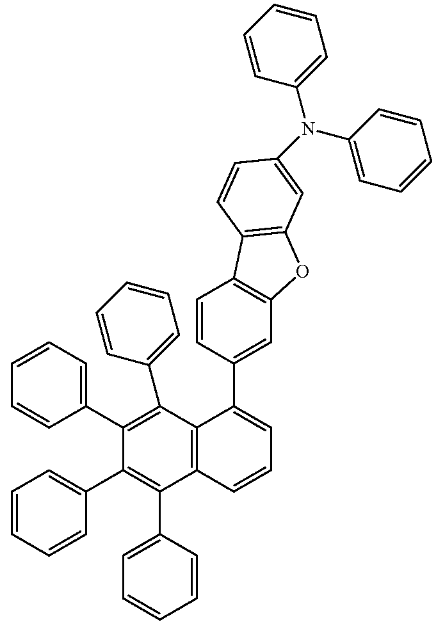
A140
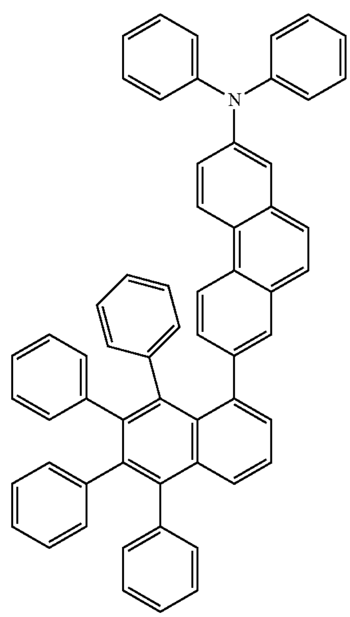

-continued
A141
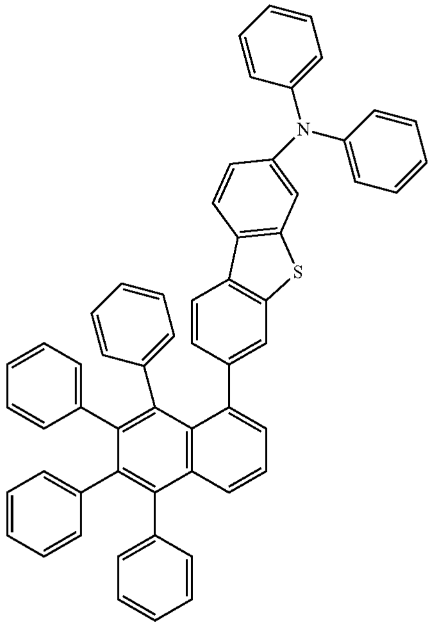
A142
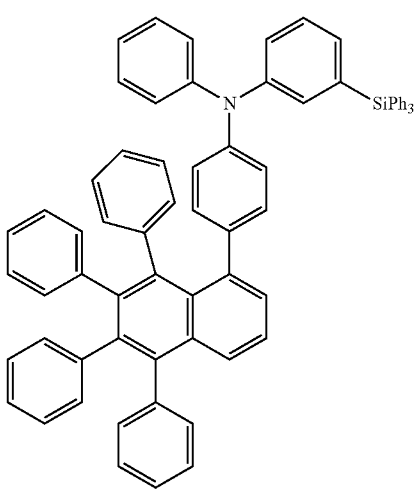
-continued
A143
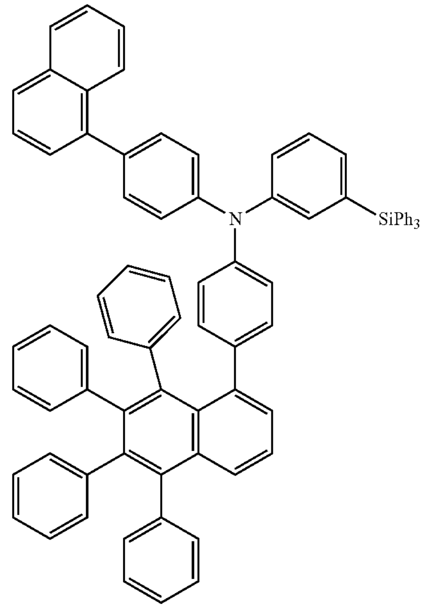
A144
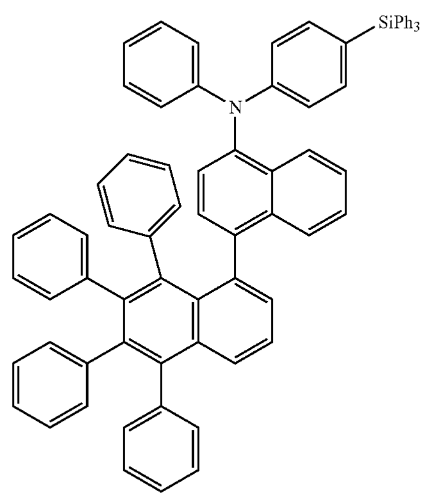
A145
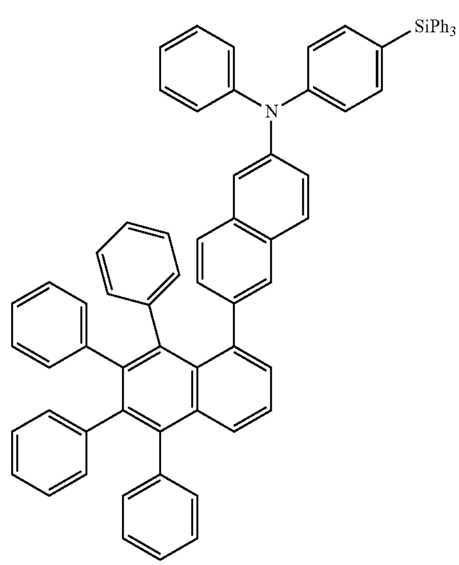

-continued
A146
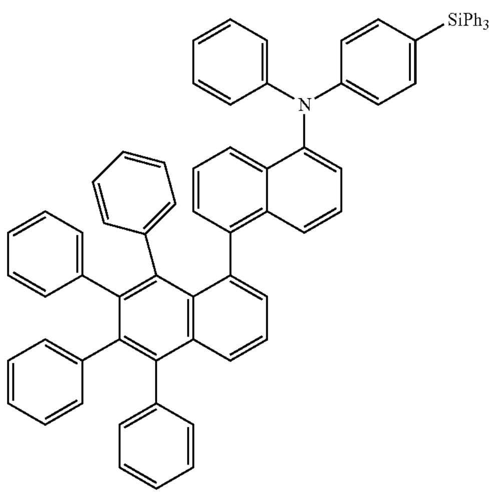
A147
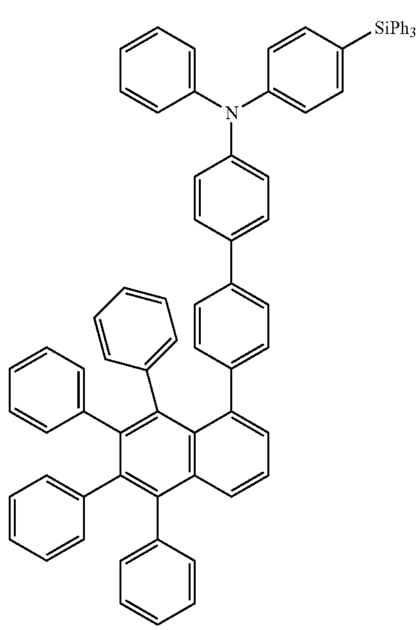
-continued
A148
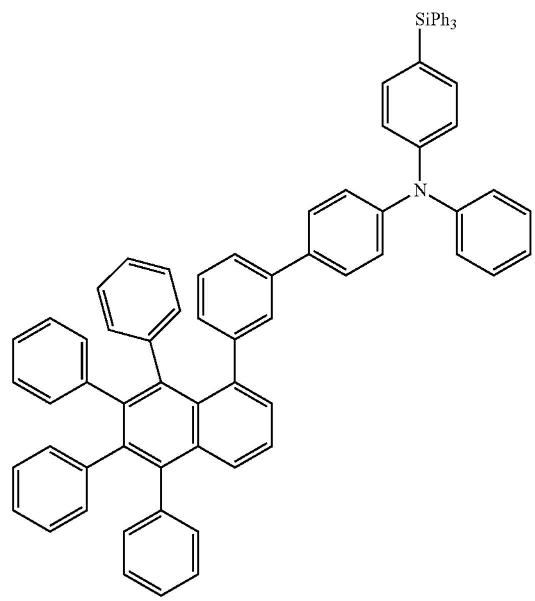
A149
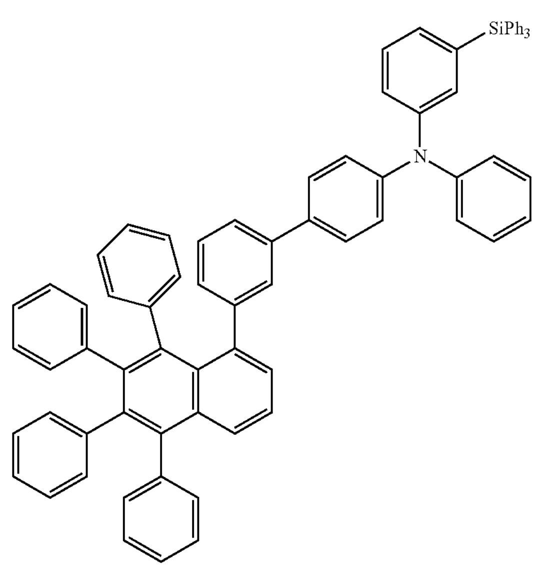

-continued
A150
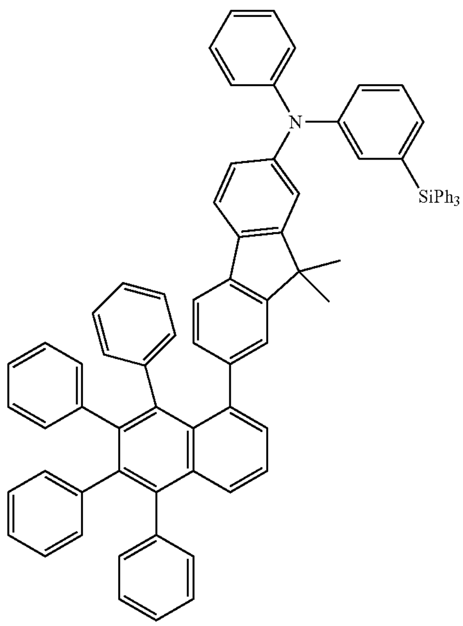
A151
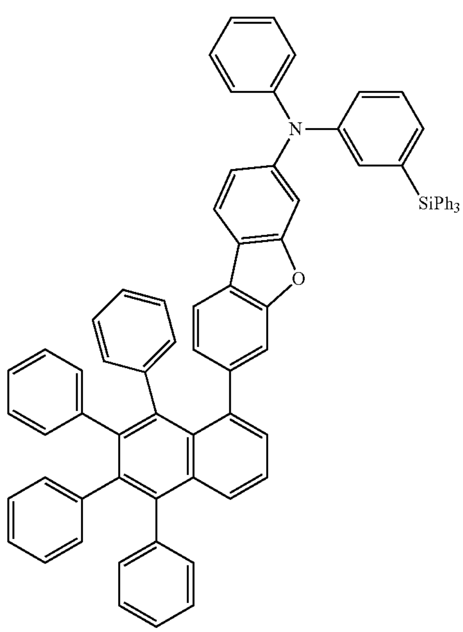
-continued
A152
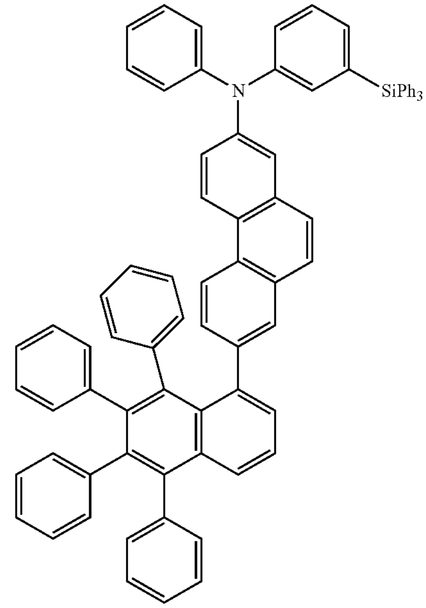
A153
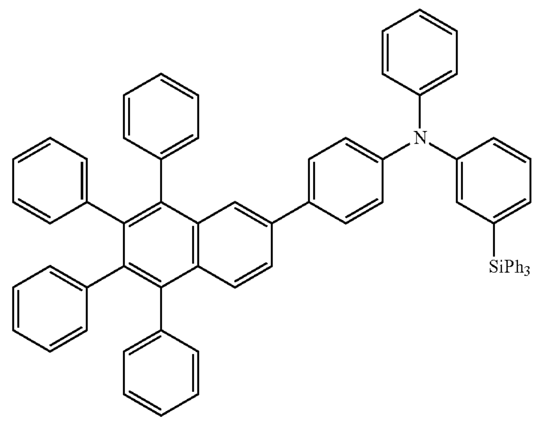
A154
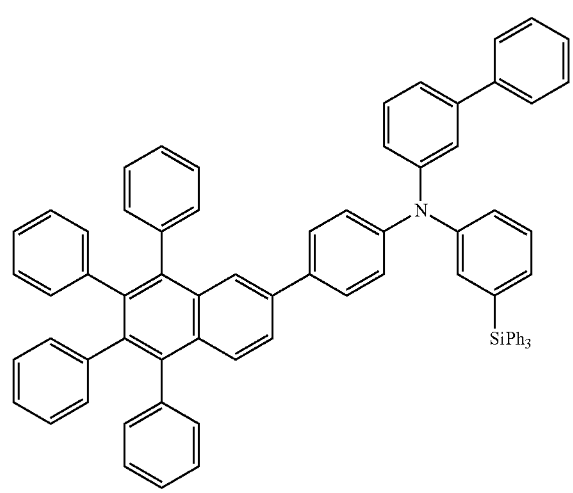

-continued
A155
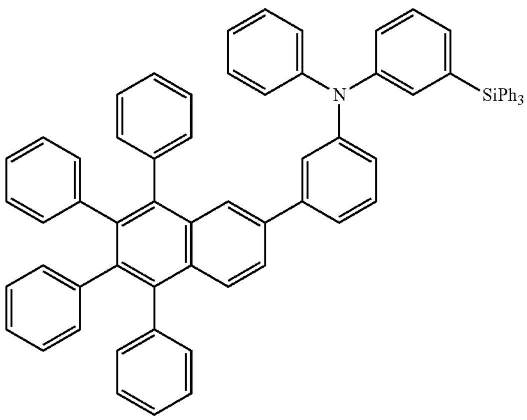
A156
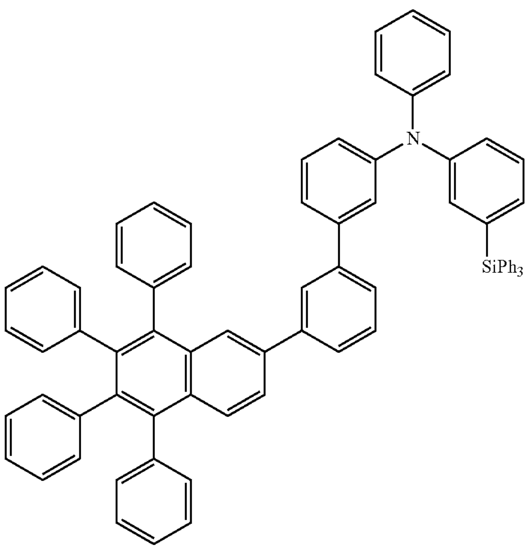
A157
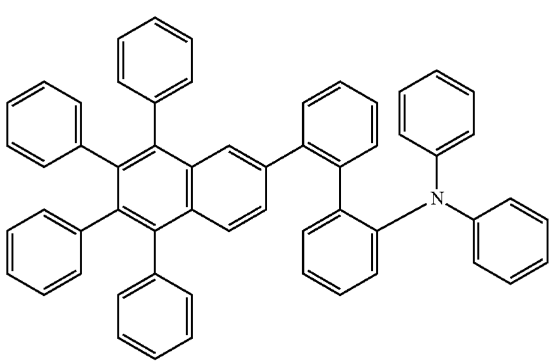
-continued
A158
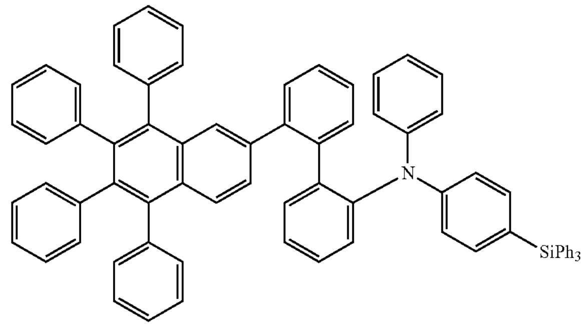
A159
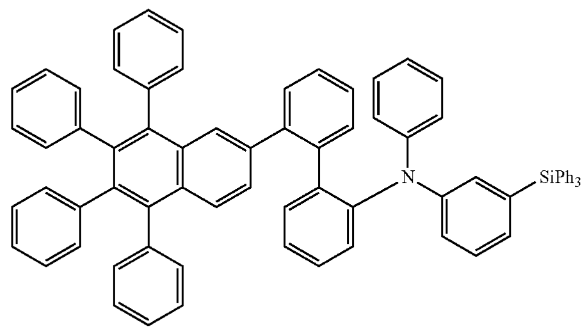
A160
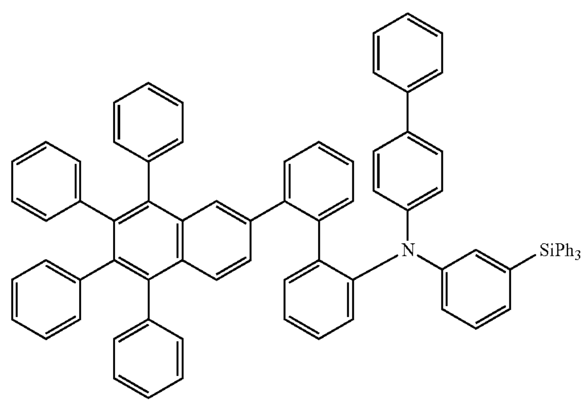
A161
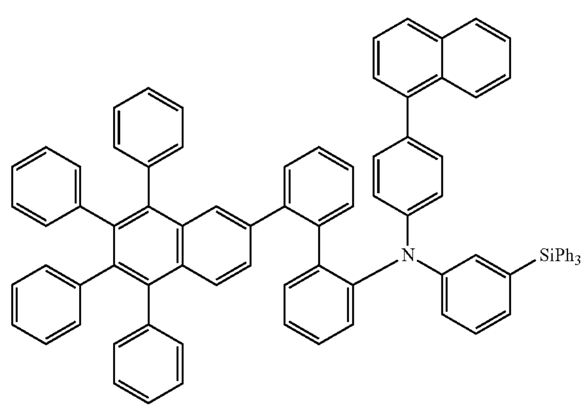

A162
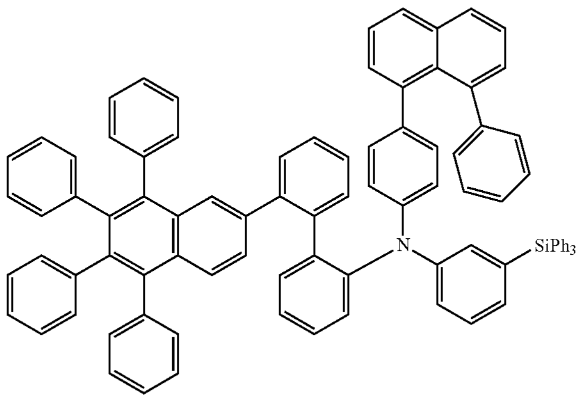
A163
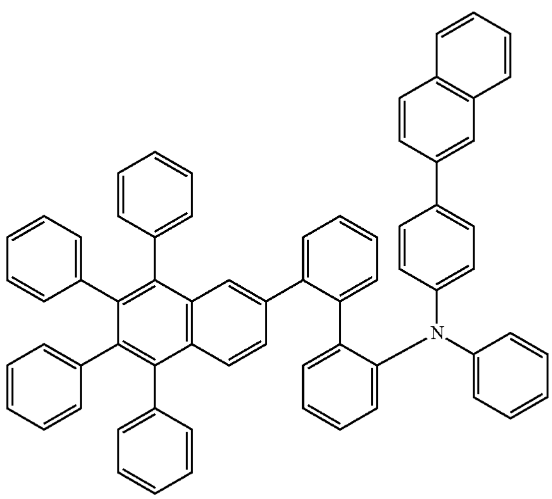
A164
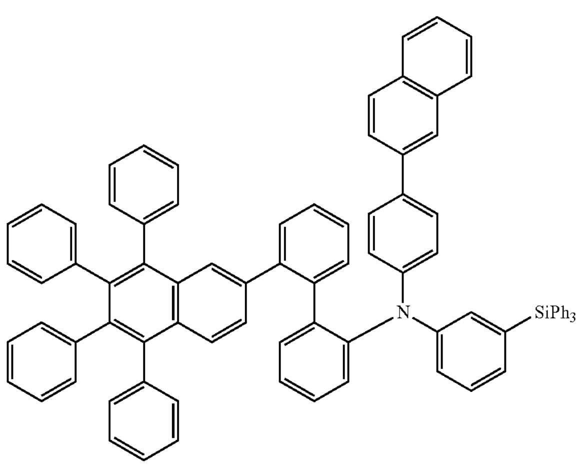
A165
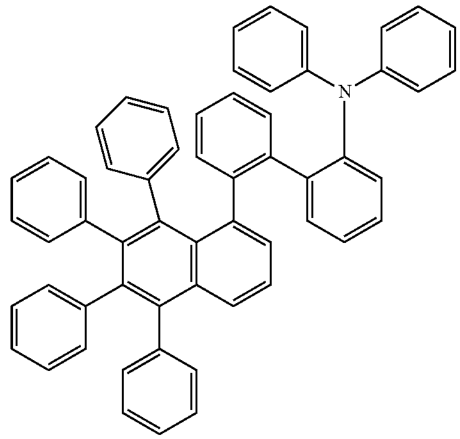
A166
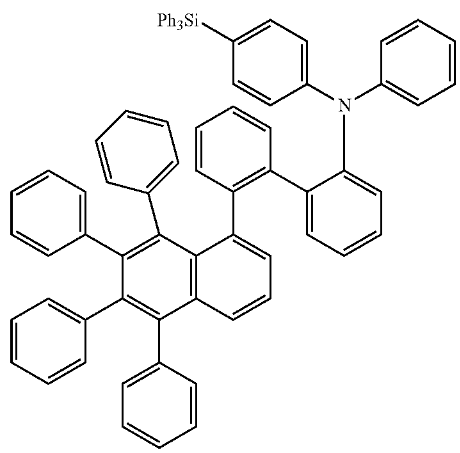
A167
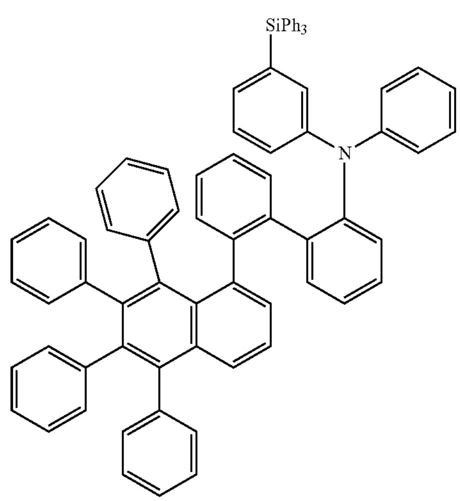

-continued
A168
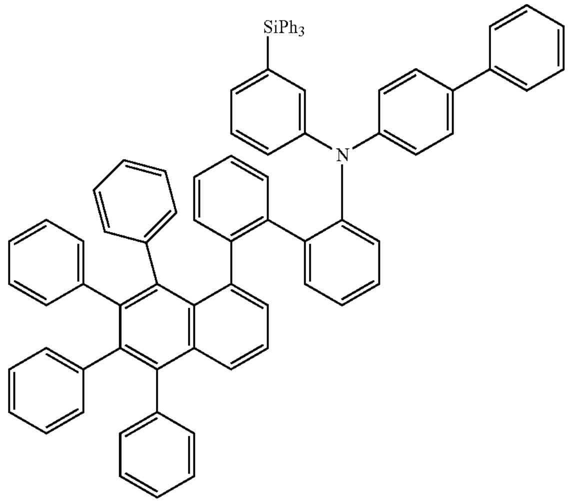
A169
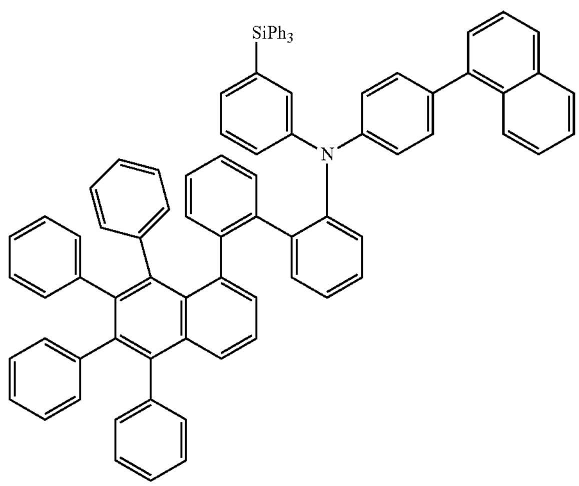
A170
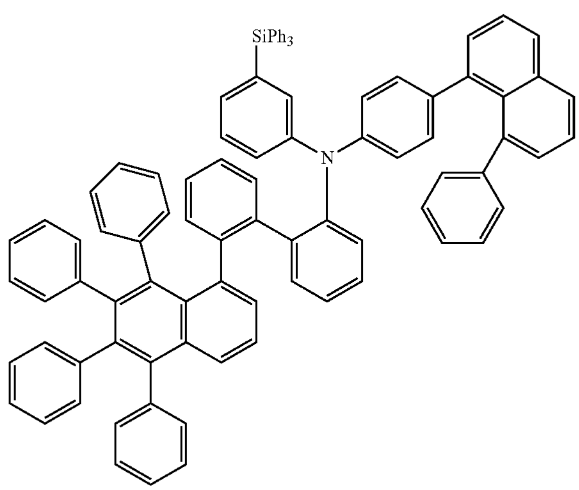
-continued
A171
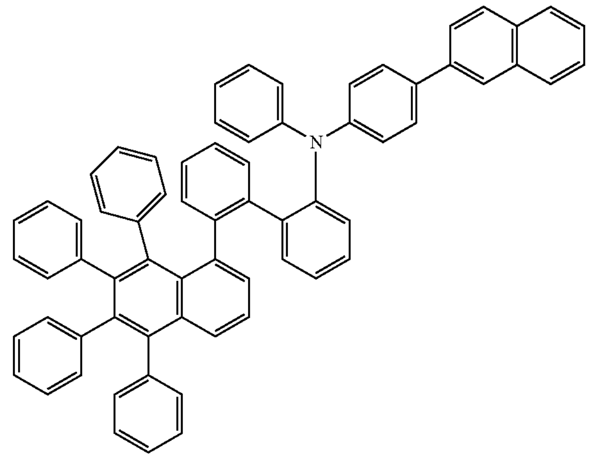
A172
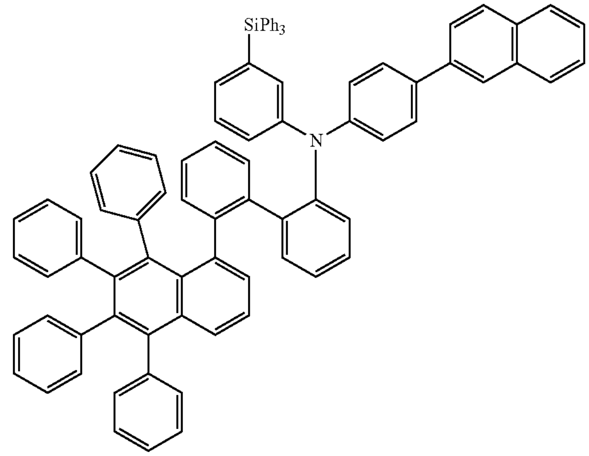
A173
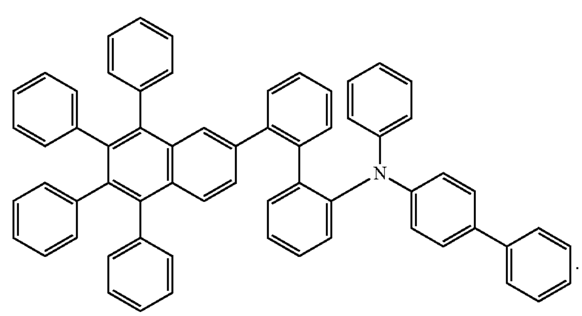
* * * * *